(12) United States Patent
Choi et al.

(10) Patent No.: US 11,764,107 B2
(45) Date of Patent: Sep. 19, 2023

(54) METHODS OF MANUFACTURING SEMICONDUCTOR DEVICES

(71) Applicant: SAMSUNG ELECTRONICS CO., LTD., Suwon-si (KR)

(72) Inventors: Byoungdeog Choi, Suwon-si (KR); JungWoo Seo, Hwaseong-si (KR); Sangyeon Han, Suwon-si (KR); Hyun-Woo Chung, Seoul (LR); Hongrae Kim, Seoul (KR); Yoosang Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 225 days.

(21) Appl. No.: 17/144,226

(22) Filed: Jan. 8, 2021

(65) Prior Publication Data

US 2021/0159113 A1 May 27, 2021

Related U.S. Application Data

(63) Continuation of application No. 16/577,429, filed on Sep. 20, 2019, now Pat. No. 10,910,261, which is a
(Continued)

(30) Foreign Application Priority Data

May 3, 2012 (KR) .................. 10-2012-0047003

(51) Int. Cl.
*H01L 21/768* (2006.01)
*H01L 23/498* (2006.01)
(Continued)

(52) U.S. Cl.
CPC .... *H01L 21/7682* (2013.01); *H01L 21/76816* (2013.01); *H01L 21/76877* (2013.01);
(Continued)

(58) Field of Classification Search
CPC .................. H01L 27/1085–10855; H01L 27/10882–10891; H01L 27/7682;
(Continued)

(56) References Cited

U.S. PATENT DOCUMENTS 5,847,428 A  12/1998  Fulford, Jr. et al.
6,329,279 B1  12/2001  Lee
(Continued)

FOREIGN PATENT DOCUMENTS

CN  102760683 A  10/2012
JP  2000-124454 A  4/2000
(Continued)

*Primary Examiner* — Sophia T Nguyen
*Assistant Examiner* — John Lin
(74) *Attorney, Agent, or Firm* — Lee IP Law, P.C.

(57) ABSTRACT

A semiconductor device includes a pair of line patterns disposed on a substrate. A contact plug is disposed between the pair of line patterns and an air gap is disposed between the contact plug and the line patterns. A landing pad extends from a top end of the contact plug to cover a first part of the air gap and an insulating layer is disposed on a second part of the air gap, which is not covered by the landing pad.

9 Claims, 117 Drawing Sheets

Related U.S. Application Data continuation of application No. 15/343,712, filed on Nov. 4, 2016, now Pat. No. 10,490,444, which is a continuation of application No. 13/803,935, filed on Mar. 14, 2013, now Pat. No. 9,520,348.

(51) Int. Cl.

| | | |
|---|---|---|
| *H10B 12/00* | (2023.01) | |
| *H10B 61/00* | (2023.01) | |
| *H10B 63/00* | (2023.01) | |
| *H10N 70/00* | (2023.01) | |
| *H01L 23/522* | (2006.01) | |
| *H01L 23/528* | (2006.01) | |
| *H01L 23/532* | (2006.01) | |
| *H10N 70/20* | (2023.01) | |

(52) U.S. Cl.
CPC ...... *H01L 21/76897* (2013.01); *H01L 23/498* (2013.01); *H01L 23/528* (2013.01); *H01L 23/5226* (2013.01); *H01L 23/5329* (2013.01); *H10B 12/315* (2023.02); *H10B 61/22* (2023.02); *H10B 63/30* (2023.02); *H10B 63/80* (2023.02); *H10N 70/011* (2023.02); *H10N 70/8825* (2023.02); *H10N 70/8828* (2023.02); *H10N 70/8833* (2023.02); *H10N 70/8836* (2023.02); *H01L 2221/1063* (2013.01); *H01L 2924/0002* (2013.01); *H10B 12/0335* (2023.02); *H10B 12/053* (2023.02); *H10N 70/20* (2023.02); *H10N 70/231* (2023.02); *H10N 70/826* (2023.02)

(58) Field of Classification Search
CPC ............... H01L 29/0649; H01L 29/515; H01L 2221/1042; H01L 21/76802; H01L 21/76816; H01L 21/76877; H01L 21/76897; H01L 21/7682; G11C 5/06; G11C 5/10; H10B 12/03–0335; H10B 12/48–488

See application file for complete search history.

(56) References Cited

U.S. PATENT DOCUMENTS

| | | | |
|---|---|---|---|
| 6,472,266 | B1 | 10/2002 | Yu et al. |
| 6,917,109 | B2 | 7/2005 | Lur et al. |
| 2007/0212839 | A1 | 9/2007 | Chung |
| 2008/0308954 | A1* | 12/2008 | Seo ............... H01L 27/10855 |
| | | | 257/E21.59 |
| 2010/0002895 | A1 | 1/2010 | Notake et al. |
| 2010/0140676 | A1 | 6/2010 | Yeom |
| 2010/0285662 | A1* | 11/2010 | Kim ............... H01L 27/10855 |
| | | | 257/E21.585 |
| 2011/0084357 | A1 | 4/2011 | Liu et al. |
| 2011/0092060 | A1 | 4/2011 | Lee et al. |
| 2011/0183516 | A1 | 7/2011 | Lee |
| 2012/0168899 | A1* | 7/2012 | Kim ............... H01L 27/10855 |
| | | | 438/586 |
| 2012/0248519 | A1 | 10/2012 | Shinhara |
| 2012/0276711 | A1 | 11/2012 | Yoon et al. |

FOREIGN PATENT DOCUMENTS

| | | |
|---|---|---|
| KR | 10-2001-0004008 A | 1/2001 |
| KR | 10-2001-0011638 A | 2/2001 |
| KR | 10-2005-0013830 A | 2/2005 |
| KR | 10-0672823 B1 | 1/2007 |
| KR | 10-2008-0061038 A | 7/2008 |
| KR | 10-2008-0109281 A | 12/2008 |
| KR | 10-2009-0070691 A | 7/2009 |
| KR | 10-2010-0121884 A | 11/2010 |
| KR | 10-2010-0122700 A | 11/2010 |

\* cited by examiner

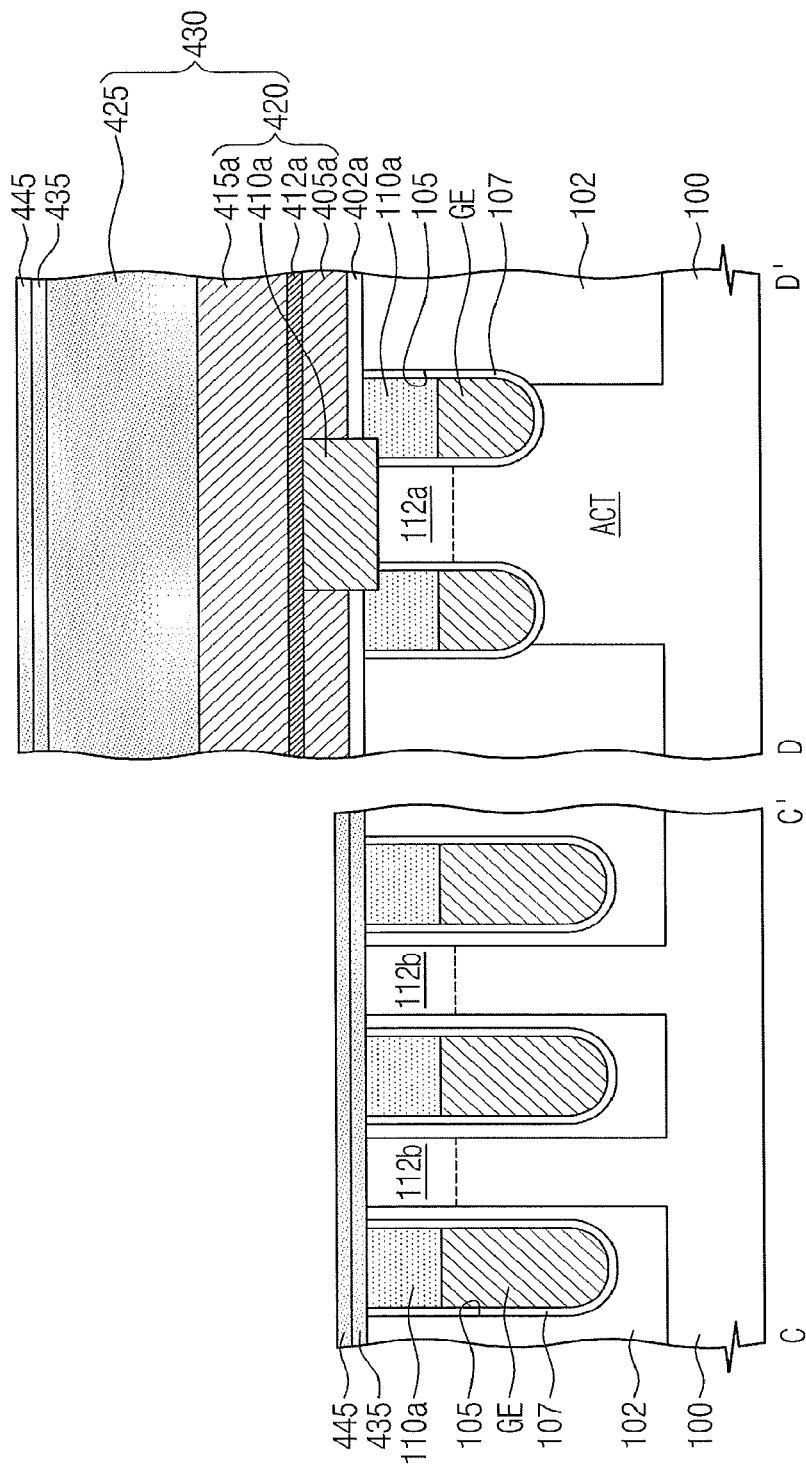

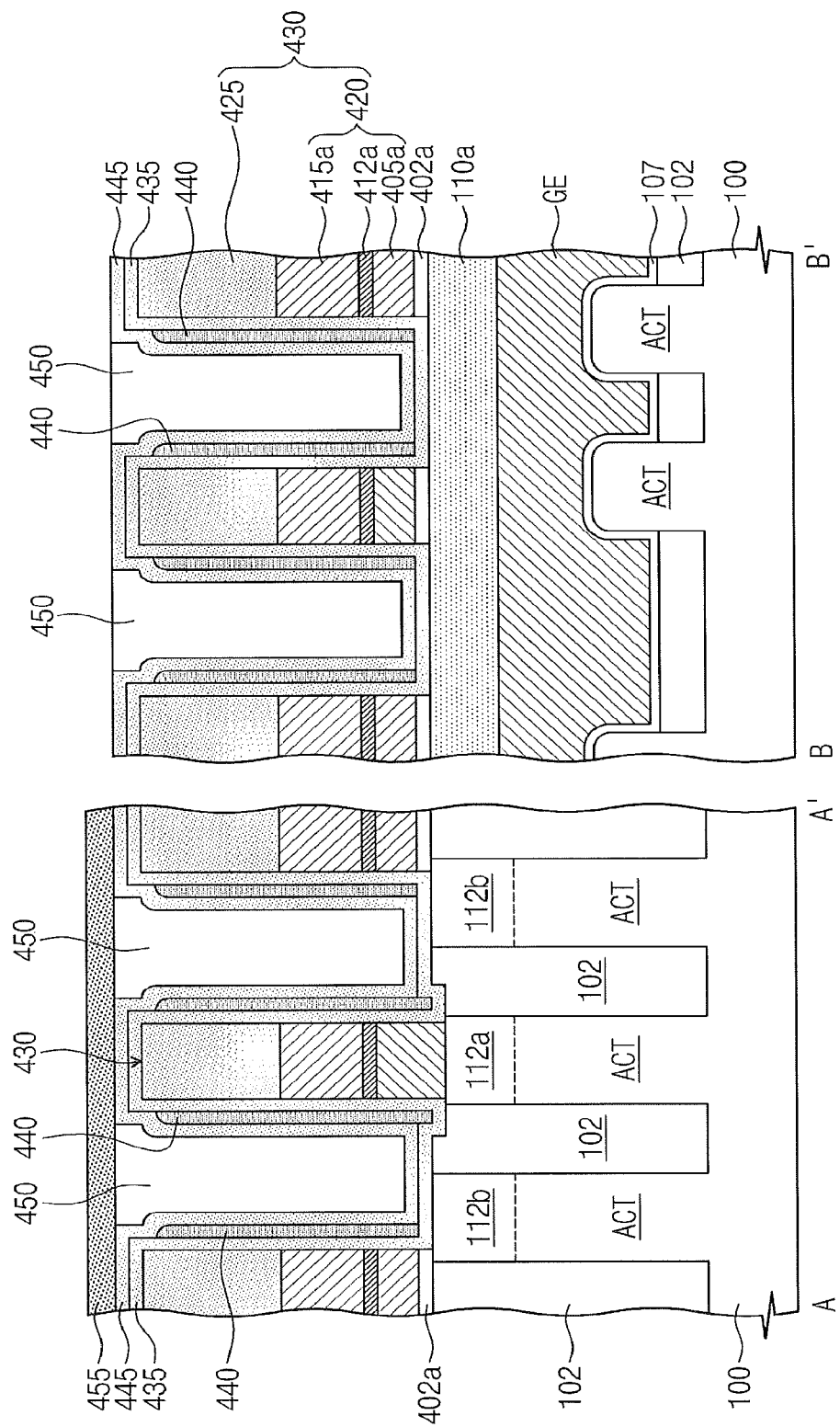

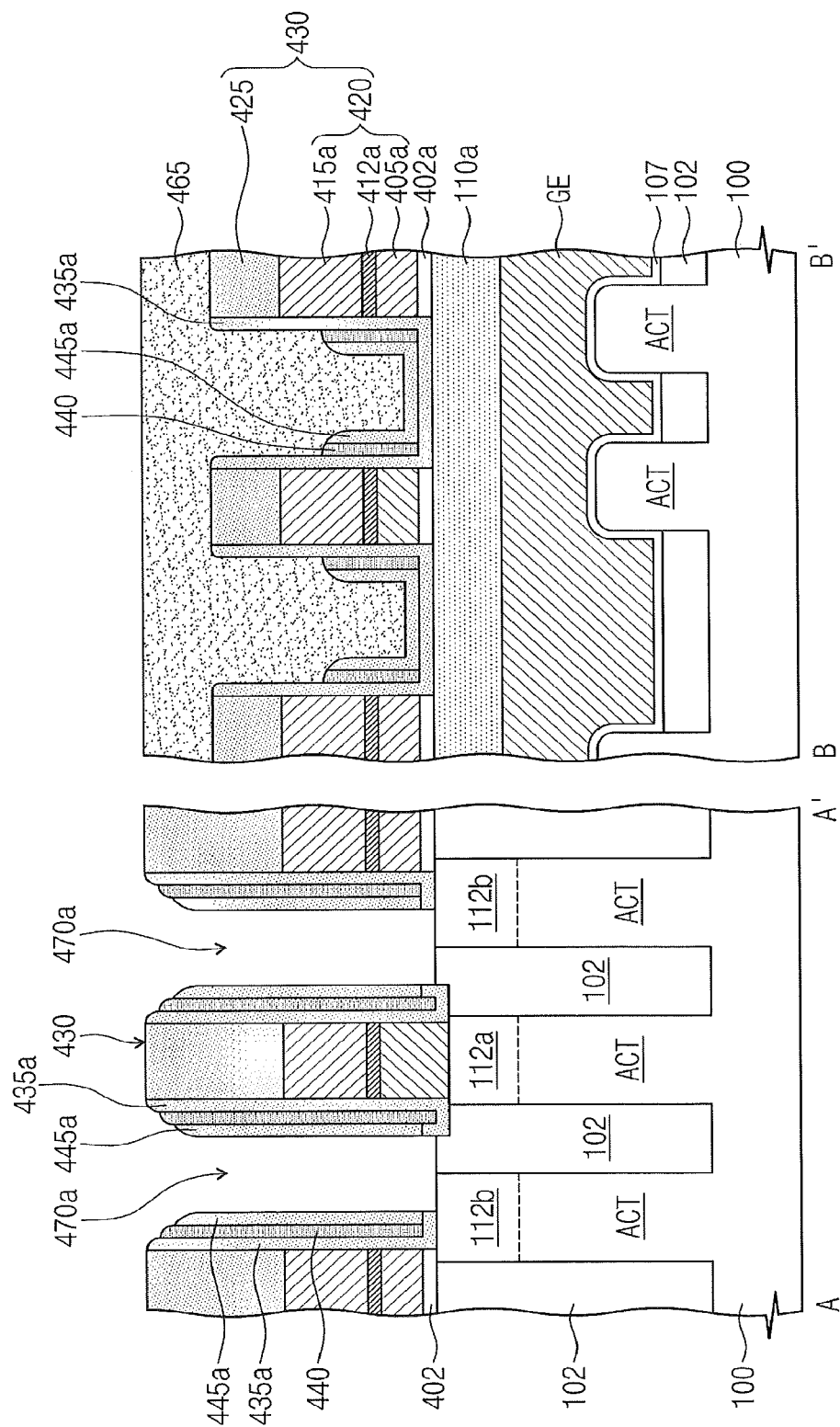

METHODS OF MANUFACTURING SEMICONDUCTOR DEVICES

CROSS-REFERENCE TO RELATED APPLICATION

This application is a continuation of U.S. patent application Ser. No. 16/577,429 filed Sep. 20, 2019, and entitled, "Semiconductor Devices and Methods of Manufacturing the Same," which is a continuation of U.S. patent application Ser. No. 15/343,712 filed on Nov. 4, 2016, and entitled, "Semiconductor Devices Having an Air Gap," now U.S. Pat. No. 10,490,444, issued Nov. 26, 2019, which is a continuation of U.S. patent application Ser. No. 13/803,935, filed on Mar. 14, 2013, and entitled, "Semiconductor Devices and Methods of Manufacturing the Same," now U.S. Pat. No. 9,520,348, issued Dec. 13, 2016, which application claims priority under 35 U.S.C. § 119 to Korean Patent Application No. 10-2012-0047003, filed on May 3, 2012, the entireties of all of which are hereby incorporated herein by reference.

FIELD

The inventive concept relates to semiconductor devices and methods of manufacturing the same and, more particularly, to semiconductor devices having an air gap and methods of manufacturing the same.

BACKGROUND

Semiconductor devices are widely used in the electronics industry because of small size, multi-function, and/or low manufacture costs thereof. The semiconductor devices may be categorized as any one of semiconductor memory devices storing logic data, semiconductor logic devices processing operations of logical data, and hybrid semiconductor devices having both the function of the semiconductor memory devices and the function of the semiconductor logic devices.

Generally, a semiconductor device may include vertically stacked patterns and contact plugs for electrically connecting the patterns to each other. As the semiconductor devices have been highly integrated, a space between patterns and/or a space between a pattern and a contact plug may be more and more reduced. Thus, a parasitic capacitance between patterns and/or between a pattern and a contact plug may increase. The parasitic capacitance may cause performance deterioration of the semiconductor device, such as reduction of an operation speed.

SUMMARY

Embodiments of the inventive concept may provide semiconductor devices capable of reducing a parasitic capacitance and methods of manufacturing the same.

Embodiments of the inventive concept may also provide highly integrated semiconductor devices and methods of manufacturing the same.

In one aspect, a semiconductor device may include: a pair of line patterns disposed on a substrate; a contact plug disposed between the pair of line patterns; an air gap disposed between the contact plug and the line patterns; a landing pad extending from a top end of the contact plug to cover a first part of the air gap; and an insulating layer disposed on a second part of the air gap, which is not covered by the landing pad.

In some embodiments, a height of the first part of the air gap covered by the landing pad may be greater than a height of the second part of the air gap not covered by the landing pad.

In other embodiments, the semiconductor device may further include: a first protecting spacer disposed between the line pattern and the contact plug; and a second protecting spacer disposed between the contact plug and the first protecting spacer. The air gap may be disposed between the first protecting spacer and the second protecting spacer.

In still other embodiments, the air gap may have a closed loop-shape surrounding the contact plug in a plan view.

In even other embodiments, the air gap disposed between the contact plug and each of the line patterns may extend in a longitudinal direction of the line pattern.

In yet other embodiments, the semiconductor device may further include: a pair of insulating fences disposed between the pair of line patterns. The contact plug may be disposed between the pair of line patterns and between the pair of insulating fences; and a bottom surface of the contact plug may have a quadrangular shape in a plan view.

In another aspect, a semiconductor device may include: a pair of line patterns disposed on a substrate; a contact plug disposed between the pair of line patterns; and a spacer structure disposed between the contact plug and each of the line patterns. Here, the spacer structure may include: a first protecting spacer adjacent to each of the line patterns; a second protecting spacer adjacent to a sidewall of the contact plug; and an air gap disposed between the first and second protecting spacers.

In still another aspect, a semiconductor device may include: a pair of line patterns disposed on a substrate; a contact plug disposed between the pair of line patterns; an air gap disposed between a lower portion of the contact plug and each of the line patterns; and a capping spacer disposed on the air gap and between an upper portion of the contact plug and each of the line patterns. Here, the lower portion of the contact plug may include a first conductive material; and the upper portion of the contact plug may include a second conductive material different from the first conductive material.

In some embodiments, a pair of the air gaps may be disposed between the pair of line patterns and both sidewalls of the lower portion of the contact plug, respectively, and the pair of the air gaps may be separated from each other. The air gaps may have line-shapes extending in longitudinal directions of the pair of line patterns in a plan view. The contact plug may be provided in plural between the pair of line patterns, and the air gaps may be disposed between each of the contact plugs and each of the line patterns, respectively. In this case, the semiconductor device may further include: insulating fences disposed between the contact plugs, respectively.

In other embodiments, at least upper parts of the air gaps respectively disposed between one of the pair of the line patterns and the contact plugs adjacent to each other may be separated from each other.

In still other embodiments, lower parts of the air gaps respectively disposed between the one line pattern and the contact plugs adjacent to each other may extend in a longitudinal direction of the one line pattern under the insulating fence so as to be connected to each other.

In even other embodiments, a height of the air gap disposed under a center of the insulating fence may be less than a height of the air gap disposed under an edge of the insulating fence.

In yet other embodiments, the air gaps respectively disposed between the one line pattern and the contact plugs adjacent to each other may be completely separated from each other by the insulating fence.

In yet still other embodiments, the capping spacer may include a first sub-spacer having a first density and a second sub-spacer having a second density greater than the first density.

In yet another aspect, a method of manufacturing a semiconductor device may include: forming a pair of line patterns on a substrate; forming a contact hole between the pair of line patterns and sacrificial spacers between the contact hole and each of the line patterns, respectively; forming a contact plug in the contact hole; and removing the sacrificial spacers to form air gaps. At this time, forming the contact hole may include: forming a filling line pattern between the pair of line patterns; forming capping mask patterns defining line type openings crossing the pair of line patterns and the filling line pattern; removing portions of the filling line pattern exposed by the line type openings to form fence concave regions and a filling pillar pattern under each of the capping mask patterns; forming insulating fences filling the fence concave regions, respectively; and removing the capping mask patterns and the filling pillar patterns.

BRIEF DESCRIPTION OF THE DRAWINGS

The inventive concept will become more apparent in view of the attached drawings and accompanying detailed description.

FIGS. 4A to 13A are plan views illustrating a method of manufacturing a semiconductor device according to some embodiments of the inventive concept;

FIGS. 4B to 13B are cross-sectional views taken along lines I-I' of FIGS. 4A to 13A, respectively;

FIGS. 4C to 9C are cross-sectional views taken along lines II-II' of FIGS. 4A to 9A, respectively;

FIGS. 10C to 13C are cross-sectional views taken along lines of FIGS. 10A to 13A, respectively;

FIGS. 26A to 30A are plan views illustrating a method of manufacturing a semiconductor device according to still other embodiments of the inventive concept;

FIGS. 26B to 30B are cross-sectional views taken along lines V-V' of FIGS. 26A to 30A, respectively;

FIGS. 26C to 30C are cross-sectional views taken along lines VI-VI' of FIGS. 26A to 30A, respectively;

FIGS. 34A to 45A are plan views illustrating a method of manufacturing a semiconductor device according to yet other embodiments of the inventive concept;

FIGS. 34B to 45B are cross-sectional views taken along lines A-A' and B-B' of FIGS. 34A to 45A, respectively;

FIGS. 34C to 45C are cross-sectional views taken along lines C-C' and D-D' of FIGS. 34A to 45A, respectively;

DETAILED DESCRIPTION OF THE EMBODIMENTS

Figure 1A:
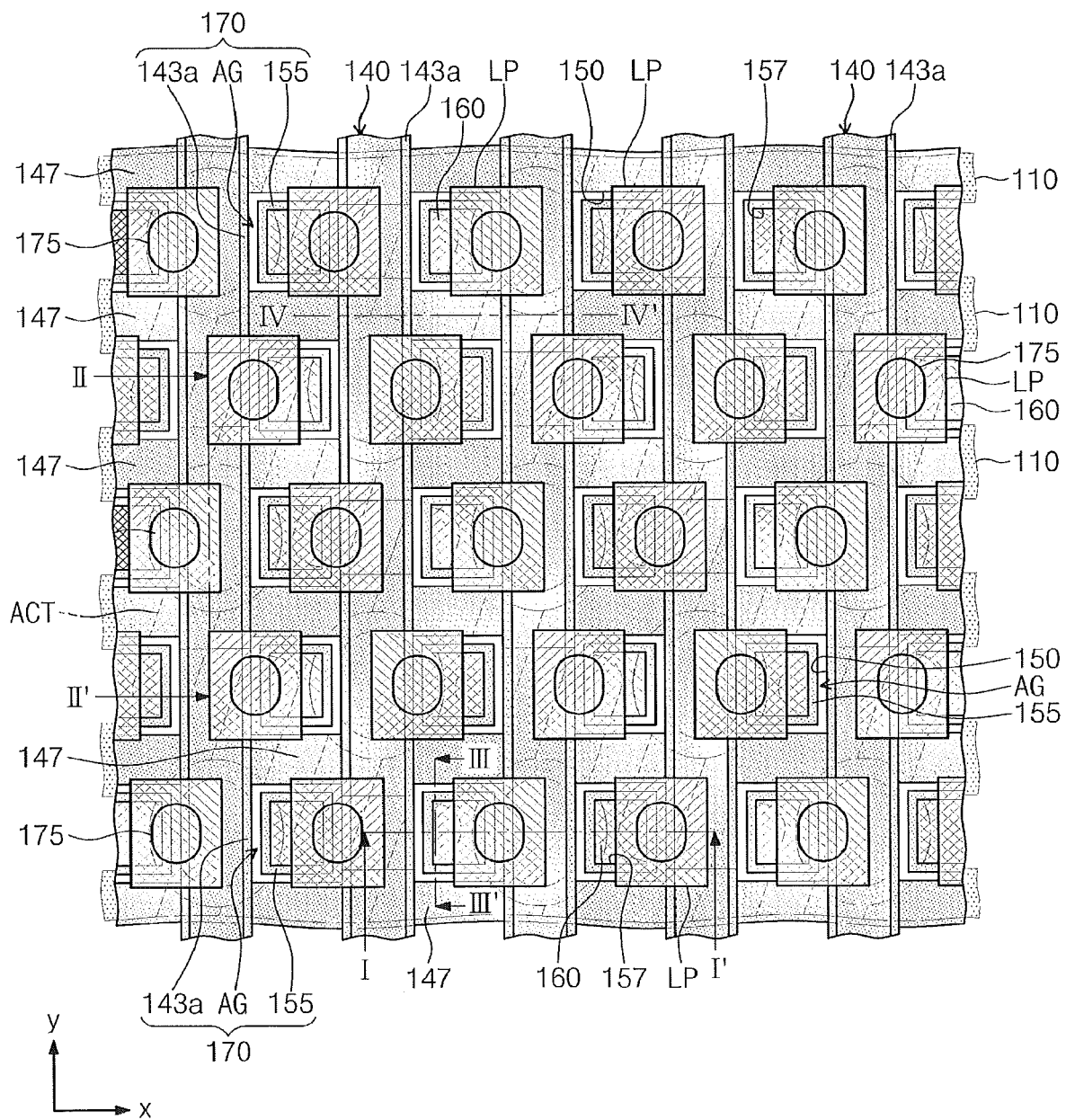
FIG. 1A is a plan view illustrating a semiconductor device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shapes illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept described and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

First Embodiment

Figure 1B:
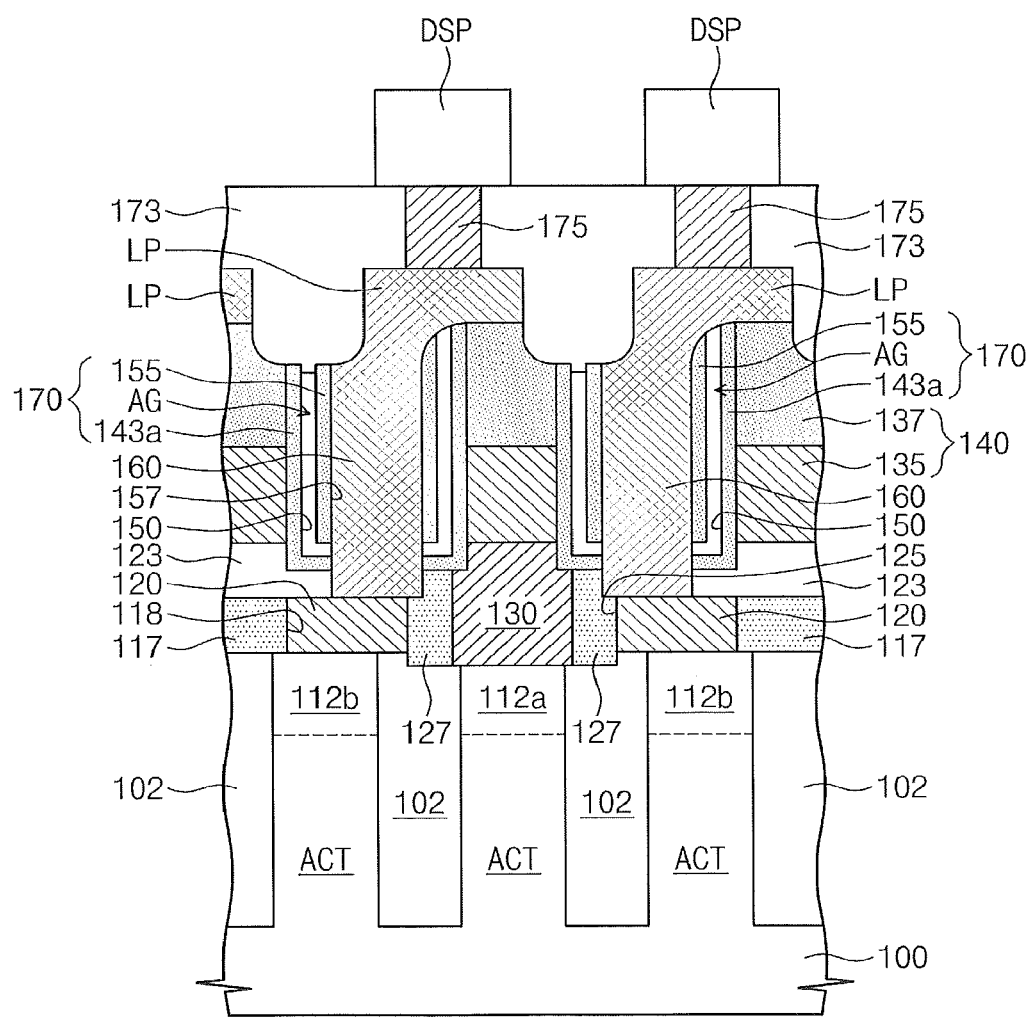
FIG. 1B is a cross-sectional view taken along a line I-I' of FIG. 1A.
Figure 1C:
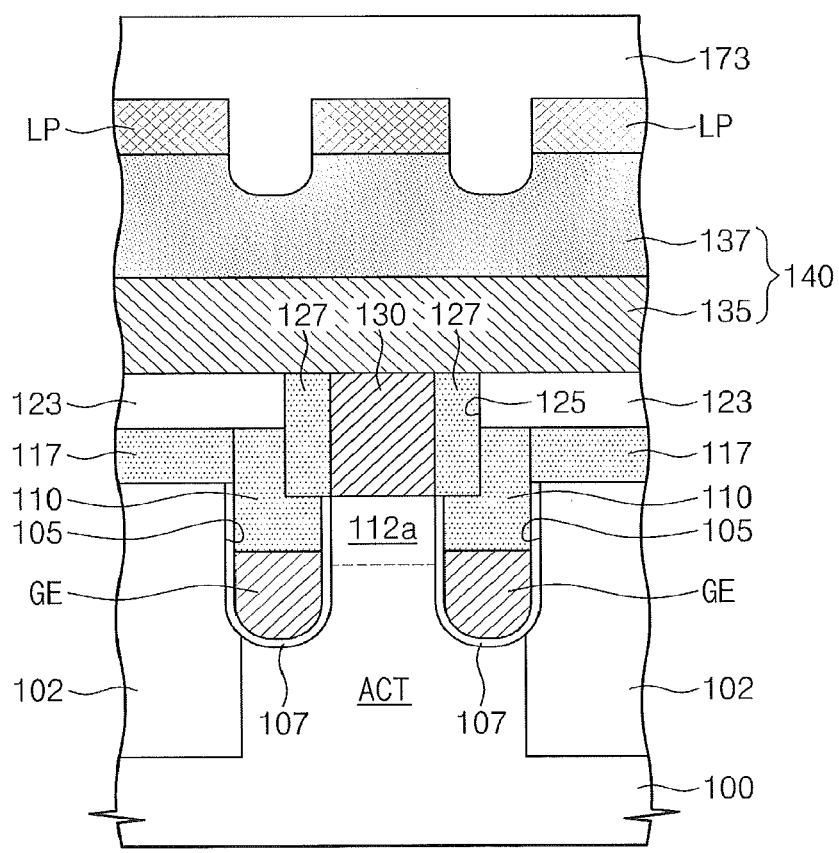
FIG. 1C is a cross-sectional view taken along a line II-II' of FIG. 1A.
Figure 1D:
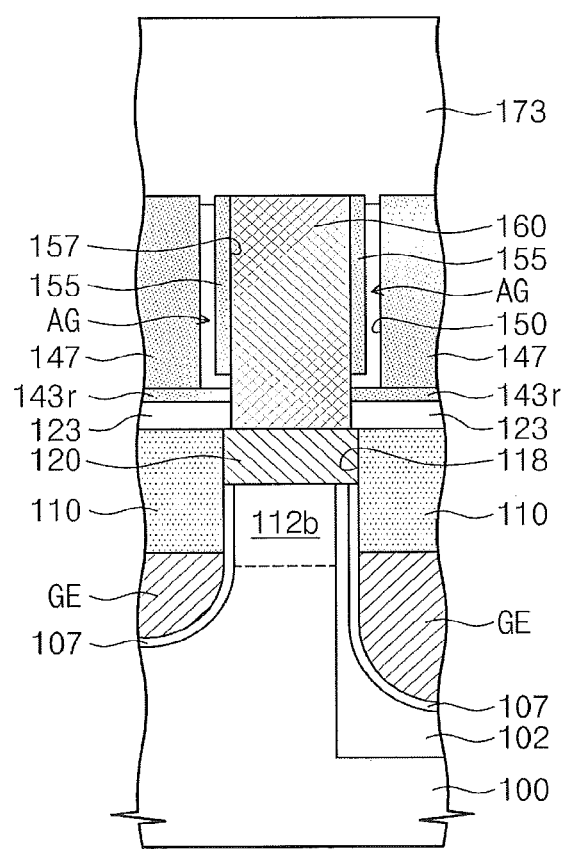
FIG. 1D is a cross-sectional view taken along a line of FIG. 1A.

FIG. 1A is a plan view illustrating a semiconductor device according to some embodiments of the inventive concept. FIGS. 1B, 1C, 1D, and 1E are cross-sectional views taken along lines I-I', and IV-IV' of FIG. 1A, respectively. FIG. 1F is an enlarged view of a spacer-structure including an air gap illustrated in FIG. 1A.

Referring to FIGS. 1A to 1E, a device isolation pattern 102 may be disposed on a semiconductor substrate 100 (hereinafter, referred to as "a substrate") to define active portions ACT. Each of the active portions ACT may have an isolated shape. In a plan view, the active portions ACT may correspond to portions of the substrate 100 surrounded by the device isolation pattern 102, respectively. The substrate 100 may include a semiconductor material. For example, the substrate 100 may be a silicon substrate, a germanium substrate, or a silicon-germanium substrate. The device isolation pattern 102 may include an oxide (e.g., silicon oxide), a nitride (e.g. silicon nitride), and/or an oxynitride (e.g., silicon oxynitride).

Figure 4A:
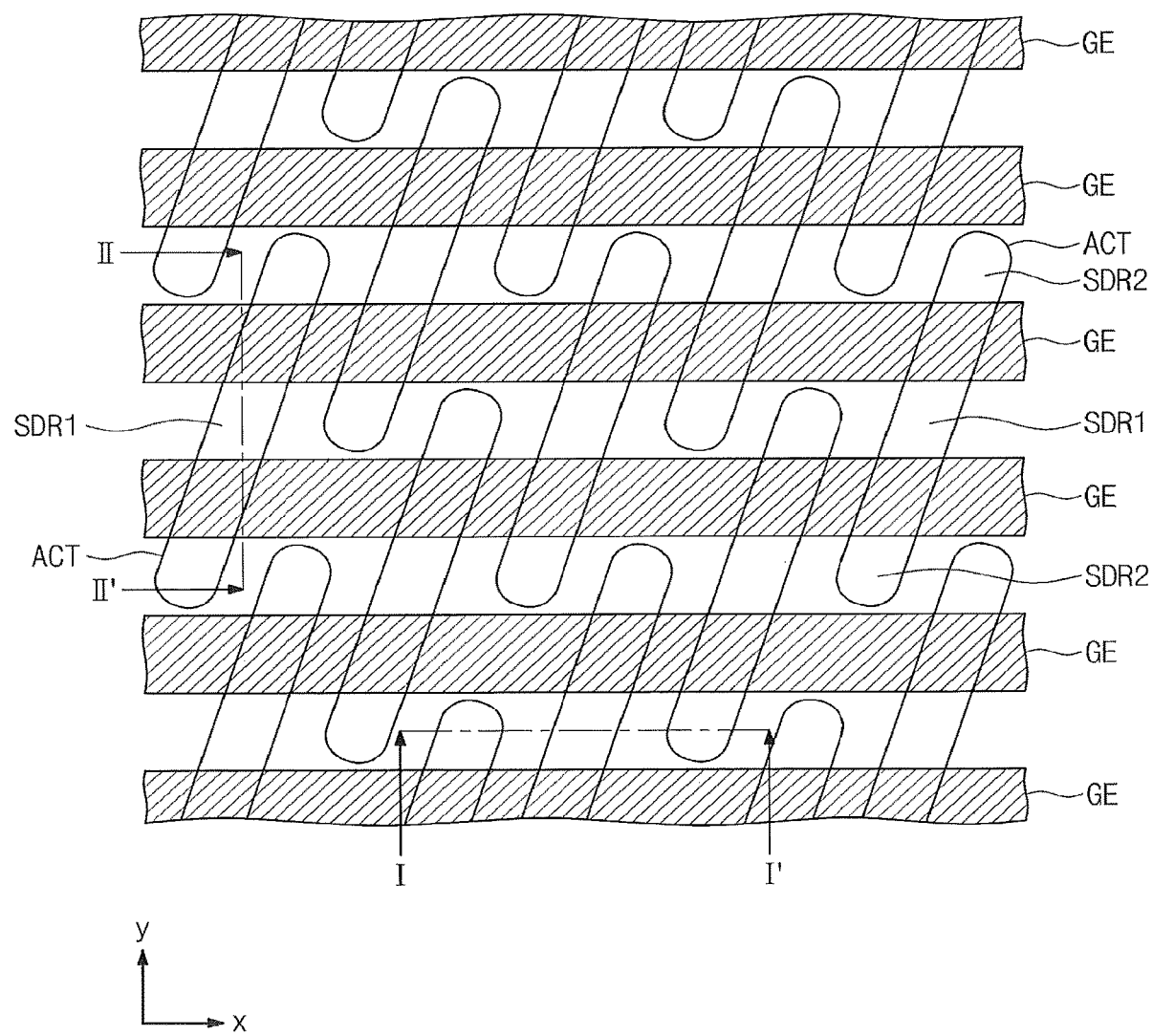

Arrangement of the active portions ACT and gate electrodes GE in a plan view will be described with reference to FIG. 4A in more detail. FIG. 4A is a plan view showing the active portions ACT and the gate electrodes GE. Referring to FIGS. 1A to 1E and 4A, the active portions ACT may be arranged along rows and columns in a plan view. The rows may be parallel to an x-axis direction of FIG. 1A, and the columns may be parallel to a y-axis direction of FIG. 1A. In some embodiments, first, second, and third rows may be adjacent to each other. Portions of the active portions ACT constituting the first row may be disposed between the active portions ACT constituting the second row, respectively. Portions of the active portions ACT constituting the third row may also be disposed between the active portions ACT constituting the second row, respectively. Here, the active portions ACT constituting the first, second, and third rows are spaced apart from each other. Each of the active portions ACT may have a rectangular shape extending in one direction in a plan view. A long axis of the active portion ACT may be non-perpendicular and non-parallel to the x-axis direction.

The gate electrodes GE cross the active portions ACT. The gate electrodes GE may be respectively disposed in recess regions 105, which are formed in the device isolation pattern 102 and the active portions ACT. A pair of the recess regions ACT may cross each of the active portions ACT. Thus, a pair of the gate electrodes GE may cross each of the active portions ACT. The gate electrodes GE may extend in the x-axis direction. Thus, the long axis of each of the active portions ACT may be non-perpendicular and non-parallel to the gate electrode GE in a plan view. The gate electrode GE is formed of a conductive material. For example, the gate electrode GE may include at least one of a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide).

A gate dielectric layer 107 may be disposed between each of the gate electrodes GE and an inner surface of each of the recess regions 105. The gate dielectric layer 107 may include at least one of a thermal oxide, silicon nitride, silicon oxynitride, and a high-k dielectric material.

Figure 1E:
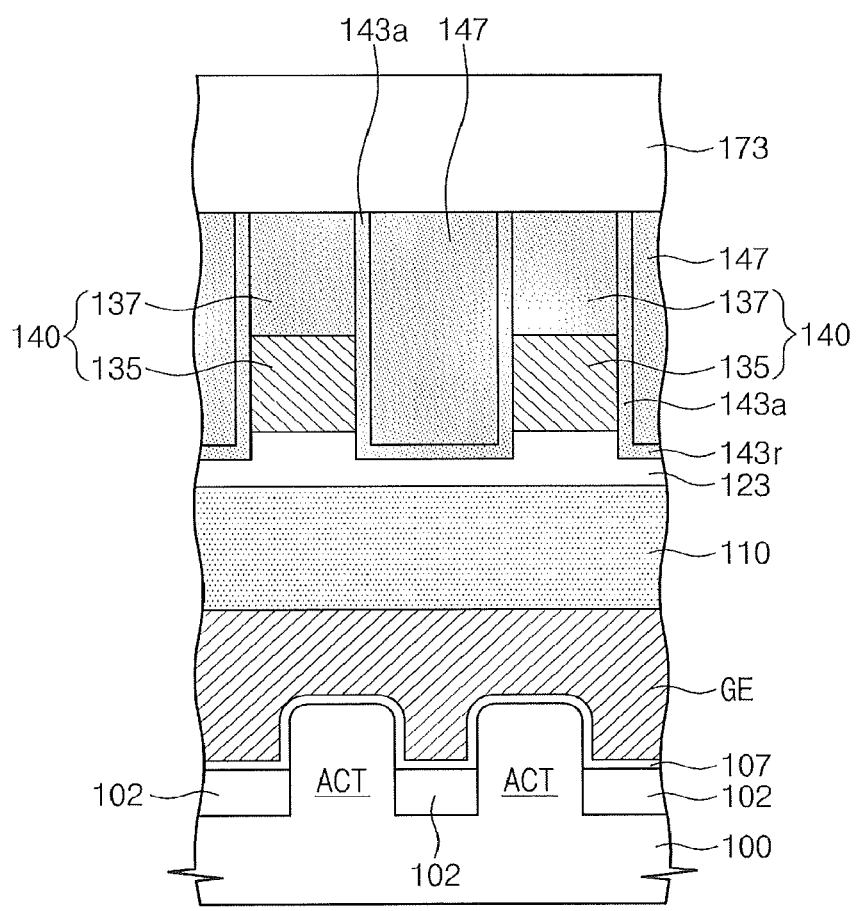
FIG. 1E is a cross-sectional view taken along a line IV-IV' of FIG. 1A.
Figure 1F:
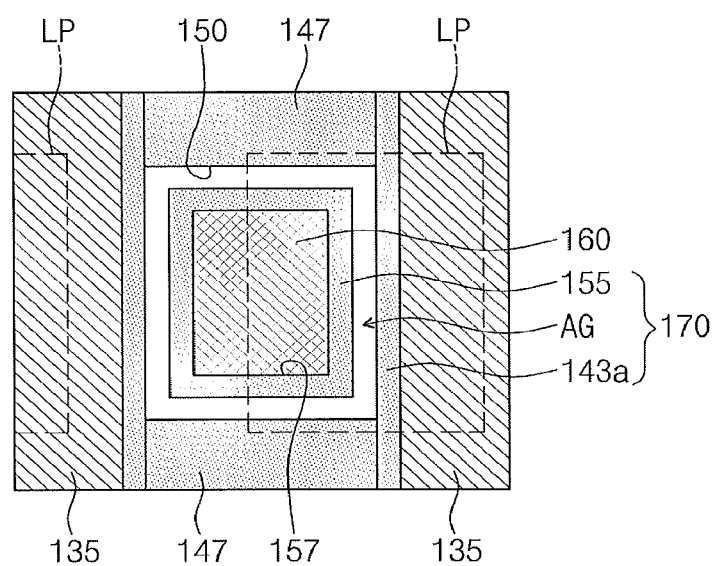
FIG. 1F is an enlarged view of a spacer-structure including an air gap illustrated in FIG. 1A.

As illustrated in FIG. 1E, a bottom surface of the recess region 105 may include a first bottom portion defined by a recessed portion of the active portion ACT and a second bottom portion defined by a recessed portion of the device isolation pattern 102. Here, the second bottom portion may be lower than the first bottom portion. Thus, the gate electrode GE may cover a top surface and both sidewalls of the recessed portion of the active portion ACT. In other words, a channel region under the gate electrode GE may be defined at the top surface and both sidewalls of the recessed portion of the active portions ACT. As a result, the channel region may have a three-dimensional structure, so that a channel width of the channel region may increase in a limited area.

A first doped region 112a may be disposed in each of the active portions ACT between the pair of gate electrodes GE, and a pair of second doped regions 112b may be disposed in both edge regions of each of the active regions ACT, respectively. The pair of gate electrodes GE may be disposed between the pair of second doped regions 112b in a plan view. A selection component may include each of the gate electrodes GE, and the first doped region 112a and the second doped region 112b adjacent thereto. In other words, the selection component may be a field effect transistor. Thus, a pair of the selection components may be formed in each of the active portions ACT. The pair of the selection components may share the first doped region 112a. The gate electrode GE is disposed in the recess region 105, so that a channel length of the channel region under the gate electrode GE may increase in a limited area. Thus, it is possible to reduce or minimize "short channel effect."

As illustrated in FIGS. 1C, 1D, and 1E, a top surface of each of the gate electrodes GE may be lower than a top surface of the active portion ACT. A gate capping insulating pattern 110 may be disposed on each of the gate electrodes GE. The gate capping insulating pattern 110 may have a linear shape extending in a longitudinal direction of the gate electrode GE and cover an entire top surface of the gate electrode GE. The gate capping insulating pattern 110 may fill the recess region 105 on the gate electrode GE. Additionally, the gate capping insulating pattern 110 may protrude higher than the top surface of the active portion ACT.

A base conductive pad 120 may be disposed on each of the second doped regions 112b. The base conductive pad 120 may be disposed between the protruding portions of a pair of the gate capping insulating patterns 110 adjacent to each other. The base conductive pads 120 are spaced apart from each other. The base conductive pads 120 may be connected to the second doped regions 112b, respectively. The base conductive pads 120 may include at least one of a doped semiconductor material (e.g., doped silicon), a conductive metal nitride (e.g., titanium nitride, tantalum nitride, and/or tungsten nitride), a metal (e.g., tungsten, titanium, and/or tantalum), and a metal-semiconductor compound (e.g., a metal silicide). If the base conductive pads 120 include the doped semiconductor material, the doped semiconductor material of the base conductive pads 120 may be doped with dopants of the same conductivity type as the second doped regions 112b.

Lower insulating fences 117 may be disposed between the protruding portions of a pair of the gate capping insulating patterns 110 adjacent to each other. Some of the base conductive pads 120 may be spaced apart from each other by the lower insulating fences 117. Top surfaces of the base conductive pads 120 may be substantially coplanar with top surface of the lower insulating fences 117. A first interlayer insulating layer 123 may be disposed on the substrate 100 having the base conductive pads 120 and the lower insulating fences 117. The first interlayer insulating layer 123 may include an oxide (e.g., silicon oxide).

Wire-plugs 130 may be disposed in wire-contact holes 125 penetrating the first interlayer insulating layer 123, respectively. The wire-plugs 130 may be connected to the first doped regions 112a, respectively. An insulating spacer 127 may be disposed between the wire-plug 130 and an inner sidewall of the wire-contact hole 125. In some embodiments, a portion of the inner sidewall of the wire-contact hole 125 may consist of a sidewall of the base conductive pad 120 adjacent to the wire-plug 130. Thus, the insulating spacer 127 may be disposed between the wire-plug 130 and the base conductive pad 120 adjacent thereto. The wire-plugs 130 may include at least one of a doped semiconductor material (e.g., doped silicon), a conductive metal nitride (e.g., titanium nitride, tantalum nitride, and/or tungsten nitride), a metal (e.g., tungsten, titanium, and/or tantalum), and a metal-semiconductor compound (e.g., a metal silicide). If the wire-plugs 130 include the doped semiconductor material, the doped semiconductor material of the wire-plugs 130 may be doped with dopants of the same conductivity type as the first doped regions 112a.

Figure 8A:
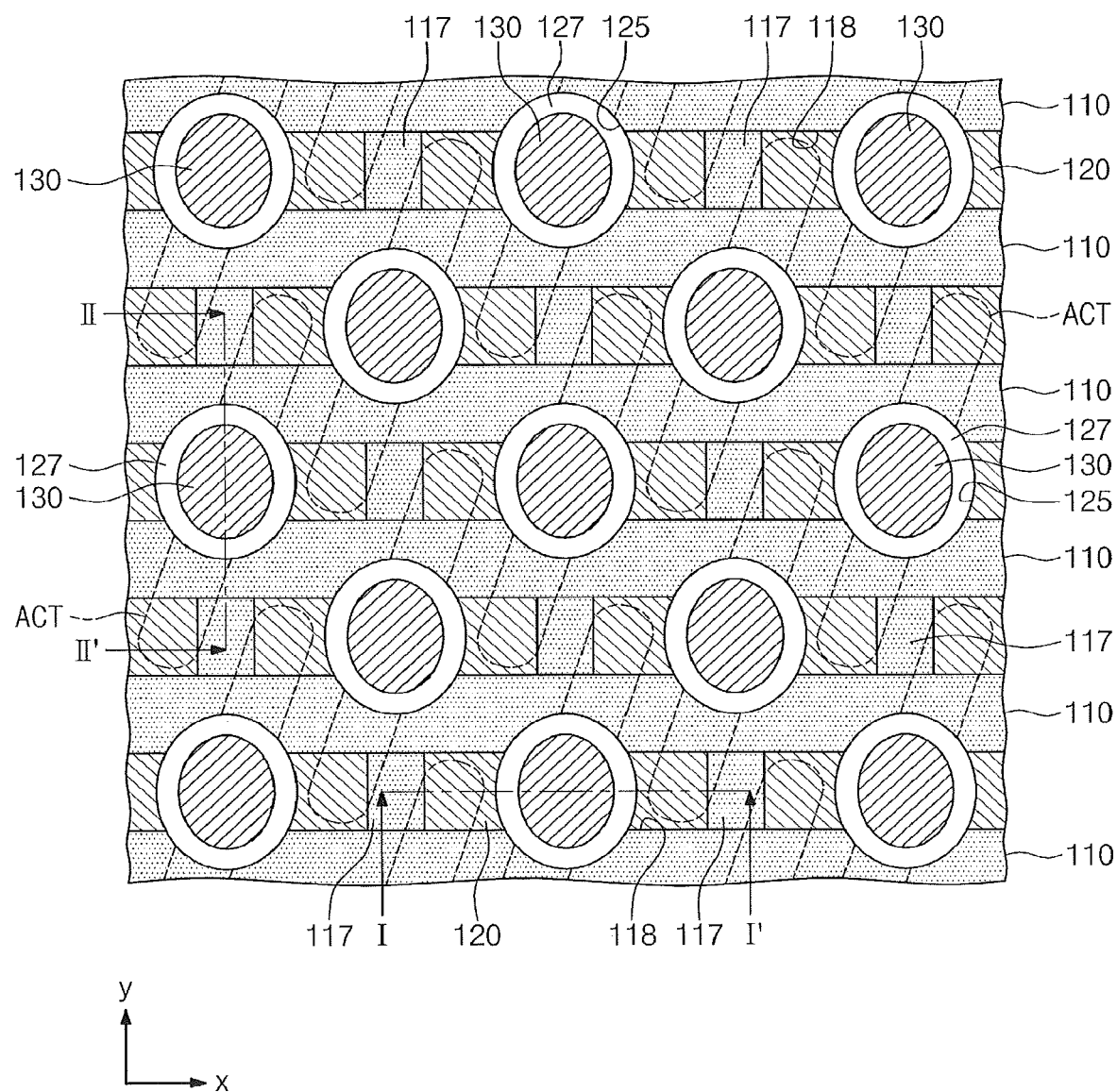

Relation of positions of the lower insulating fences 117, the base conductive pads 120, and the wire-plugs 130 in a plan view will be described with reference to FIG. 8A in more detail. FIG. 8A is a plan view showing the lower insulating fences 117, the base conductive pads 120, and the wire-plugs 130. Referring to FIGS. 1A to 1E and 8A, the lower insulating fences 117, the base conductive pads 120, and the wire-plugs 130 may be disposed between a pair of the gate capping insulating patterns 110 adjacent to each other in a plan view. The lower insulating fences 117 may be arranged in the x-axis direction. A pair of the base conductive pads 120 may be disposed between the pair of the gate capping insulating patterns 110 and between a pair of the lower insulating fences 117 adjacent to each other. Each of the wire-plugs 130 may be disposed between the pair of the base conductive pads 120. The insulating spacer 127 may be disposed between the wire-plug 127 and the pair of the base conductive pads 120 adjacent to the wire-plug 127.

Referring to FIGS. 1A to 1F, line patterns 140 may be disposed on the first interlayer insulating layer 123. The line patterns 140 may cross over the gate capping insulating pattern 110 and the gate electrodes GE. As illustrated in FIG. 1A, the line patterns 140 may extend in the y-axis direction. Each of the line patterns 140 may include a conductive wire 135 and a hard mask pattern 137, which are sequentially stacked. Each of the conductive wires 135 may be connected to the wire-plugs 130 arranged in the y-axis direction. The conductive wires 135 may be electrically connected to the first doped region 112a through the wire-plugs 130. In some embodiments, a width of a conductive wire 135 may be less than a width of a wire-plug 130 in the x-axis direction. The conductive wire 135 may include at least one of a metal (e.g., tungsten, titanium, and/or tantalum) and a conductive metal nitride (e.g., titanium nitride, tantalum nitride, and/or tungsten nitride). The hard mask pattern 137 is formed of an insulating material. For example, the hard mask pattern 137 may include a nitride (e.g., silicon nitride) and/or an oxynitride (e.g., silicon oxynitride).

Contact plugs 160 are disposed between a pair of the line patterns 140 adjacent to each other. The contact plugs 160 are spaced apart from each other. A spacer structure 170 including an air gap AG is disposed between each of the contact plugs 160 and the pair of the line patterns 140 adjacent to each other. In some embodiments, a landing pad LP may extend from a top end of the contact plug 160 to cover a first part of the air gap AG. Here, a second part of the air gap AG is not covered by the landing pad LP.

As illustrated in FIG. 1B, a height of the first part of the air gap AG may be different from a height of the second part of the air gap AG. In other words, the first part and the second part of the air gap AG may be asymmetric with respect to the contact plug 160. The height of the first part of the air gap AG covered by the landing pad LP may be greater than the height of the second part of the air gap AG not covered by the landing pad LP. In some embodiments, a top end of the first part of the air gap AG may be closed by the landing pad LP. In other words, the top end of the first part of the air gap AG may be formed of the landing pad LP. A top end of the second part of the air gap AG may be closed by a second interlayer insulating layer 173. In other words, the top end of the second part of the air gap AG may be formed of the second interlayer insulating layer 173.

The spacer structure 170 may further include a first protecting spacer 143a and a second protecting spacer 155. The first protecting spacer 143a may be disposed between the contact plug 160 and a sidewall of the line pattern 140, and the second protecting spacer 155 may be disposed between the contact plug 160 and the first protecting spacer 143a. Here, the air gap AG may be disposed between the first and second protecting spacers 143a and 155. The first protecting spacer 143a may protect the sidewall of the line pattern 140, particularly, a sidewall of the conductive wire 135. The second protecting spacer 155 may protect a sidewall of the contact plug 160.

In some embodiments, the first protecting spacer 143a may have an L-shaped cross section. A bottom end of the second protecting spacer 155 may be vertically spaced apart from a bottom portion of the first protecting spacer 143a, which laterally protrudes. Thus, the air gap AG may have an L-shaped cross section.

As illustrated in FIGS. 1A and 1F, the air gap AG may have a closed loop-shape surrounding the contact plug 160 in a plan view. The second protecting spacer 155 may also have a closed loop-shape surrounding the contact plug 160. In some embodiments, the first protecting spacer 143a may have a line-shape extending along the sidewall of the line pattern 140. In more detail, upper insulating fences 147 arranged in the y-axis direction may be disposed between the pair of the line patterns 140 adjacent to each other. A guide hole 150 may be defined between a pair of the upper insulating fences 147 and between the pair of the line patterns 140 adjacent to each other. The first protecting spacer 143a having the line-shape may be disposed between the upper insulating fence 147 and the line pattern 140. Thus, the guide hole 150 may be surrounded by the pair of the upper insulating fences 147 and a pair of the first protecting layers 143a disposed between the pair of the line patterns 140.

In a plan view, the contact plug 160 may be disposed in the guide hole 150. The second protecting spacer 155 may be disposed between the contact plug 160 and an inner sidewall of the guide hole 150. The air gap AG may be disposed between the second protecting spacer 155 and the inner sidewall of the guide hole 150. The guide hole 150 may have a quadrangular shape in a plan view. Due to the shape of the guide hole 150, a bottom surface of the contact plug 160 may have a quadrangular shape.

As illustrated in FIGS. 1D and 1E, an extending portion 143r of the first protecting spacer 143a may be disposed between the upper insulating fence 147 and the first interlayer insulating layer 123.

In other embodiments, the first protecting spacer 143a may have a shape surrounding the sidewall of the contact plug 160. In this case, the first protecting spacer 143a may be disposed between the contact plug 160 and the inner sidewall of the guide hole 150.

The first protecting spacer 143a may be formed of an insulating material preventing the conductive wire 135 from being oxidized. Additionally, the first protecting spacer 143a may be formed of an insulating material preventing metal atoms in the conductive wire 135 from diffusing. For example, the first protecting spacer 143a may include a nitride (e.g., silicon nitride) and/or an oxynitride (e.g., silicon oxynitride). The second protecting spacer 155 may be formed of an insulating material preventing the contact plug 160 being oxidized. For example, the second protecting spacer 155 may include a nitride (e.g., silicon nitride) and/or an oxynitride (e.g., silicon oxynitride).

As illustrated in FIGS. 1A, 1B, and 1F the second protecting layer 155 having the closed loop-shape in a plan view may be defined a contact hole 157. The contact plug 160 may be disposed in the contact hole 157. The contact hole 157 may extend downward to penetrate the first interlayer insulating layer 123. Thus, the contact plug 160 may also extend downward to be connected to the base conductive pad 120.

The contact plug 160 may be disposed in the contact hole 157, and the landing pad LP may be disposed outside the contact hole 157. In some embodiments, the landing pad LP may extend to cover a portion of a top surface of the line pattern 140 (i.e., a top surface of the hard mask pattern 137) adjacent to one side of the contact plug 160. The portion of the top surface of the hard mask pattern 137 covered by the landing pad LP may be higher than another portion of the top surface of the hard mask pattern 137 not covered by the landing pad LP. The landing pad LP may be connected to a portion of a top surface of the contact plug 160 without an interface. In other words, the landing pad LP and the contact plug 160 may constitute one body. However, the inventive concept is not limited thereto. In other embodiments, an interface may be formed between the landing pad LP and the contact plug 160. The contact plug 160 and the landing pad LP are formed of a conductive material. For example, the contact plug 160 and the landing pad LP may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide).

As described above, the second interlayer insulating layer 173 may be disposed on the second part of the air gap AG not covered by the landing pad LP. As illustrated in FIG. 1B, the second interlayer insulating layer 173 may fill a space between the landing pads LP and cover top surfaces of the landing pads LP. Alternatively, the second interlayer insulating layer 173 may fill the space between the landing pads LP and have a top surface substantially coplanar with the top surfaces of the landing pads LP.

Data storage parts DSP may be disposed on the second interlayer insulating layer 173. The data storage parts DSP may be electrically connected to the landing pads LP, respectively. Each of the data storage parts DSP may be electrically connected to the landing pad LP through a via-plug 175 penetrating the second interlayer insulating layer 173. Thus, each of the data storage parts DSP may be electrically connected to each of the second doped regions 112b through the landing pad LP, the contact plug 160, and the base conductive pad 120. In other words, the conductive wire 135 and the data storage part DSP may be electrically connected to the first doped region 112a and the second doped region 112b of each of the selection components, respectively. Each of the selection components and the data storage part DSP connected thereto may constitute one memory cell. Thus, the semiconductor device according to embodiments of the inventive concept may be realized as a semiconductor memory device. The data storage part DSP may be realized as one of various shapes storing logic data.

According to the semiconductor device described above, the contact plug 160 is disposed between the pair of the line patterns 140 adjacent to each other, and the spacer structure 170 including the air gap AG is disposed between the contact plug 160 and the line patterns 140. The air gap AG has a dielectric constant lower than that of silicon oxide. Thus, a parasitic capacitance between the contact plug 160 and the line pattern 140 is reduced. As a result, a semiconductor device with improved reliability may be realized. Additionally, because the parasitic capacitance is reduced, a highly integrated semiconductor device may be realized.

Moreover, the first part of the air gap AG is covered by the landing pad LP, but the second part of the air gap AG is not covered by the landing pad LP. Thus, the air gap AG may be easily formed.

Furthermore, the air gap AG may be disposed between the first and second protecting spacers 143a and 155. In other words, the first protecting spacer 143a protects the sidewall of the line pattern 140 (i.e., the sidewall of the conductive wire 135), and the second protecting spacer 155 protects the contact plug 160. Thus, the air gap AG may be easily formed without damage of the conductive wire 135 and the contact plug 160.

Figure 2:
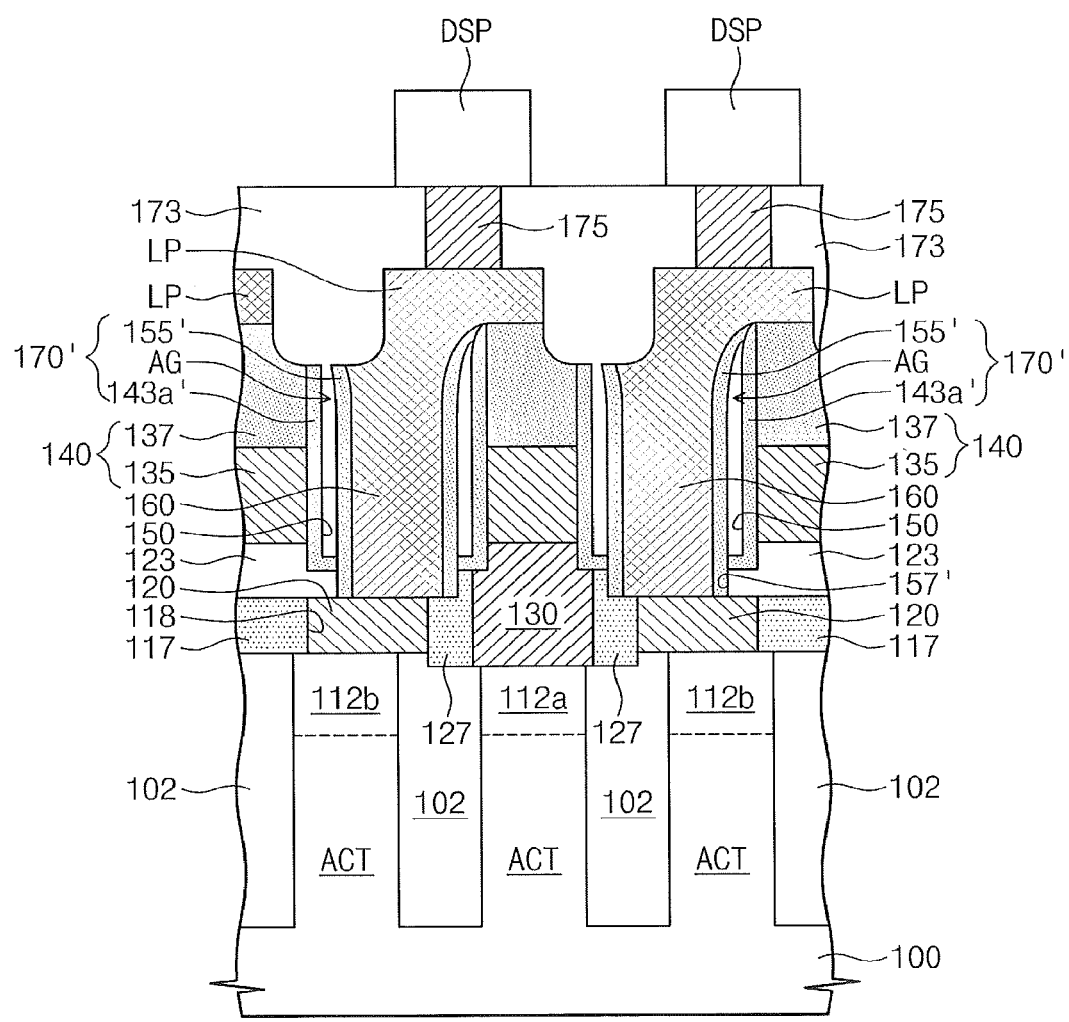
FIG. 2 is a cross-sectional view illustrating a modified example of a semiconductor device according to some embodiments of the inventive concept.

FIG. 2 is a cross-sectional view illustrating a modified example of a semiconductor device according to some embodiments of the inventive concept.

Referring to FIG. 2, according to the modified example, top ends of first and second protecting spacers 143a' and 155' disposed under the landing pad LP may be in contact with each other. Thus, a top end of the first part of the air gap AG under the landing pad LP may be closed by the top ends of the first and second protecting spacers 143a' and 155', which are in contact with each other. In this case, a lower portion of the second protecting spacer 155' may be in contact with a bottom end of the first protecting spacer 143a'. Thus, a bottom end of the air gap AG may be closed by the first and second protecting spacers 143a' and 155'. The second protecting spacer 155' may extend downward to be disposed between the contact plug 160 and a sidewall of a part of a contact hole 157' penetrating the first interlayer insulating layer 123. The first and second spacers 143a' and 144' and the air gap AG may constitute a spacer structure 170'.

As described above, the data storage part DSP may be realized as one of various shapes. This will be described with reference to the drawings.

Figure 3A:
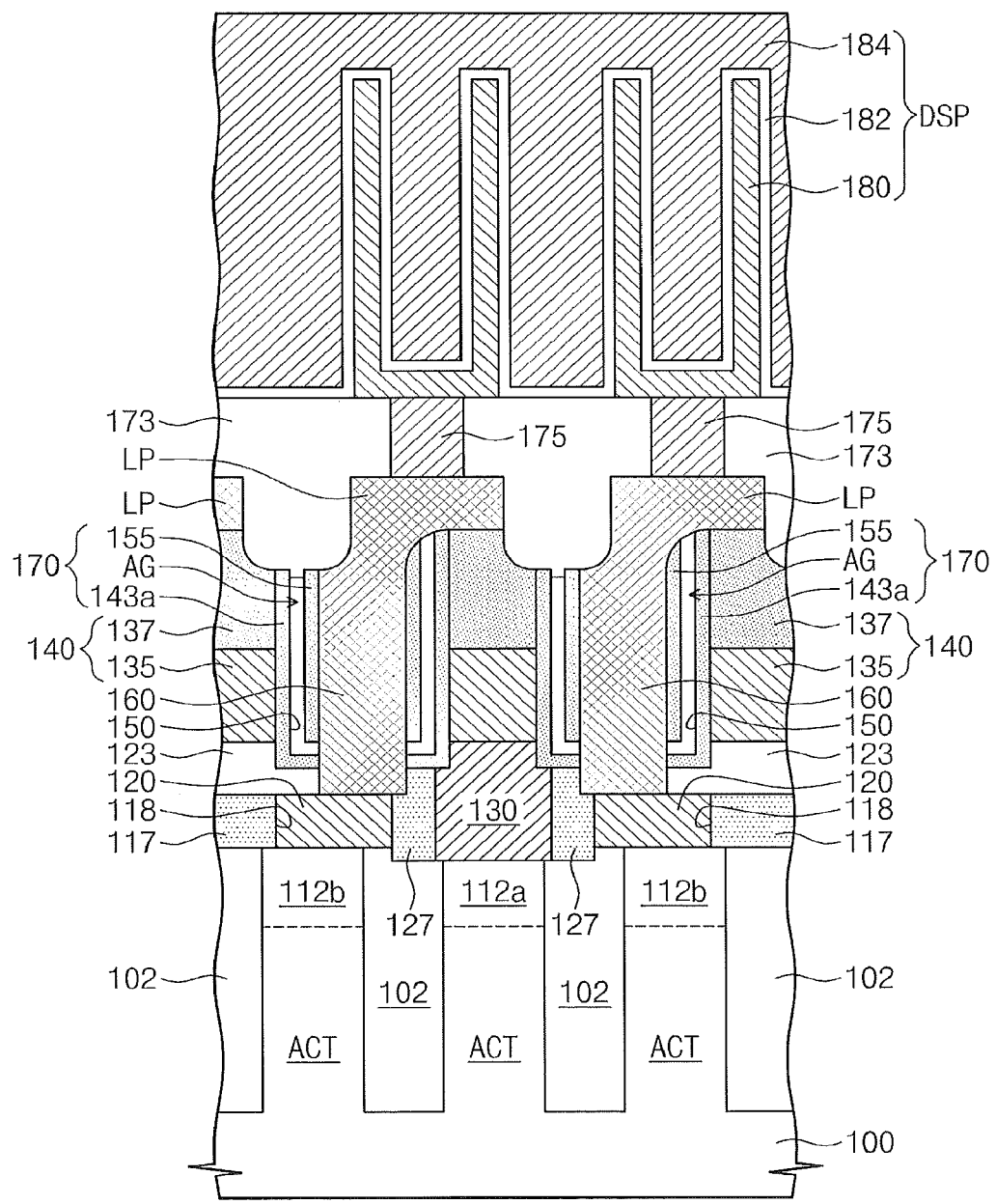
FIG. 3A is a cross-sectional view illustrating an example of a data storage part of a semiconductor device according to embodiments of the inventive concept.

FIG. 3A is a cross-sectional view illustrating an example of a data storage part of a semiconductor device according to embodiments of the inventive concept.

Referring to FIG. 3A, a data storage part DSP may include a lower electrode 180, an upper electrode 184, and a capacitor dielectric layer 182 disposed between the lower and upper electrodes 180 and 184. In other words, the data storage part DSP may be realized as a capacitor. The lower electrode 180 may be electrically connected to each of the landing pads LP through each of the via-plugs 175. The lower electrode 180 may have a cylindrical shape or a hollow cylindrical shape. The upper electrode 184 may cover surfaces of a plurality of the lower electrodes 180. The capacitor dielectric layer 182 may be disposed between the upper electrode 184 and the lower electrodes 180. Each of the lower electrode 180 and the upper electrode 184 may include at least one of a doped semiconductor material (e.g., doped silicon), a conductive metal nitride (e.g., titanium nitride, tantalum nitride, and/or tungsten nitride), a metal (e.g., ruthenium, iridium, titanium, and/or tantalum), and a conductive metal oxide (e.g., iridium oxide). The upper electrode 184 may be formed of the same material as the lower electrode 180. Alternatively, the upper electrode 184 may include a conductive material different from that of the lower electrode 180. The capacitor dielectric layer 182 may include at least one of an oxide (e.g., silicon oxide), a nitride (e.g., silicon nitride), an oxynitride (e.g., silicon oxynitride), a high-k dielectric material, and/or a ferroelectric material.

As described above, if the data storage part DSP is a capacitor, the conductive wire 135 may be a bit line.

Figure 3B:
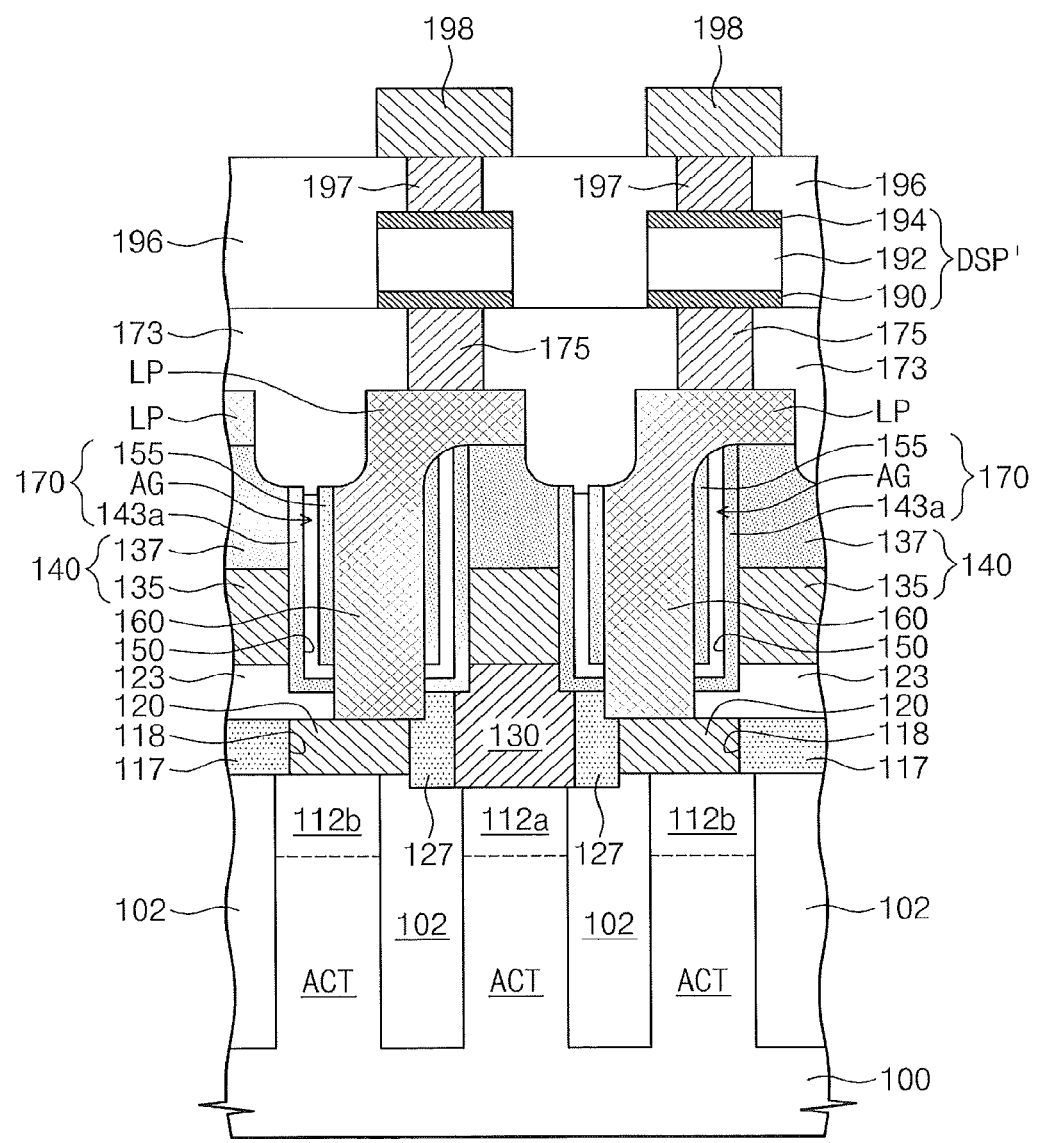
FIG. 3B is a cross-sectional view illustrating another example of a data storage part of a semiconductor device according to embodiments of the inventive concept.

FIG. 3B is a cross-sectional view illustrating another example of a data storage part of a semiconductor device according to embodiments of the inventive concept.

Referring to FIG. 3B, a data storage part DSP' according to the present example may include a lower electrode 190, a variable resistor 192, and an upper electrode 194. The variable resistor 192 may be converted into one of a plurality of states respectively having resistance values different from each other by a program operation. The lower and upper electrodes 190 and 194 may include a conductive metal nitride (e.g., titanium nitride, tantalum nitride, and/or tungsten nitride).

In some embodiments, the variable resistor 192 may include a magnetic tunnel junction pattern. The magnetic tunnel junction pattern may include a reference magnetic layer, a free magnetic layer, and a tunnel barrier disposed between the reference and free magnetic layers. The reference magnetic layer may have a fixed magnetization direction in one direction. The free magnetic layer may have a magnetization direction configured to be changeable to a direction parallel or anti-parallel to the fixed magnetization direction of the reference magnetic layer. Each of the reference and free magnetic layers may include a ferromagnetic material. The tunnel barrier may include aluminum oxide and/or magnesium oxide.

In other embodiments, the variable resistor 192 may include a phase change material. The phase change material may be converted into an amorphous state or a crystalline state by a temperature and/or supplying a duration of heat supplied by a program operation. The phase change material in the amorphous state may exhibit a resistivity greater than that of the phase change material in the crystalline state. For example, the phase change material may be formed of a compound including at least one of chalcogenide elements (e.g., tellurium (Te) and selenium (Se)). For example, the phase change material may include Ge—Sb—Te, As—Sb—Te, As—Ge—Sb—Te, Sn—Sb—Te, Ag—In—Sb—Te, In—Sb—Te, a group 5A element-Sb—Te, a group 6A element-Sb—Te, a group 5A element-Sb—Se, and a group 6A element-Sb—Se. If the variable resistor 192 includes the phase change material, the lower electrode 190 may be omitted and the variable resistor 192 may be connected to the via-plug 175. In this case, the via-plug 175 may be used as a heater electrode, and the via-plug 175 may include a conductive metal nitride (e.g., titanium nitride, a tantalum nitride, and/or tungsten nitride).

In still other embodiments, the variable resistor 192 may include a transition metal oxide. An electrical path may be created or lost in the transition metal oxide by a program operation. Both ends of the created electrical path may be connected to the lower electrode 190 and the upper electrode 194, respectively. The data storage part DSP' having the electrical path may exhibit a low resistance as compared with the absence of the electrical path. For example, the transition metal oxide may include at least one of niobium oxide, titanium oxide, nickel oxide, zirconium oxide, vanadium oxide, PCMO((Pr,Ca)MnO$_3$), strontium-titanium oxide, barium-strontium-titanium oxide, strontium-zirconium oxide, barium-zirconium oxide, and barium-strontium-zirconium oxide. If the variable resistor 192 includes the transition metal oxide, the lower and upper electrodes 190 and 194 may include at least one of a conductive metal nitride (e.g., titanium nitride and/or tantalum nitride), a transition metal (e.g., titanium and/or tantalum), and a rare-earth metal (e.g., ruthenium and/or platinum).

Referring to FIG. 3A, a third interlayer insulating layer 196 may cover the data storage parts DSP', and upper via-plugs 197 may penetrate the third interlayer insulating layer 196 so as to be connected to the data storage parts DSP', respectively. The upper wires 198 may be disposed on the third interlayer insulating layer 196. The upper wires 198 may extend to be parallel to the conductive wires 135. The upper wires 198 may be electrically connected to the data storage part DSP' through the upper via-plug 197. As described above, if the data storage part DSP' includes the variable resistor 192, the upper wires 198 may correspond to bit lines, and the conductive wires 135 may correspond to source lines.

FIGS. 4A to 13A are plan views illustrating a method of manufacturing a semiconductor device according to some embodiments of the inventive concept. FIGS. 4B to 13B are cross-sectional views taken along lines I-I' of FIGS. 4A to 13A, respectively. FIGS. 4C to 9C are cross-sectional views taken along lines II-II' of FIGS. 4A to 9A, respectively. FIGS. 10C to 13C are cross-sectional views taken along lines of FIGS. 10A to 13A, respectively.

Figure 4B:
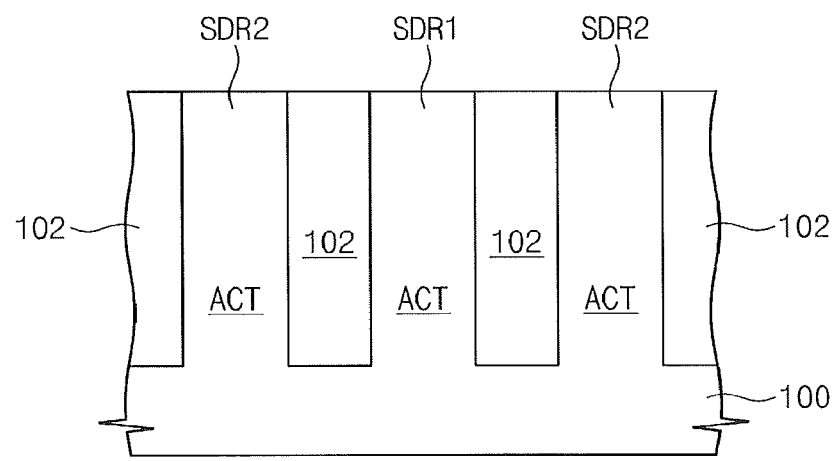
Figure 4C:
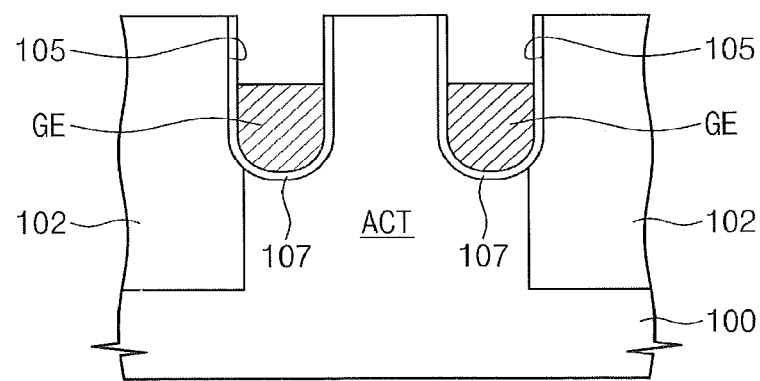

Referring to FIGS. 4A to 4C, a device isolation pattern 102 may be formed on a substrate 100 to define active portions ACT. A device isolation trench may be formed in the substrate 100 and then the device isolation pattern 102 may fill the device isolation trench. In a plan view, the active portions ACT may be arranged as described above.

The active portions ACT and the device isolation pattern 102 may be patterned to form recess regions 105. The recess regions 105 cross the active portions ACT. A pair of the recess regions 105 may cross each of the active portions ACT. As illustrated in FIG. 4A, each of the active portions ACT may be divided into a first source/drain region S/D1 and a pair of second source/drain regions S/D2 by the pair of recess regions 105. The first source/drain region S/D1 may be defined between the pair of the recess regions 105. The pair of second source/drain regions S/D2 may be defined at both edge regions of each of the active portions ACT, respectively.

A gate dielectric layer 107 may be formed on an inner surface of each of the recess regions 105. The gate dielectric layer 107 may be formed by a thermal oxidation process, a chemical vapor deposition (CVD) process, and/or an atomic layer deposition (ALD) process. The gate dielectric layer 107 may also be formed on a top surface of the active portion ACT.

Subsequently, a gate conductive layer may be formed to fill the recess regions 105. The gate conductive layer may be etched to form gate electrodes GE in the recess regions 105, respectively. Top surfaces of the gate electrodes GE may be recessed to be lower than the top surfaces of the active portions ACT. In some embodiments, as illustrated in FIG. 1E, a bottom surface of a part of the recess region 105 in the device isolation pattern 102 may be lower than a bottom surface of another part of the recess region 105 in the active portion ACT. Thus, the gate electrode GE may cover a top surface and both sidewalls of the recessed portion of the active portion ACT.

Figure 5A:
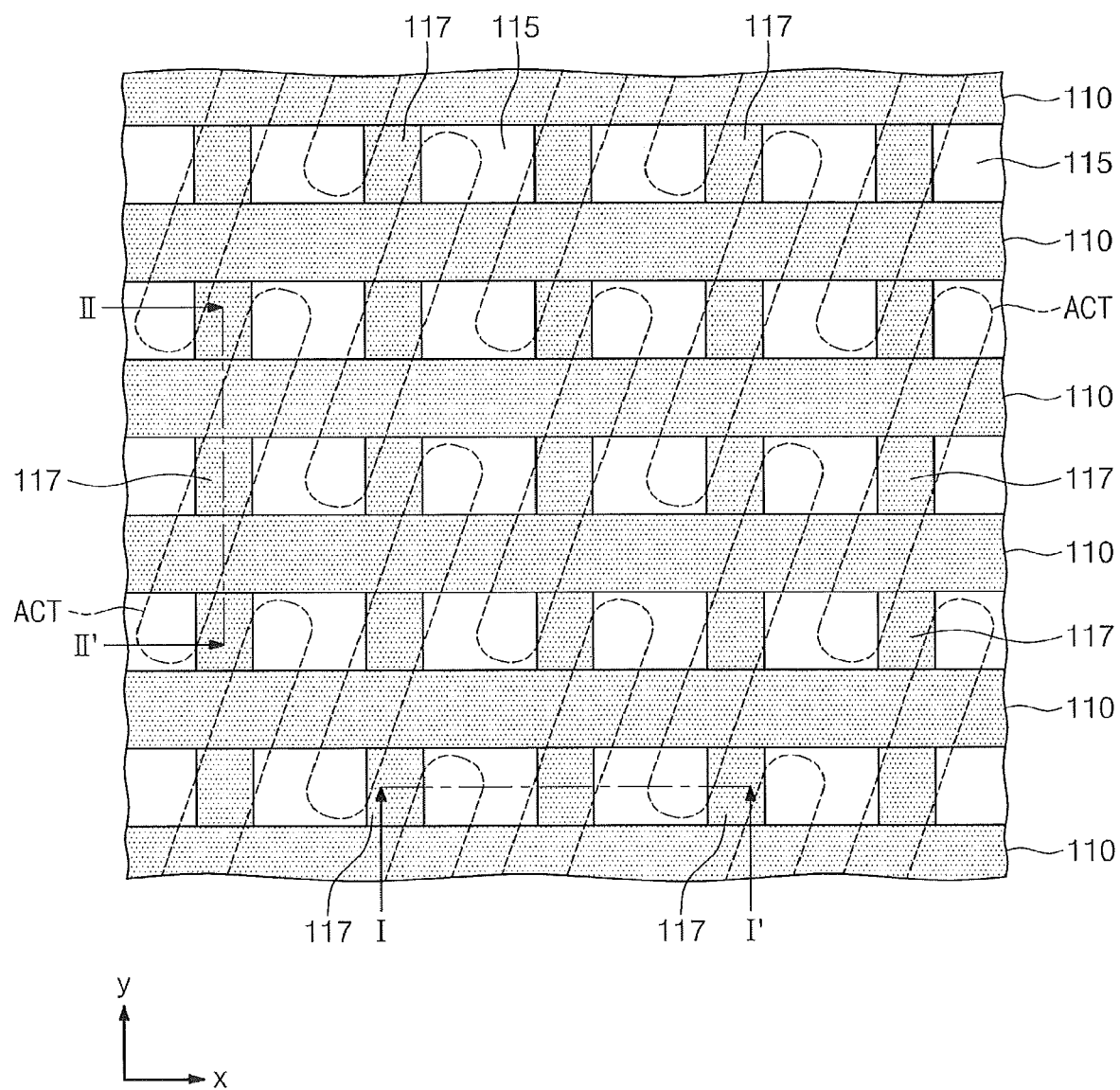
Figure 5B:
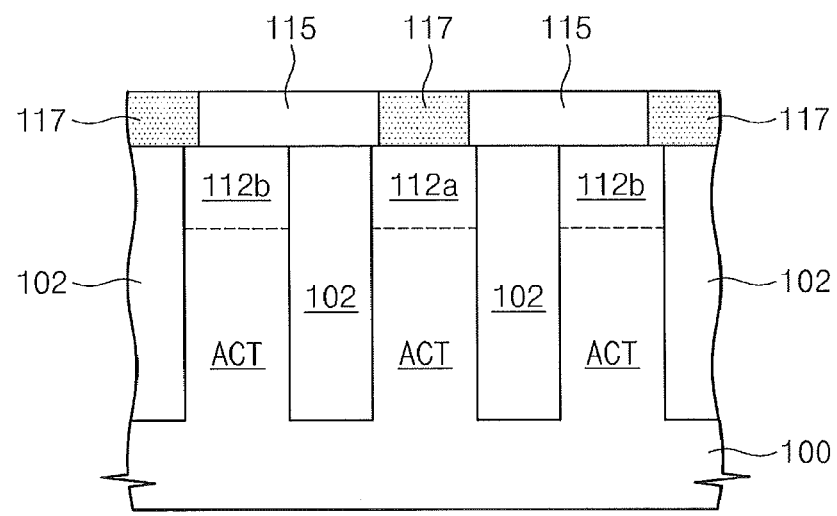
Figure 5C:
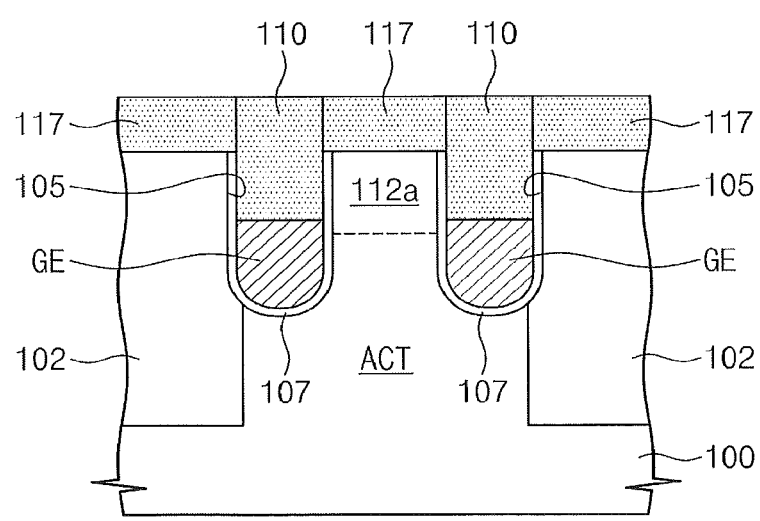

Referring to FIGS. 5A to 5C, a capping insulating layer may be formed on the substrate 100. The capping insulating layer may fill the recess regions 105 on the gate electrodes GE. The capping insulating layer may be patterned to form gate capping insulating patterns 110 on the gate electrodes GE, respectively. The gate capping insulating pattern 110 may fill the recess region 105 on the gate electrode GE and have a protrusion higher than the top surface of the active portion ACT. The gate capping insulating pattern 110 extends in parallel to the gate electrode GE.

In some embodiments, the protrusion of the gate capping insulating pattern 110 may have a width substantially equal to a width of the recess region 105. In other embodiments, the width of the protrusion of the gate capping insulating pattern 110 may be less than the width of the recess region 105. In still other embodiments, the width of the protrusion of the gate capping insulating pattern 110 may be greater than the width of the recess region 105.

Dopants may be injected into the active portions ACT using the gate capping insulating patterns 110 as masks to form first and second doped regions 112a and 112b. The first doped region 112a and the second doped region 112b may be formed the first source/drain region S/D1 and the second source/drain region S/D2 of FIG. 4A, respectively.

A first filling layer may be formed on an entire surface of the substrate 100. And then the first filling layer may be planarized until the gate capping insulating patterns 110 are exposed. Thus, first filling line patterns may be formed. Each of the first filling line patterns may be disposed between the protrusions of the gate capping insulating patterns 110 adjacent to each other. Subsequently, the first filling line patterns may be patterned to form first concave regions and first filling patterns 115. The first filling patterns 115 may be spaced apart from each other by the first concave regions. The first concave regions may be formed between the protrusions of the gate capping insulating patterns 110. A first fence insulating layer filling the first concave regions may be formed on the substrate 100. The first fence insulating layer may be planarized until the first filling patterns 115 are exposed, so that lower insulating fences 117 are formed. The lower insulating fences 117 may fill the first concave regions, respectively.

As illustrated in FIG. 5A, the lower insulating fences 117 may be two-dimensionally arranged along rows and columns in a plan view. Each of the first filling patterns 115 may be disposed between the protrusions of the pair of the gate capping insulating patterns 110 adjacent to each other and between a pair of the lower insulating fences 117 adjacent to each other in the x-axis direction. Each of the first filling patterns 115 may be disposed on at least a portion of each of the second doped regions 112b. Some of the lower insulating fences 117 may be disposed on the first doped regions 112a, respectively, and the others of the lower insulating fences 117 may be disposed on the device isolation pattern 102.

The first filling patterns 115 may be formed of a material having an etch selectivity with respect to the lower insulating fences 117 and the gate gapping insulating patterns 110. For example, the first filling patterns 115 may be formed of silicon oxide, and the lower insulating fences 117 and the gate capping insulating patterns 110 may be formed of silicon nitride and/or silicon oxynitride.

Figure 6A:
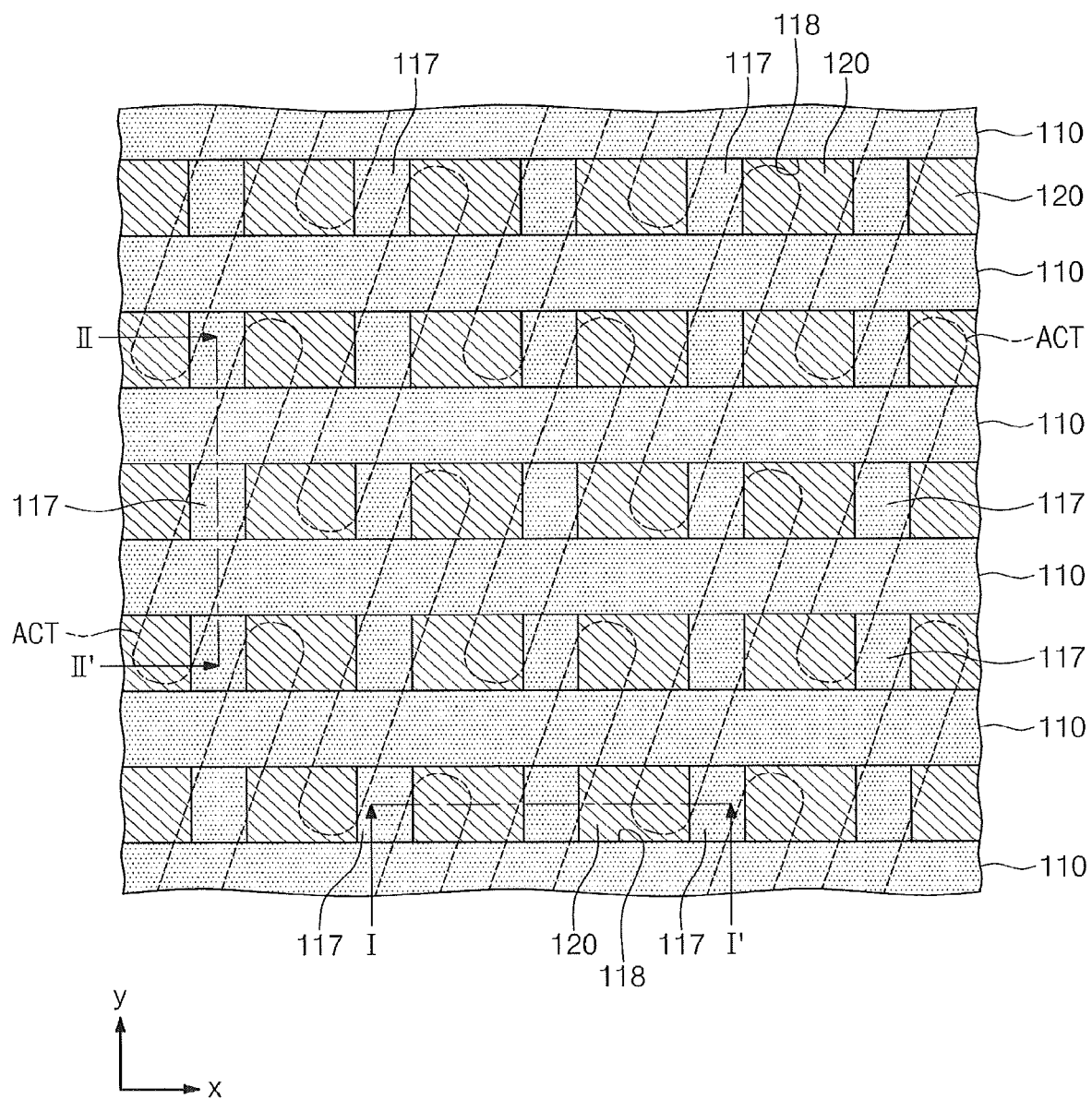
Figure 6B:
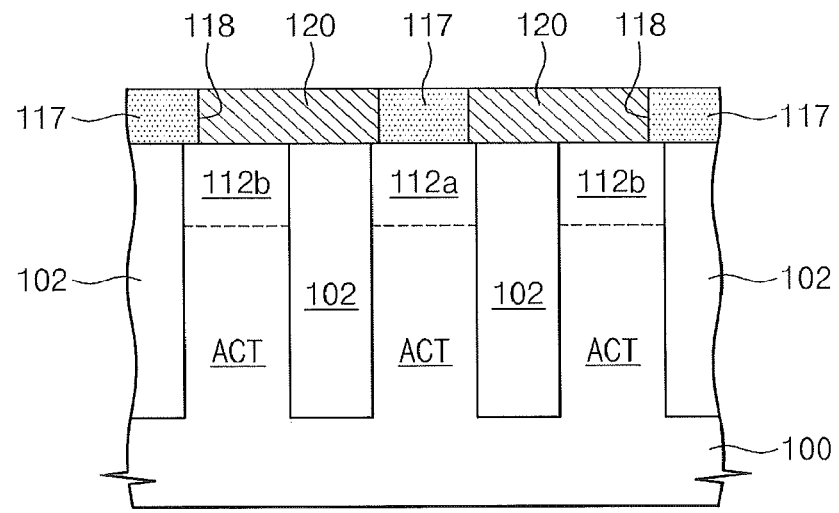
Figure 6C:
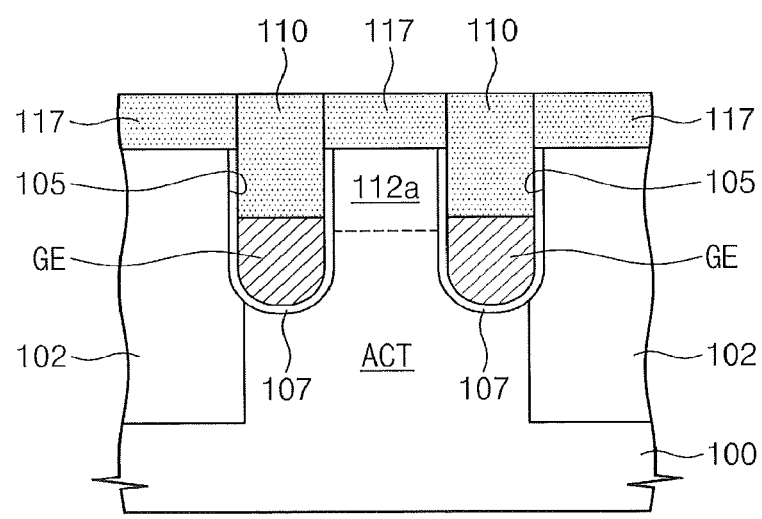

Referring to FIGS. 6A to 6C, the first filling patterns 115 may be removed to form openings 118 exposing the second doped regions 112b, respectively. In some embodiments, each of the openings 118 may also expose a portion of the doped region 112a of a neighboring active portion 112b, which is adjacent to the second doped region 112b.

A first conductive layer may be formed on the substrate 100 to fill the openings 118. The first conductive layer may be planarized until the lower insulating fences 117 and the gate capping insulating patterns 110 are exposed, so that base conductive patterns 120 may be formed. The base conductive patterns 120 may be connected to the second doped regions 112b, respectively. In some embodiments, the base conductive pad 120 may be in contact with an edge of the first doped region 112a adjacent to the second doped region 112b connected to the base conductive pad 120.

Figure 7A:
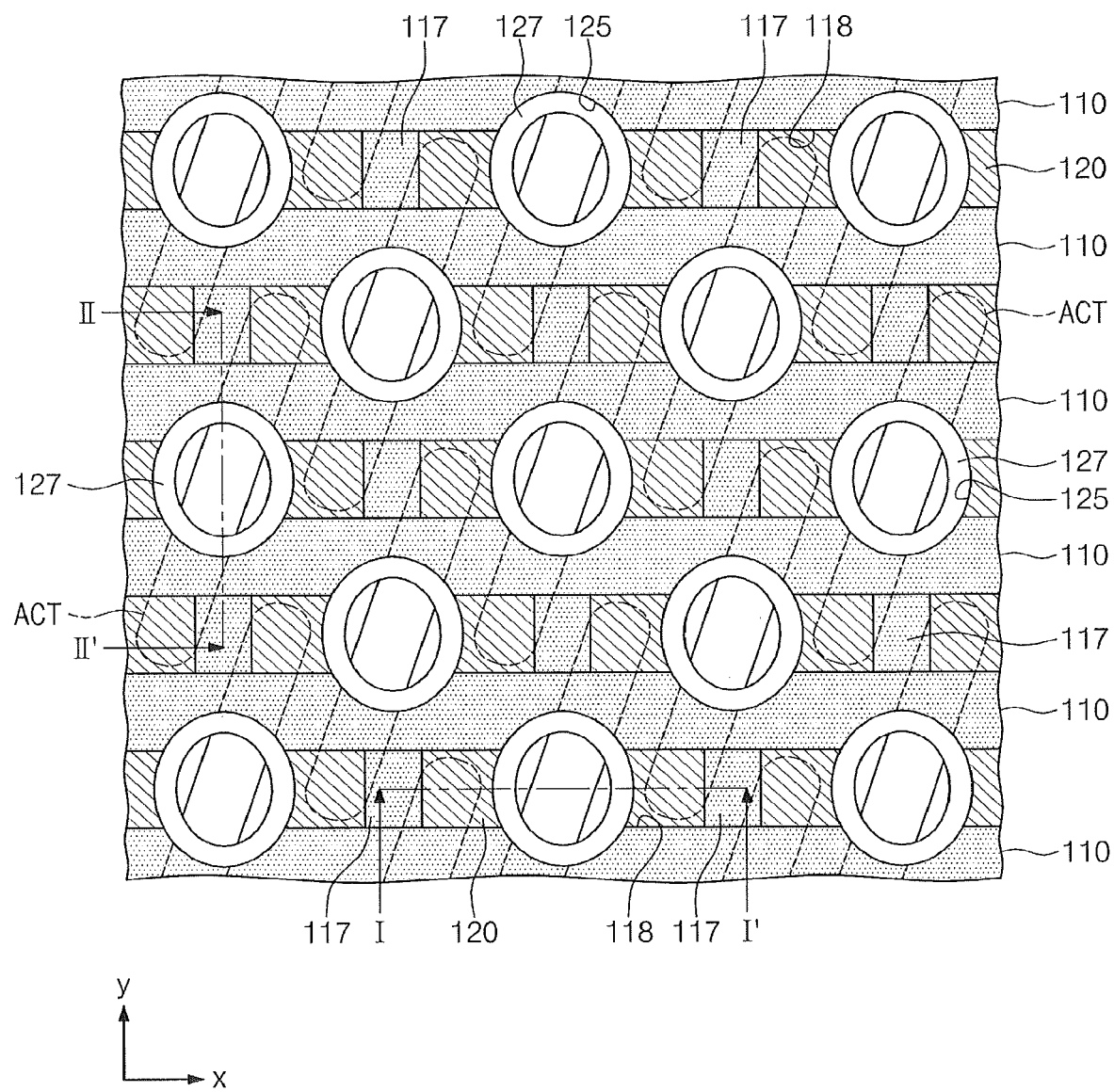
Figure 7B:
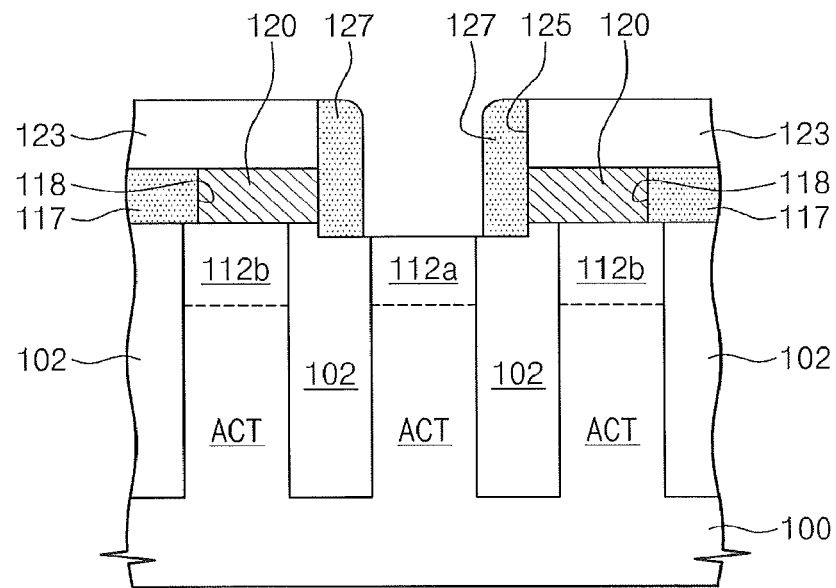
Figure 7C:
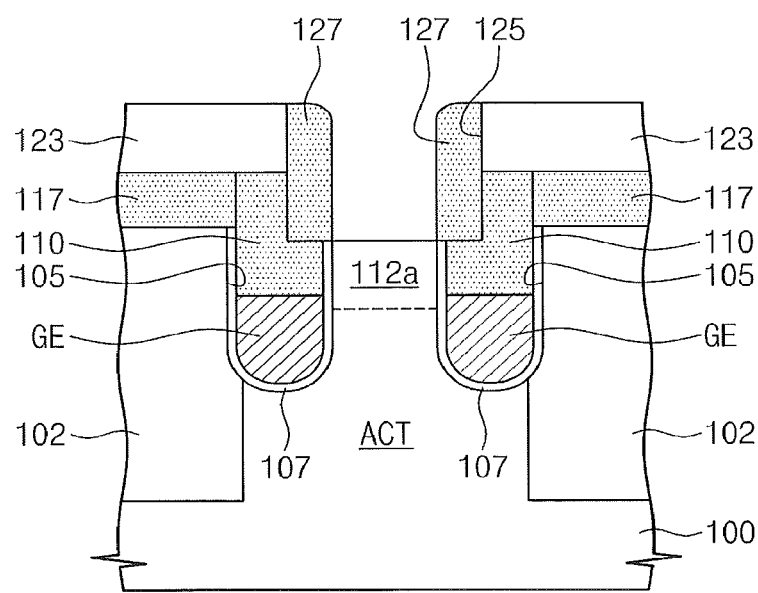

Referring to FIGS. 7A to 7C, a first interlayer insulating layer 123 may be formed on an entire surface of the substrate 100. The first interlayer insulating layer 123 may be patterned to form a wire-contact hole 125 exposing each of the first doped regions 112a. In more detail, a mask pattern (not shown) may be formed on the first interlayer insulating layer 123. The mask pattern may include mask-openings respectively defining the wire-contact holes 125. A width of the mask-opening in the x-axis direction may be greater than a width in the x-axis direction of the lower insulating fence 117 disposed on the first doped region 112a. A width of the mask-opening in the y-axis direction may be greater than a distance between the pair of the gate capping insulating patterns 110 adjacent to each other. The first interlayer insulating layer 123, the lower insulating fence 117 on the first doped region 112a, the base conductive pads 120 on the first doped region 112a, and portions of the gate capping insulating patterns 110 may be etched using the mask pattern as an etch mask. Thus, the wire-contact holes 125 may be formed. In some embodiments, one sidewall of the base conductive pad 120 may be exposed by an inner sidewall of the wire-contact hole 125. Because the wire-contact holes 125 are formed, the first doped region 112a may be spaced apart from the base conductive pads 120.

Subsequently, an insulating spacer layer may be conformally formed on the substrate 100 and then the insulating spacer layer may be anisotropically etched-back. Thus, an insulating spacer 127 may be formed on the inner sidewall of each of the wire-contact holes 125.

Figure 8B:
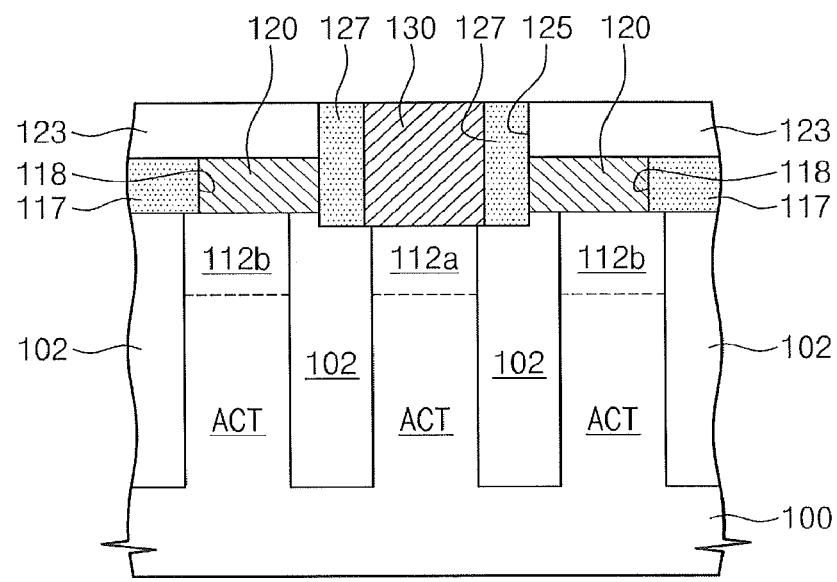
Figure 8C:
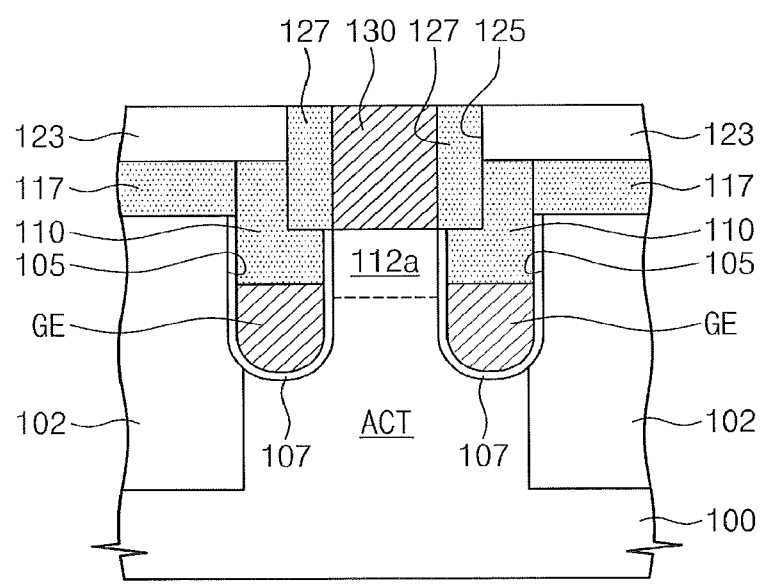

Referring to FIGS. 8A to 8C, subsequently, a second conductive layer may be formed on the substrate to fill the wire-contact holes 125. The second conductive layer may be planarized until the first interlayer insulating layer 123 is exposed, thereby forming a wire-plug 130 filling each of the wire-contact holes 125. The wire-plug 130 is connected to the first doped region 112a. The wire-plug 130 may be electrically insulated from the base conductive pad 120 by the insulating spacer 127.

Figure 9A:
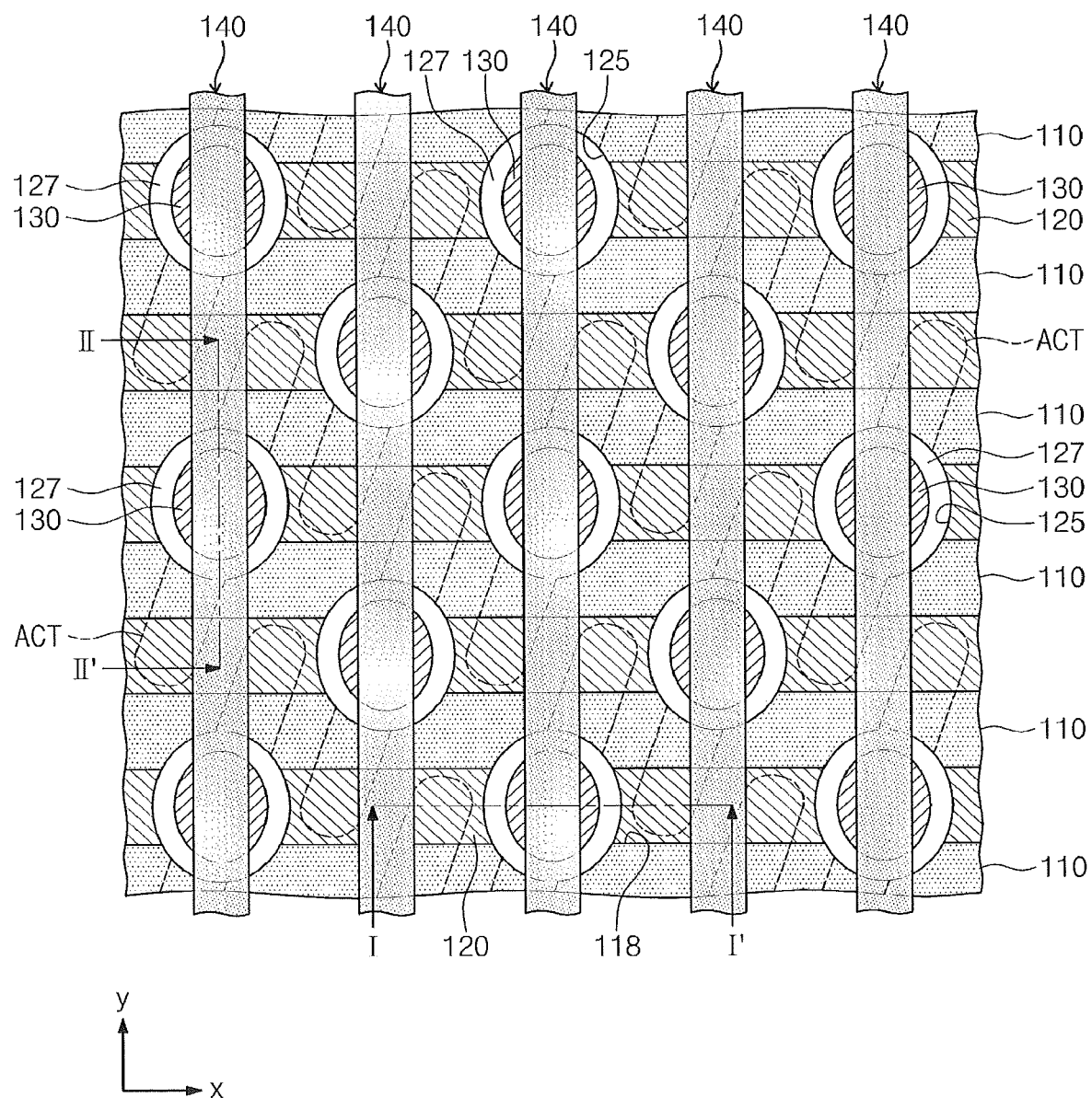
Figure 9B:
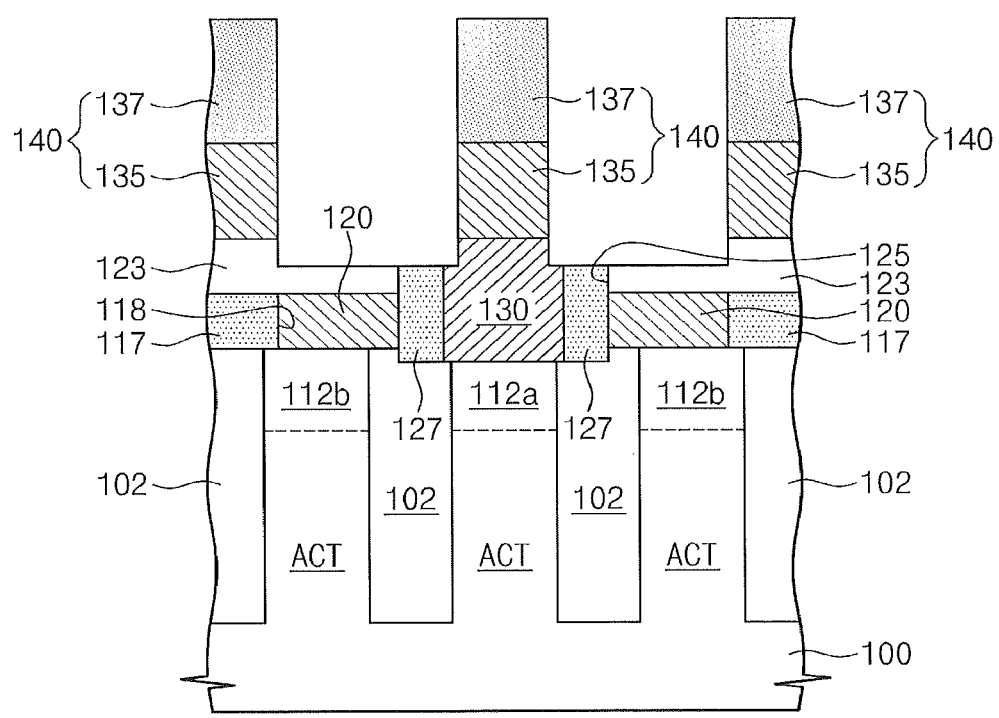
Figure 9C:
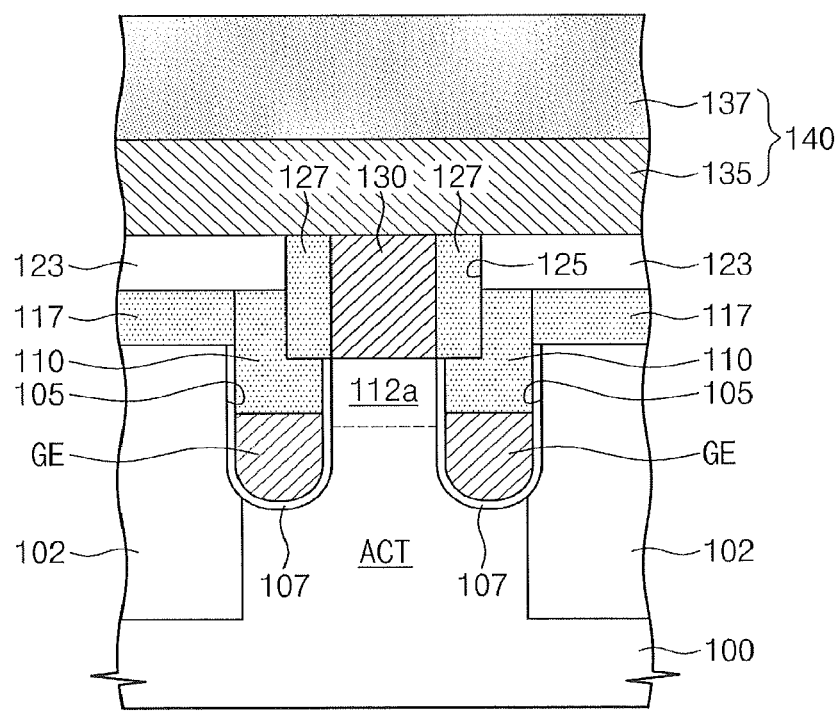

Referring to FIGS. 9A to 9C, a third conductive layer and a hard mask layer may be sequentially formed on the substrate 100, and then the hard mask layer and the third conductive layer may be successively patterned to form line patterns 140. Each of the line patterns 140 may include a conductive wire 135 and a hard mask pattern 137, which are sequentially stacked. Each of the conductive wires 135 may be connected to the wire-plugs 130 arranged in the y-axis direction.

Figure 10A:
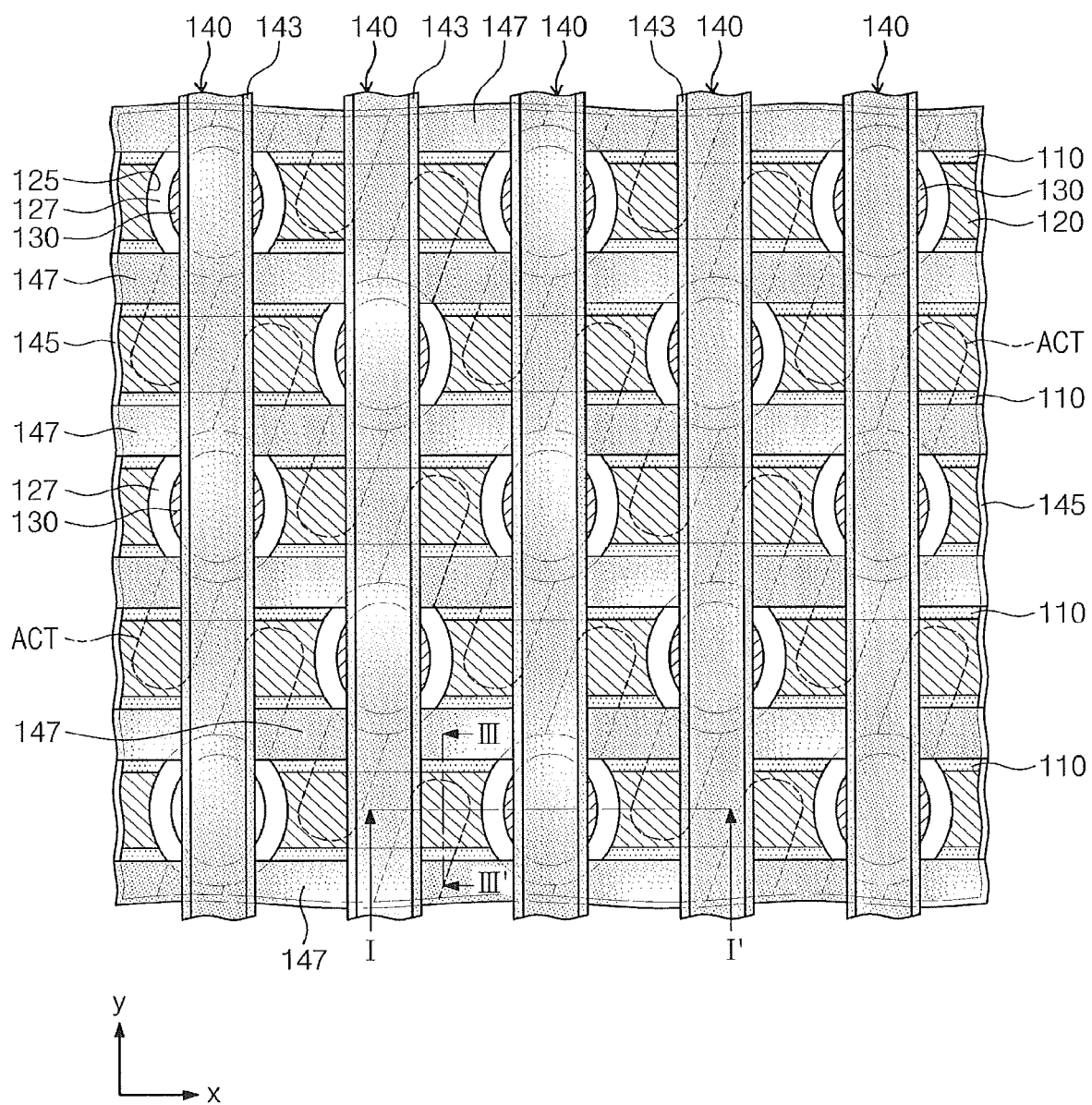
Figure 10B:
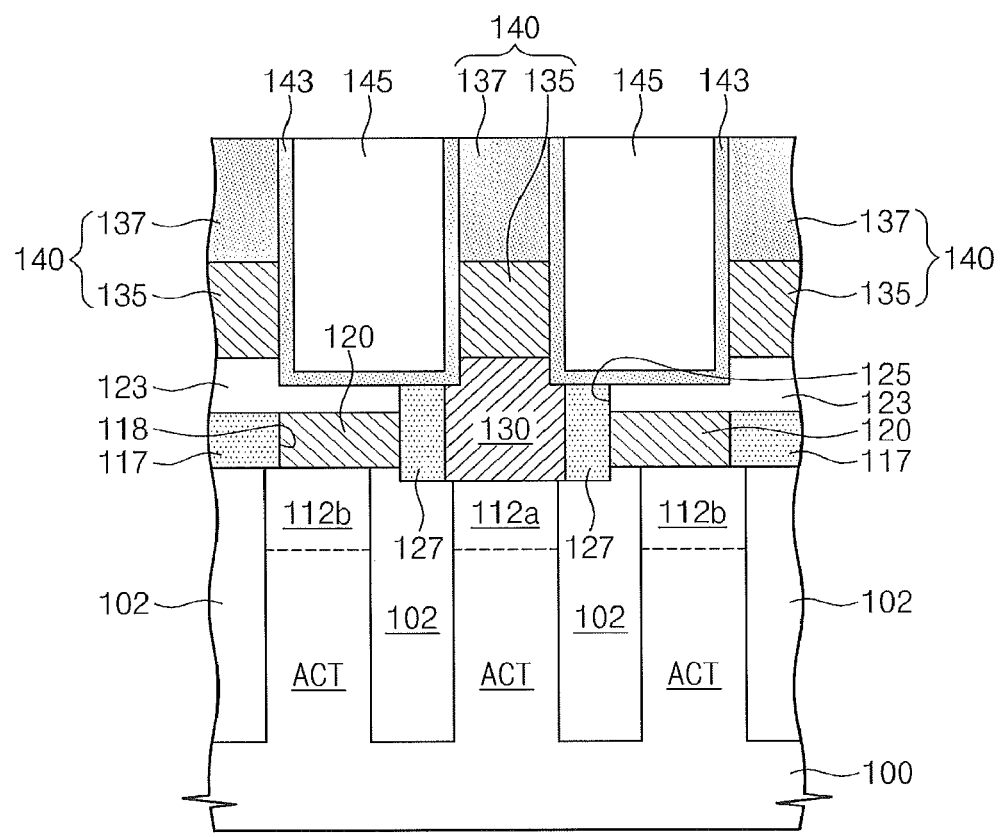
Figure 10C:
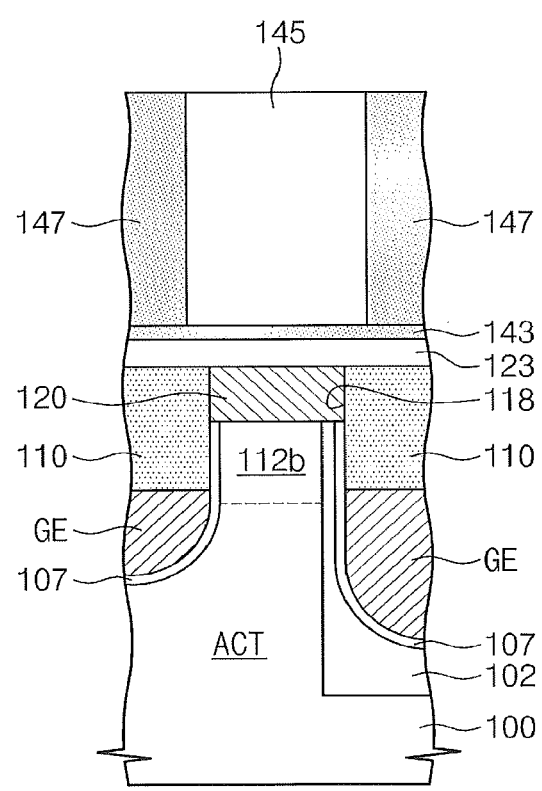

Cross-sectional views of FIGS. 10A to 13A, which correspond to the cross-sectional view taken along the line II-II' of FIG. 9A, may be the same as the cross-sectional view of FIG. 9C. Thus, for avoiding the repetition of the same drawing, FIGS. 10C to 13C show cross-sectional views taken along lines of FIGS. 10A to 13A, respectively. Referring to FIGS. 10A to 10C, after the line patterns 140 are formed, a first protecting spacer layer 143 may be conformally formed on the substrate 100 and then a second filling layer may be formed on the first protecting spacer layer 143. The second filling layer may fill spaces between the line patterns 140. The second filling layer may be planarized to form second filling line patterns. The second filling line patterns may fill the spaces between the line patterns 140, respectively. When the second filling layer is planarized, the first protecting spacer layer 143 on top surfaces of the line patterns 140 may be removed. But, the first protecting spacer layer 143 under the second filling line patterns remains. The first protecting spacer layer 143 may have a substantially uniform thickness on both sidewalls of the line patterns 140 and the first interlayer insulating layer 124 between the line patterns 140. The first protecting spacer layer 143 protects the sidewalls of the line patterns 140 (i.e., sidewalls of the conductive wires 135).

The first protecting spacer layer 143 is formed of an insulating material. The second filling layer may be formed of a material having an etch selectivity with respect to the hard mask pattern 137 and the first protecting spacer layer 143. For example, the second filling layer may be formed of silicon oxide, and the first protecting spacer layer 143 and the hard mask pattern 137 may be formed of silicon nitride and/or silicon oxynitride.

The second filling line patterns may be patterned to form second concave regions and second filling patterns 145 between the line patterns 140. The second filling patterns 145 are spaced apart from each other by the second concave regions. The second concave regions may expose the first protecting spacer layer 143. The second filling patterns 145 may be disposed over the base conductive pads 120, respectively. A second fence insulating layer may be formed on the substrate 100 to fill the second concave regions. And then the second fence insulating layer may be planarized until the second filling patterns 145 are exposed, thereby forming upper insulating fences 147.

Each of the second filling patterns 145 is disposed between a pair of the upper insulating fences 147 adjacent to each other in the y-axis direction. The upper insulating fences 147 may be formed of an insulating material having an etch selectivity with respect to the second filling patterns 145. For example, the upper insulating fences 147 may be formed of silicon nitride and/or silicon oxynitride.

Figure 11A:
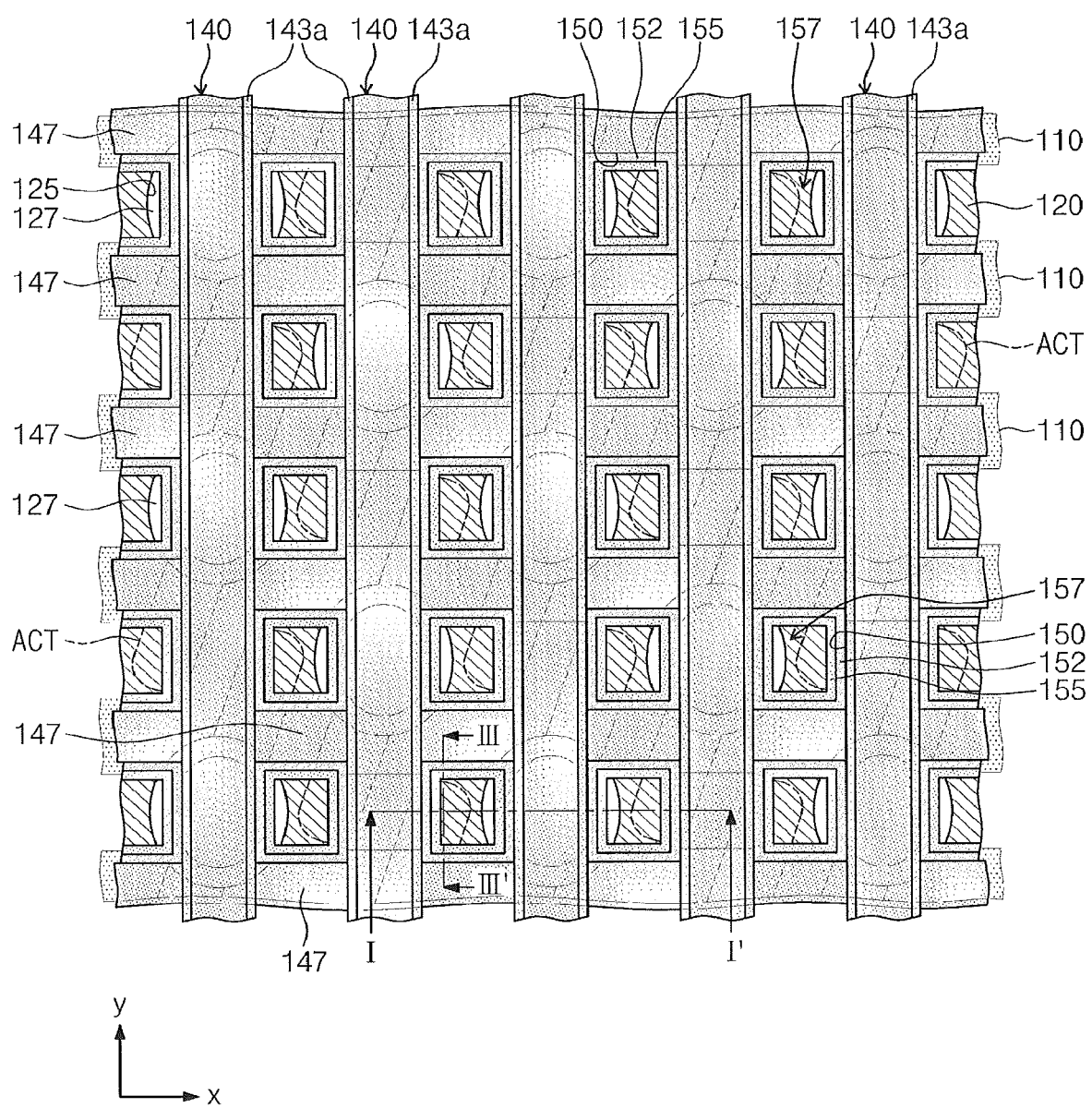
Figure 11B:
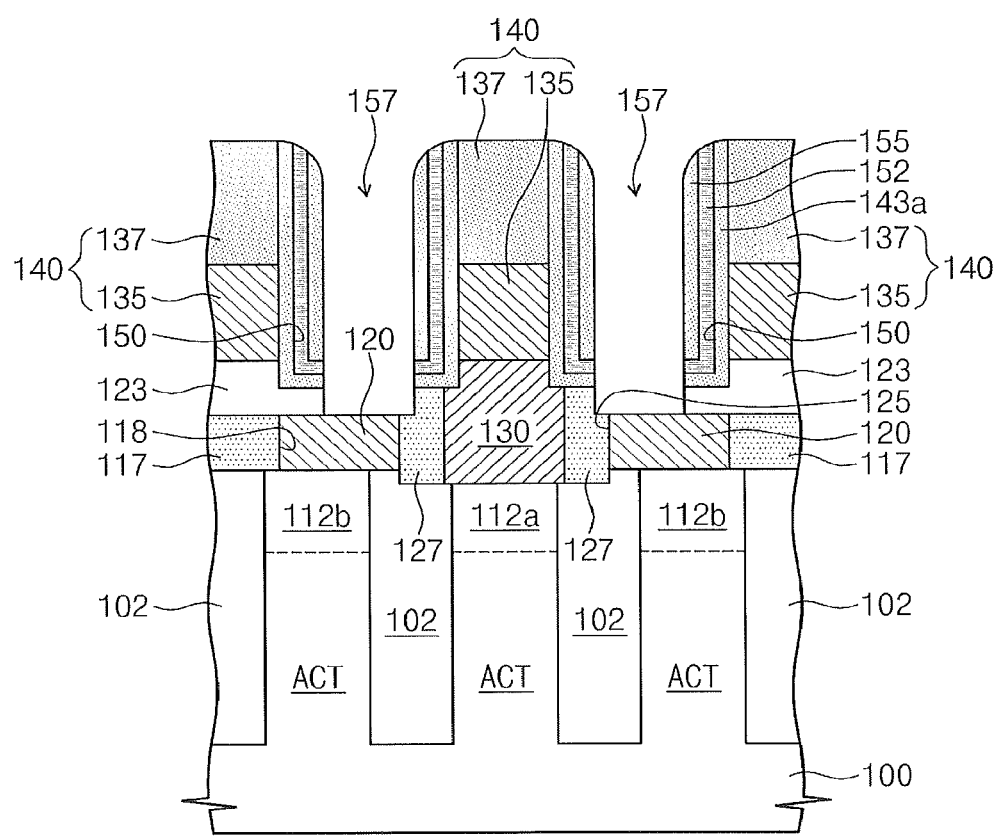
Figure 11C:
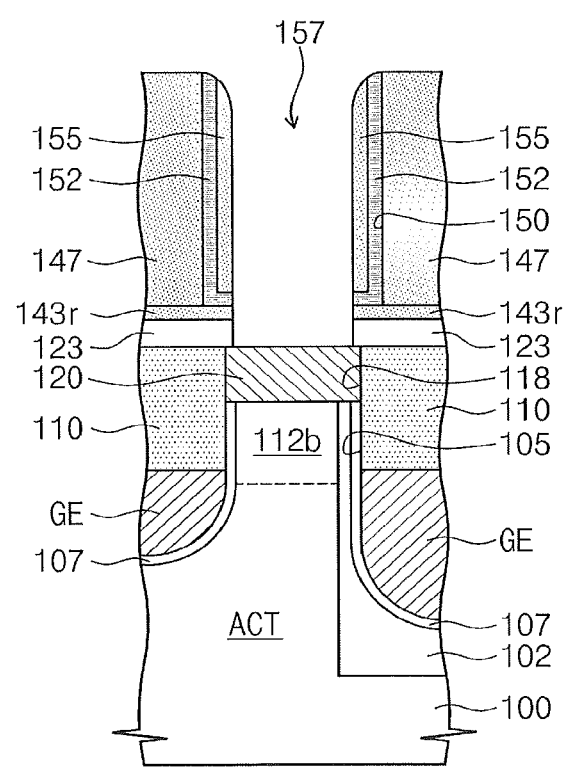

Referring to FIGS. 11A to 11C, the second filling patterns 145 may be removed to form guide holes 150. The guide holes 150 may be disposed over the base conductive pads 120, respectively. Each of the guide holes 150 may have a quadrangular shape in a plan view.

A sacrificial spacer layer may be conformally formed on the substrate 100 including the guide holes 150, and then a second protecting spacer layer may be conformally formed on the sacrificial spacer layer. Subsequently, the second protecting spacer layer, the sacrificial spacer layer, and the first protecting spacer layer may be successively and anisotropically etched to form a contact hole 157, a first protecting spacer 143a, a sacrificial spacer 152, and a second protecting spacer 155. The first protecting spacer 143a may have a line-shape extending along the sidewall of the line pattern 140. The sacrificial spacer 152 and the second protecting spacer 155 may be sequentially stacked on an inner sidewall of the guide hole 150. The contact hole 157 may be surrounded by the second protecting spacer 155 and the sacrificial spacer 152. The first interlayer insulating layer 123 under a bottom of the contact hole 157 may be anisotropically etched to expose the base conductive pad 120. In some embodiments, a top end of the sacrificial spacer 143a may be exposed after the spacers 143a, 152, and 155 are formed.

The second protecting spacer 155, the first protecting spacer 143a, the hard mask pattern 137, and the upper insulating fences 147 may be formed of an insulating material having an etch selectivity with respect to the sacrificial spacer 152. For example, the second protecting spacer 155, the first protecting spacer 143a, the hard mask pattern 137, and the upper insulating fence 147 may be formed of silicon nitride and/or silicon oxynitride, and the sacrificial spacer 152 may be formed of silicon oxide.

Figure 12A:
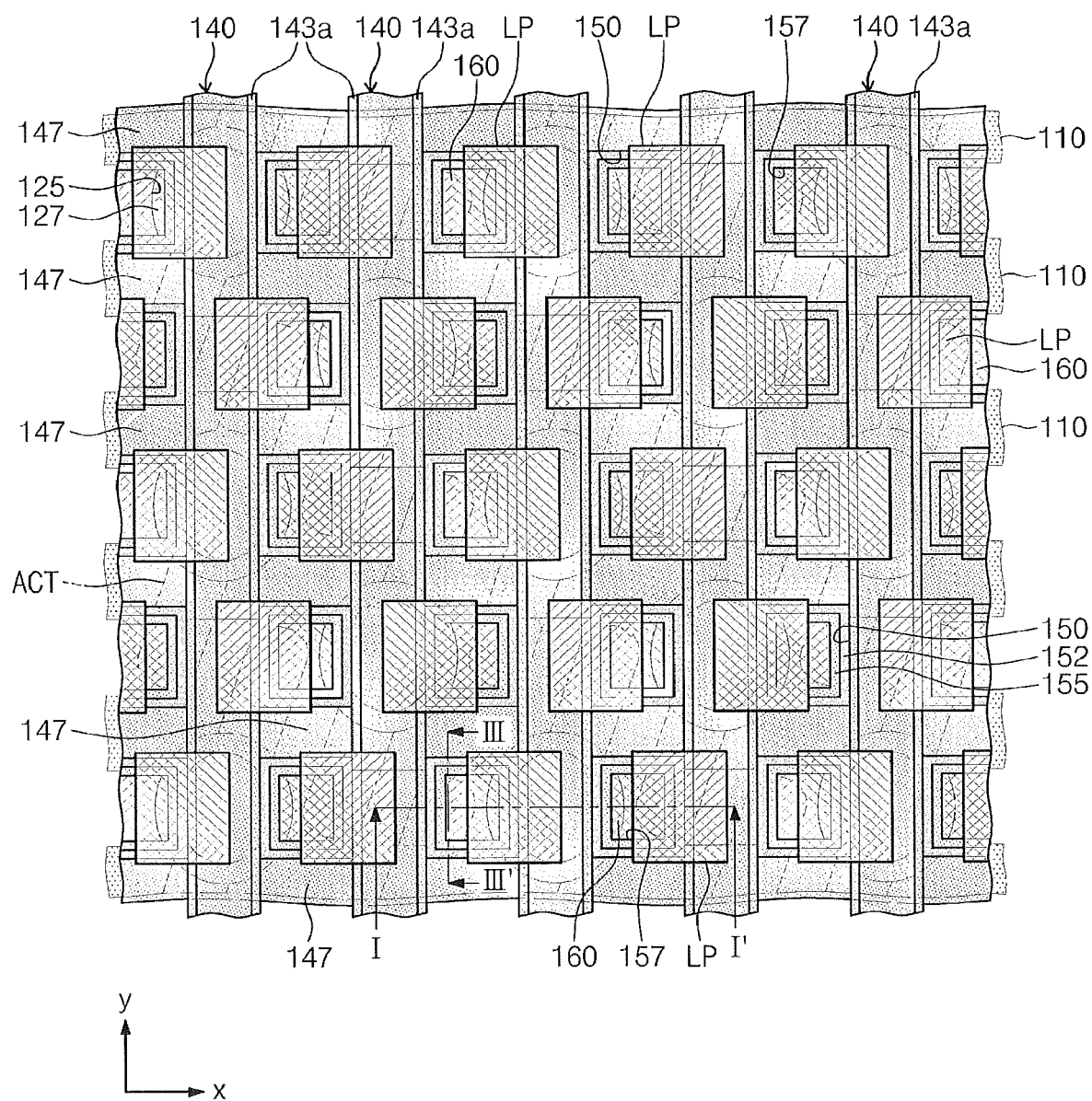
Figure 12B:
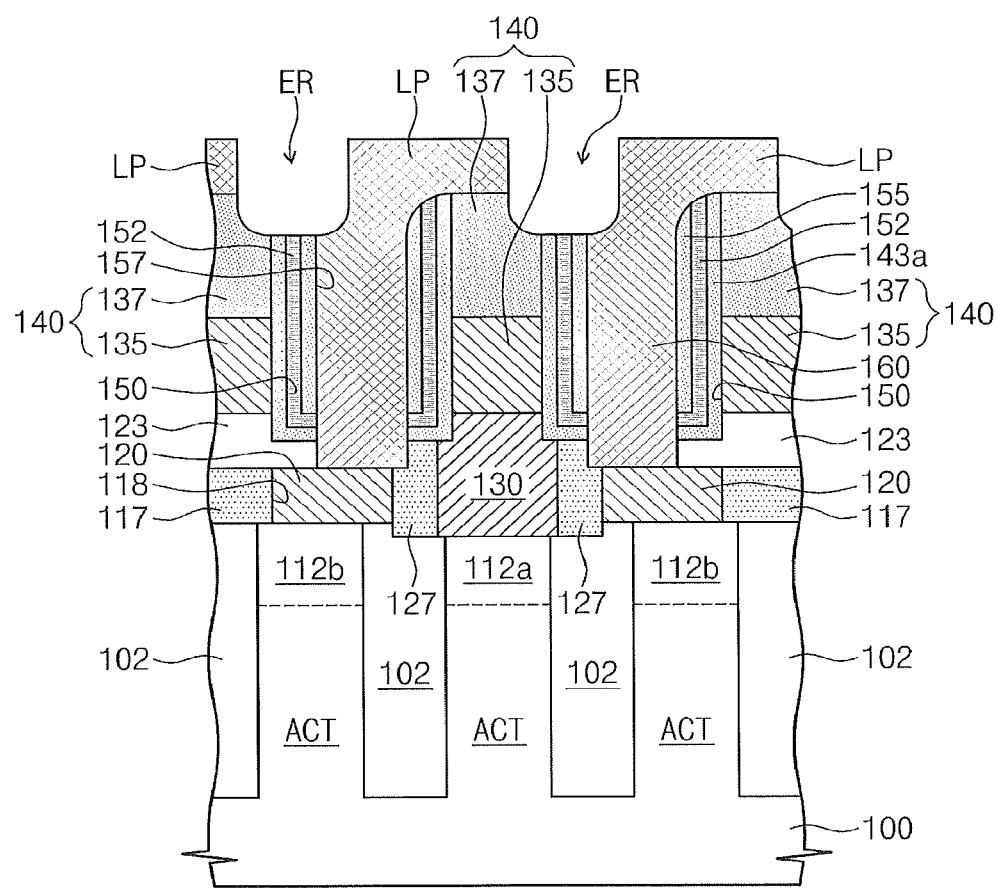
Figure 12C:
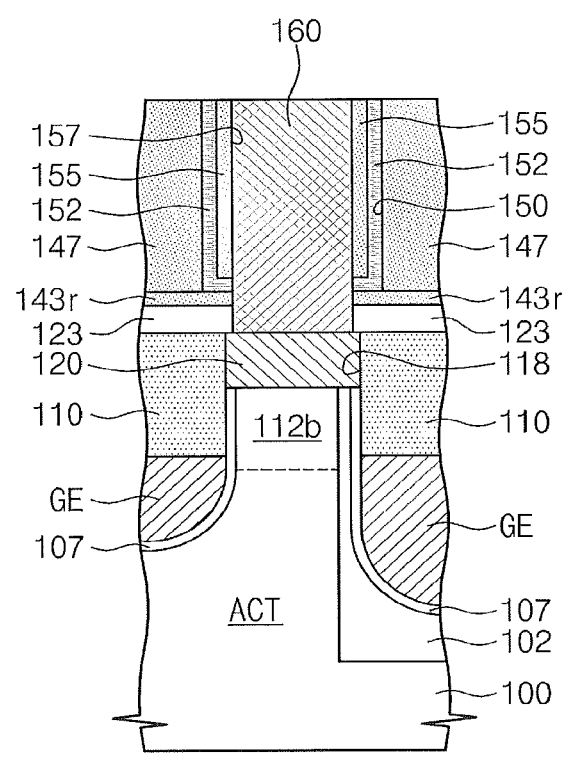

Referring to FIGS. 12A to 12C, a third conductive layer may be formed on the substrate 100 to fill the contact holes 157. The third conductive layer may be patterned to form contact plugs 160 and landing pads LP. Each of the contact plugs 160 fills each of the contact holes 157, respectively. Each of the landing pads LP may extend from a top end of each of the contact plugs 160 to be disposed outside the contact hole 157.

The landing pad LP may cover a first portion of the sacrificial spacer 152 surrounding the contact plug 160. Here, the sacrificial spacer 152 has a second portion not covered by the landing pad LP. The second portion of the sacrificial spacer 152 is exposed. The landing pad LP may also cover portions of the first and second spacers 143a and 155, which are disposed at both sides of the first portion of the sacrificial spacer 152, respectively. In some embodiments, the landing pad LP may also cover a portion of a top surface of the line pattern 140 adjacent to the first portion of the sacrificial spacer 152.

A bottom surface of an etched region ER between the landing pads LP may be lower than a top end of the first portion of the sacrificial spacer 152 covered by the landing pad LP. In other words, a top end of the second portion of the sacrificial spacer 152 not covered by the landing pad LP may be lower than the top end of the first portion of the sacrificial spacer 152 covered by the landing pad LP. Likewise, top ends of one-portions of the first and second protecting spacers 143a and 155 not covered by the landing pad LP may be lower than top ends of another-portions of the first and second protecting spacers 143a and 155 covered by the landing pad LP. The first portion and the second portion of the sacrificial spacer 152 are connected to each other.

Figure 13A:
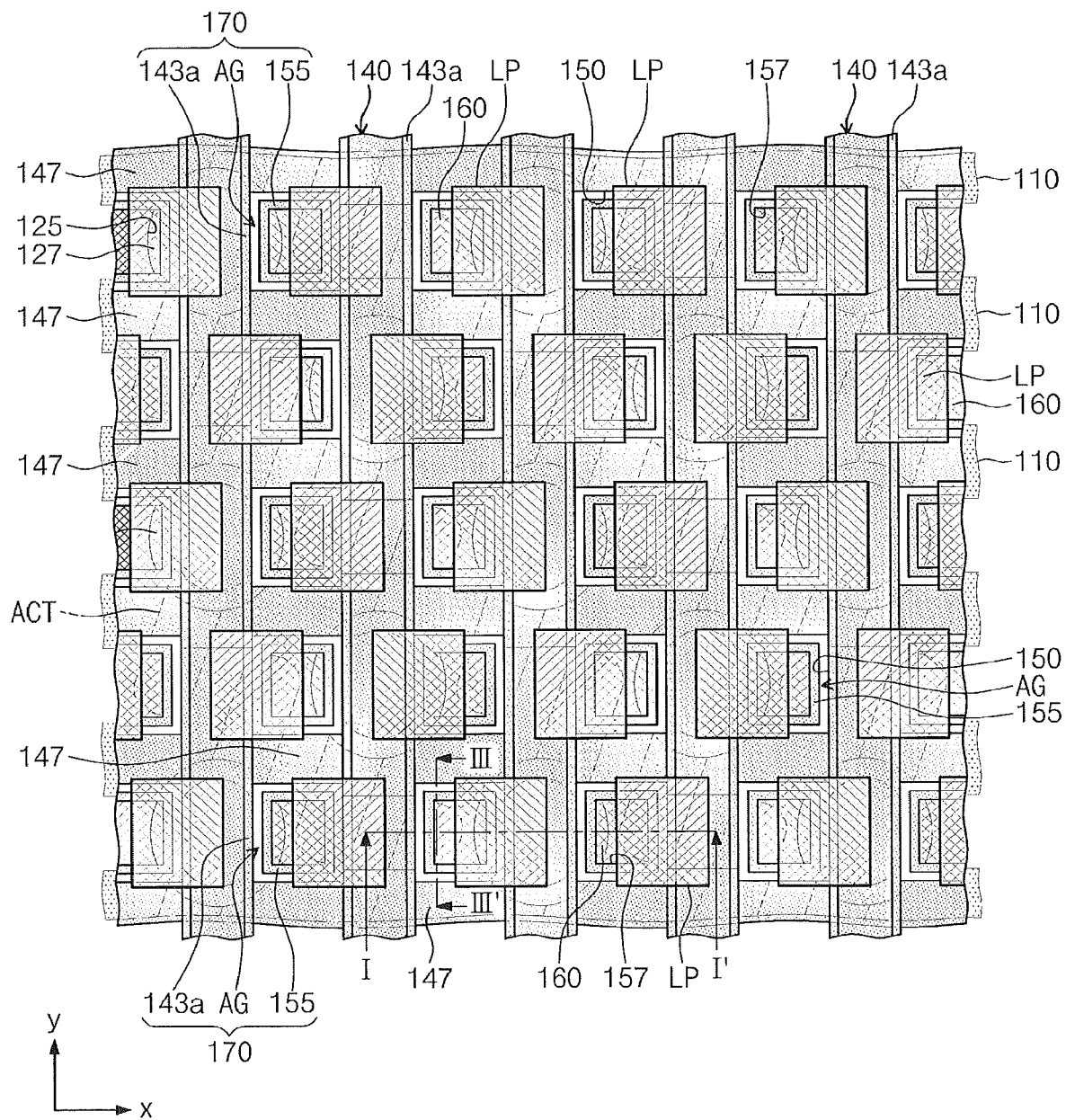
Figure 13B:
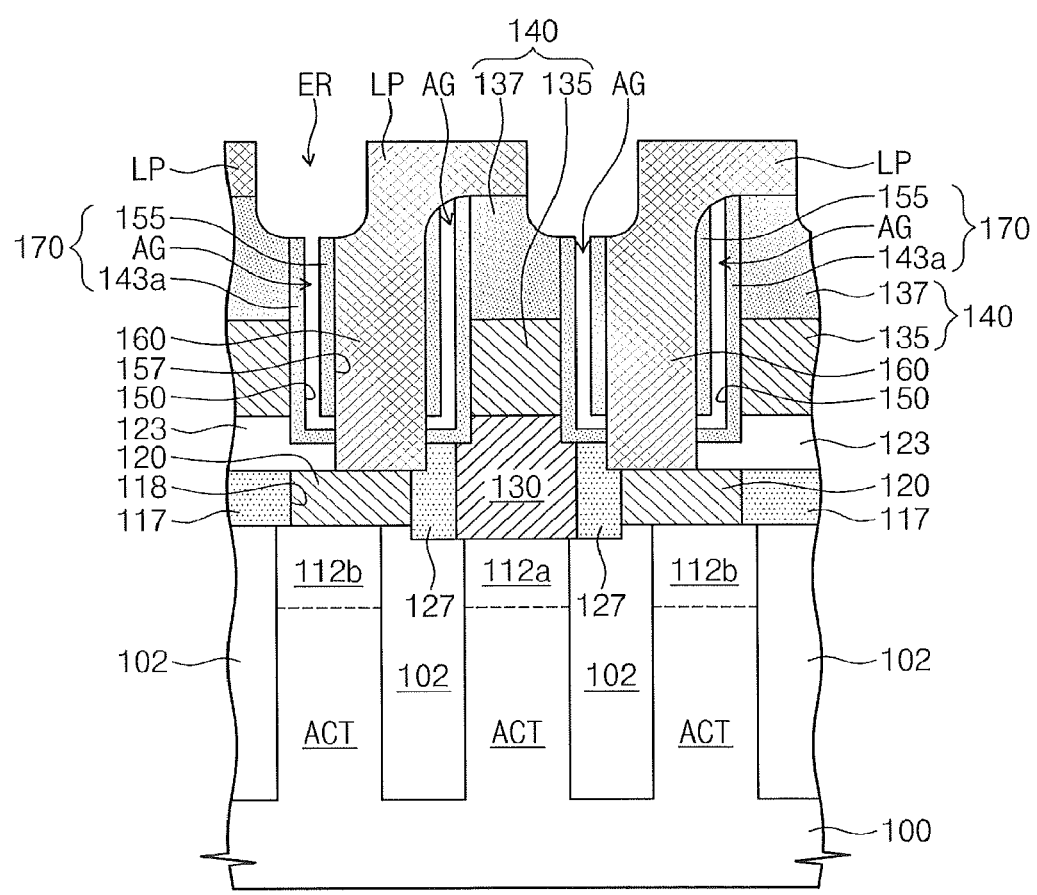
Figure 13C:
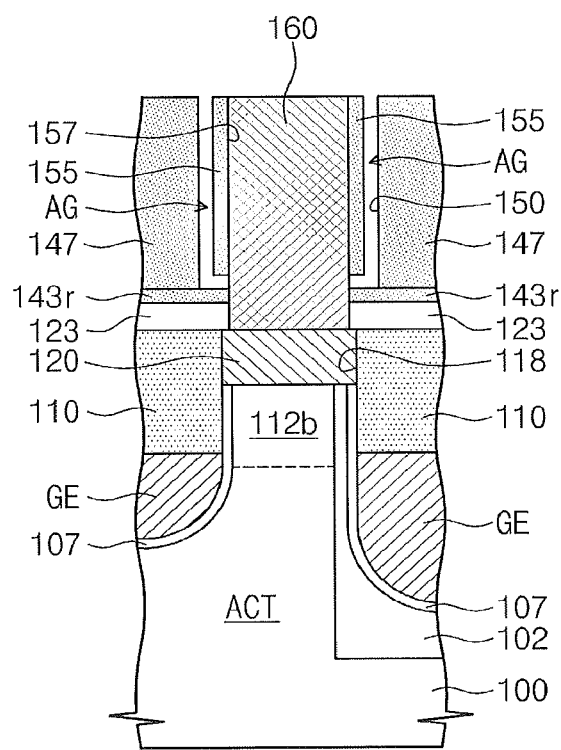

Referring to FIGS. 13A to 13C, the sacrificial spacer 152 is removed by an isotropic etching process through the exposed second portion of the sacrificial spacer 152. At this time, the first portion of the sacrificial spacer 152 is also removed. Thus, an air gap AG is formed between the contact plug 160 and the line patterns 140 adjacent to the contact plug 160. In other words, a spacer structure 170 including the air gap AG may be formed between the contact plug 160 and the line patterns 140 adjacent thereto. A part of the air gap AG between the contact plug 160 and the line pattern 140 is disposed between the first and second protecting spacers 143a and 155. Another part of the air gap AG between the contact plug 160 and the upper insulating fence 147 may be disposed between the second protecting spacer 155 and the upper insulating fence 147. The sacrificial spacer 152 may be removed by a wet etching process.

A top end of a first part of the air gap AG covered by the landing pad LP may be closed by the landing pad LP. Next, the second interlayer insulating layer 173 illustrated in FIGS. 1A to 1E may be formed. A top end of a second part of the air gap AG not covered by the landing pad LP may be closed by the second interlayer insulating layer 173. The second interlayer insulating layer 173 may have a poor step coverage property. Thus, the top end of the second part of the air gap AG can be closed. Because the top end of the first portion of the sacrificial spacer 152 is higher than the top end of the second portion of the sacrificial spacer 152, a height of the first part of the air gap AG covered by the landing pad LP may be greater than a height of the second part of the air gap AG not covered by the landing pad LP.

Subsequently, the via-plugs 175 and the data storage parts DSP of FIGS. 1A and 1B may be formed. The data storage parts DSP may be realized as the data storage part DSP illustrated in FIG. 3A or the data storage part DSP' illustrated in FIG. 3B. Thus, the semiconductor device illustrated in FIGS. 1A to 1F may be realized.

According to the method of manufacturing the semiconductor device described above, after the landing pad LP is formed to partially cover the sacrificial spacer 152, the sacrificial spacer 152 may be removed by the anisotropic etching process through the exposed portion of the sacrificial spacer 152. Thus, the air gap AG may be easily formed between the contact plug 160 and the line patterns 140. As a result, a parasitic capacitance may be reduced to realize the semiconductor device having excellent reliability. Additionally, because the air gap AG is easily formed, the productivity of the semiconductor device may be improved.

Additionally, during the removal of the sacrificial spacer 152, the first protecting spacer 143a protects the sidewall of the conductive wire 135, and the second protecting spacer 155 protects the contact plug 160. Thus, it is possible to prevent or reduce the damage to the conductive wire 135 and the contact plug 160, which may be caused by the process of removing the sacrificial spacer 152. As a result, the semiconductor device having improved reliability may be realized.

Next, a method of manufacturing the semiconductor device of FIG. 2 will be described with reference to FIGS. 14 to 18. FIGS. 14 to 18 are cross-sectional views illustrating a modified example of a method of manufacturing a semiconductor device according to some embodiments of the inventive concept. The manufacturing method may include the method of forming the guide holes 150, which is described above.

Figure 14:
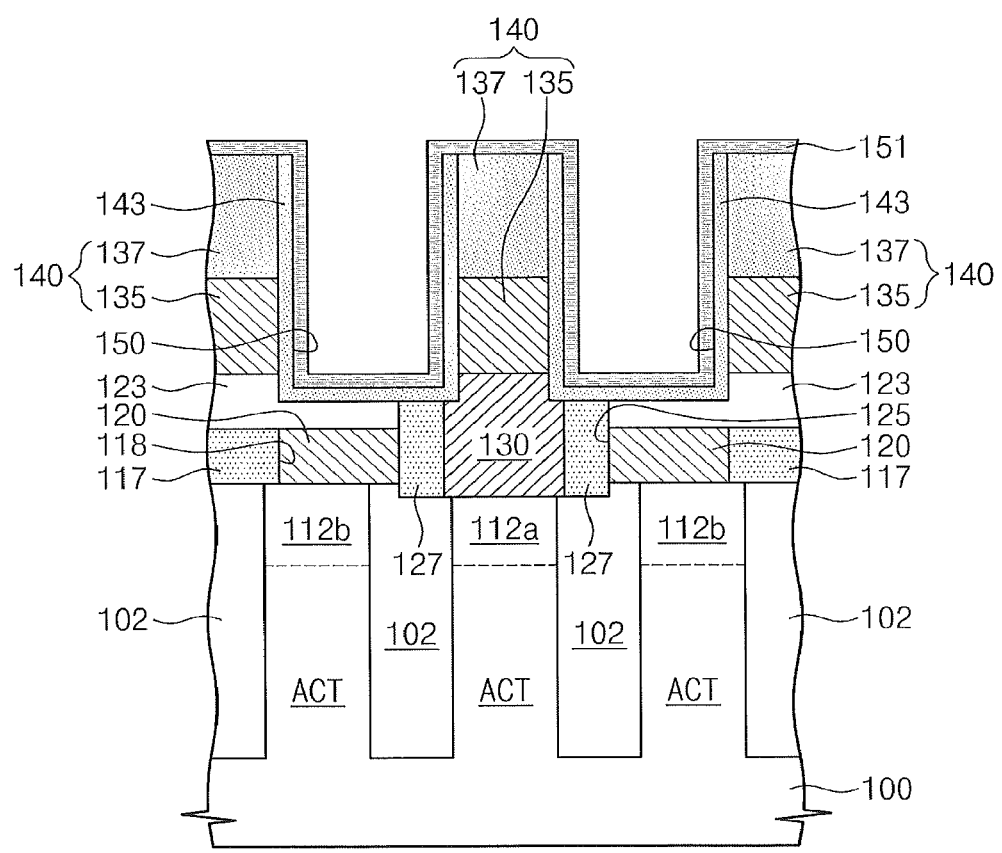
FIGS. 14 to 18 are cross-sectional views illustrating a modified example of a method of manufacturing a semiconductor device according to some embodiments of the inventive concept.

Referring to FIG. 14, a sacrificial spacer layer 151 may be conformally formed on the substrate 100 having the guide holes 150. As described above, the first protecting spacer layer 143 and the hard mask pattern 137 are formed of an insulating material having an etch selectivity with respect to the sacrificial spacer layer 151.

Figure 15:
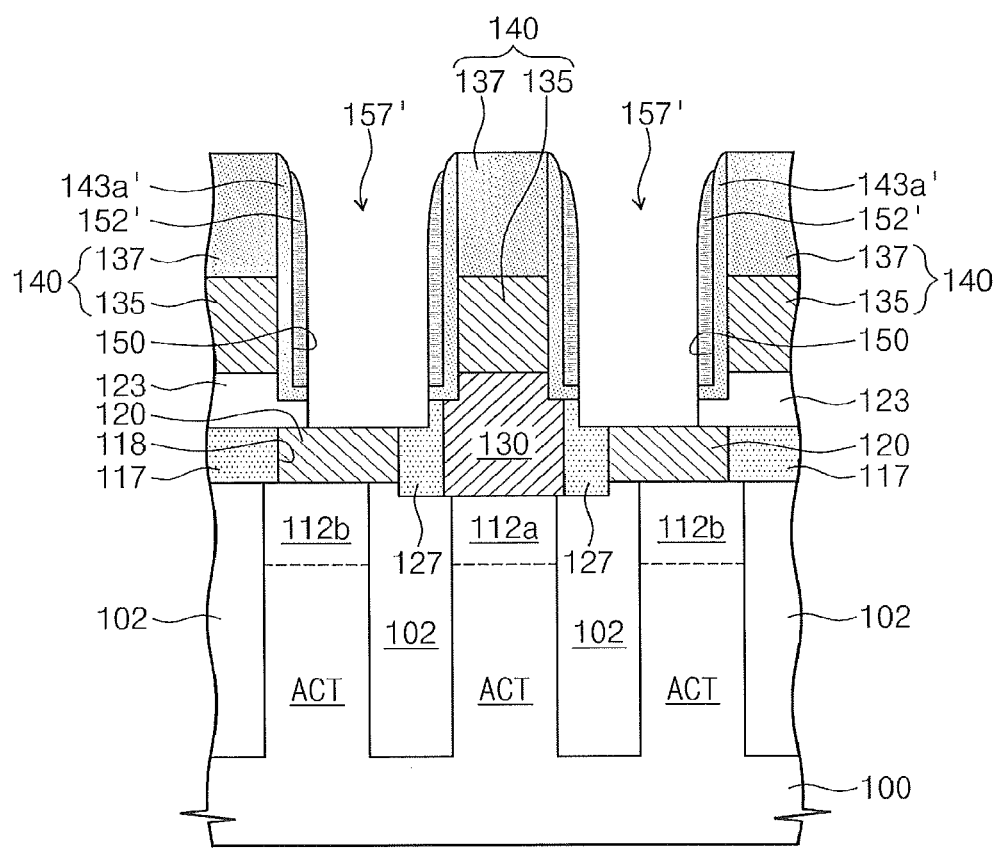

Referring to FIG. 15, the sacrificial spacer layer 151, the first protecting spacer layer 143, and the first interlayer insulating layer 123 may be anisotropically etched to form a first protecting spacer 143a', a sacrificial spacer 152', and a contact hole 157'. The first protecting spacer 143a' may have a line shape extending along the sidewall of the line pattern 140. The sacrificial spacer 152' may be formed on the inner sidewall of the guide hole 150. The contact hole 157' may expose the base conductive pad 120. A top end of the sacrificial spacer 152' may be etched while the first interlayer insulating layer 123 is etched. Thus, the top end of the sacrificial spacer 152' may be lower than a top end of the first protecting spacer 143a'.

Figure 16:
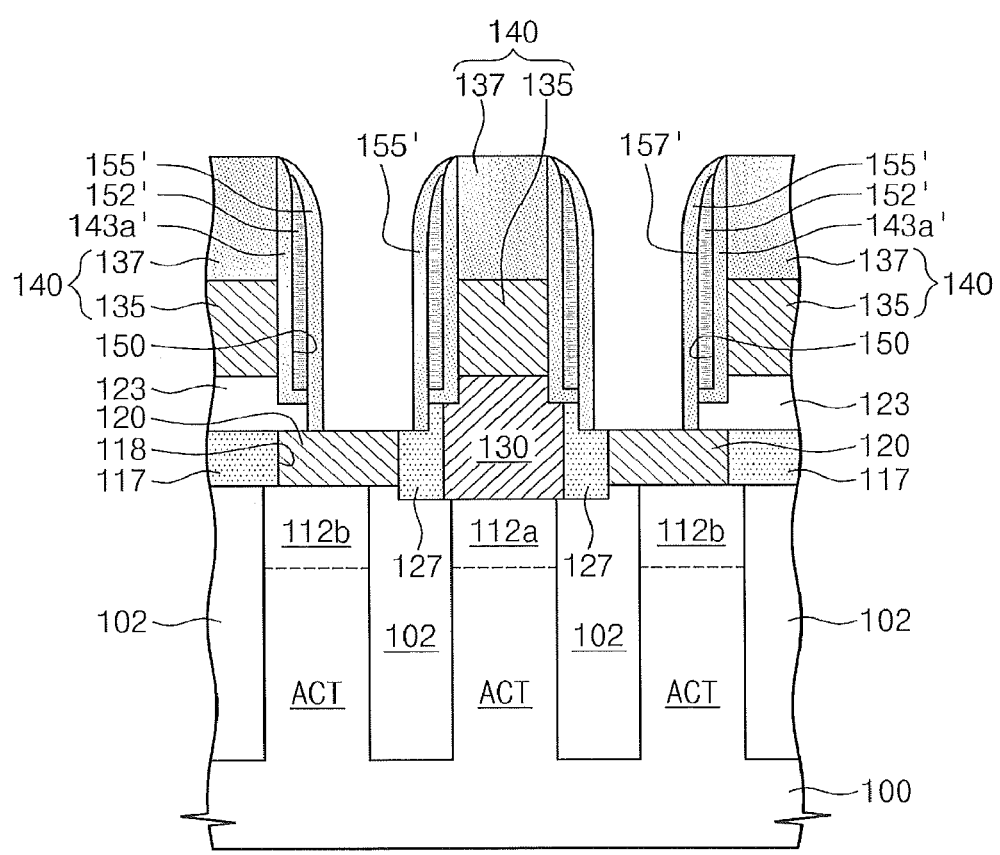

Referring to FIG. 16, a second protecting spacer layer may be conformally formed on the substrate 100 having the contact holes 157', and then the second protecting spacer layer may be anisotropically etched until the base conductive pad 120 is exposed. Thus, a second protecting spacer 155' may be formed on an inner sidewall of the contact hole 157'. At this time, a top end of the second protecting spacer 155' may be in contact with a top end of the first protecting spacer 143a'. Thus, a top end of the sacrificial spacer 152' is not exposed. In other words, the sacrificial spacer 152' may be surrounded by the first and second protecting spacers 143a' and 155', so that the sacrificial spacer 152' may not be exposed. As described above, the second protecting spacer 155' is formed of an insulating material having an etch selectivity with respect to the sacrificial spacer 152'.

Figure 17:
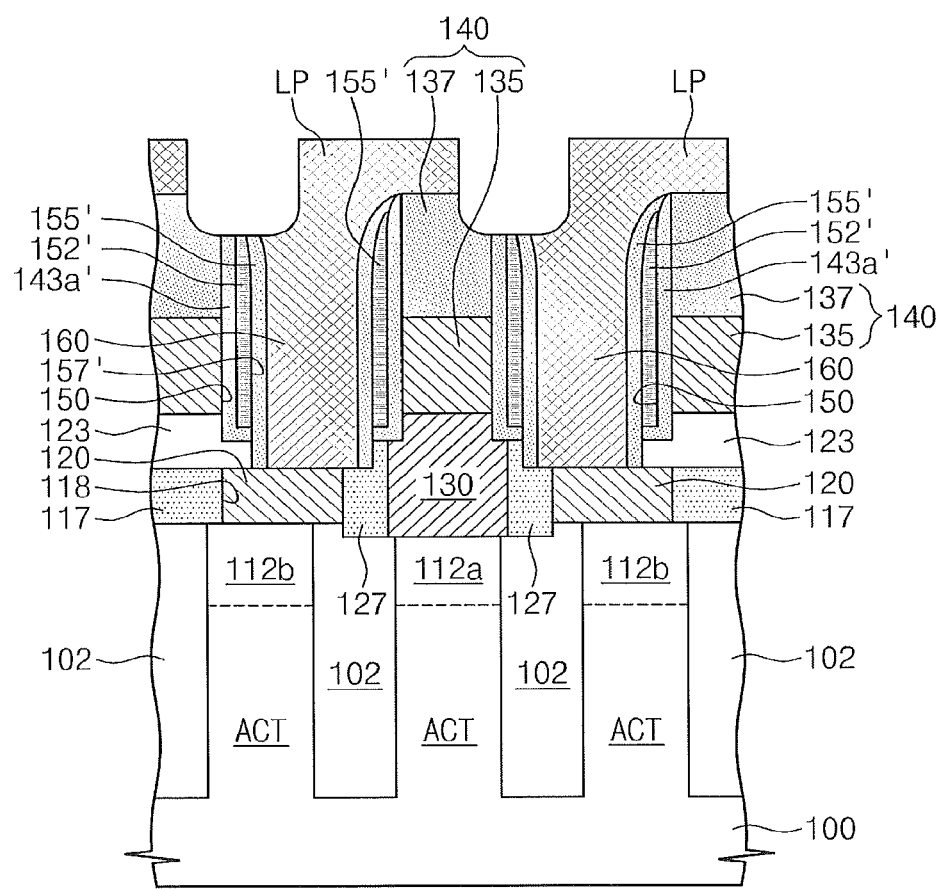

Referring to FIG. 17, next, a conductive layer may be formed on the substrate 100. The conductive layer fills the contact holes 157' having the second protecting spacers 155'. The conductive layer may be patterned to form a contact plug 160 filling the contact hole 157' and a landing pad LP extending from a top end of the contact plug 160. The landing pad LP may cover a first portion of the sacrificial spacer 152', and the sacrificial spacer 152' may include a second portion not covered by the landing pad LP.

A top end of the first portion of the sacrificial spacer 152' may be surrounded by the top ends of the first and second protecting spacers 143a' and 155', which are disposed under the landing pad LP and are in contact with each other. The first and second protecting spacers 143a' and 155' covering a top end of the second portion of the sacrificial spacer 152' may be removed during the patterning process for the formation of the landing pad LP. Additionally, the top end of the second portion of the sacrificial spacer 152' may be partially etched. Thus, the second portion of the sacrificial spacer 152' may be exposed. A top end of the exposed second portion of the sacrificial spacer 152' may be lower than the top end of the first portion of the sacrificial spacer 152'.

Figure 18:
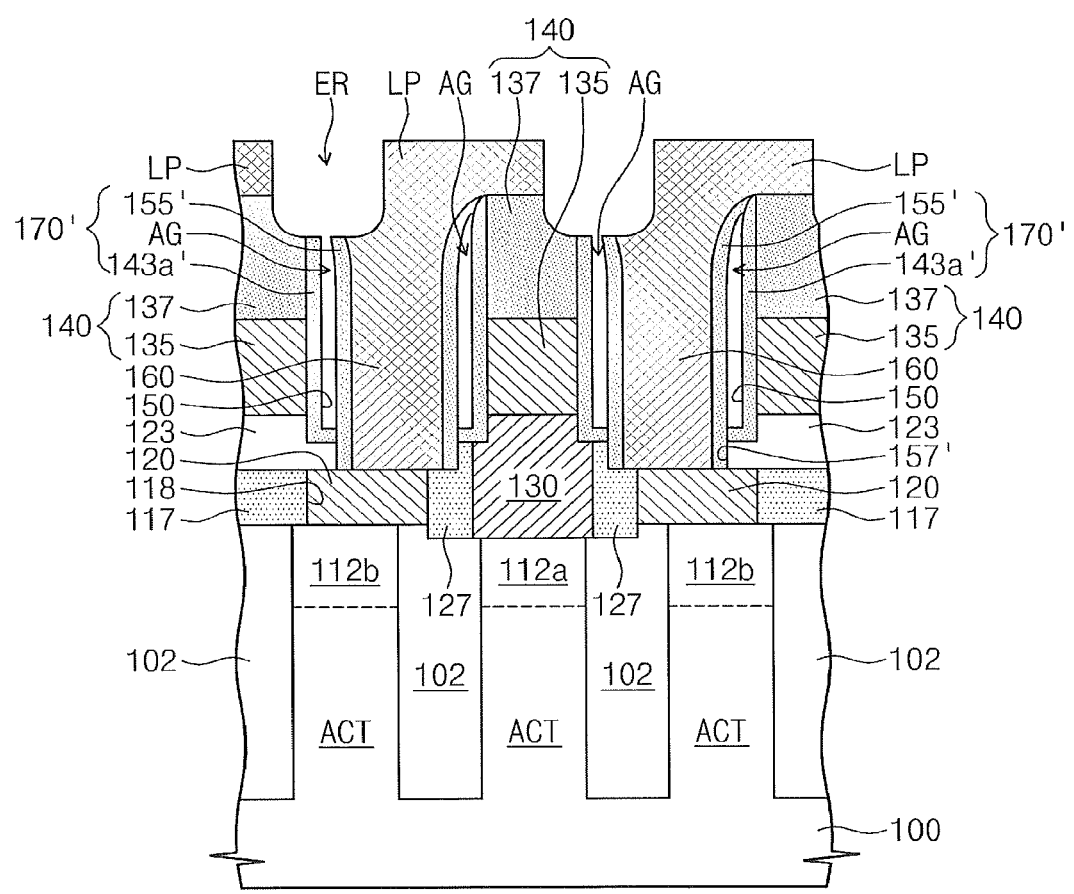

Referring to FIG. 18, the sacrificial spacer 152' may be removed by an isotropic etching process through the exposed second portion of the sacrificial spacer 152'. Thus, a spacer structure 170' including an air gap AG may be formed. Next, the second interlayer insulating layer 173, the via-plug 175, and the data storage part DSP of FIG. 2 may be formed to realize the semiconductor device of FIG. 2.

Second Embodiment

In the present embodiment, the same elements as described in the first embodiment will be indicated by the same reference numerals or the same reference designators. For the purpose of ease and convenience in explanation, the descriptions to the same elements as in the first embodiment will be omitted or mentioned briefly. That is, differences between the present embodiment and the first embodiment will be mainly described hereinafter.

Figure 19:
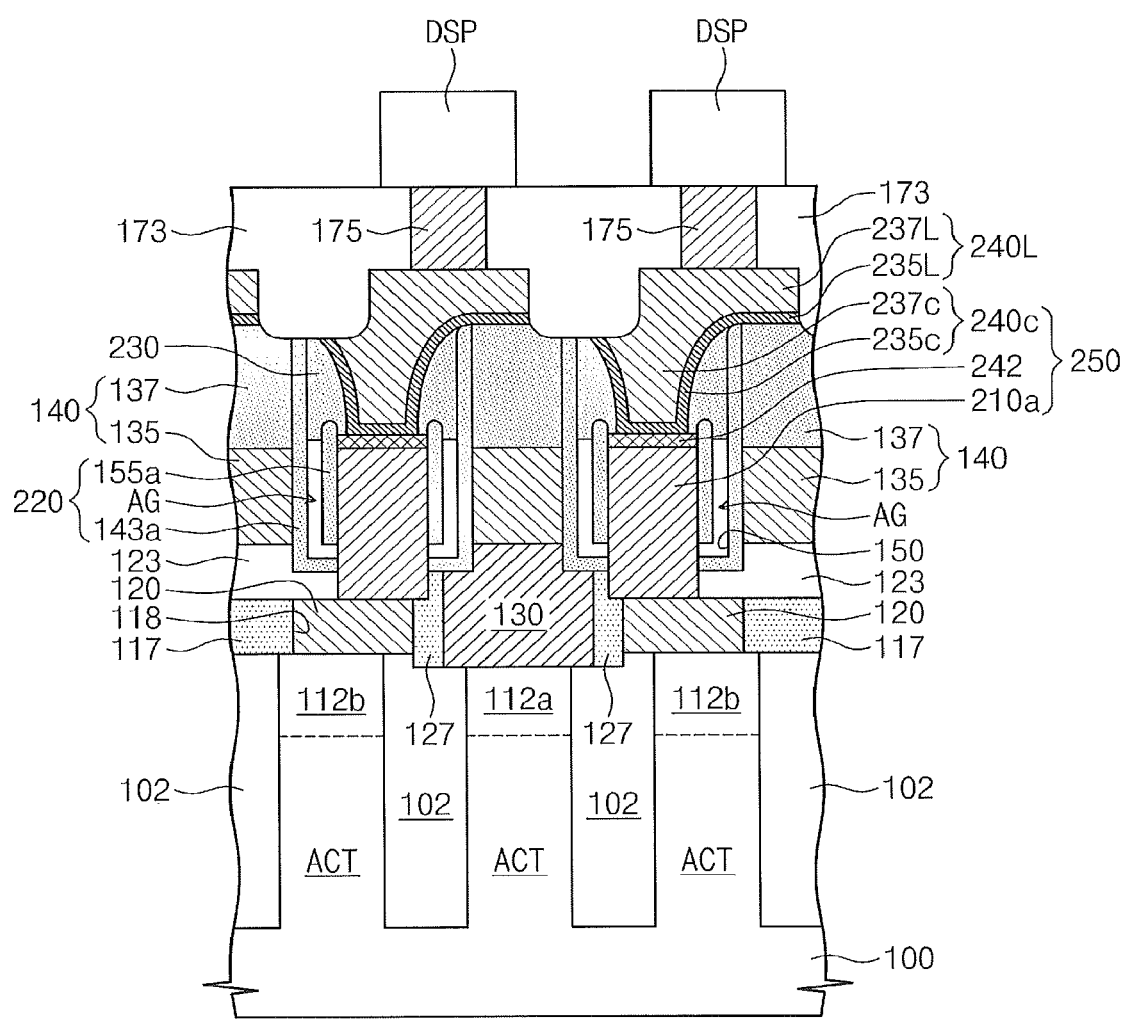
FIG. 19 is a cross-sectional view illustrating a semiconductor device according to other embodiments of the inventive concept.

FIG. 19 is a cross-sectional view illustrating a semiconductor device according to other embodiments of the inventive concept.

Referring to FIG. 19, a contact plug 250 between line patterns 140 adjacent to each other may include a lower plug 210a and an upper plug 240c, which are sequentially stacked. The lower plug 210a may be formed of a first conductive material, and the upper plug 240c may include a second conductive material different from the first conductive material.

A spacer structure 220 including an air gap AG may be disposed between a lower portion (i.e., the lower plug 210a) of the contact plug 250 and the line patterns 140. A capping spacer 230 may be disposed between an upper portion (i.e., the upper plug 240c) of the contact plug 250 and the line patterns 140. The capping spacer 230 may be disposed on the air gap AG. The capping spacer 230 may close a top end of the air gap AG. The capping spacer 230 is formed of an insulating material. For example, the capping spacer 230 may be formed of silicon nitride and/or silicon oxynitride.

The line pattern 140 may include a conductive wire 135 and the hard mask pattern 137, which are sequentially stacked. The spacer structure 220 including the air gap AG may be disposed between the lower plug 210a and the conductive wire 135. The capping spacer 230 may be disposed between the upper plug 240c and the hard mask pattern 137. In other words, the air gap AG may be confinedly disposed between the lower plug 210a and the conductive wire 135.

The spacer structure 220 may further include a first protecting spacer 143a and a second protecting spacer 155a. The first protecting spacer 143a is adjacent to the sidewall of the line pattern 140, and the second protecting spacer 155a is adjacent to the contact plug 250. At this time, the air gap AG may be disposed between the first and second protecting spacers 143a and 155a. In some embodiments, a top end of the second protecting spacer 155a is lower than the top surface of the line pattern 140. Thus, the capping spacer 230 may cover top ends of the air gap AG and the second protecting spacer 155a. The first protecting spacer 143a may extend upward between the line pattern 140 and the capping spacer 230. The first and second protecting spacers 143a and 155a may include silicon nitride and/or silicon oxynitride.

Planar shapes of the air gap AG and the second protecting spacer 155a may be substantially the same as described in the first embodiment. In other words, each of the second protecting spacer 155a and the air gap AG may have a closed loop-shape surrounding the lower plug 210a in a plan view. However, the inventive concept is not limited thereto. The air gap AG may have one of other various shapes. In other embodiments, the first and second protecting spacers 143a and 155a may be removed. In still other embodiments, at least a portion of the first protecting spacer 143a may remain and the second protecting spacer 155a may be removed. Thus, a size of the air gap AG may increase.

The lower plug 210a of the contact plug 250 may extend downward to be connected to the base conductive pad 120. In some embodiments, the lower plug 210a may be formed of a doped semiconductor material (e.g., doped silicon), and the upper plug 240c may include a metal. In more detail, the upper plug 240c may include a barrier pattern 235c and a metal pattern 237c sequentially stacked. For example, the barrier pattern 235c may include a transition metal (e.g., titanium, tantalum) and/or a conductive metal nitride (e.g., titanium nitride, tantalum nitride, tungsten nitride). The metal pattern 237 may include tungsten or aluminum. In this case, the contact plug 250 may further include an ohmic layer 242. For example, the ohmic layer 242 may be formed of a metal-semiconductor compound (e.g., a metal silicide such as titanium silicide).

A landing pad 240L may extend from a top end of the contact plug 250 to cover a part of the air gap AG and a portion of the capping spacer 230. The landing pad 240L may be formed of the same material as the upper plug 240c. For example, the landing pad 240 may include a barrier pattern 235L and a metal pattern 237L sequentially stacked. The barrier pattern 235L and the metal pattern 237L of the landing pad 240L may be connected to the barrier pattern 235c and the metal pattern 237c of the upper plug 240c, respectively. The barrier pattern 235L and the metal pattern 237L of the landing pad 240L may be formed of the same materials as the barrier pattern 235c and the metal pattern 237c of the upper plug 240c, respectively.

In the present embodiment, the air gap AG may be disposed between the lower plug 210a of the contact plug 250 and the conductive wire 135 of the line pattern 140. Thus, a parasitic capacitance may be reduced or minimized to realize the semiconductor device having improved reliability. Additionally, the air gap AG may be disposed between the first and second protecting spacers 143a and 155a. Thus, the line pattern 140 and the contact plug 250 may be protected by the first and second protecting spacers 143a and 155a.

The data storage part DSP of FIG. 19 may be realized as the data storage part DSP of FIG. 3A or the data storage part DSP' of FIG. 3B.

FIGS. 20 to 24 are cross-sectional views illustrating a method of manufacturing a semiconductor device according to other embodiments of the inventive concept. A method of manufacturing a semiconductor device according to the present embodiment may include the processes described with reference to FIGS. 4A to 11A, 4B to 11B, and 4C to 11C in the first embodiment mentioned above.

Figure 20:
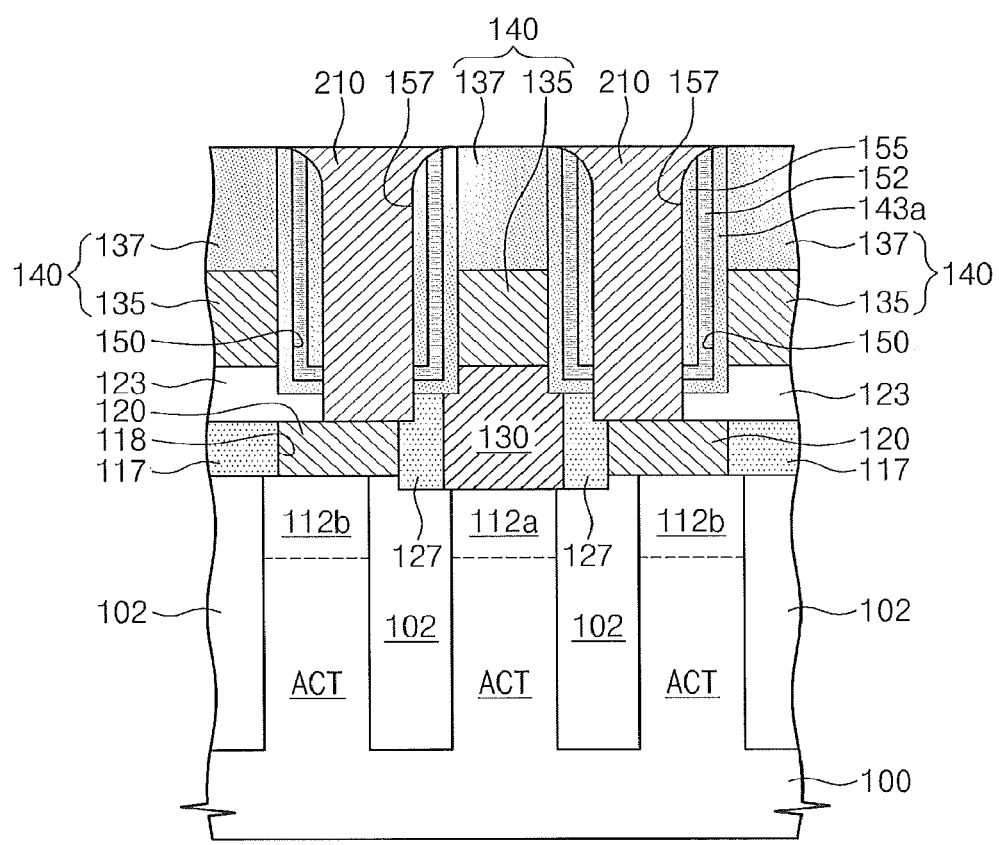
FIGS. 20 to 24 are cross-sectional views illustrating a method of manufacturing a semiconductor device according to other embodiments of the inventive concept.

Referring to FIG. 20, a conductive layer filling the contact holes 157 may be formed on the substrate 100 and then the conductive layer may be planarized to form a preliminary contact plug 210 filling each of the contact holes 157. The preliminary contact plug 210 may be formed of a first conductive material. For example, the preliminary contact plug 210 may be formed of a doped semiconductor material (e.g., doped silicon).

Figure 21:
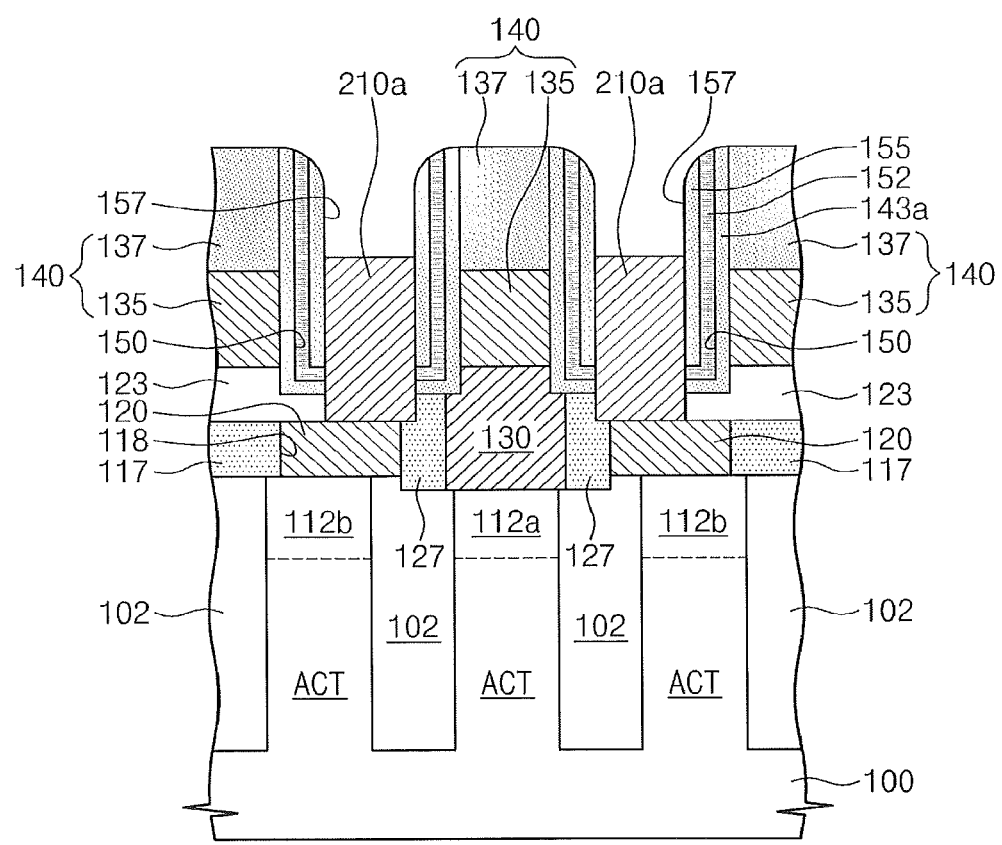

Referring to FIG. 21, the preliminary contact plug 210 may be recessed to form a lower plug 210a filling a lower part of the contact hole 157.

Figure 22:
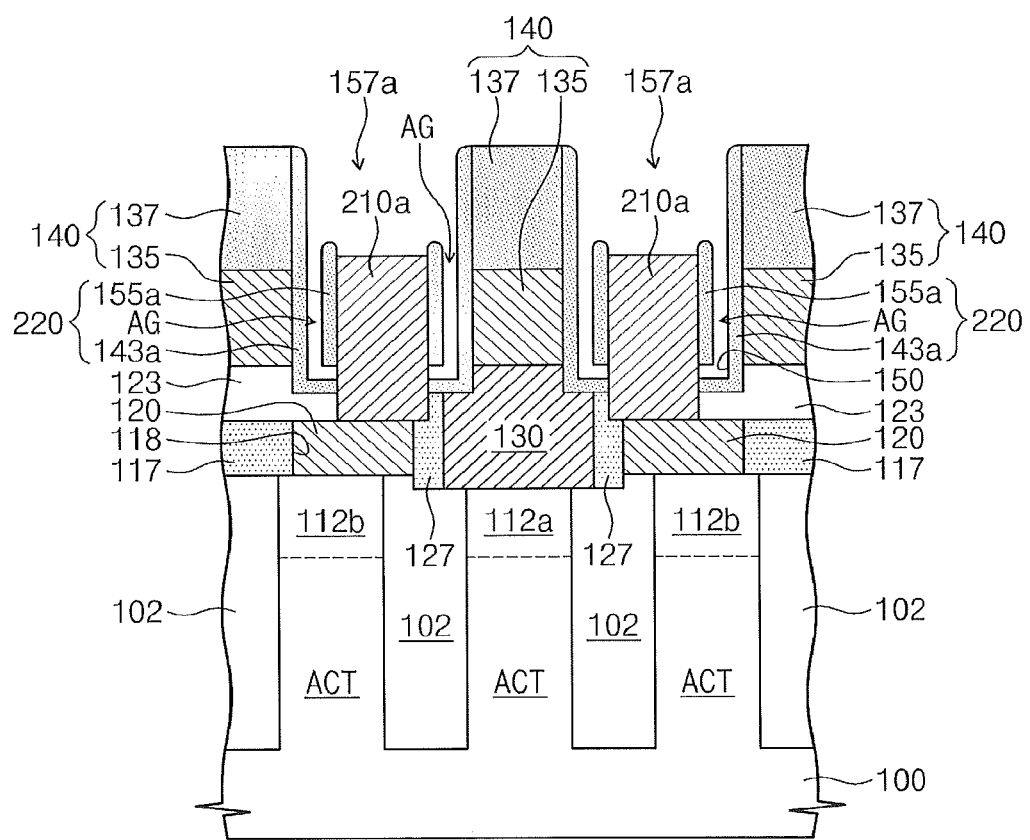

Referring to FIG. 22, subsequently, the sacrificial spacer 152 may be removed by an isotropic etching process. Thus, an air gap AG may be formed between the lower plug 210a and the line patterns 140. When the sacrificial spacer 152 is removed, an upper portion of the second protecting spacer 155 may be removed. Thus, as illustrated in FIG. 22, a top end of the second protecting spacer 155a of which the upper portion is removed may be lower than the top surface of the line pattern 140. Additionally, a width of an upper part of a contact hole 157a may become wide. In other embodiments, when the sacrificial spacer 152 is removed, the second protecting spacer 155a contacting the lower plug 210a may be removed and at least a portion of the first protecting spacer 143a may remain. In still other embodiments, the first and second protecting spacers 143a and 155a may be removed when the sacrificial spacer 152 is removed.

Figure 23:
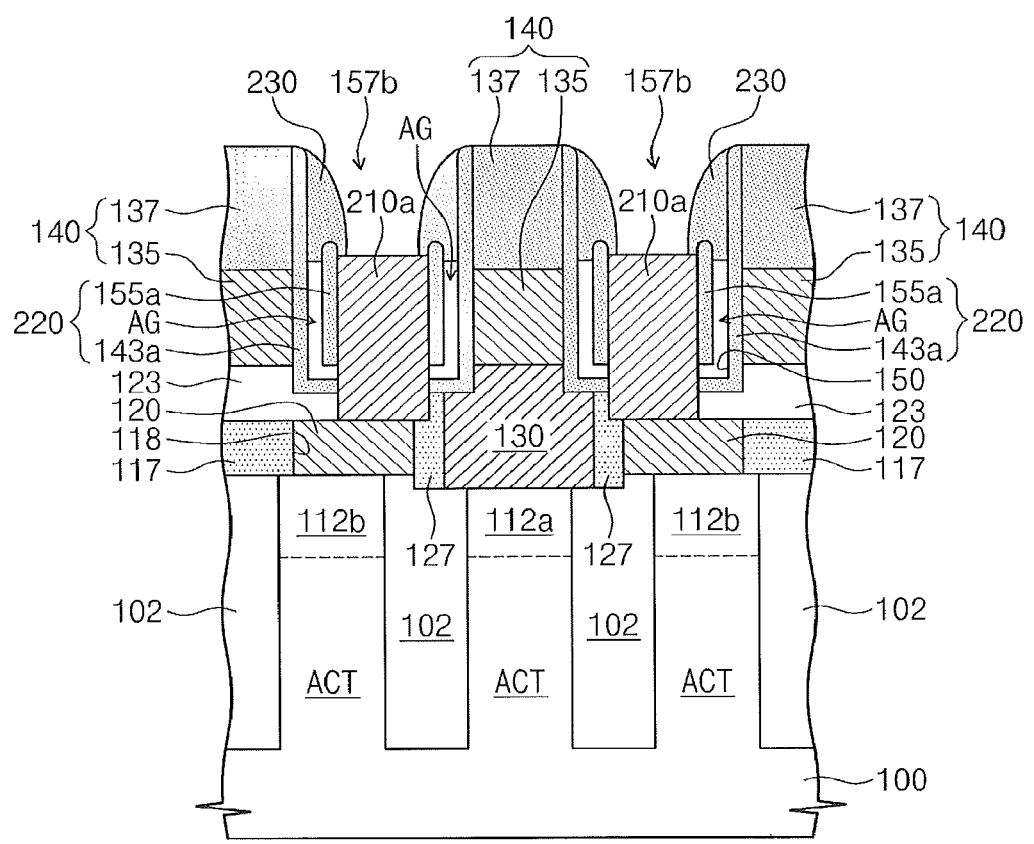

Referring to FIG. 23, next, a capping spacer layer may be formed on the substrate 100 and then the capping spacer layer may be anisotropically etched until a top surface of the lower plug 210a is exposed. Thus, a capping spacer 230 may be formed on an inner sidewall of the upper part of the contact hole 157a. A step coverage property of the capping spacer layer may be poor. Thus, the capping spacer 230 may not fill the air gap AG but close the top end of the air gap AG. The capping spacer 230 may cover the second protecting spacer 155a.

A spacer structure 220 may include the first protecting spacer 143a, the air gap AG, and the second protecting spacer 155a, which are disposed between the lower plug 210a and the line pattern 140. A contact hole 157b surrounded by the capping spacer 230 may expose the lower plug 210a.

Figure 24:
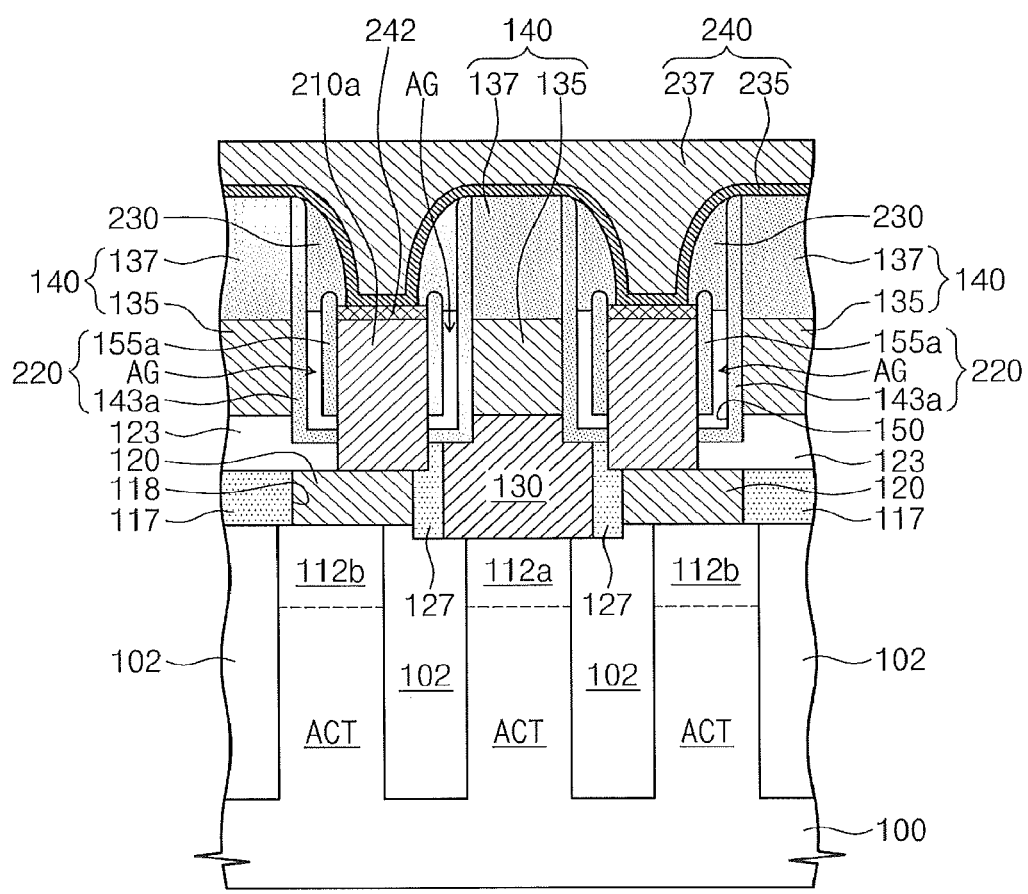

Referring to FIG. 24, a conductive layer 240 may be formed on the substrate 100 having the contact hole 157b and the capping spacer 230. The conductive layer 240 may fill the contact hole 157b. The conductive layer 240 may include a barrier conductive layer 235 and a metal layer 237, which are sequentially stacked. For example, the barrier conductive layer 235 may include a transition metal. The transition metal of the barrier conductive layer 235 may react with a semiconductor material of the lower plug 210a, thereby forming an ohmic layer 242. The ohmic layer 242 may be formed by a thermal energy. The thermal energy for the formation of the ohmic layer 242 may be supplied by a process temperature of a deposition process of the barrier conductive layer 235 or an additional thermal process.

Next, the conductive layer 240 may be patterned to form the upper plug 240c and the landing pad 240L of FIG. 19. Thus, the contact plug 250 of FIG. 19 may be formed. Subsequently, the second interlayer insulating layer 173, the via-plug 175, and the data storage part DSP of FIG. 19 may be formed to realize the semiconductor device of FIG. 19.

Third Embodiment

In the present embodiment, the same elements as described in the first embodiment will be indicated by the same reference numerals or the same reference designators. For the purpose of ease and convenience in explanation, the descriptions to the same elements as in the first embodiment will be omitted or mentioned briefly. That is, differences between the present embodiment and the first embodiment will be mainly described hereinafter.

Figure 25A:
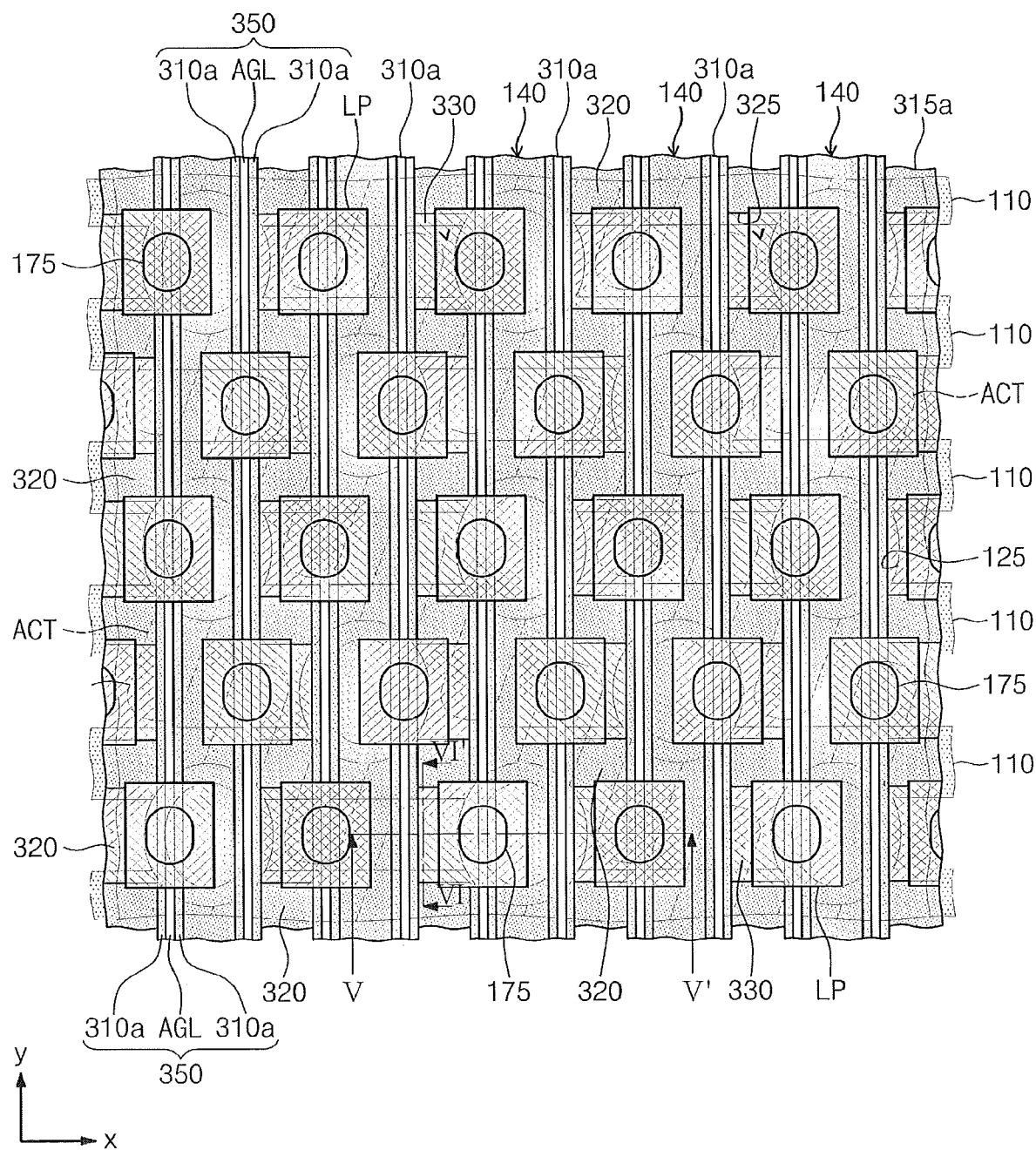
FIG. 25A is a plan view illustrating a semiconductor device according to still other embodiments of the inventive concept.
Figure 25B:
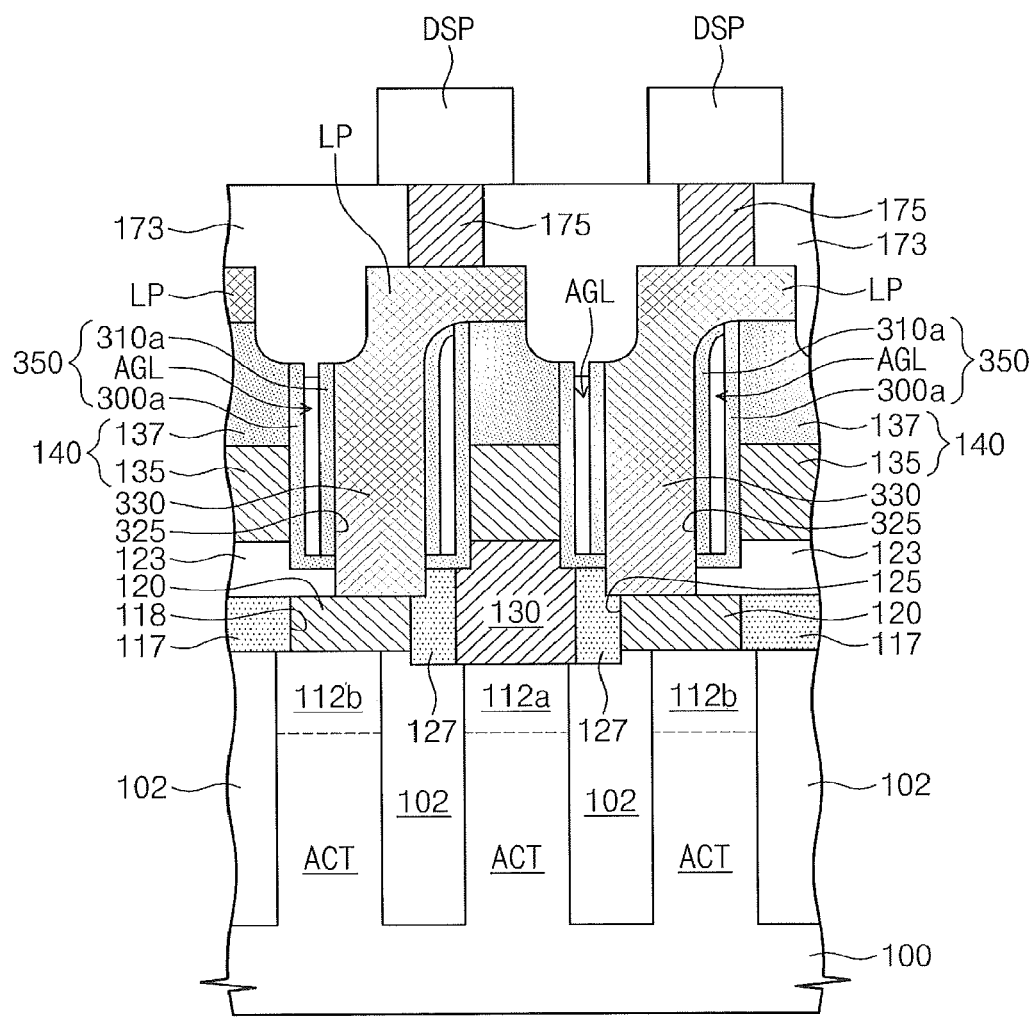
FIG. 25B is a cross-sectional view taken along a line V-V' of FIG. 25A.
Figure 25C:
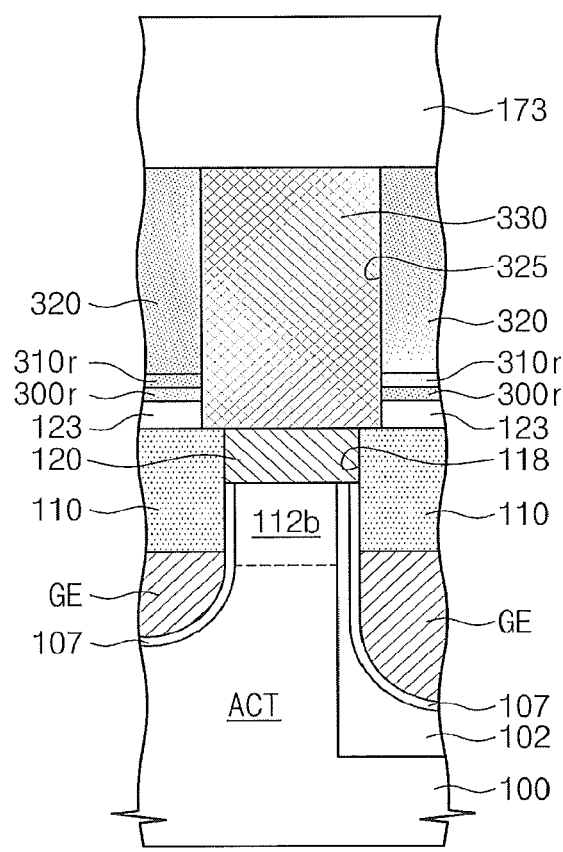
FIG. 25C is a cross-sectional view taken along a line VI-VI' of FIG. 25A.
Figure 25D:
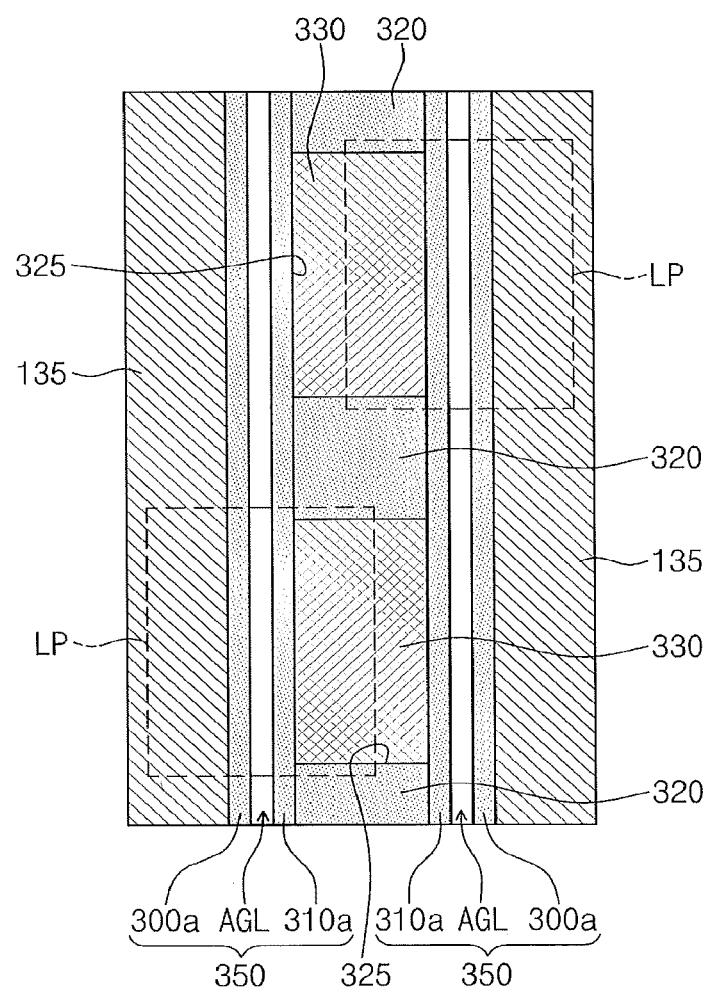
FIG. 25D is an enlarged view of a spacer-structure including an air gap illustrated in FIG. 25A.

FIG. 25A is a plan view illustrating a semiconductor device according to still other embodiments of the inventive concept. FIGS. 25B and 25C are cross-sectional views taken along lines V-V' and VI-VI' of FIG. 25A. FIG. 25D is an enlarged view of a spacer-structure including an air gap illustrated in FIG. 25A.

Referring to FIGS. 25A to 25D, contact plugs 330 may be disposed between a pair of line patterns 140 adjacent to each other. The contact plugs 330 are spaced apart from each other. Each of the contact plugs 330 may be connected to each of the base conductive pads 120. A spacer structure 350 including an air gap AGL may be disposed between the contact plug 330 and each of the line patterns 140. In a plan view, the spacer structure 350 may have a line-shape extending along the sidewall of the line pattern 140. Thus, the air gap AGL may also extend along the sidewall of the line pattern 140 in a plan view.

The spacer structure 350 may further include a first protecting spacer 300a covering the sidewall of the line pattern 140 and a second protecting spacer 310a adjacent to the contact plug 330. The first and second protecting spacers 300a and 310a may also have line-shapes extending along the sidewall of the line pattern 140. The first and second protecting spacers 300a and 310a may be formed of an insulating material. For example, the first and second protecting spacers 300a and 310a may include silicon nitride and/or silicon oxynitride.

The contact plug 330 may be disposed in a contact hole 325 defined between the pair of line patterns 140 adjacent to each other. In some embodiments, upper insulating fences 320 may be disposed between a pair of the spacer structures 350, which are disposed between the pair of line patterns 140 adjacent to each other. The contact hole 325 may be defined by a pair of the upper insulating fences 320 and the pair of the spacer structures 350, which are disposed between the pair of line patterns 140 adjacent to each other. Thus, each of bottom surfaces of the contact hole 325 and the contact plug 330 may have a quadrangular shape. In some embodiments, as illustrated in FIG. 25C, the air gap may not exist between the upper insulating fence 320 and the contact plug 330. The upper insulating fences 320 may include silicon nitride and/or silicon oxynitride. In some embodiments, as illustrated in FIG. 25C, an extending portion 300r of the first protecting spacer 300a may be disposed between a bottom surface of the upper insulating fence 320 and the first interlayer insulating layer 123. Additionally, an extending portion 310r of the second protecting spacer 310a may be disposed between a bottom surface of the upper insulating fence 320 and the extending portion 300r of the first protecting spacer 300a.

As illustrated in FIGS. 25A and 25D, a landing pad LP may extend from a top end of the contact plug 330 to cover a first part of the air gap AGL. The air gap AGL may include a second part not covered by the landing pad LP. As illustrated in FIG. 25B, a height of the first part of the air gap AGL may be greater than a height of the second part of the air gap AGL.

Top ends of the first and second protecting spacers 300a and 310a under the landing pad LP may be in contact with each other. Thus, a top end of the first part of the air gap AGL may be covered by the top ends of the first and second protecting spacers 300a and 310a under the landing pad LP, which are in contact with each other. The inventive concept is not limited thereto. In other embodiments, as described with reference to FIG. 1B, the top ends of the first and second protecting spacers 300a and 310a under the landing pad LP may be spaced apart from each other, and the top end of the first part of the air gap AGL may be closed by the landing pad LP.

A top end of the second part of the air gap AGL may be closed by a second interlayer insulating layer 173. Top ends of the first and second protecting spacers 300a and 310a adjacent to the second part of the air gap AGL may be lower than the top ends of the first and second protecting spacers 300a and 310a under the landing pad LP.

The contact plug 330 and the landing pad LP may be formed of the same materials as the contact plug 160 and the landing pad LP in the first embodiment described above, respectively. Alternatively, the contact plug 330 and the landing pad LP may be replaced with the contact plug 250 and the landing pad 240L of FIG. 19. In some embodiments, the air gap AG of FIG. 19 may also extend along the sidewall of the line pattern 140 like the air gap AGL.

The data storage part DSP illustrated in FIG. 25B may be realized as the data storage part DSP of FIG. 3A or the data storage part DSP' of FIG. 3B.

FIGS. 26A to 30A are plan views illustrating a method of manufacturing a semiconductor device according to still other embodiments of the inventive concept. FIGS. 26B to 30B are cross-sectional views taken along lines V-V' of FIGS. 26A to 30A, respectively. FIGS. 26C to 30C are cross-sectional views taken along lines VI-VI' of FIGS. 26A to 30A, respectively. A method of manufacturing a semiconductor device according to the present embodiment may include the processes described with reference to FIGS. 4A to 9A, 4B to 9B, and 4C to 9C.

Figure 26A:
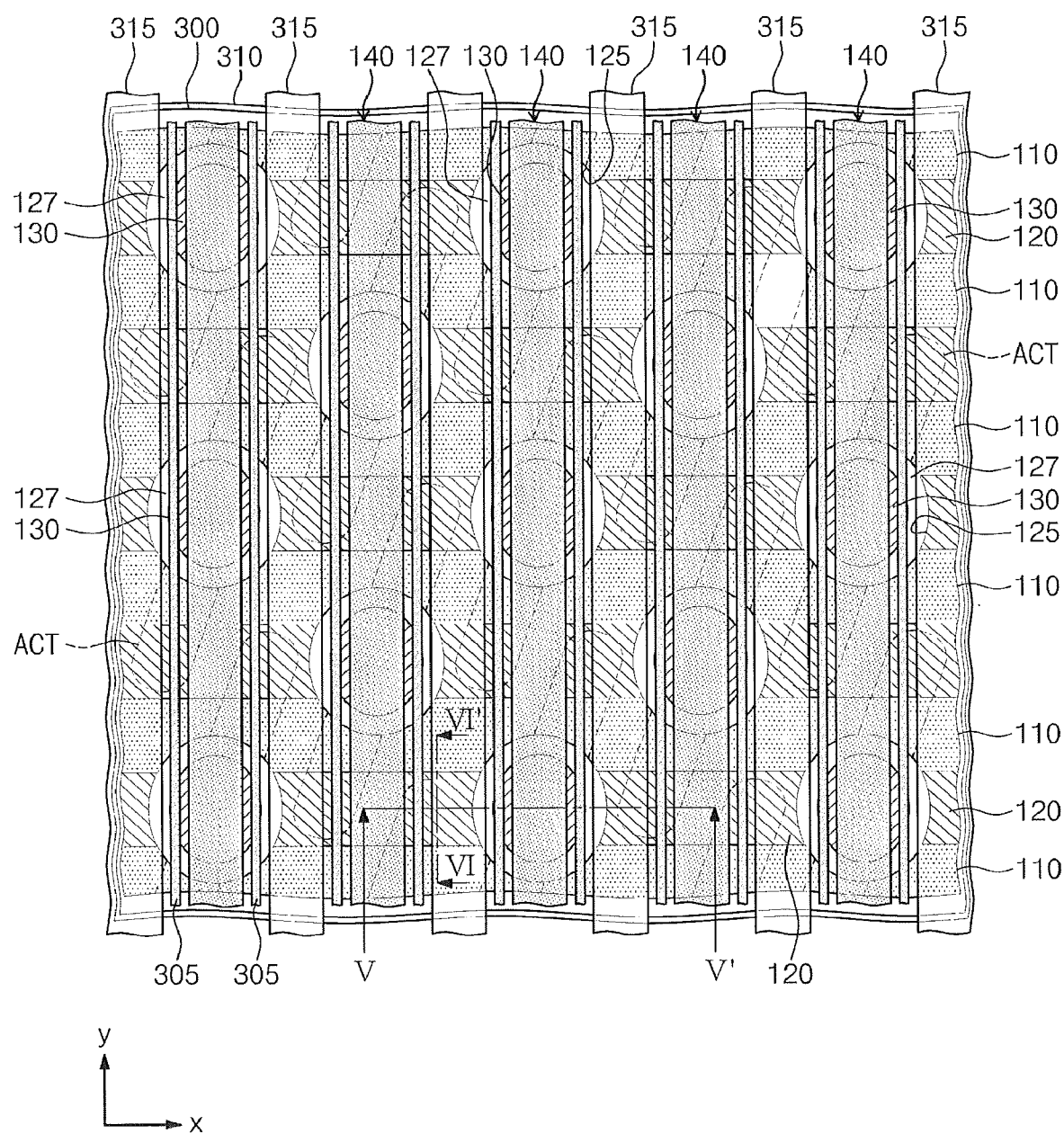
Figure 26B:
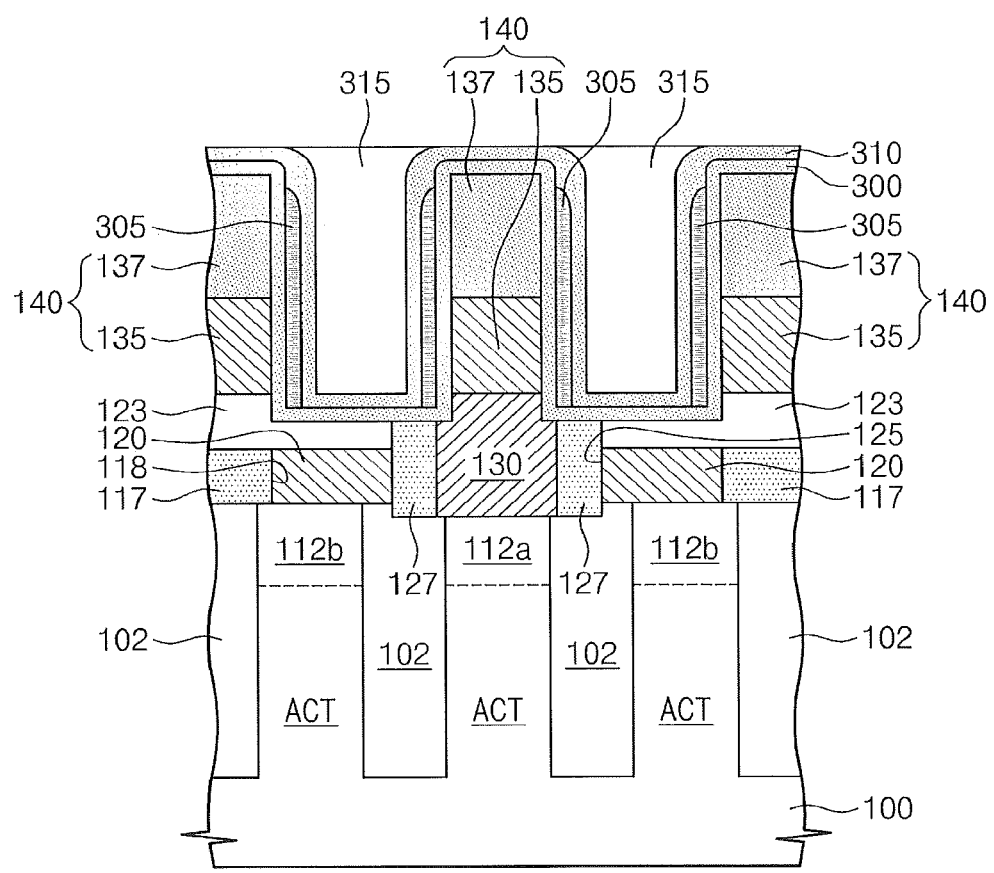
Figure 26C:
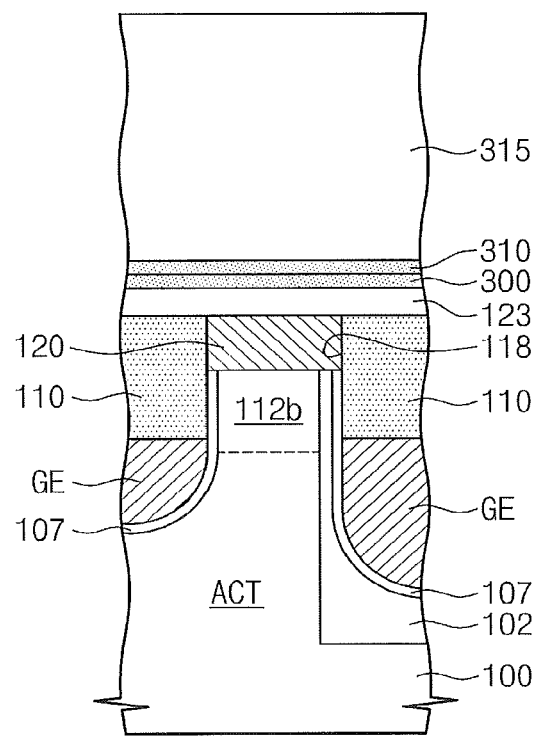

Referring to FIGS. 26A to 26C, a first protecting spacer layer 300 may be conformally formed on the substrate 100 having line patterns 140. A sacrificial spacer layer may be conformally formed on the first protecting spacer layer 300 and then the sacrificial spacer layer may be anisotropically etched to form a sacrificial spacer 305. The sacrificial spacer 305 may have a line-shape extending along one sidewall of each of the line patterns 140. A top end of the sacrificial spacer 305 may be lower than a top surface of the line pattern 140 due to over-etch.

A second protecting spacer layer 310 may be conformally formed on the substrate 100 having the sacrificial spacer 305. The second protecting spacer layer 310 covers the sacrificial spacer 305. The first and second protecting spacer layers 300 and 310 may be formed of an insulating material having an etch selectivity with respect to the sacrificial spacer 305. For example, the sacrificial spacer 305 may be formed of silicon oxide, and the first and second protecting spacer layers 300 and 310 may include silicon nitride and/or silicon oxynitride.

A filling layer may be formed on the substrate 100 having the second protecting spacer 310 and then the filling layer may be planarized to form filling line patterns 315. Each of the filling line patterns 315 may be formed between a pair of the line patterns 140 adjacent to each other. The filling line pattern 315 may be formed of a material having an etch selectivity with respect to the second protecting spacer layer 310. For example, the filling line pattern 315 may be formed of silicon oxide.

Figure 27A:
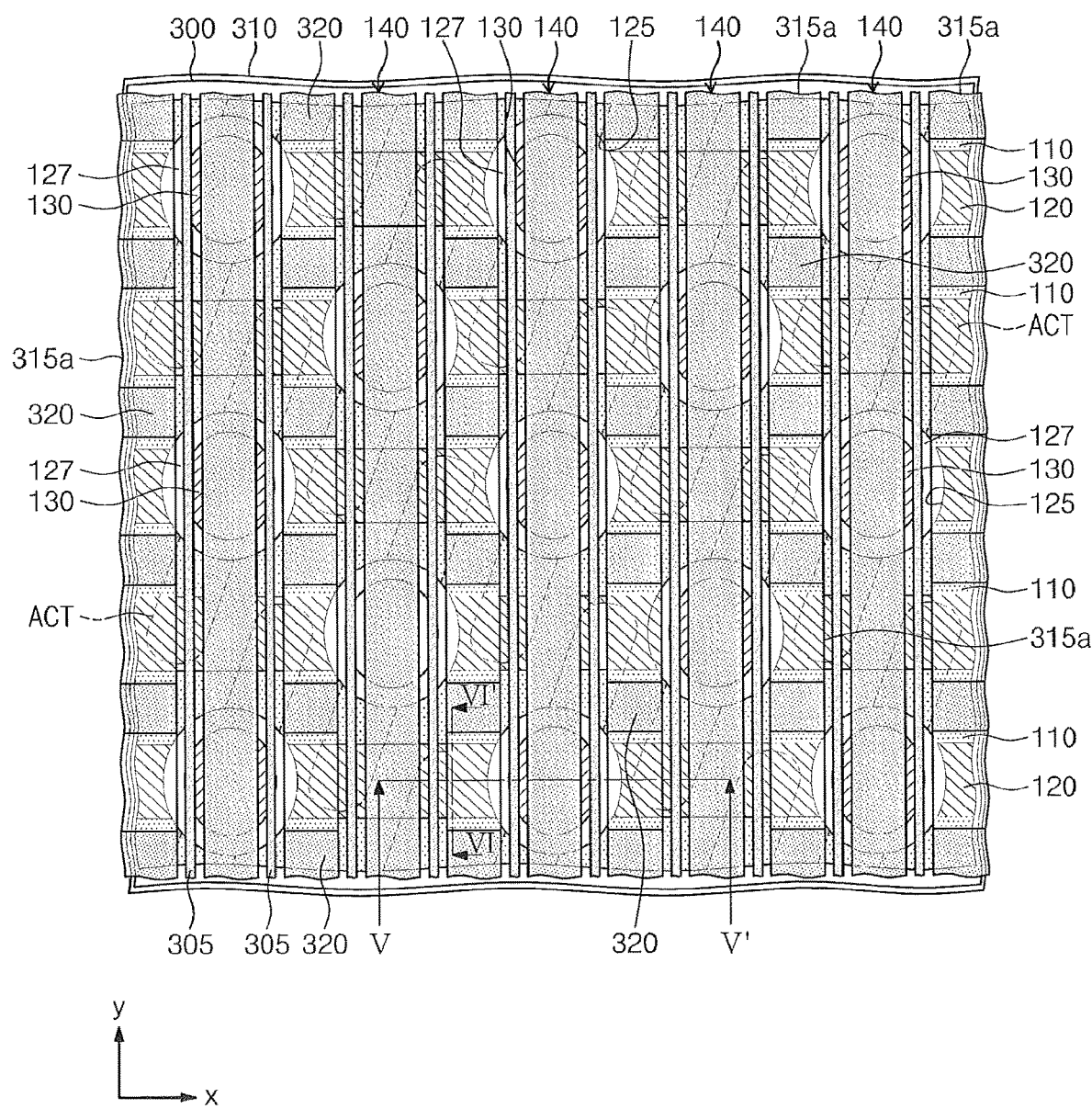
Figure 27B:
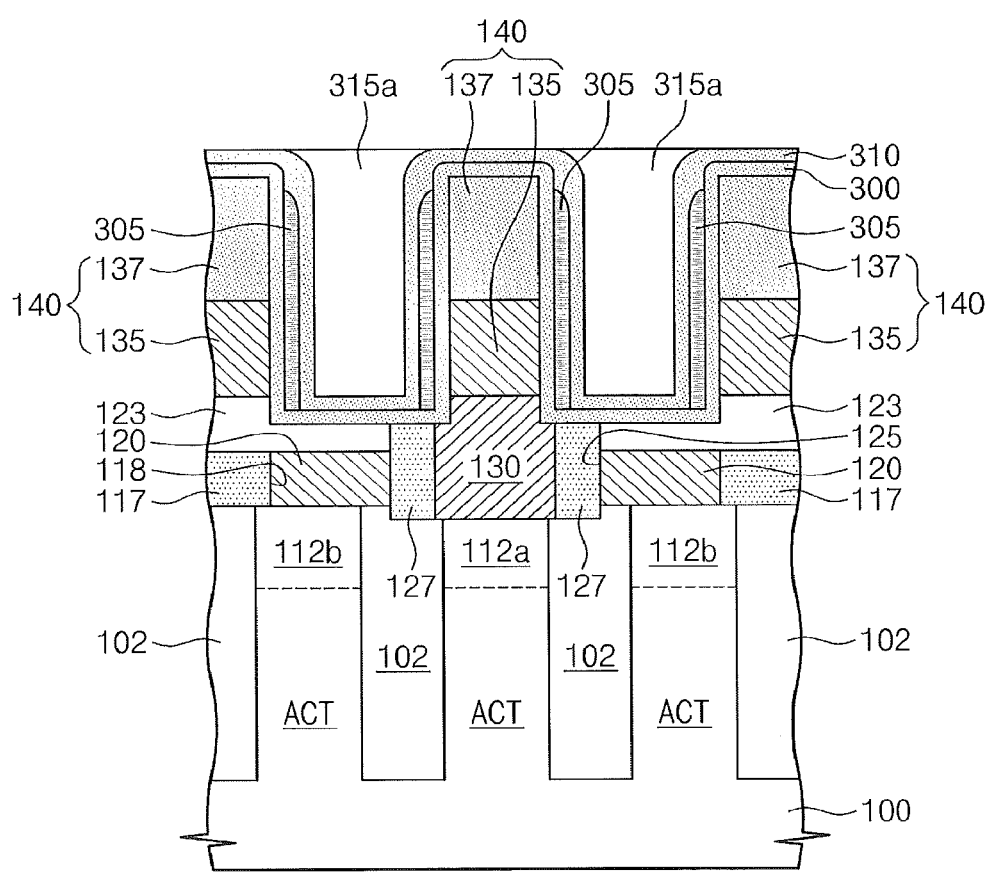
Figure 27C:
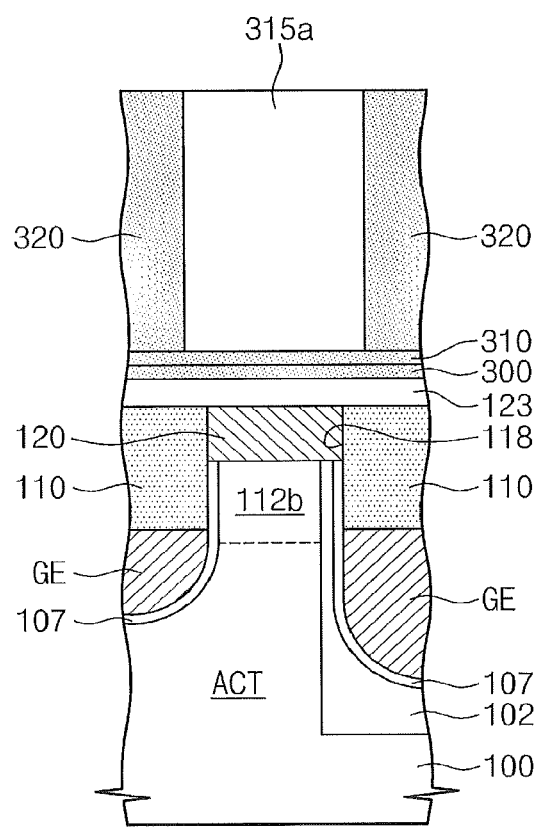

Referring to FIGS. 27A to 27C, the filling line pattern 315 may be patterned to form concave regions and filling patterns 315a. A fence insulating layer may be formed on the substrate 100 to fill the concave regions, and then the fence insulating layer may be planarized to form upper insulating fences 320. A bottom surface and both sidewalls of the upper insulating fence 320 may be covered by the second protecting spacer layer 310 disposed between the pair of the line patterns 140 adjacent to each other. The upper insulating fences 320 may be formed of an insulating material having an etch selectivity with respect to filling patterns 315a. For example, the upper insulating fences 320 may be formed of silicon nitride and/or silicon oxynitride. The filling patterns 315a may be formed over the base conductive pads 120, respectively.

Figure 28A:
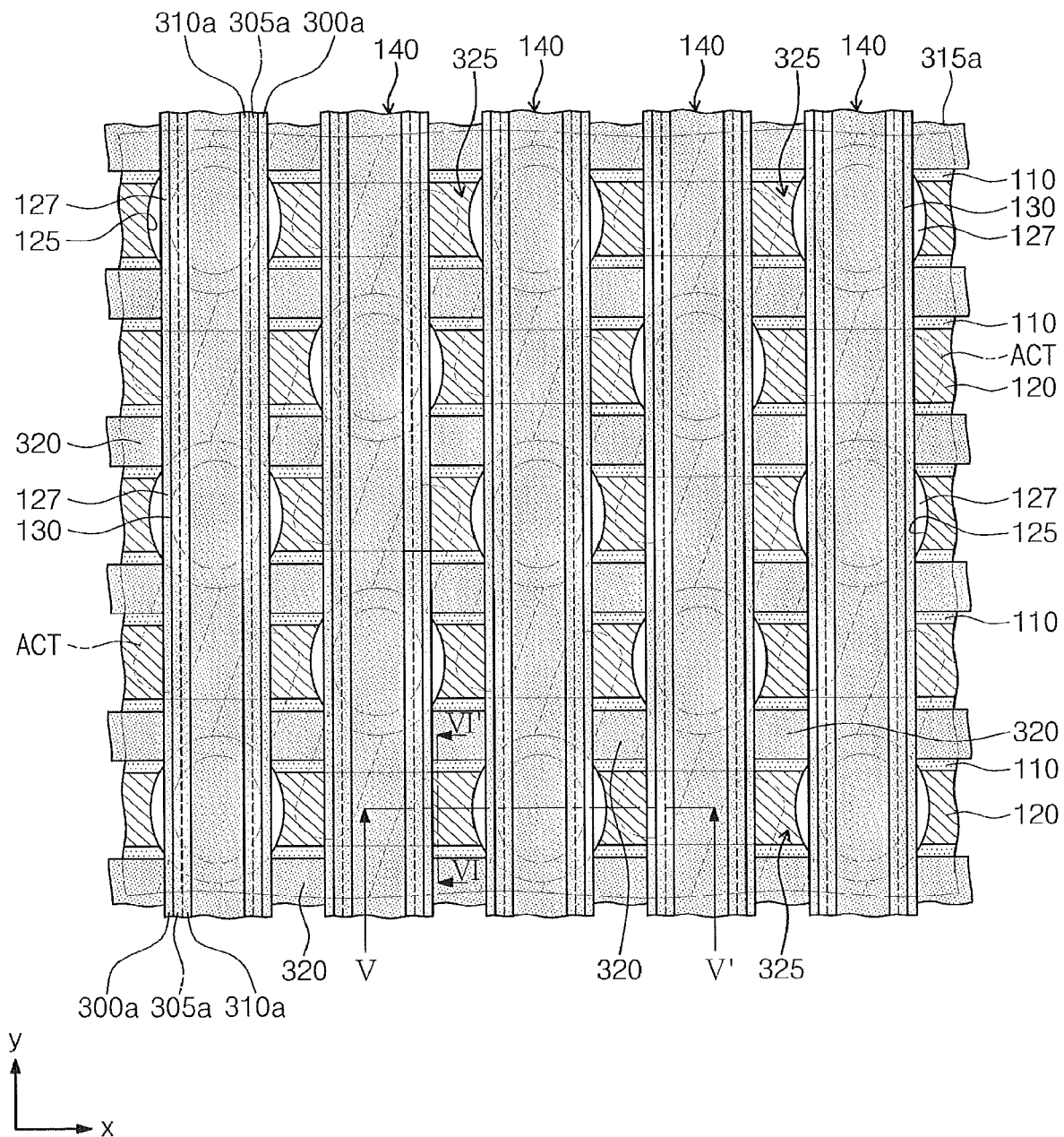
Figure 28B:
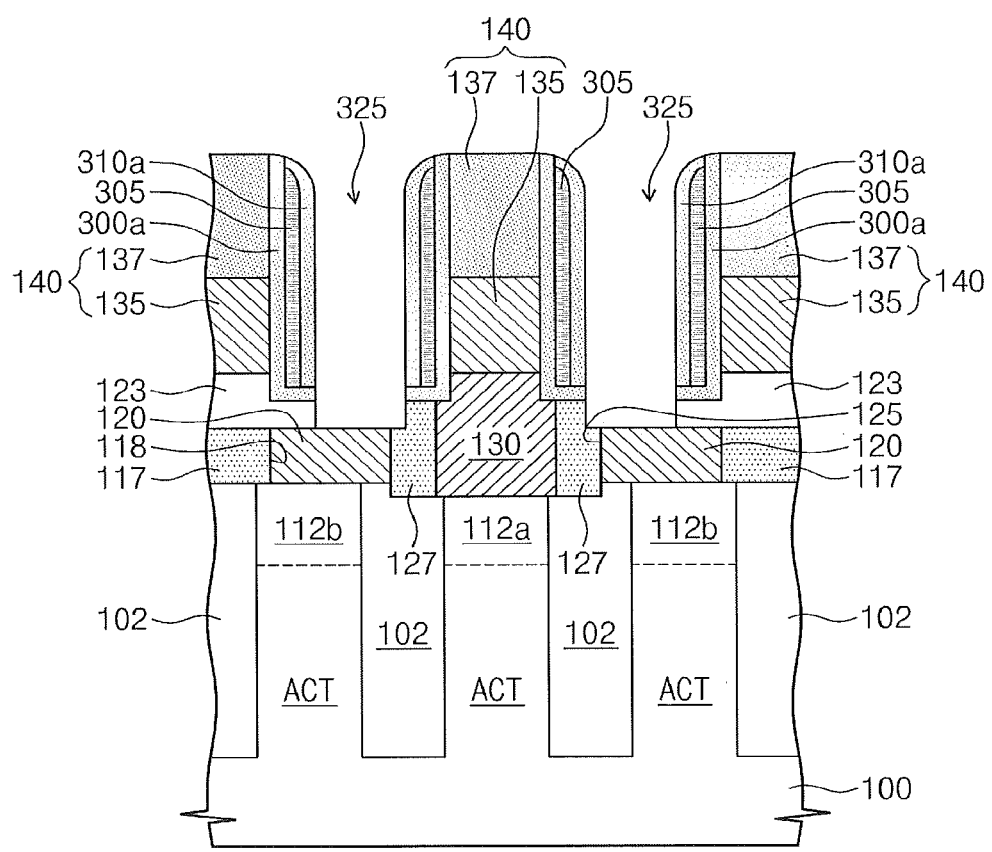
Figure 28C:
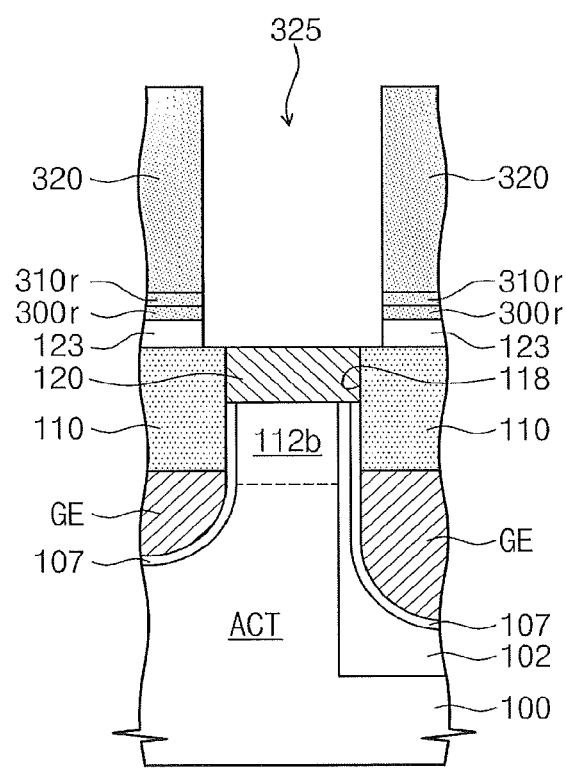

Referring to FIGS. 28A to 28C, the filling patterns 315a may be removed to form preliminary contact holes. Each of the preliminary contact holes may expose the second protecting spacer layer 310 between the line patterns 140.

Subsequently, the second protecting spacer layer 310, the first protecting spacer layer 300, and the first interlayer insulating layer 123 may be successively and anisotropically etched to form contact holes 325, first protecting spacers 300a, and second protecting spacers 310a. Each of the contact holes 325 may expose the base conductive pad 120. The first and second protecting spacers 300a and 310a disposed on one sidewall of the line pattern 140 may surround the sacrificial spacer 305. Portions 310r and 300r of the second and first protecting spacer layers under the upper insulating fence 320 may remain.

Figure 29A:
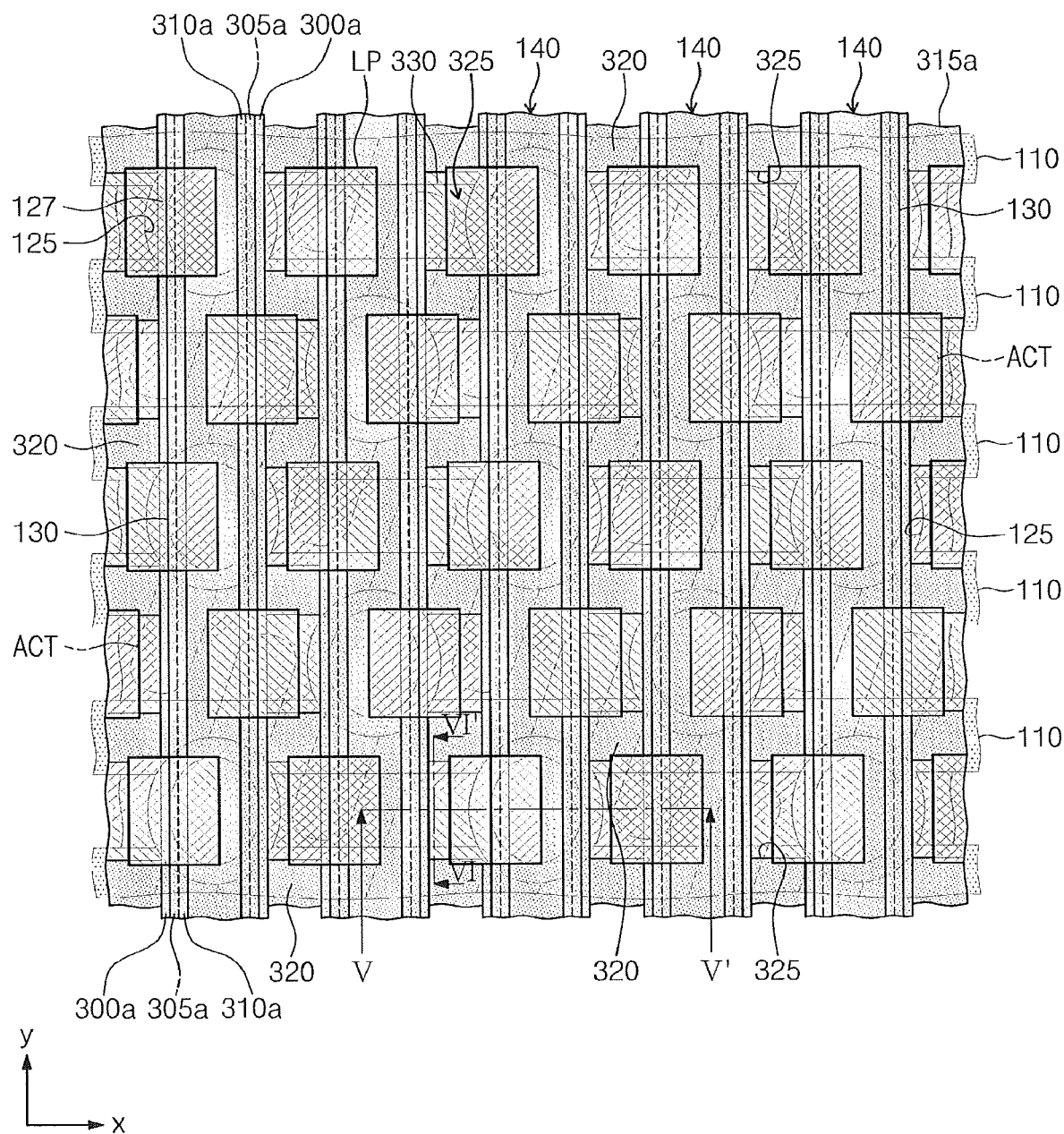
Figure 29B:
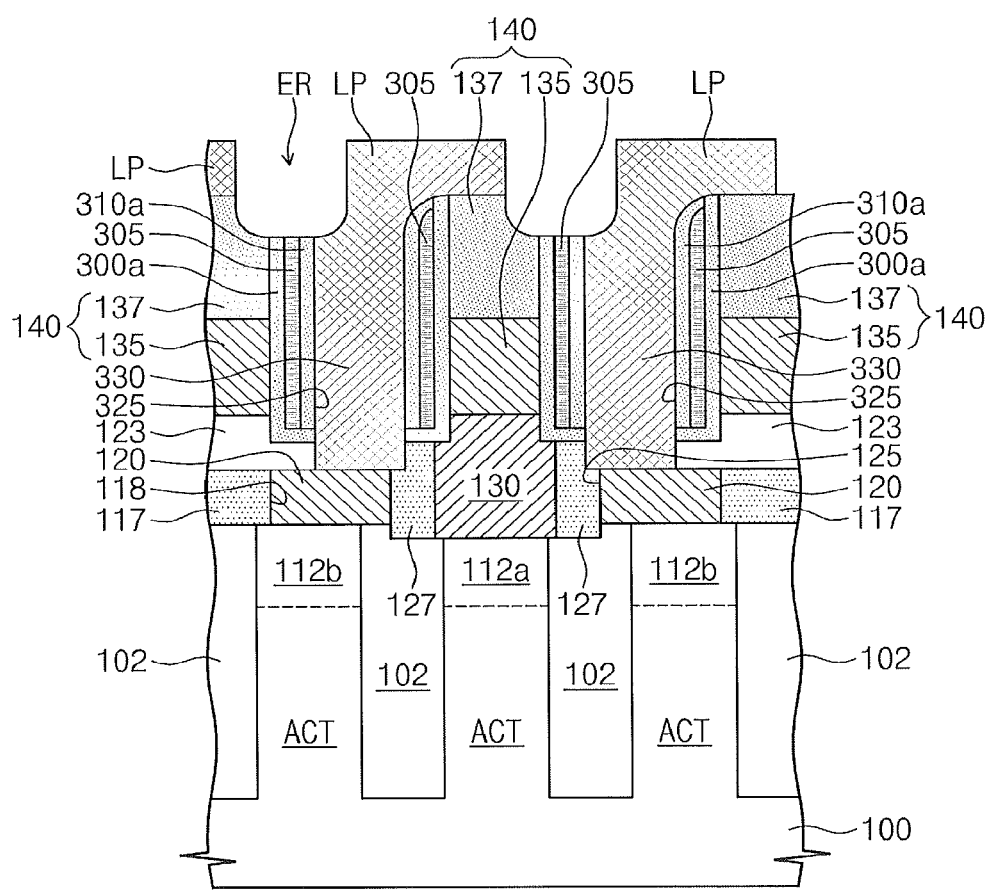
Figure 29C:
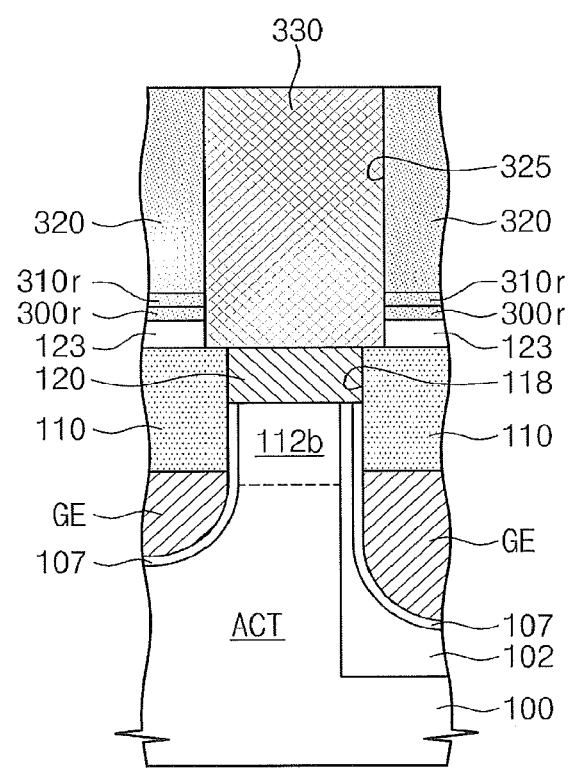

Referring to FIGS. 29A to 29C, a conductive layer may be formed on the substrate 100 to fill the contact holes 325, and then the conductive layer may be patterned to form a contact plug 330 filling each of the contact holes 325 and a landing pad LP extending from a top end of the contact plug 330. The sacrificial spacer 305 may include a first portion and a second portion. The first portion of the sacrificial spacer 305 is covered by the landing pad LP, and the second portion of the sacrificial spacer 305 is not covered by the landing pad LP. Top ends of the first and second protecting spacers 300a and 310a adjacent to the second portion of the sacrificial spacer 305 may be etched when the conductive layer is patterned. Thus, the second portion of the sacrificial spacer 305 may be exposed.

Figure 30A:
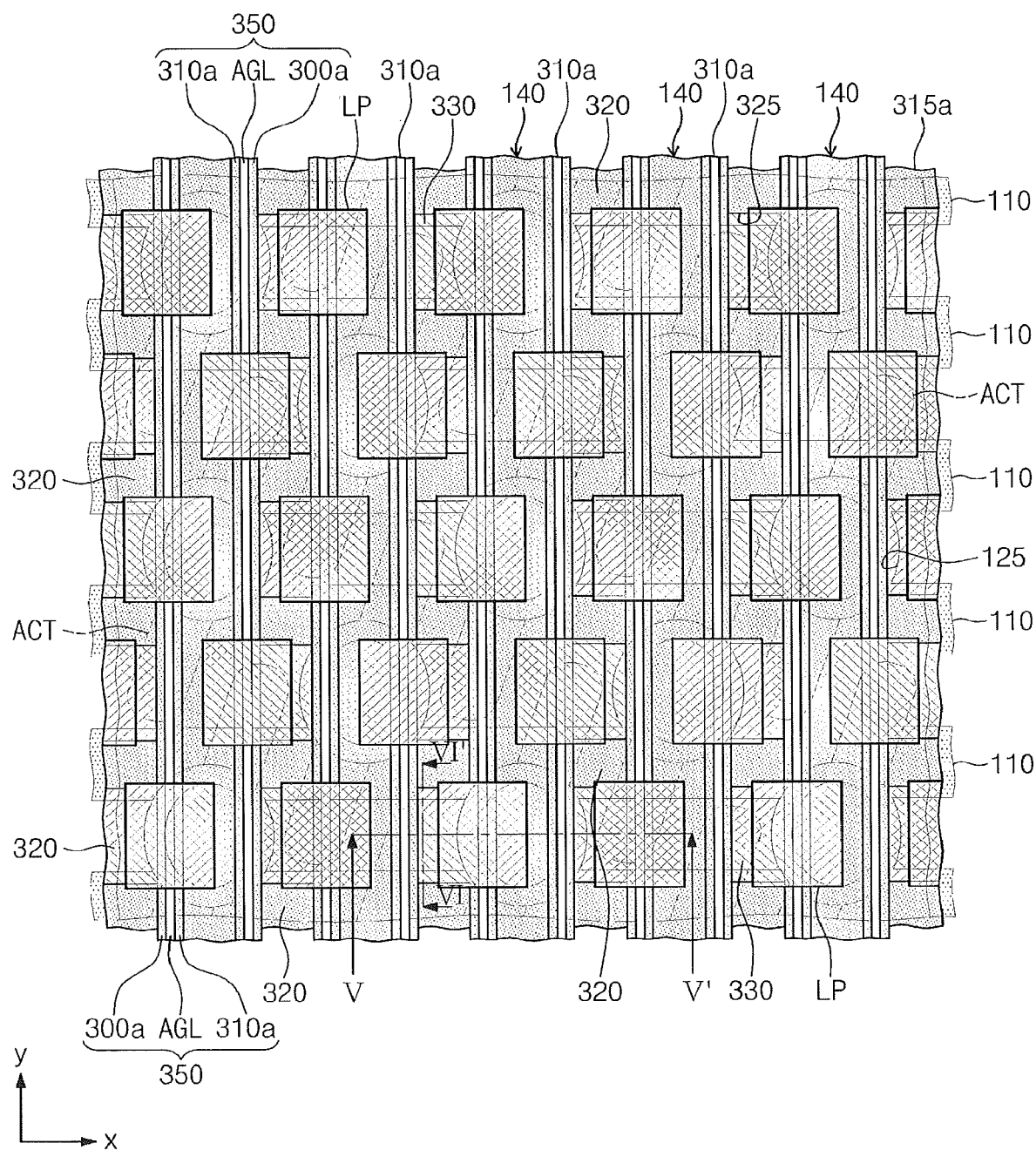
Figure 30B:
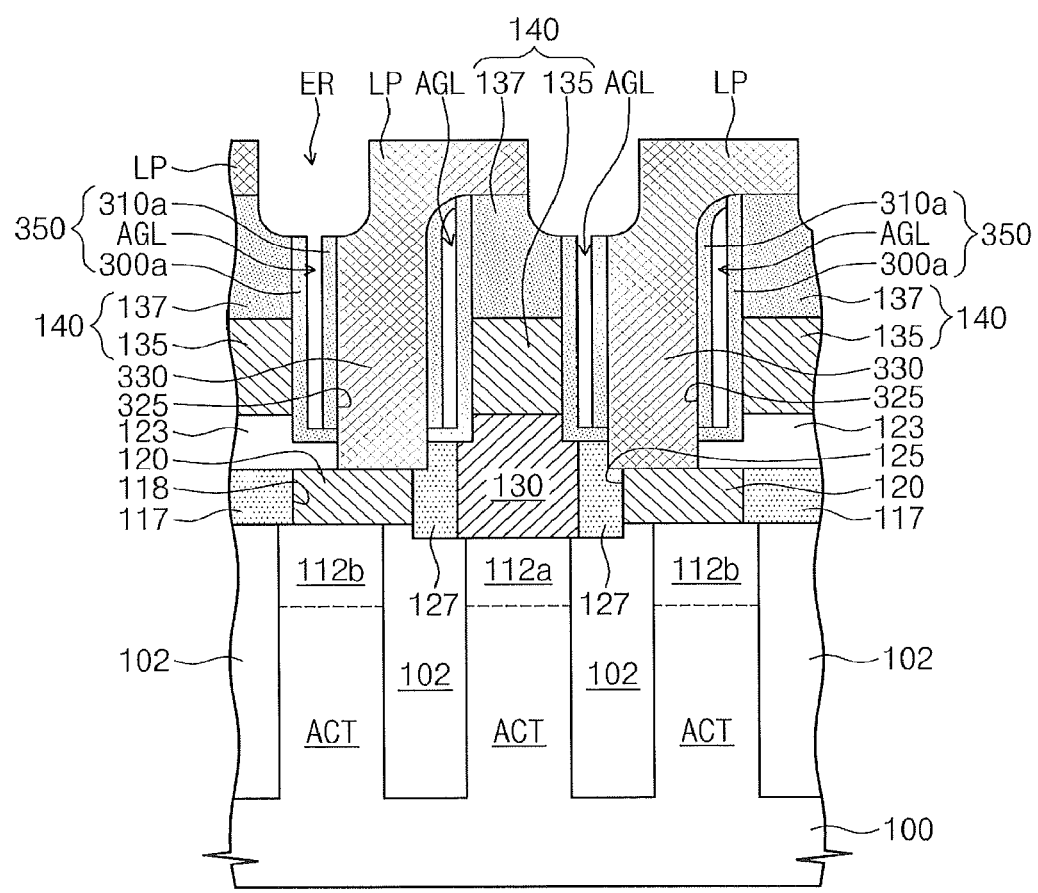
Figure 30C:
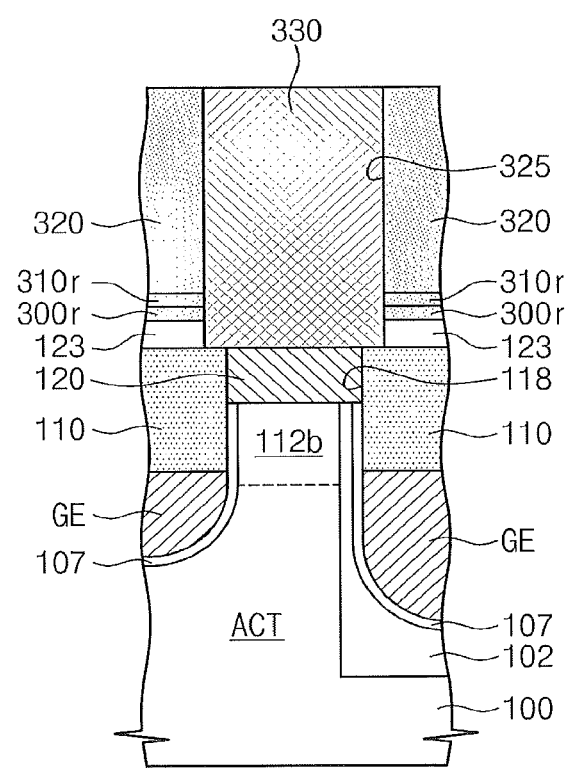

Referring to FIGS. 30A to 30C, the sacrificial spacer 305 is removed by an isotropic etching process through the exposed second portion of the sacrificial spacer 305. At this time, the first portion of the sacrificial spacer 305 is also removed in company with the second portion of the sacrificial spacer 305. As a result, it is possible to form a spacer structure 350 including an air gap AGL. The air gap AGL may be formed between the first and second protecting spacers 300a and 310a.

Next, the second interlayer insulating layer 173 of FIGS. 25B and 25C may be formed. Thus, a part of the air gap AGL, which is not covered by the landing pad LP, may be closed by the second interlayer insulating layer 173. Subsequently, the via-plugs 175 and the data storage parts DSP of FIGS. 25A to 25C may be formed to realize the semiconductor device illustrated in FIGS. 25A to 25C.

Fourth Embodiment

In the present embodiment, the same elements as described in the first embodiment will be indicated by the same reference numerals or the same reference designators. For the purpose of ease and convenience in explanation, the descriptions to the same elements as in the first embodiment will be omitted or mentioned briefly. That is, differences between the present embodiment and the first embodiment will be mainly described hereinafter.

Figure 31A:
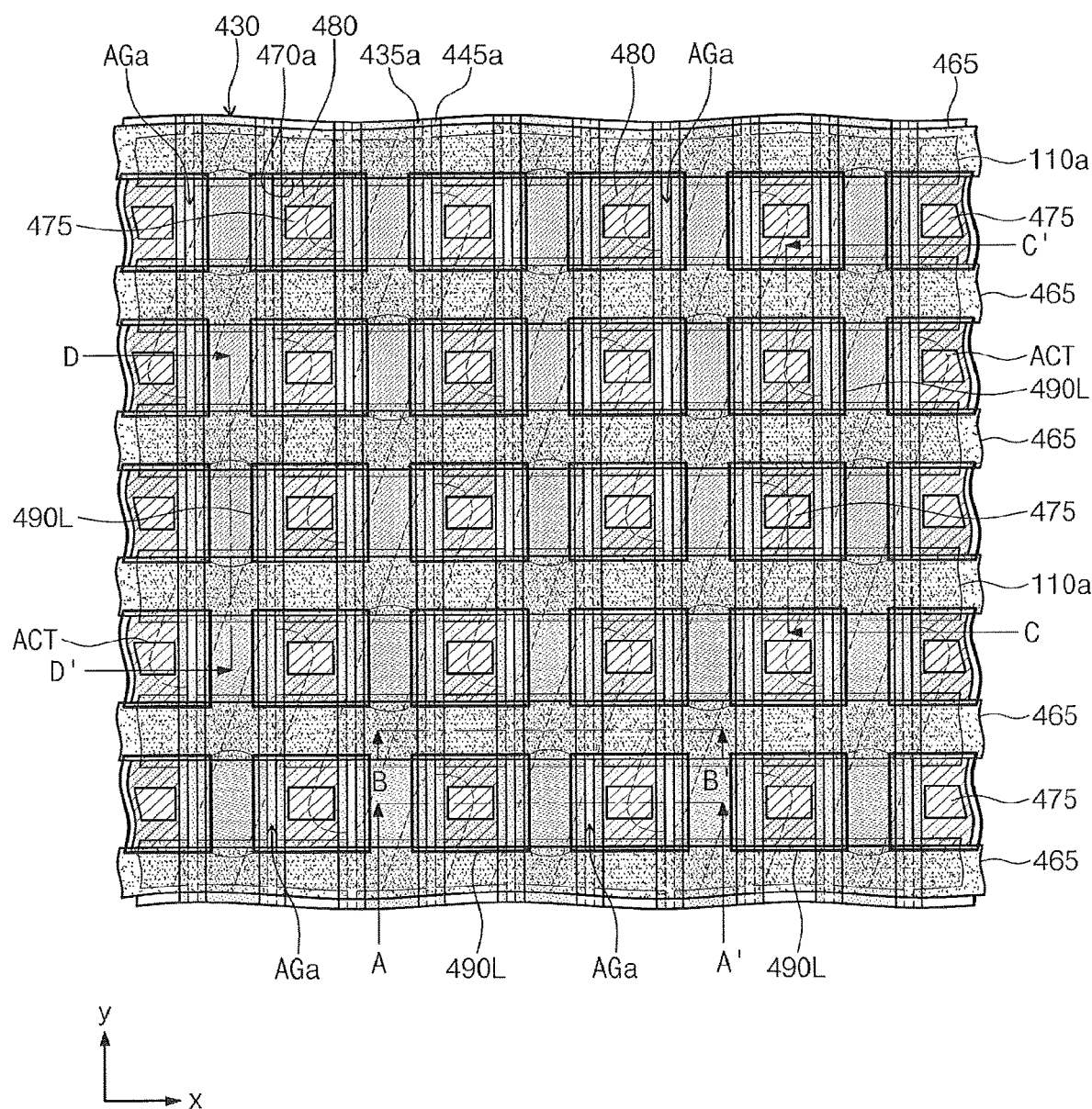
FIG. 31A is a plan view illustrating a semiconductor device according to yet other embodiments of the inventive concept.
Figure 31B:
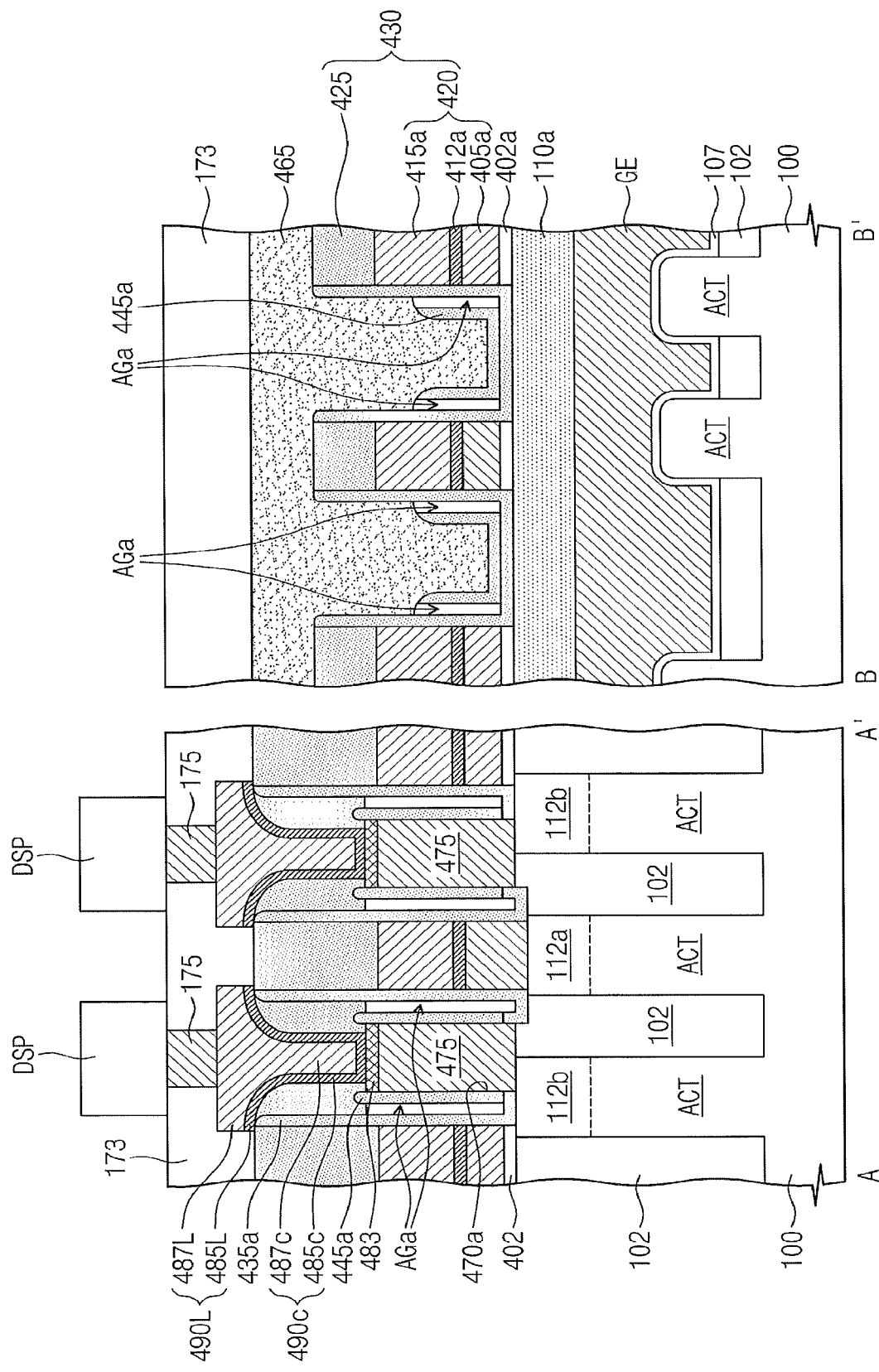
FIG. 31B is a cross-sectional view taken along lines A-A' and B-B' of FIG. 31A.
Figure 31C:
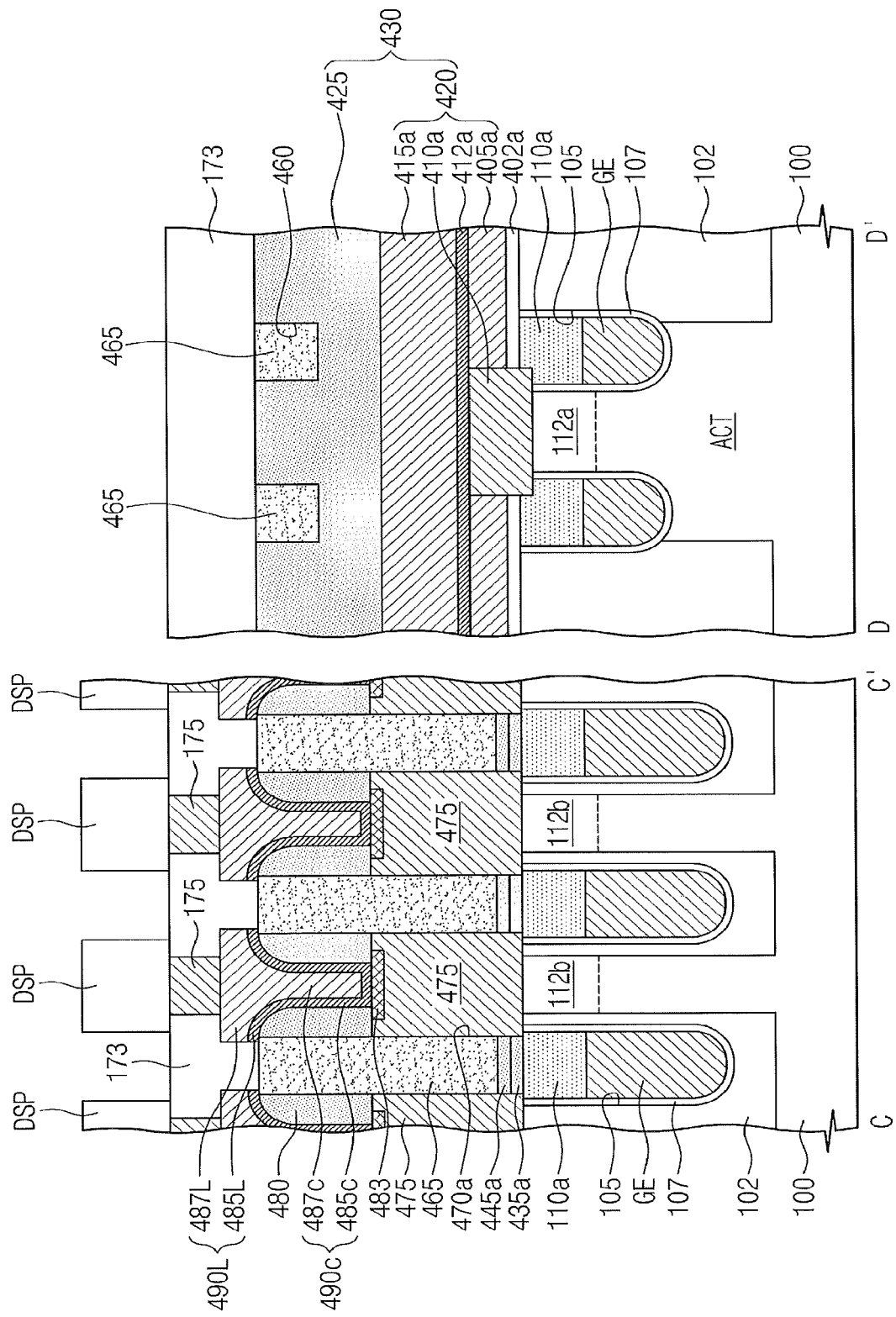
FIG. 31C is a cross-sectional view taken along lines C-C' and D-D' of FIG. 31A.
Figure 31D:
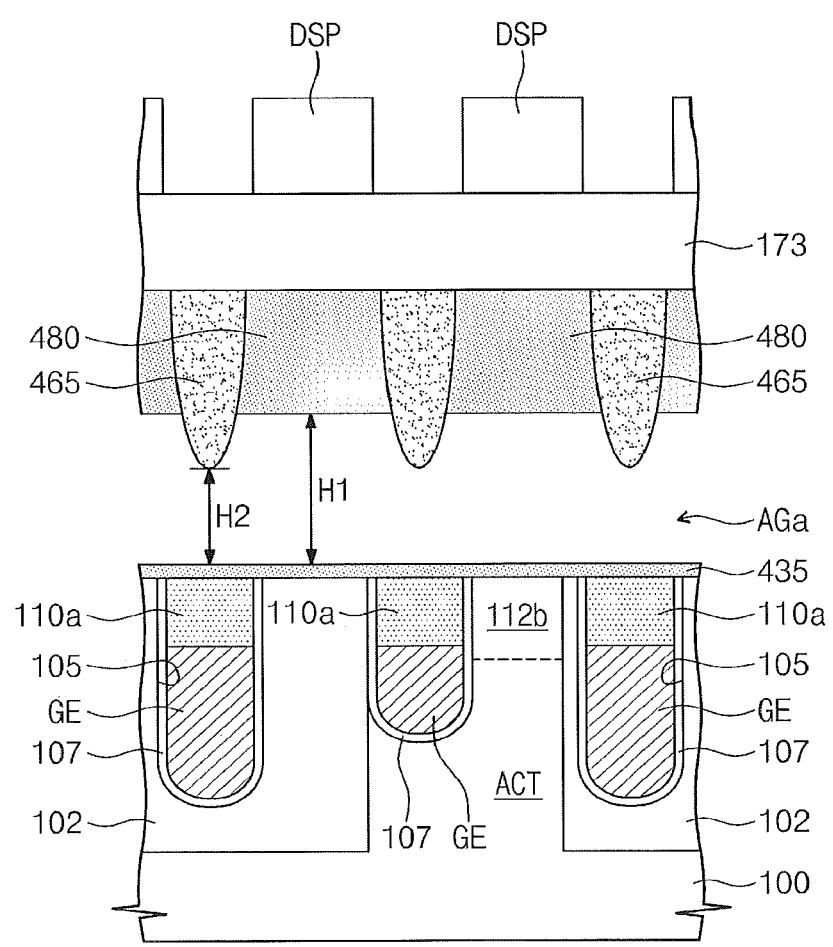
FIG. 31D is a cross-sectional view taken along a longitudinal direction of an air gap of FIG. 31A.

FIG. 31A is a plan view illustrating a semiconductor device according to yet other embodiments of the inventive concept, FIG. 31B is a cross-sectional view taken along lines A-A' and B-B' of FIG. 31A, and FIG. 31C is a cross-sectional view taken along lines C-C' and D-D' of FIG. 31A. FIG. 31D is a cross-sectional view taken along a longitudinal direction of an air gap of FIG. 31A.

Referring to FIGS. 31A to 31D, the lower insulating fence 117 and the base conductive pad 120 in the first to third embodiments described above may be omitted in the present embodiment. In this case, a top surface of a gate capping insulating pattern 110a on each of the gate electrode GE may be disposed at substantially the same level as the top surface of the substrate 100. The gate electrodes GE and the gate capping insulating patterns 110a may extend an x-axis direction of FIG. 31A.

Line patterns 430 may cross over the gate electrodes GE. For example, the line patterns 430 may extend in a y-axis direction of FIG. 31A. Each of the line patterns 430 may be disposed over a plurality of the first doped regions 112a arranged in a longitudinal direction of the line pattern 430. Each of the line patterns 430 may include a conductive wire 420 and a hard mask pattern 425, which are sequentially stacked. As illustrated in FIG. 31C, the conductive wire 420 may include a base conductive pattern 405a and a wire-contact part 410a. A top surface of the wire-contact part 410a may be substantially coplanar with a top surface of the base conductive pattern 405a. The wire-contact part 410a may be in contact with the base conductive pattern 405a. The wire-contact part 410a may include both sidewalls aligned with both sidewalls of the base conductive pattern 405a which extend in the longitudinal direction of the line pattern 430. The wire-contact part 410a may be connected to the first doped region 112a. An insulating pattern 402a may be disposed between the base conductive pattern 405a and the substrate 100. Particularly, the insulating pattern 402a may be disposed between the base conductive pattern 405a and the second doped region 112b.

The conductive wire 420a may further include a barrier conductive pattern 412a and a metal pattern 415a, which are sequentially stacked on the base conductive pattern 405a and the wire-contact part 410a. Each of the barrier conductive pattern 412a and the metal pattern 415a may include both sidewalls aligned with the both sidewalls of the base conductive pattern 405a and both sidewalls of the wire-contact part 410a. The base conductive pattern 405a and the wire-contact part 410a may be formed of a doped semiconductor material (e.g., doped silicon). The barrier conductive pattern 412a may include a transition metal (e.g., titanium, tantalum) and/or a conductive metal nitride (e.g., titanium nitride, tantalum nitride). The metal pattern 415a may include tungsten or aluminum. In some embodiments, the conductive wire 420 may further include an ohmic layer disposed between the barrier conductive pattern 412a and the base conductive pattern 405a and between the barrier conductive pattern 412a and the wire-contact part 410a. The ohmic layer of the conductive wire 420 may include a metal-semiconductor compound (e.g., a metal silicide).

The hard mask pattern 425 of the line pattern 430 may be formed of substantially the same material as the hard mask pattern 137 of the first embodiment described above.

Insulating fences 465 may cross the line patterns 420. The insulating fences 465 may be parallel to each other. For example, the insulating fences 465 may extend in the x-axis direction. The insulating fences 465 may extend downward to fill spaces between the line patterns 430 thereunder. The insulating fences 465 are spaced apart from each other in the y-axis direction. A top surface of the hard mask pattern 420 under the insulating fence 465 may be recessed to be lower than a top surface of the hard mask pattern 420 beside the insulating fence 465. Thus, a top surface of the insulating fence 465 may be substantially coplanar with the top surface of the hard mask pattern 420 beside the insulating fence 465.

A contact plug may be disposed in a contact hole 470a defined between a pair of the line patterns 430 adjacent to each other and between a pair of the insulating fences 465 adjacent to each other. As illustrated in FIG. 31A, a plurality of the contact plugs may be disposed between the pair of the line patterns 430, and the insulating fences 465 may be disposed between the plurality of contact plugs, respectively.

The contact plug may include a lower plug 475 and an upper plug 490c sequentially stacked. The lower plug 475 may be connected to the second doped region 112b. The lower plug 475 may include a first conductive material, and the upper plug 490c may include a second conductive material different from the first conductive material. Particularly, the second conductive material of the upper plug 490c may have a resistivity lower than that of the first conductive material of the lower plug 475. For example, the lower plug 475 may include a doped semiconductor material (e.g., doped silicon), and the upper plug 490c may include a barrier pattern 485c and a metal pattern 487c sequentially stacked. The barrier pattern 485c of the upper plug 490c may include a conductive metal nitride (e.g., titanium nitride and/or tantalum nitride) and/or a transition metal (e.g., titanium and/or tantalum). The metal pattern 487c of the upper plug 490c may include tungsten and/or aluminum. Additionally, the contact plug may further include an ohmic layer 483 disposed between the lower and upper plugs 475 and 490c. The ohmic layer 483 may include a metal-semiconductor compound (e.g., a metal silicide).

An air gap AGa may be disposed between the lower plug 475 and each of the line patterns 430. In a plan view, the air gap AGa may have a line-shape extending along a sidewall of each of the line patterns 430. In other words, a pair of the air gaps AGa may be disposed between the lower plug 475 and the line pattern 430 at one side of the lower plug 475 and between the lower plug 475 and the line pattern 430 at another side of the lower plug 475, respectively. Different from the second embodiment described above, the pair of the air gaps AGa may be separated from each other. In other words, the air gap AGa may not exist between the lower plug 475 and the insulating fence 465. For example, the lower plug 475 may be in contact with the insulating fence 465.

A capping spacer 480 may be disposed between the upper plug 490c and the pair of the line patterns 430 disposed at both sides of the upper plug 490c. The capping spacer 480 may close top ends of the pair of air gaps AGa. The capping spacer 480 may surround a sidewall of the upper plug 490c. In other words, the capping spacer 480 may have a closed loop-shape in a plan view. The capping spacer 480 may be disposed between an upper portion of an inner sidewall of the contact hole 470a and the upper plug 490c. In some embodiments, the capping spacer 480 may cover an edge portion of a top surface of the lower plug 475. In this case, the upper plug 490c may be connected to the lower plug 475 through a center portion of the top surface of the lower plug 475. The capping spacer 480 is formed of an insulating material. For example, the capping spacer 480 may include silicon nitride and/or silicon oxynitride.

As described above, the base conductive pads 120 of the first to third embodiments may be omitted in the present embodiment. In this case, as illustrated in FIG. 31B, a bottom end of the air gap AGa may extend downward to be also disposed at a side of the wire-contact part 410a of the conductive wire 420.

In some embodiments, as illustrated in FIGS. 31A, 31B, and 31C, the air gap AGa may extend along a sidewall of the line pattern 430 in a longitudinal direction of the line pattern 430, so that the air gap AGa may also be disposed under the insulating fence 465. Thus, the air gaps AGa, which are respectively disposed between one of the pair of line patterns 430 and adjacent lower plugs 475 in the longitudinal direction of the line pattern 430 (i.e., the y-axis direction), may be connected to each other through one of extending parts of the air gaps AGa under the insulating fence 465. Likewise, the air gaps AGa, which are respectively disposed between the other of the pair of line patterns 430 and adjacent lower plugs 475 in the longitudinal direction of the line pattern 430 (i.e., the y-axis direction), may be connected to each other through the other of extending parts of the air gaps AGa under the insulating fence 465.

In some embodiments, as illustrated in FIGS. 31A and 31D, the air gap AGa between the lower plug 475 and the line pattern 430 may have a first height H1, and the air gap AGa under the insulating fence 465 may have a second height H2. Here, the first height H1 may be different from the second height H2. In some embodiments, the first height H1 may be greater than the second height H2. Thus, upper regions of the air gaps AGa between the line pattern 430 and the adjacent lower plugs 475 in the y-axis direction may be separated from each other and the insulating fence 465, and lower regions of the air gaps AGa may be connected to each other. As illustrated in FIG. 31D, the height of the air gap AGa under the insulating fence 465 may be varied depending on the position of the air gap AGa. For example, a height of the air gap AGa under an edge of the insulating fence 465 may be greater than a height of the air gap AGa under a center of the insulating fence 465. The air gap AGa under the center of the insulating fence 465 may have substantially the smallest height.

Referring to FIGS. 31A to 31D, a first protecting spacer 435a may be disposed between the contact plug and each of the line patterns 430, and a second protecting spacer 445a may be disposed between the first protecting spacer 435a and the contact plug. In some embodiments, the second protecting spacer 445a may be disposed between the first protecting spacer 435a and the lower plug 475. In other words, a top end of the second protecting spacer 445a may be lower than a top surface of the line pattern 430. The air gap AGa may be disposed between the first and second protecting spacers 435a and 445a. A bottom end of the first protecting spacer 435a may laterally extend to close a bottom end of the air gap AGa. In other words, the air gap AGa may be surrounded by the first and second protecting spacers 435a and 445a and the capping spacer 480.

Similarly to the air gap AGa, the first and second protecting spacers 435a and 445a may extend in the longitudinal direction of the line pattern 430 so as to be also disposed under the insulating fence 430. In some embodiments, a height of the second protecting spacer 445a under the insulating fence 430 may be less than a height of the second protecting spacer 445 disposed at a side of the lower plug 475. The first and second protecting spacers 435a and 445a are formed of an insulating material. For example, the first and second protecting spacers 435a and 445a may include silicon nitride and/or silicon oxynitride.

A landing pad 490L may extend from a top end of the upper plug 490c toward the outside of the contact hole 470a. In the present embodiment, the landing pad 490L may have a symmetric structure with respect to the contact plug. However, the inventive concept is not limited thereto. In other embodiments, the landing pad 490L may have an asymmetric structure with respect to the contact plug as described in the first embodiment. The landing pad 490L may include a barrier pattern 485L and a metal pattern 487L sequentially stacked. The barrier pattern 485L and the metal pattern 487L of the landing pad 490L may be formed of the same materials as the barrier pattern 485c and the metal pattern 487c of the upper plug 490c, respectively. Additionally, the barrier pattern 485L and the metal pattern 487L of the landing pad 490L may extend from the barrier pattern 485c and the metal pattern 487c of the upper plug 490c, respectively.

An interlayer insulating layer 173 may be disposed on the substrate 100 including the landing pads 490L, and via-plugs 175 may penetrate the interlayer insulating layer 173 so as to be connected to the landing pads 490L, respectively. Data storage parts DSP may be disposed on the interlayer insulating layer 173 and be connected to the via-plugs 175, respectively. The data storage parts DSP may be one of the data storage parts DSP and DSP' described with reference to FIGS. 3A and 3B.

In the semiconductor device according to the present embodiment, the air gap AGa is disposed between the lower plug 475 and the line pattern 430 (e.g., the conductive wire 420). Thus, a parasitic capacitance between the lower plug 475 and the conductive wire 420 can be reduced to realize the semiconductor device having improved reliability. Additionally, because the parasitic capacitance is reduced, a distance between the contact plug and the line pattern 430 can be reduced. Thus, the highly integrated semiconductor device may be realized.

On the other hand, the technical characteristic of the insulating fences 465 according to the present embodiment may be applied to the upper insulating fences 147 and 320 of the first to third embodiments described above. For example, the upper insulating fences 147 and 320 of the first to third embodiments may be replaced with the insulating fences 465 according to the present embodiment.

Figure 32A:
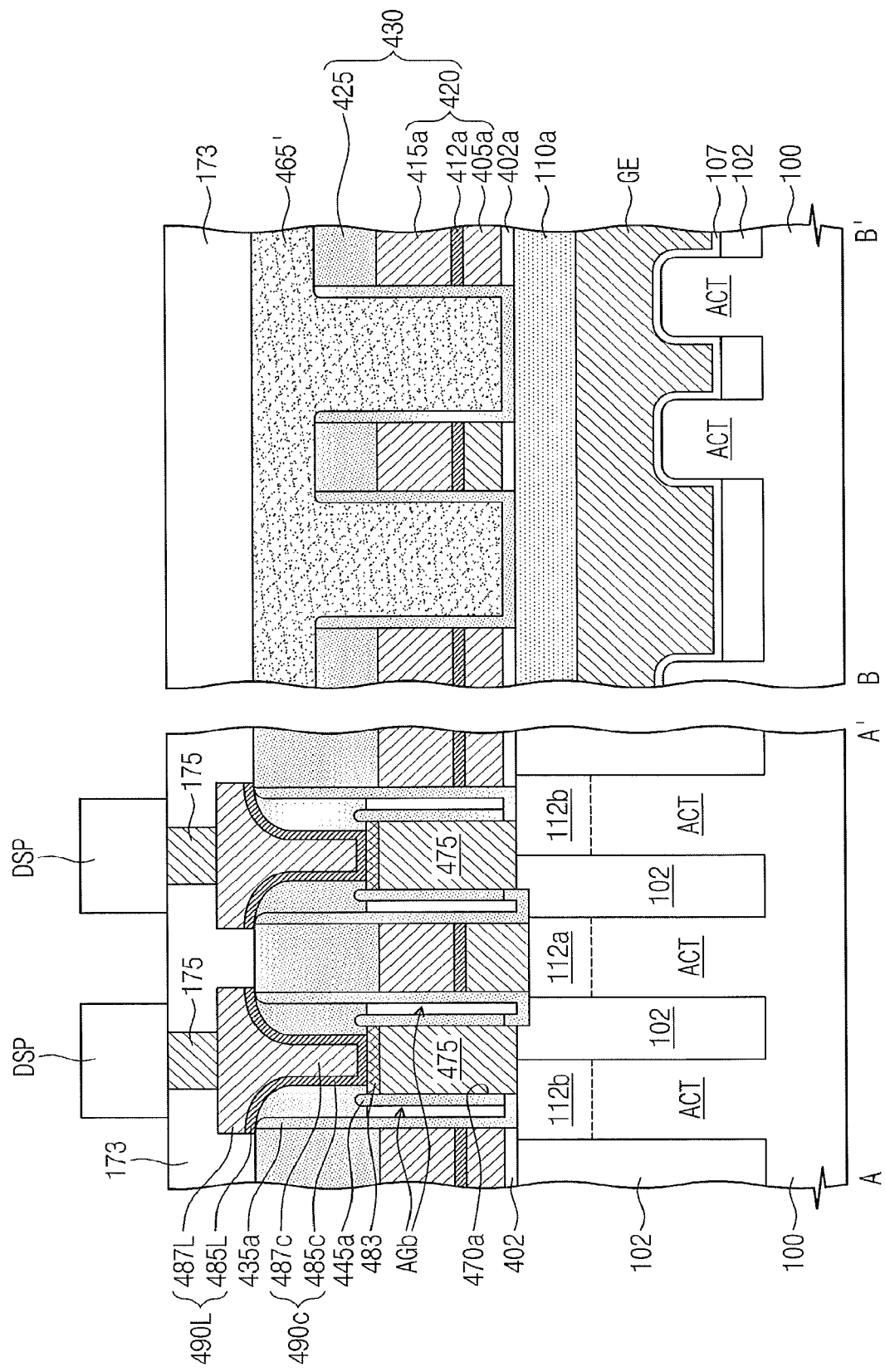
FIG. 32A is a cross-sectional view taken along lines A-A' and B-B' of FIG. 31A to illustrate a modified example of a semiconductor device according to yet other embodiments of the inventive concept.
Figure 32B:
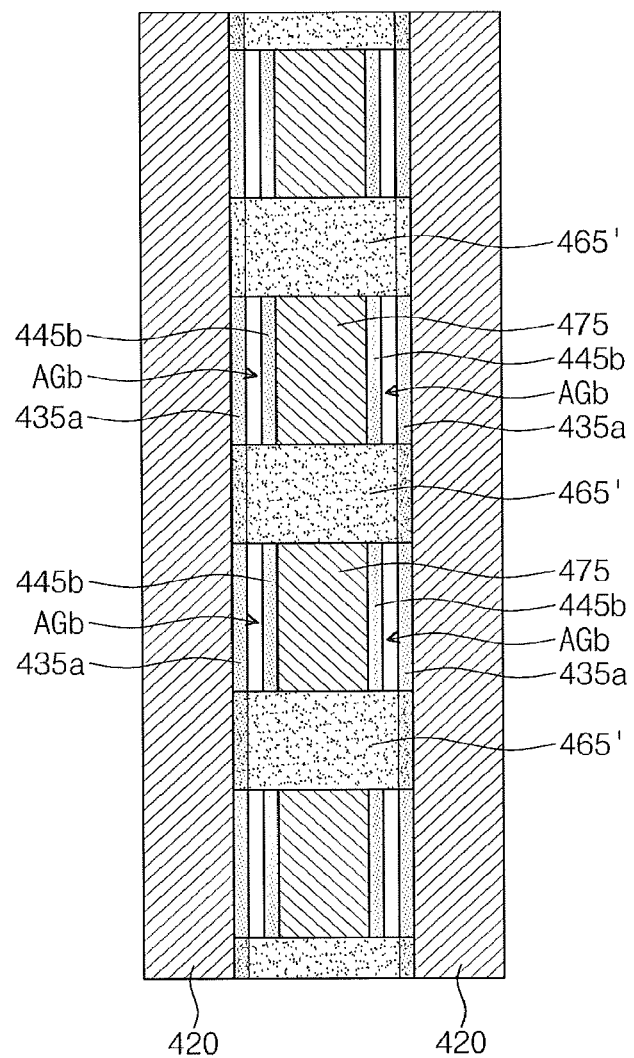
FIG. 32B is a plan view of a conductive line level to illustrate an air gap of the modified example of FIG. 32A.
Figure 32C:
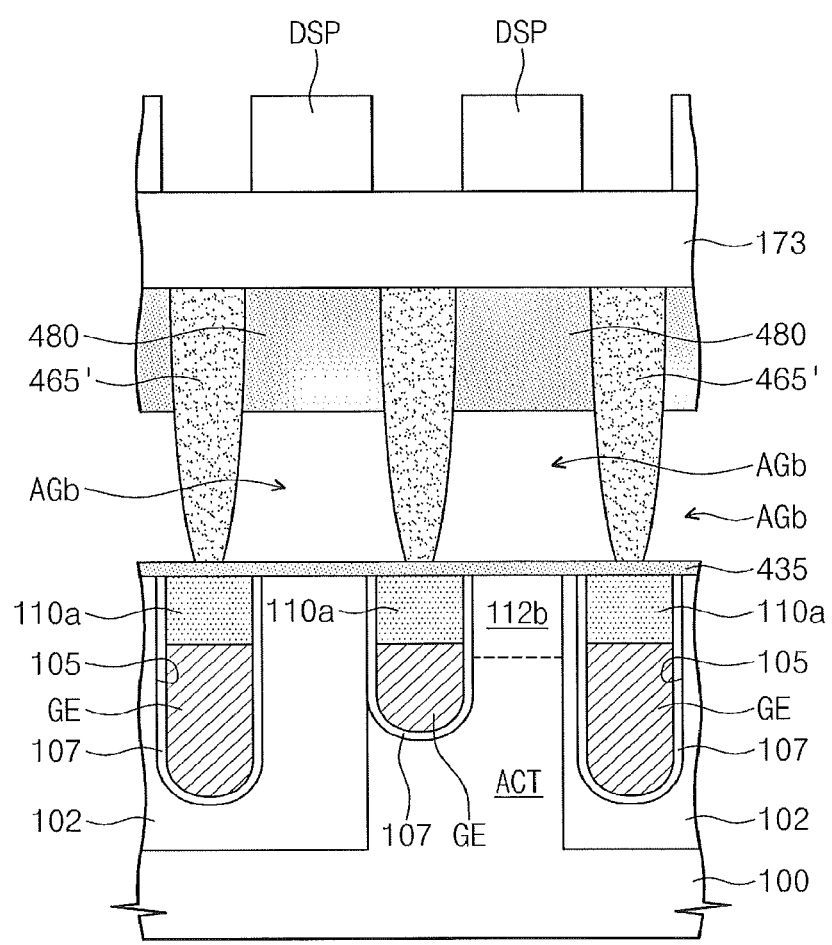
FIG. 32C is a cross-sectional view taken along a longitudinal direction of an air gap to illustrate the air gap of the modified example of FIG. 32A.

FIG. 32A is a cross-sectional view taken along lines A-A' and B-B' of FIG. 31A to illustrate a modified example of a semiconductor device according to yet other embodiments of the inventive concept. FIG. 32B is a plan view of a conductive line level to illustrate an air gap of the modified example of FIG. 32A. FIG. 32C is a cross-sectional view taken along a longitudinal direction of an air gap to illustrate the air gap of the modified example of FIG. 32A.

Referring to FIGS. 32A to 32C, a plurality of contact plugs are disposed between a pair of the line patterns 430 adjacent to each other. A pair of air gaps AGb may be disposed between each of the contact plugs and the pair of line patterns 430, respectively. Each of the air gaps AGb may be disposed between the lower plug 475 of the contact plug and the line pattern 430. The pair of air gaps AGb, which are respectively disposed between each of the contact plugs and the pair of line patterns 430, are separated from each other. Additionally, in the present modified example, the air gap AGb between one lower plug 430 and one of the pair of line patterns 430 may be completely separated from the air gap AGb between another lower plug 430 adjacent to the one lower plug 430 and the one of the pair of line patterns 430.

In more detail, the air gaps AGb respectively disposed between the one line pattern 430 and the lower plugs 475 may be arranged in a longitudinal direction of the one line pattern 430 and be completely separated from each other. As illustrated in FIGS. 32B and 32C, the air gaps AGb respectively disposed between the one line pattern 430 and the lower plugs 475 may be completely separated from each other by insulating fences 465'. In other words, the air gap AGb may be confinedly disposed between the lower plug 475 and the one line pattern 430 and between the insulating fences 465' adjacent to each other. Likewise, as illustrated in FIGS. 32A and 32B, second protecting spacers 445b respectively disposed between the one line pattern 430 and the lower plugs 475 may also be completely separated from each other by the insulating fences 465'. The second protecting spacer 445b may be adjacent to one sidewall of the lower plug 475. The air gap AGb may be disposed between the second protecting spacer 445b and a first protecting spacer 435a adjacent to the line pattern 430.

Figure 33:
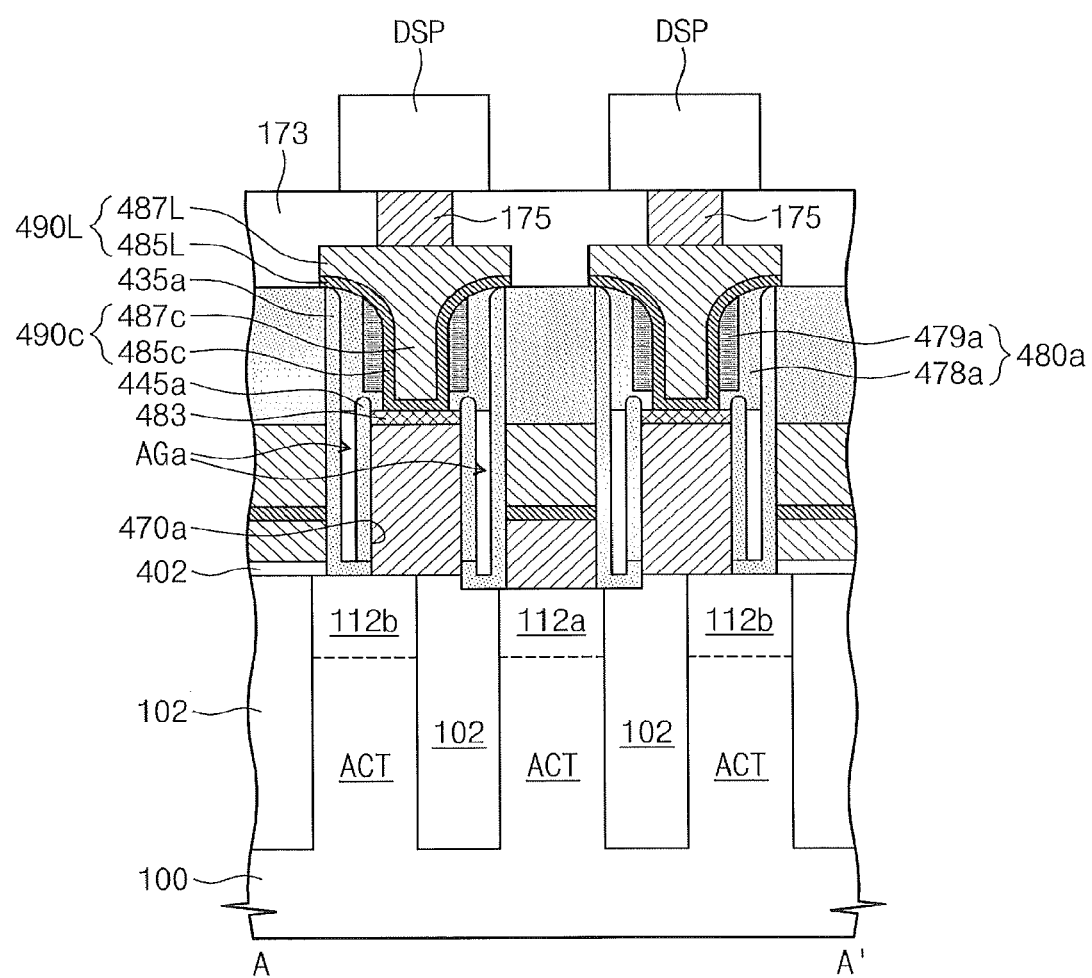
FIG. 33 is a cross-sectional view taken along a line A-A' of FIG. 31A to illustrate another modified example of a semiconductor device according to yet other embodiments of the inventive concept.

FIG. 33 is a cross-sectional view taken along a line A-A' of FIG. 31A to illustrate another modified example of a semiconductor device according to yet other embodiments of the inventive concept.

Referring to FIG. 33, in the present modified example, a capping spacer 480a may include a first sub-spacer 478a and a second sub-spacer 479a sequentially stacked. Each of the first and second sub-spacers 478a and 479a are formed of an insulating material. Here, a density of the first sub-spacer 478a may be different from a density of the second sub-spacer 479a. In some embodiments, the density of the first sub-spacer 478a may be less than the density of the second sub-spacer 479a. Thus, a step coverage property of the first sub-spacer 478a may be poorer than a step coverage property of the second sub-spacer 479a. For example, the first sub-spacer 478a may be formed of a porous silicon nitride, and the second sub-spacer 479a may be formed of silicon nitride having a density greater than that of the first sub-spacer 478a (e.g., the porous silicon nitride).

Next, methods of manufacturing a semiconductor device according to the present embodiment will be described with reference to the drawings.

Figure 38A:
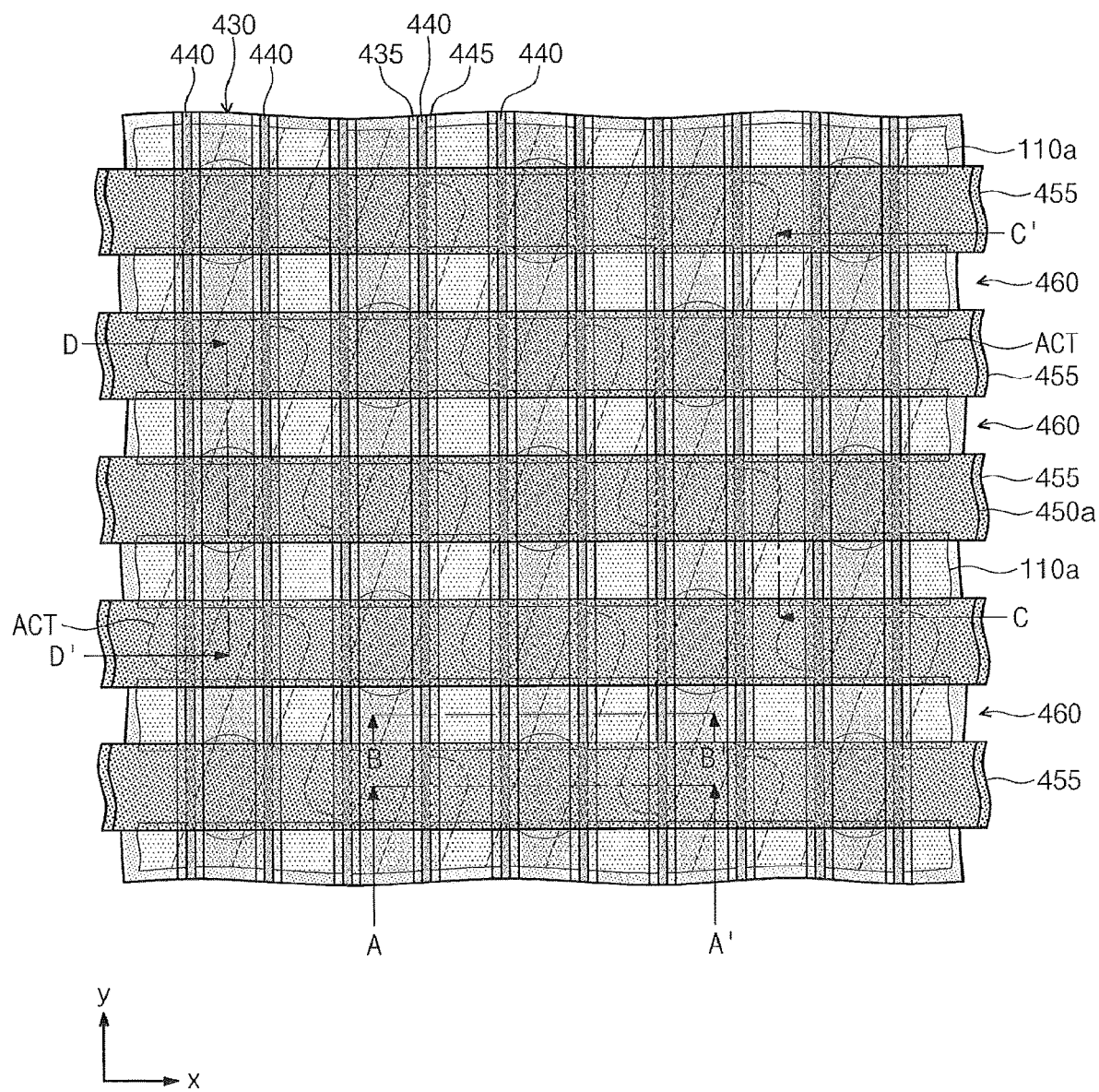
Figure 38B:
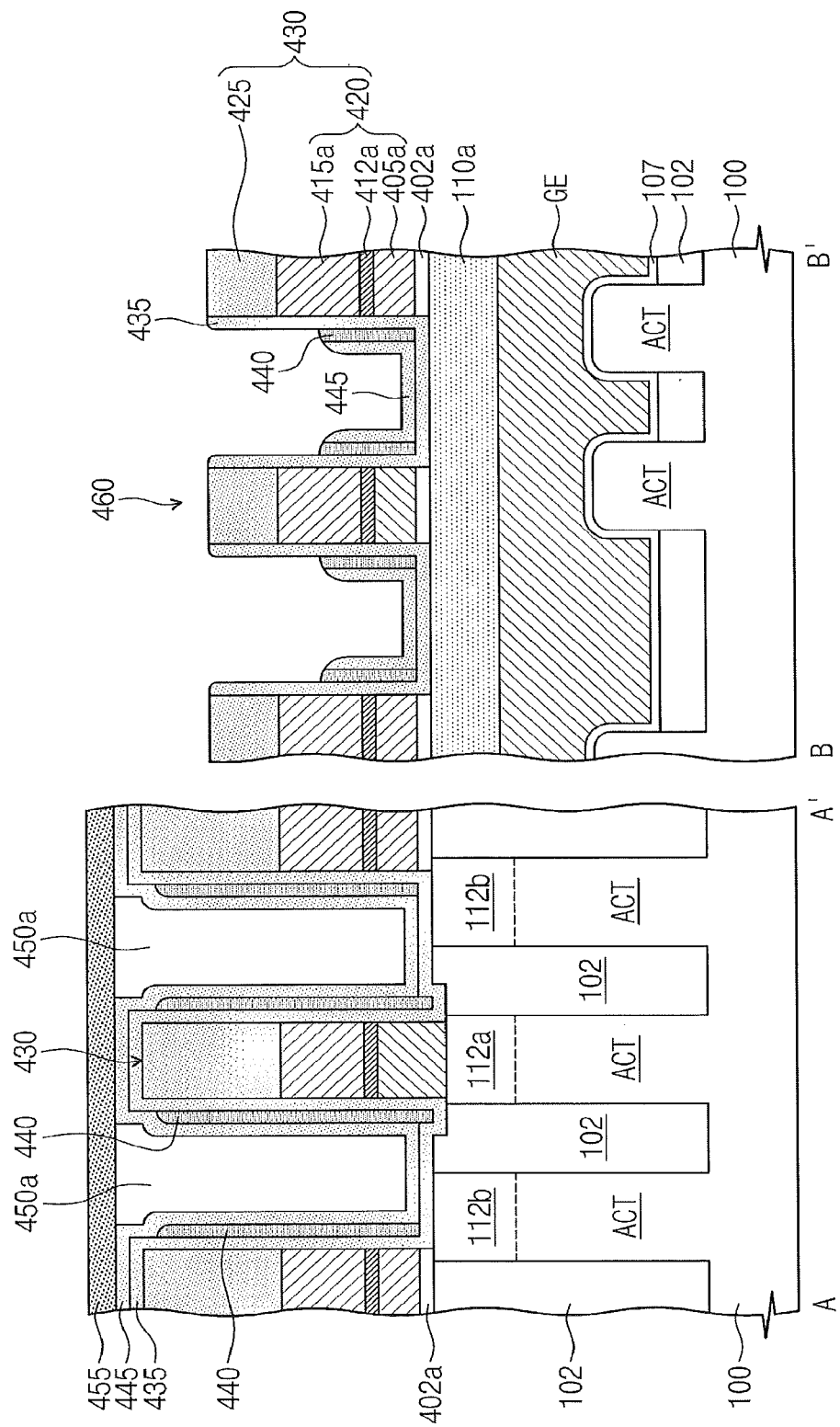
Figure 38C:
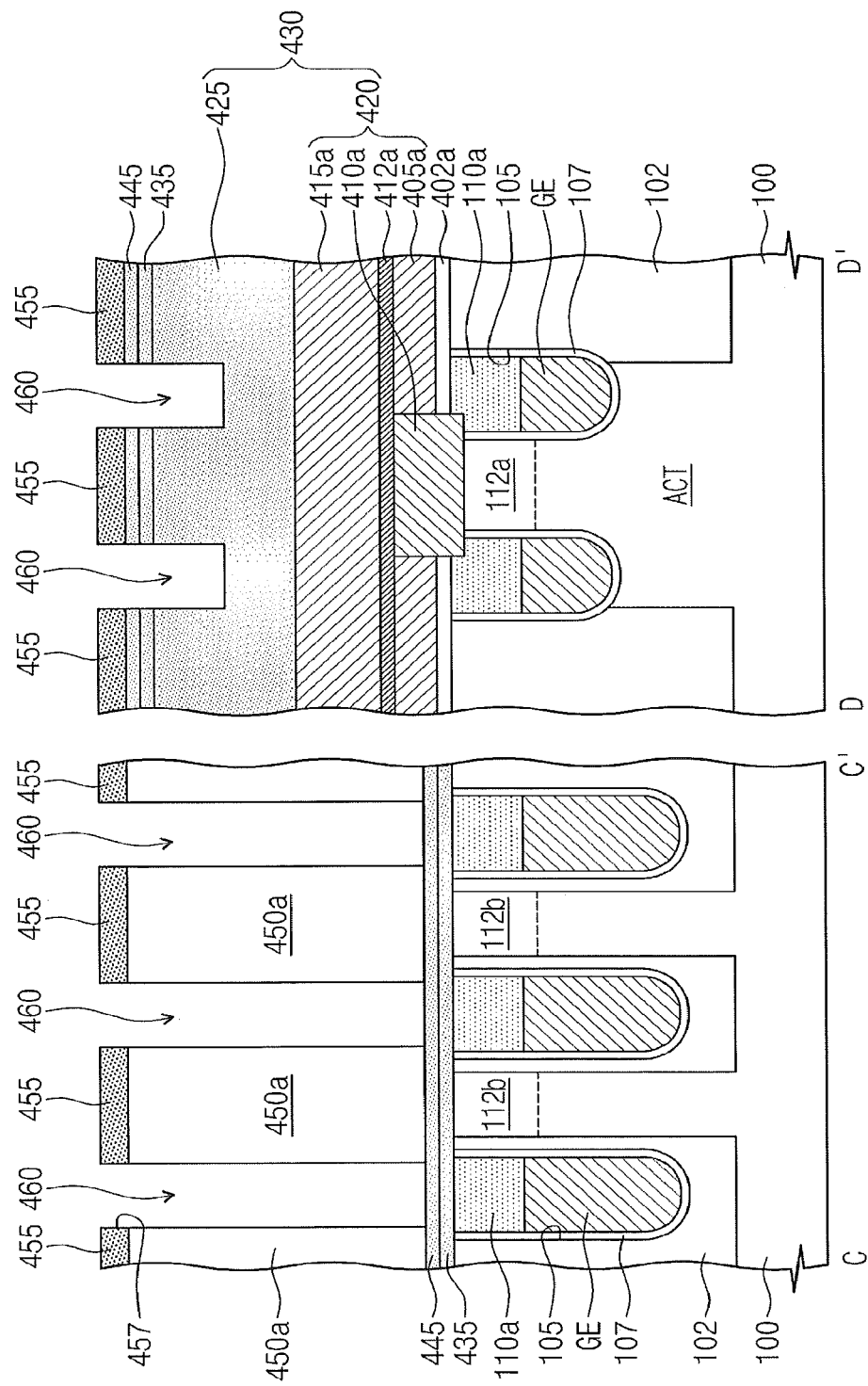
Figure 38D:
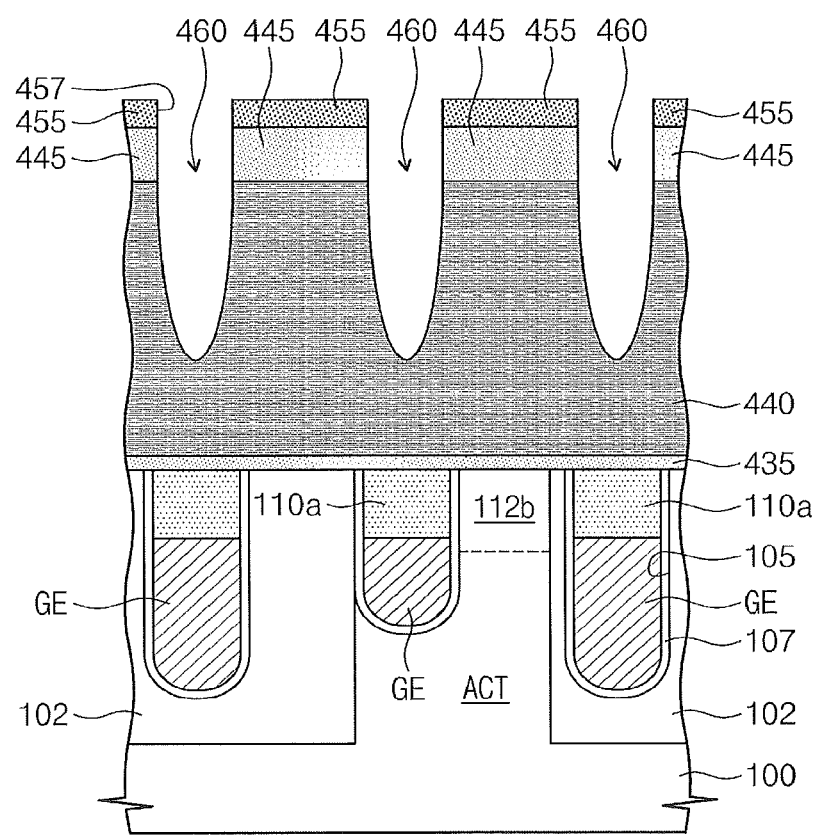
FIG. 38D is a cross-sectional view taken along a longitudinal direction of a sacrificial spacer of FIG. 38A.
Figure 39A:
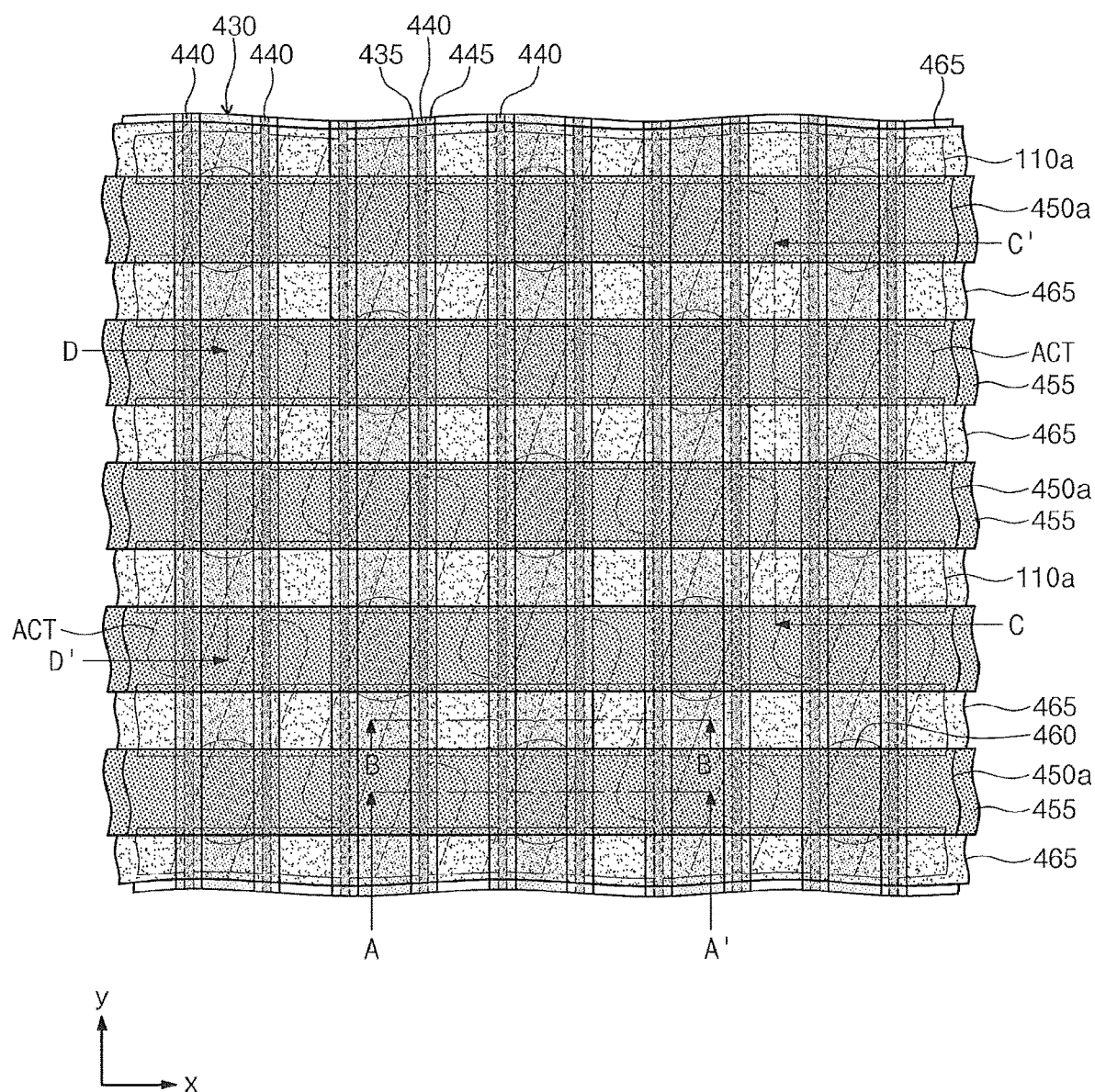
Figure 39B:
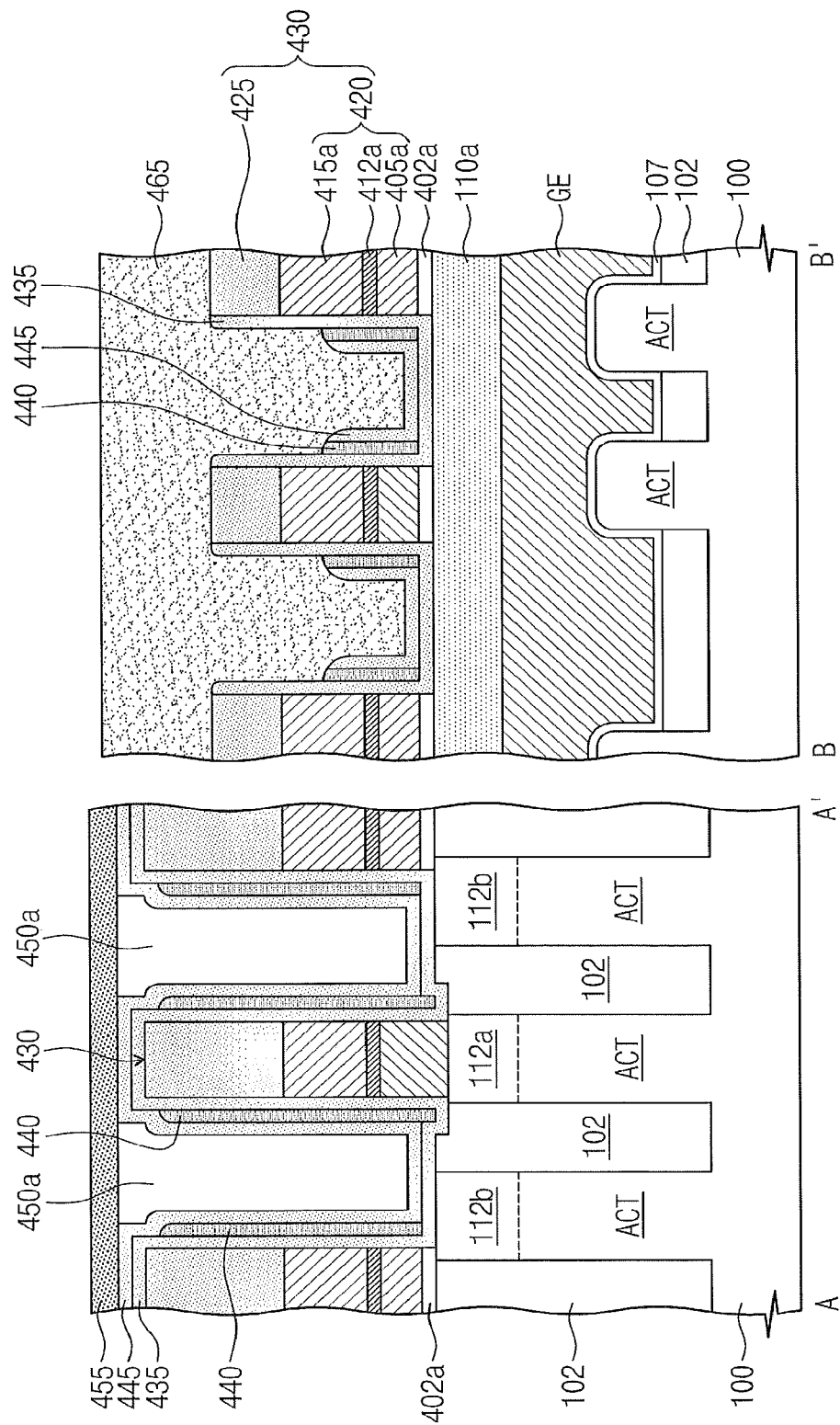
Figure 39C:
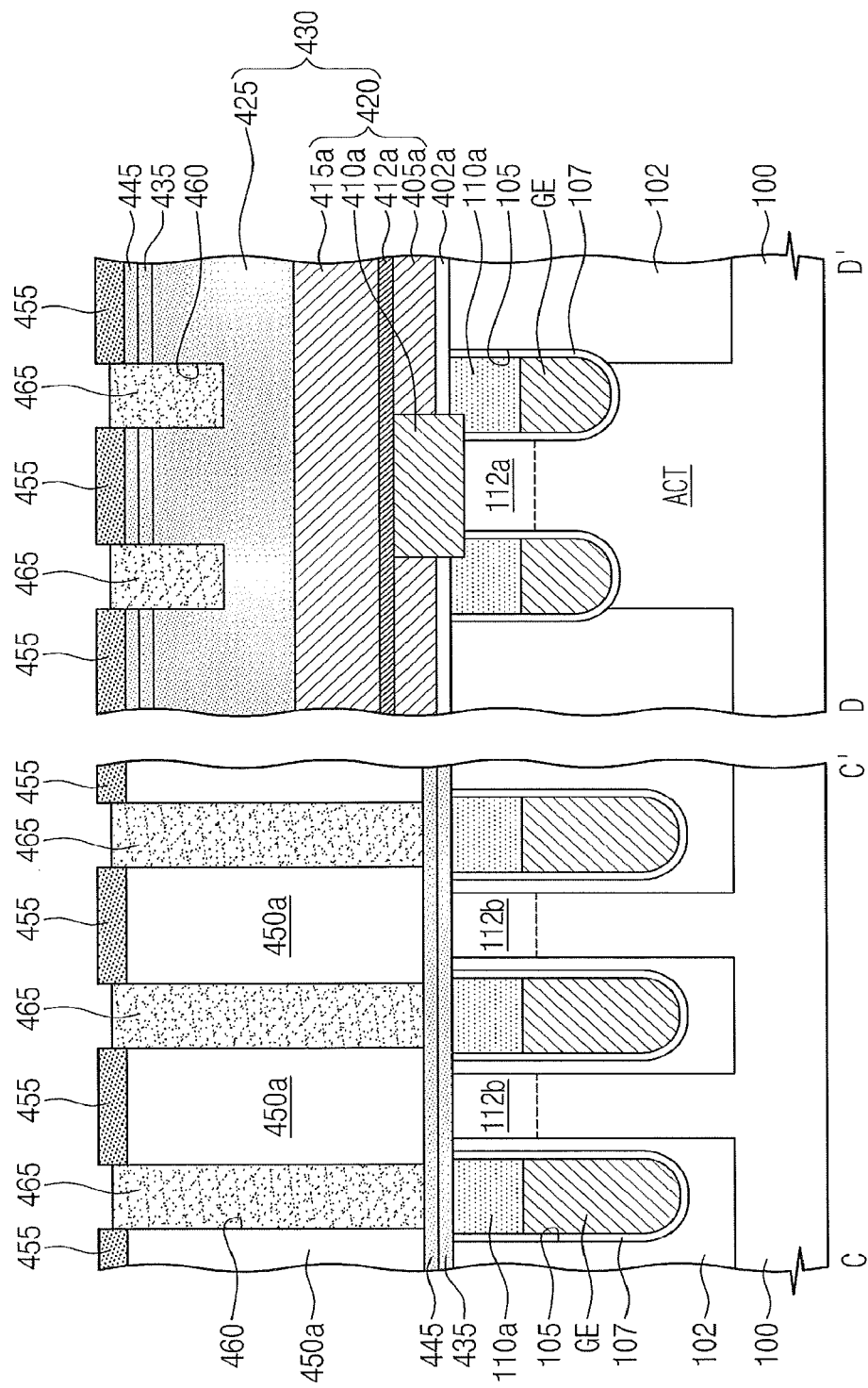
Figure 39D:
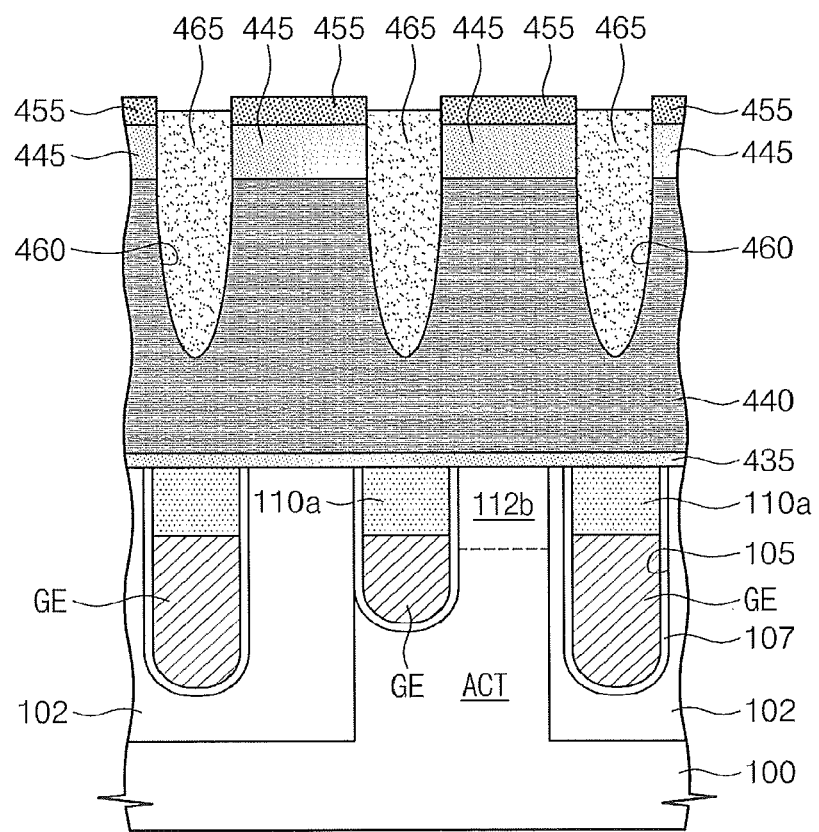
FIG. 39D is a cross-sectional view taken along a longitudinal direction of a sacrificial spacer of FIG. 39A.

FIGS. 34A to 45A are plan views illustrating a method of manufacturing a semiconductor device according to yet other embodiments of the inventive concept. FIGS. 34B to 45B are cross-sectional views taken along lines A-A' and B-B' of FIGS. 34A to 45A, respectively. FIGS. 34C to 45C are cross-sectional views taken along lines C-C' and D-D' of FIGS. 34A to 45A, respectively. FIG. 38D is a cross-sectional view taken along a longitudinal direction of a sacrificial spacer of FIG. 38A. FIG. 39D is a cross-sectional view taken along a longitudinal direction of a sacrificial spacer of FIG. 39A.

Figure 34A:
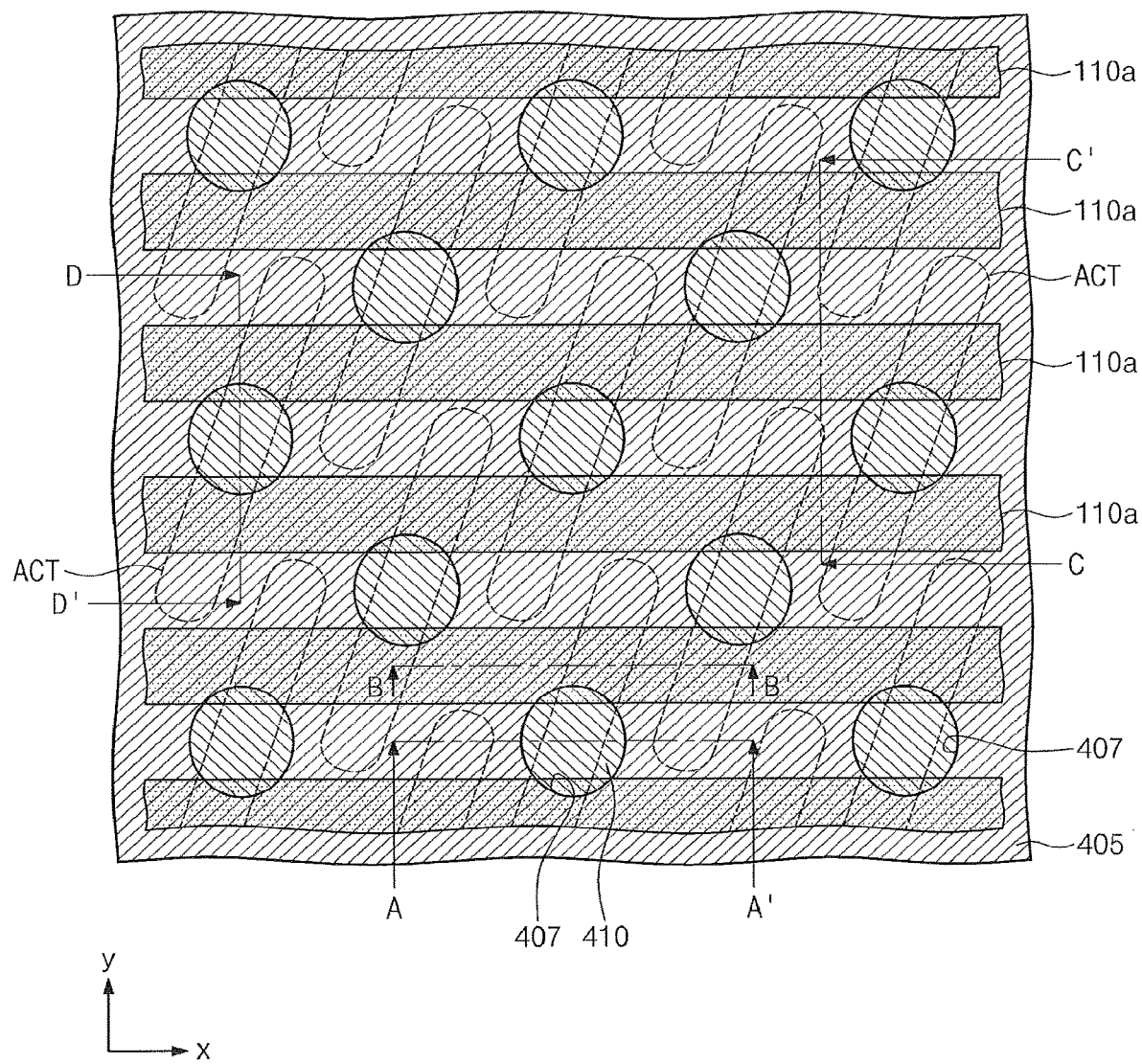
Figure 34B:
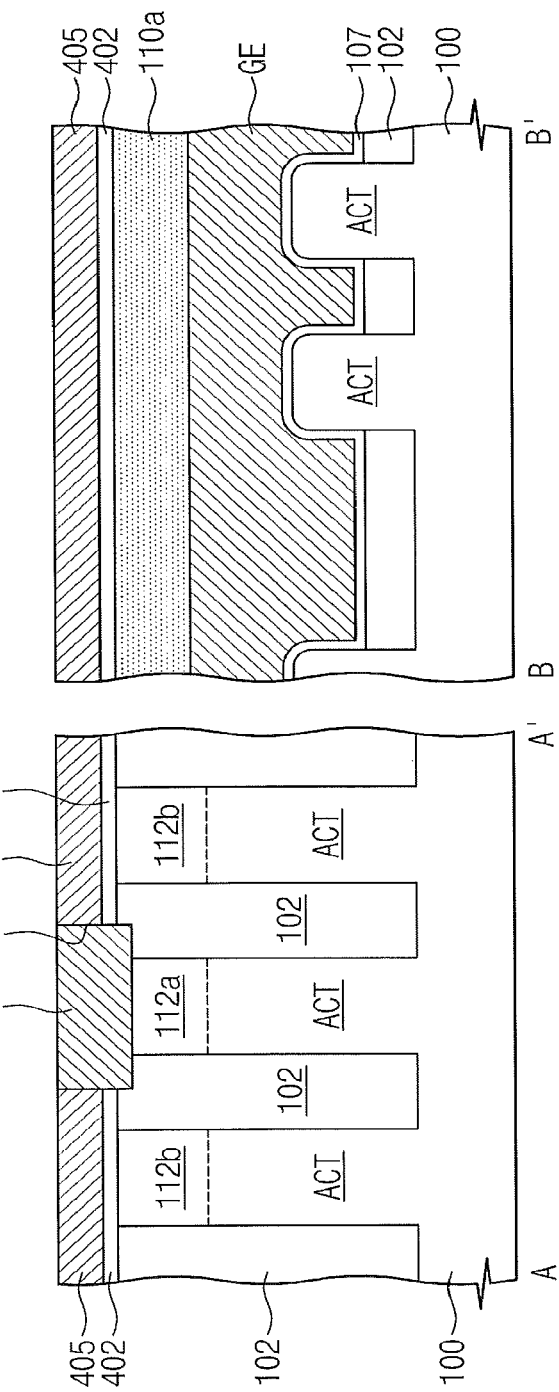
Figure 34C:
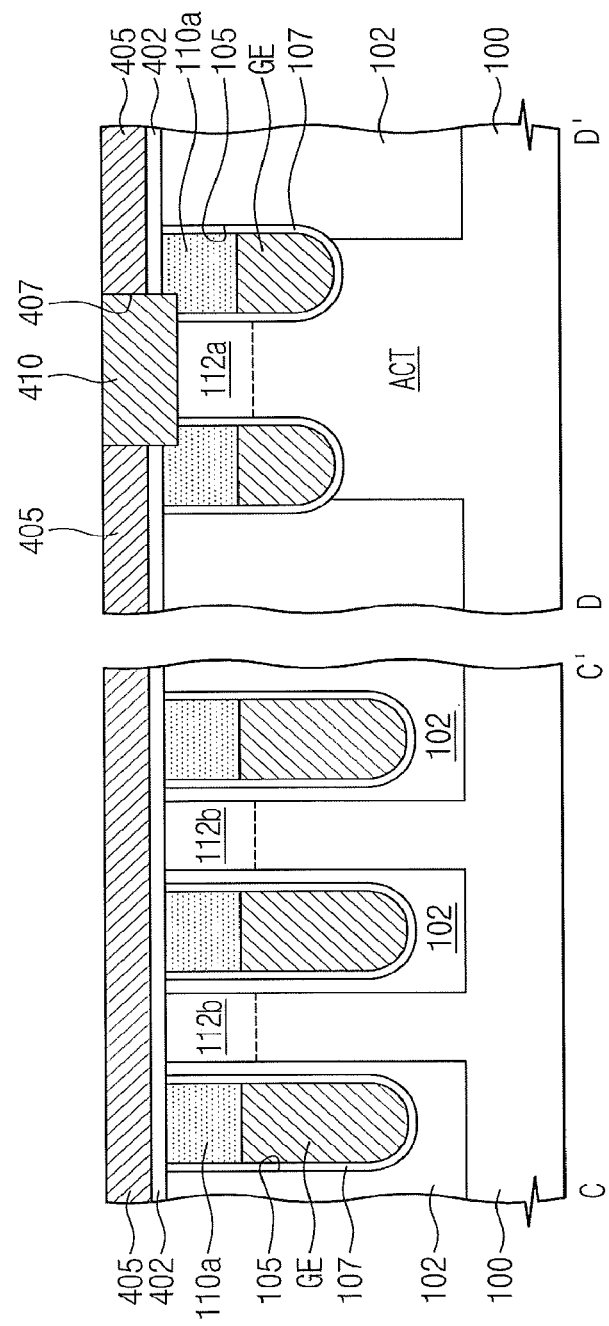

Referring to FIGS. 34A to 34C, an insulating layer 402 may be formed on the substrate 100 including active portions ACT, gate electrodes GE, gate capping insulating patterns 110a, and doped regions 112a and 112b. Top surfaces of the gate capping insulating patterns 110a may be substantially coplanar with a top surface of the substrate 100. The insulating layer 402 may include silicon oxide, silicon nitride, and/or silicon oxynitride. In some embodiments, the insulating layer 402 may correspond to a gate insulating layer of transistors in a peripheral circuit region (not shown). However, the inventive concept is not limited thereto.

A base conductive layer 405 may be formed on the insulating layer 402. For example, the base conductive layer 405 may be formed of a semiconductor material doped with dopants (e.g., doped silicon). In some embodiments, an etch stop layer (not shown) may be formed on the base conductive layer 405. The etch stop layer may include an oxide, a nitride, and/or an oxynitride. The etch stop layer, the base conductive layer 405, and an insulating layer 402 may be successively patterned to form holes 407 exposing the first doped regions 112a, respectively. A bottom surface of each of the holes 407 may be recessed to be lower than a top surface of the substrate 100 (e.g., a top surface of the active portion ACT not exposed by the hole 407).

Subsequently, a contact-conductive layer may be formed on the substrate 100 to fill the holes 407, and the contact-conductive layer may be planarized until the etch stop layer is exposed. Thus, contact conductive patterns 410 may be formed to fill the holes 407, respectively. Next, the etch stop layer may be removed to expose the base conductive layer

405. Each of the contact conductive patterns 410 may be connected to the first doped region 112*a* exposed by each of the holes 407.

As illustrated in FIGS. 34B and 34C, top surfaces of the contact conductive patterns 410 may be disposed at substantially the same level as a top surface of the base conductive layer 405. Sidewalls of the contact conductive patterns 410 may be in contact with the base conductive layer 405 forming inner sidewalls of the holes 407. The contact conductive patterns 410 may be formed of a semiconductor material doped with dopants (e.g., doped silicon).

Figure 35A:
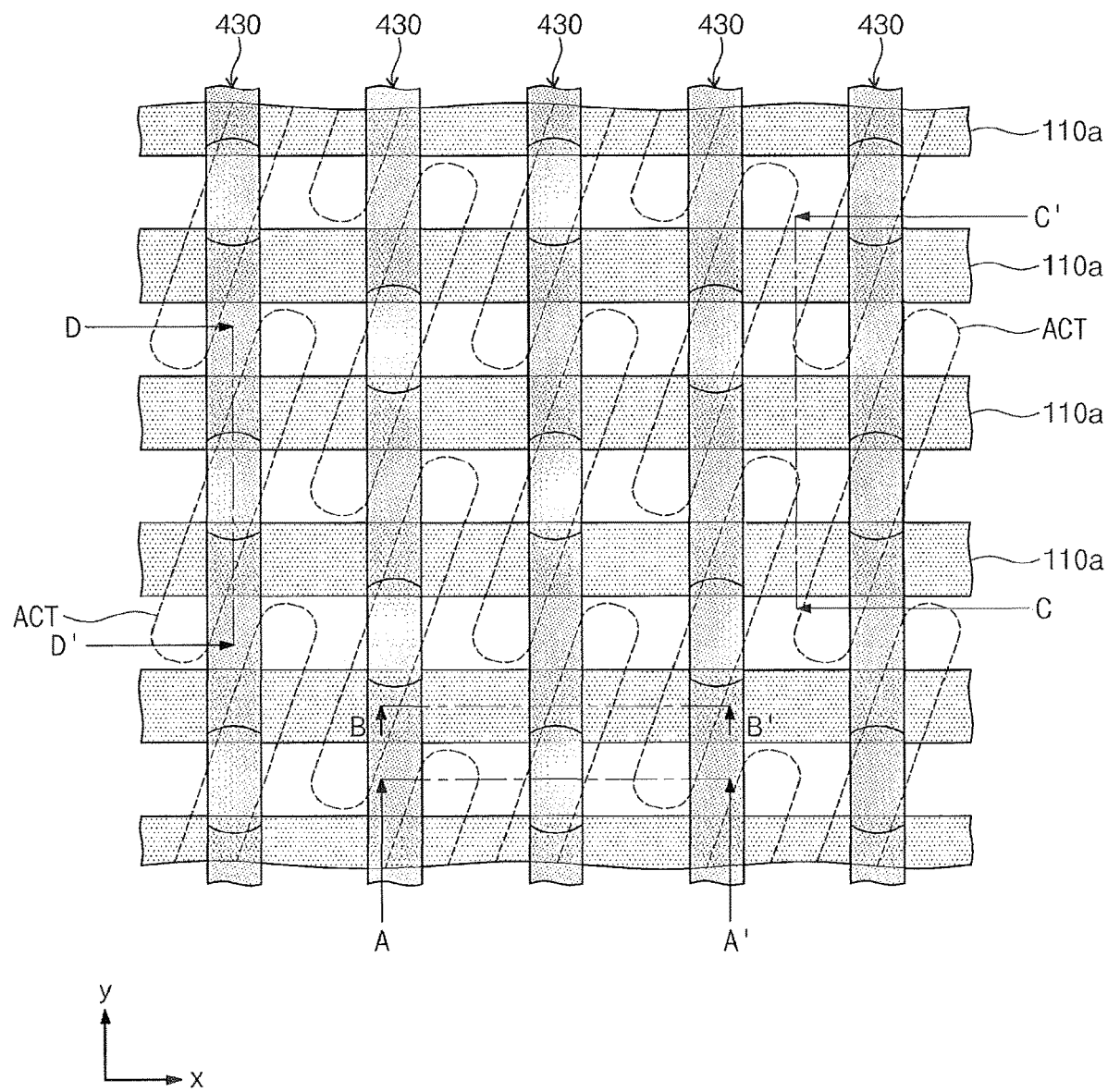
Figure 35B:
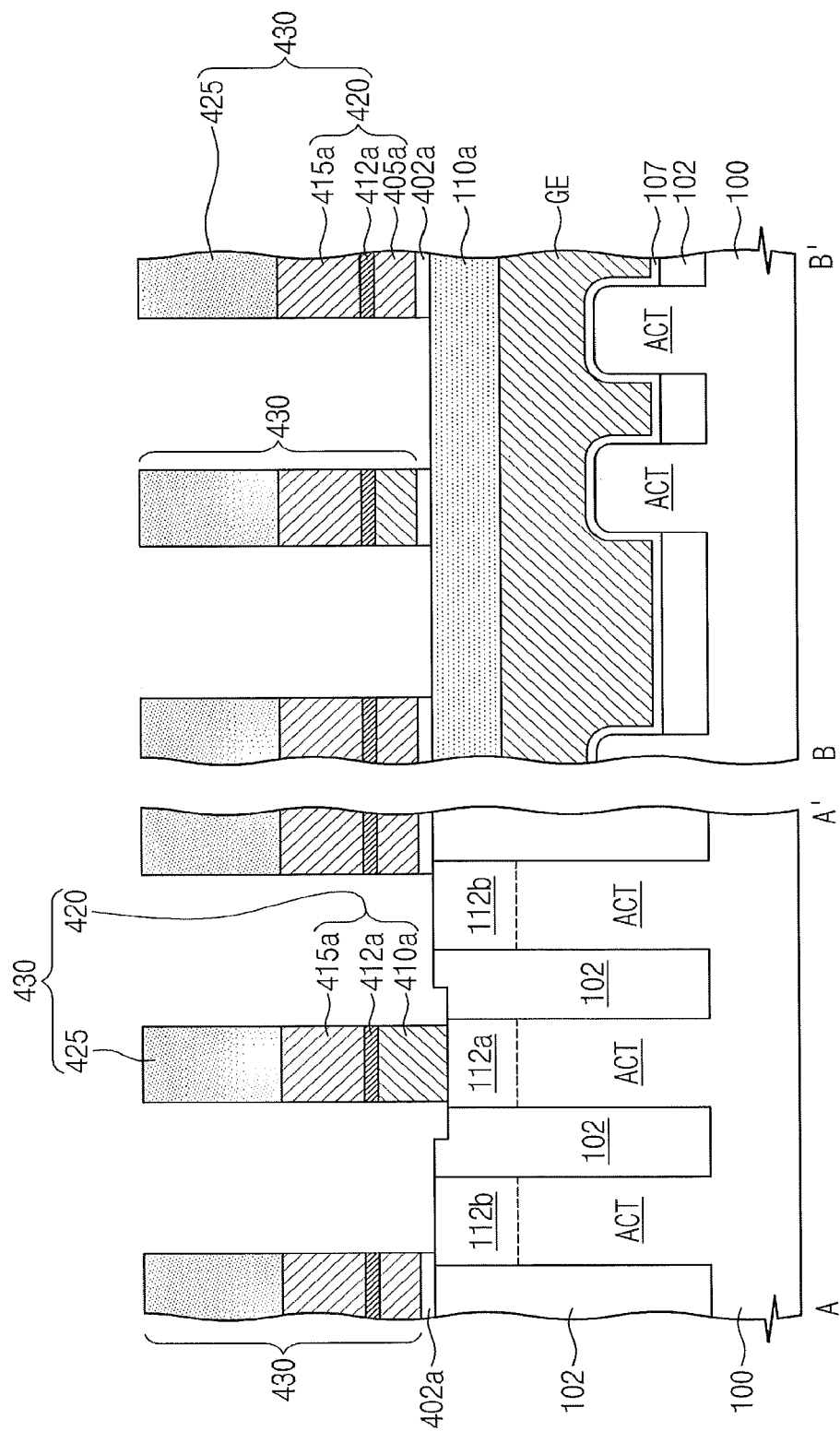
Figure 35C:
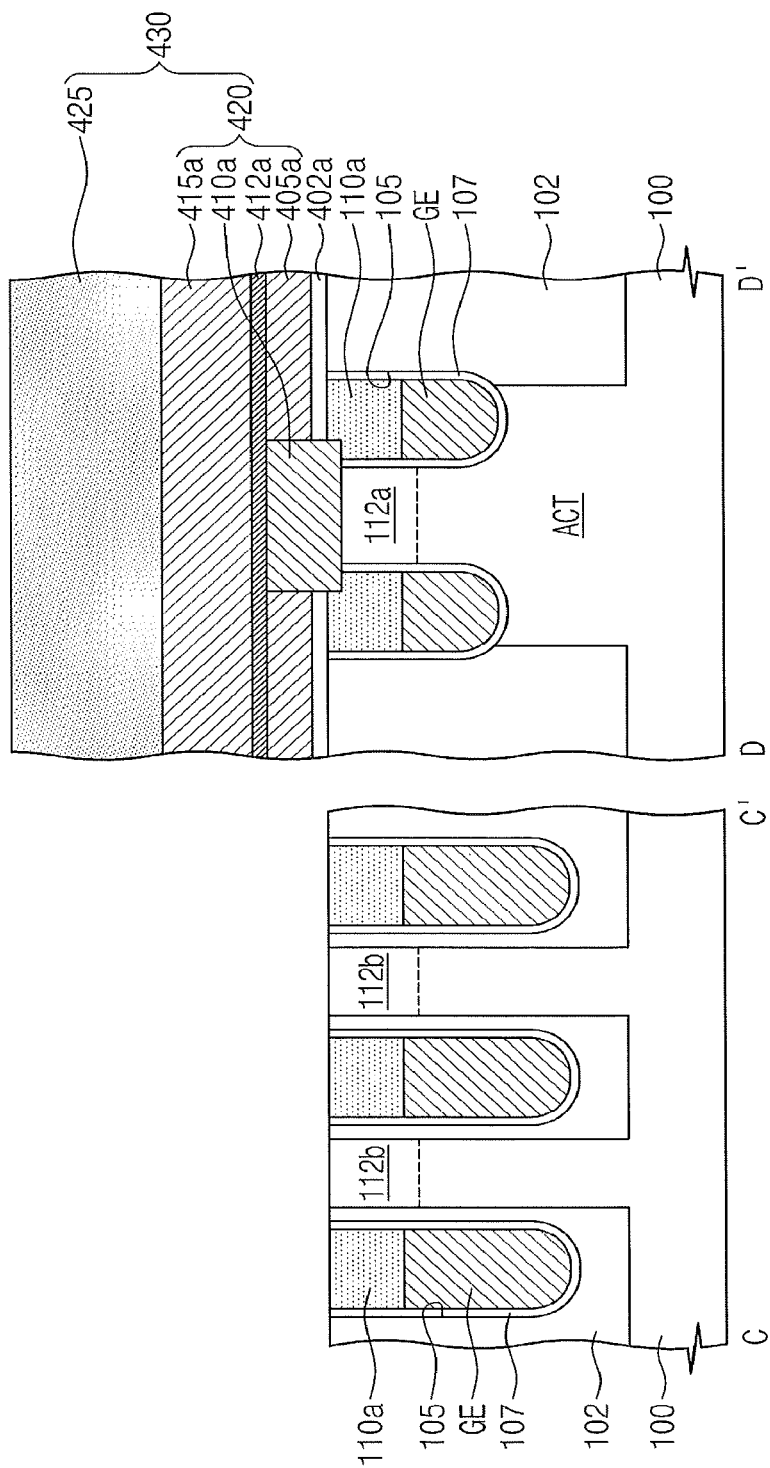

Referring to FIGS. 35A to 35C, a barrier conductive layer and a metal layer may be sequentially formed on the substrate 100 having the base conductive layer 405 and the contact conductive patterns 410. The barrier conductive layer may be in contact with the base conductive layer 405 and the contact conductive patterns 410. A hard mask layer may be formed on the metal layer.

The hard mask layer, the metal layer, the barrier conductive layer, the base conductive layer 405, the contact conductive patterns 410, and the insulating layer 402 may be successively patterned to form line patterns 430 extending in parallel to each other in a y-axis direction. An insulating pattern 402 may be formed under each of the line patterns 430.

Each of the line patterns 430 may include a conductive wire 420 and a hard mask pattern 425 sequentially stacked. The conductive wire 420 may include a base conductive pattern 405*a* and a wire-contact part 410*a*. The base conductive pattern 405*a* is a portion of the base conductive layer 405, and the wire-contact part 410*a* is a portion of the contact conductive pattern 410. The base conductive pattern 405*a* is disposed on the insulating pattern 402, and the wire-contact part 410*a* is connected to the first doped region 112*a*. The base conductive pattern 405*a* may be laterally in contact with the wire-contact part 410*a*. The wire-contact part 410*a* may have both sidewalls aligned with both sidewalls of the base conductive pattern 405*a* along the y-axis direction. The conductive wire 420 may further include a barrier conductive pattern 412*a* and a metal pattern 415*a* sequentially stacked on the base conductive pattern 405*a* and the wire-contact part 410*a*.

Figure 36A:
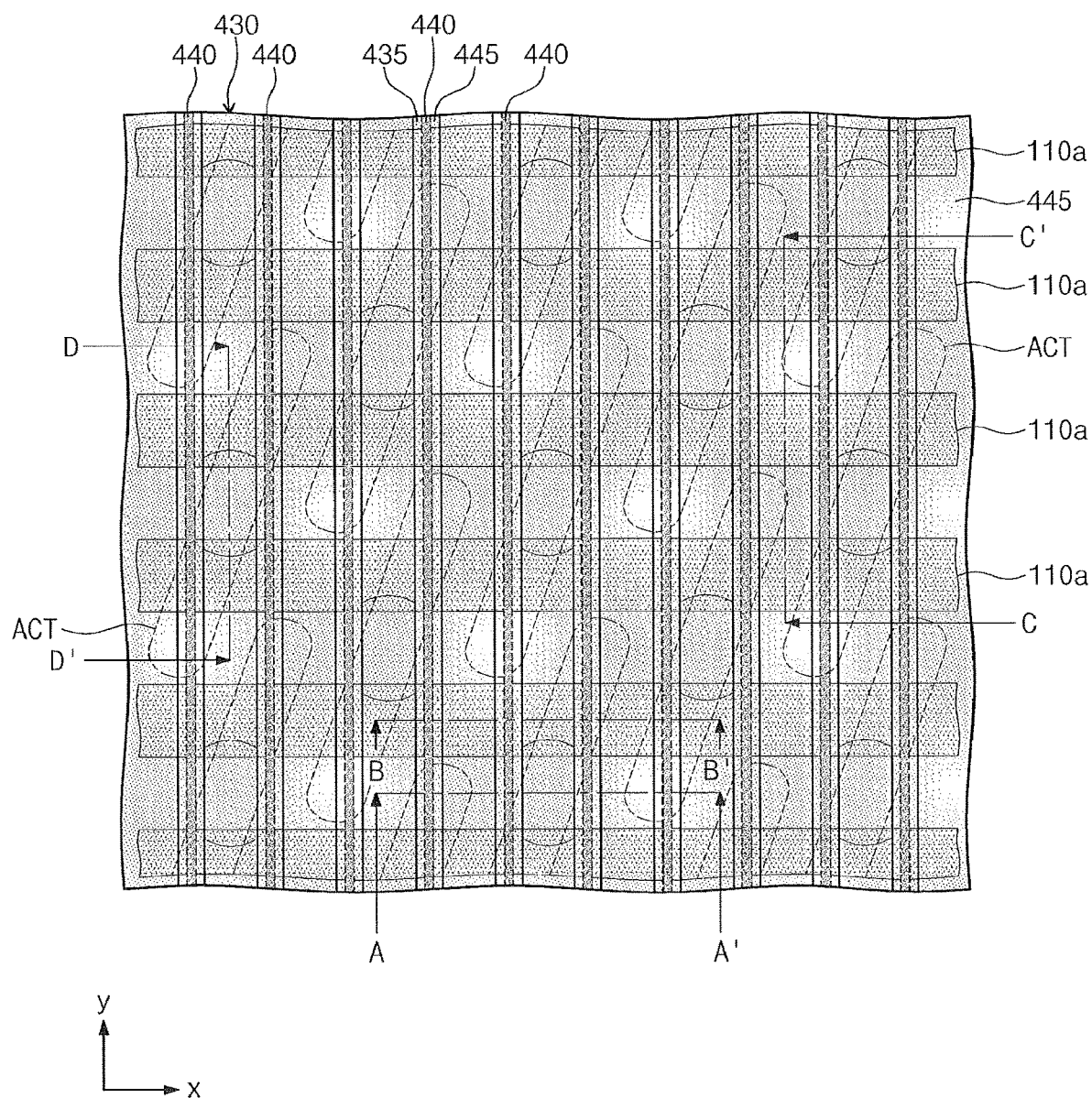
Figure 36B:
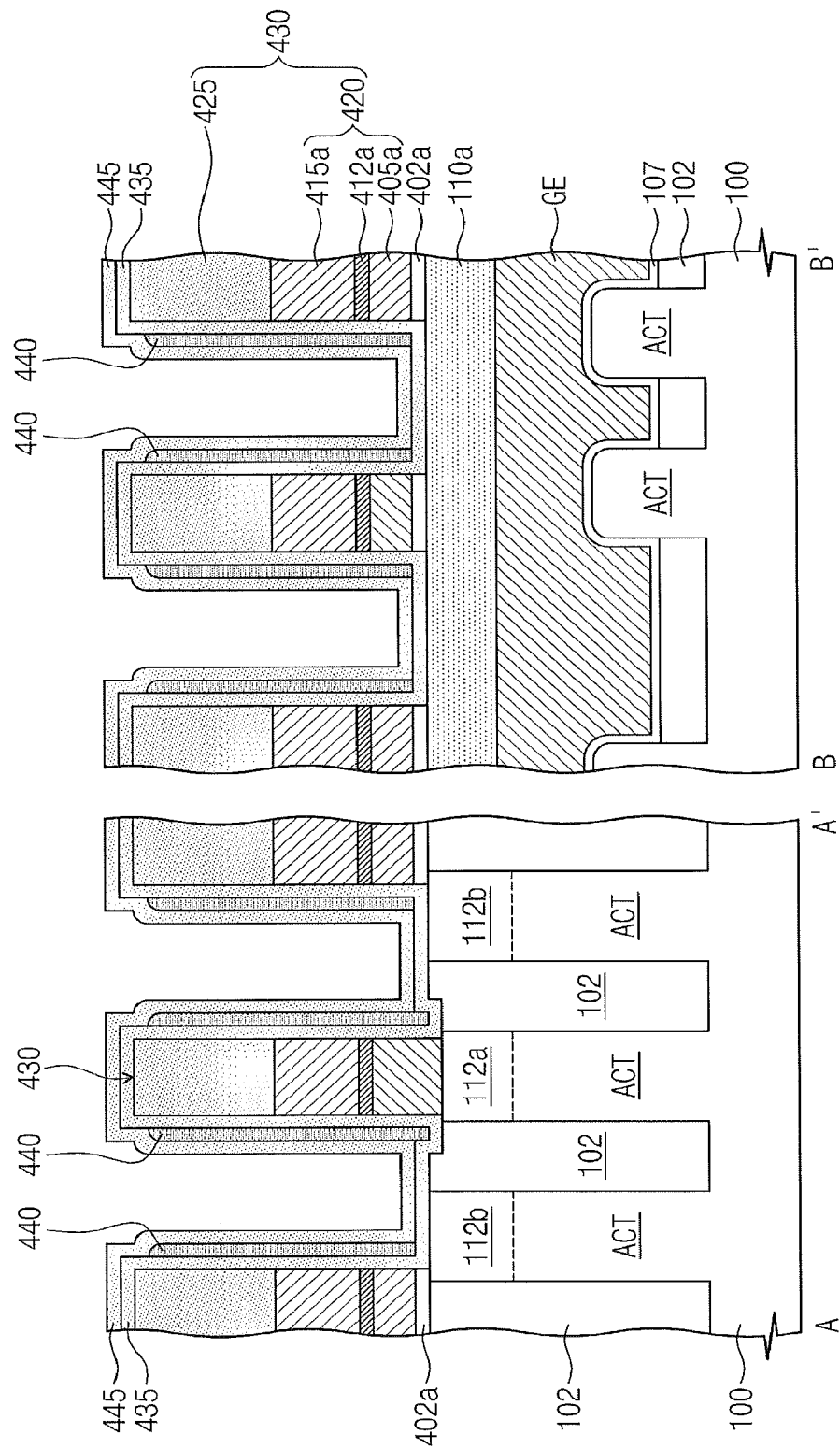

Referring to FIGS. 36A to 36C, a first protecting spacer layer 435 may be conformally formed on the substrate 100 having the line patterns 430. Thus, the first protecting spacer layer 435 may cover both sidewalls and a top surface of each of the line patterns 430. A sacrificial spacer layer may be conformally formed on the substrate 100 having the first protecting spacer layer 435 and then an etch-back process may be performed on the sacrificial spacer layer to form sacrificial spacers 440 at both sidewalls of each of the line patterns 430, respectively. Subsequently, a second protecting spacer layer 445 may be conformally formed on the substrate 100 having the sacrificial spacers 440. The sacrificial spacers 440 may be formed of a material having an etch selectivity with respect to the first and second protecting spacer layers 435 and 445. For example, the first and second protecting spacer layers 435 and 445 may be formed of silicon nitride and/or silicon oxynitride, and the sacrificial spacers 440 may be formed of silicon oxide.

Figure 37A:
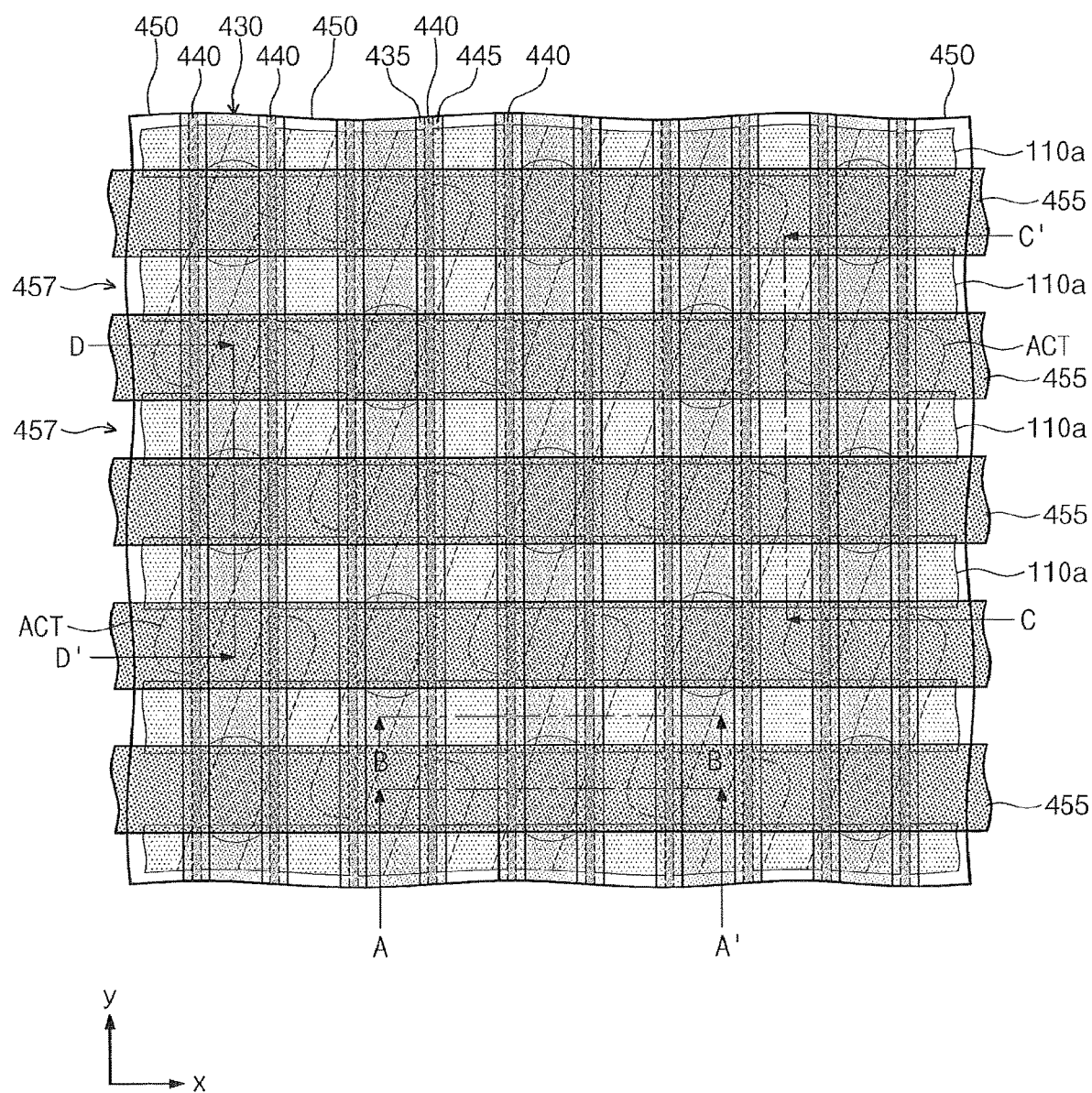
Figure 37C:
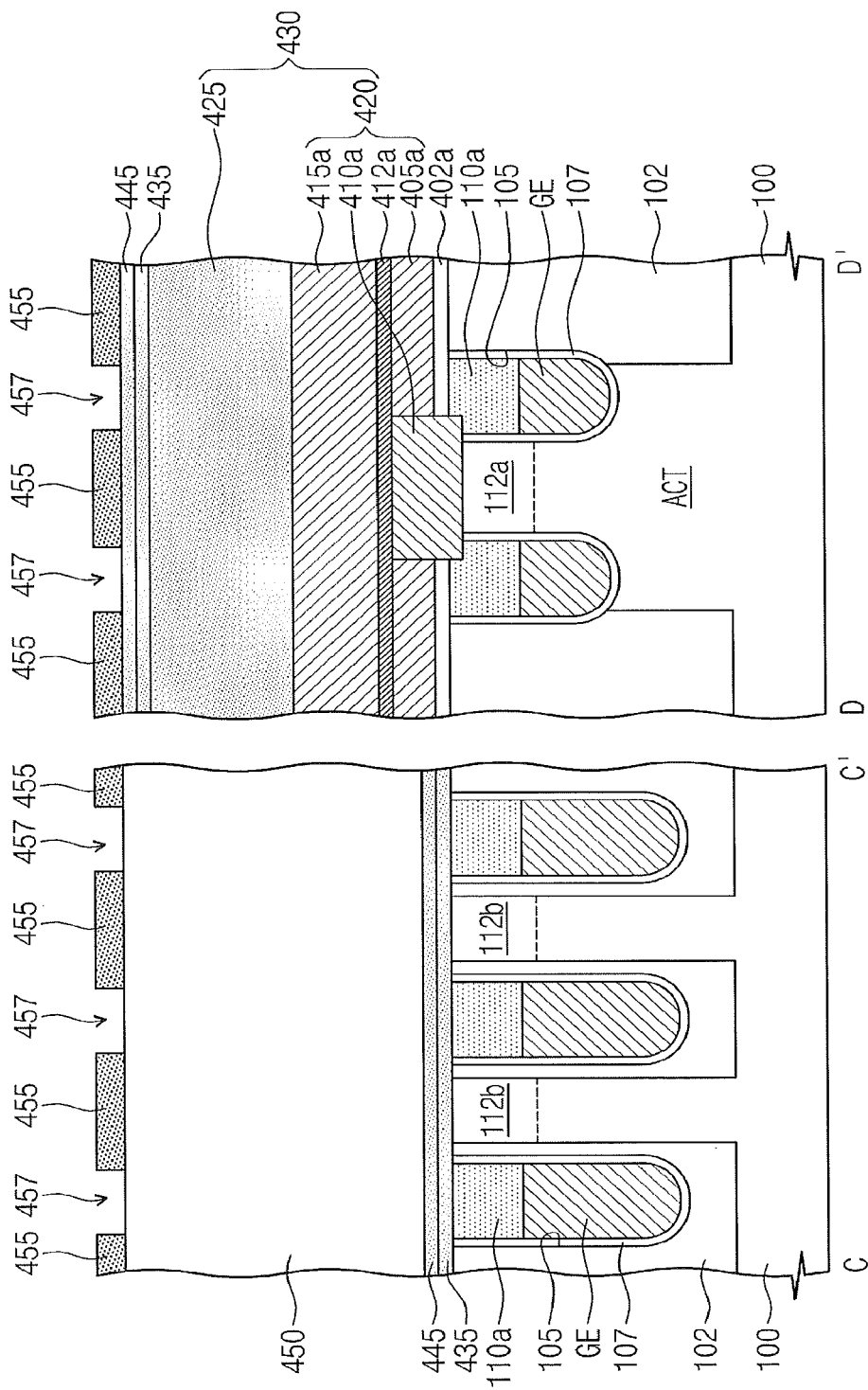

Referring to FIGS. 37A to 37C, next, a filling layer may be formed on an entire surface of the substrate 100 to fill spaces between the line patterns 430. The filling layer may be planarized to form filling line patterns 450. Each of the filling line patterns 450 fills the space between a pair of the line patterns 430 adjacent to each other. The filling line patterns 450 may be separated from each other. Thus, the filling line patterns 450 may extend in parallel to the line patterns 430. The filling line patterns 450 may be formed of silicon oxide.

Subsequently, a capping mask layer may be formed on the substrate 100 having the filling line patterns 450 and then the capping mask layer may be patterned to form capping mask patterns 455. The capping mask patterns 455 may cross over the filling line patterns 450 and the line patterns 430. For example, the capping mask patterns 455 may extend in an x-axis direction. The capping mask patterns 455 may be spaced apart from each other in the y-axis direction. Thus, line type openings 457 may be defined between the capping mask patterns 455. Each of the line type openings 457 may be defined between a pair of the capping mask patterns 455 adjacent to each other and may expose portions of the filling line patterns 450 and portions of the second protecting spacer layer 445 disposed on top surfaces of the line patterns 430. Each of the capping mask patterns 455 may overlap with each of the gate electrodes GE and each of the gate capping insulating patterns 110*a*.

The capping mask pattern 445 may be formed of a material having an etch selectivity with respect to the first and second protecting spacer layers 435 and 445, the hard mask pattern 425 of the line pattern 430, and the filling line pattern 450.

In some embodiments, a portion of the capping mask layer may remain in the peripheral circuit region (not shown). The capping mask layer in the peripheral circuit region may protect a structure, which is disposed in the peripheral circuit region and is formed of the same material as the filling line pattern 450.

Referring to FIGS. 38A to 38D, the exposed filling line patterns 450 are etched using the capping mask patterns 455 as etch masks until the second protecting spacer layer 445 under the filling line patterns 450 is exposed. Thus, fence concave regions 460 and filling pillar patterns 450*a* may be formed.

The filling pillar patterns 450*a* are disposed under the capping mask patterns 455 and are separated from each other. Each of the filling pillar patterns 450*a* may overlap with at least a portion of each of the second doped regions 112*b*.

Portions of the second protecting spacer layer 445, the first protecting spacer 435, the hard mask patterns 425, and the sacrificial spacers 440 under a bottom of each of the line type openings 457 may be recessed when the fence concave regions 460 are formed. At this time, the conductive wire 420 under the hard mask pattern 425 may not be exposed. Thus, the fence concave region 460 formed under each of the line type openings 457 may include a groove region and hole regions. The groove region of the fence concave region 460 may be disposed on the recessed hard mask patterns 425 and extend in parallel to the capping mask patterns 455 to cross the line patterns 430. The hole regions of the fence concave region 460 may be defined between the line patterns 430 under each of the line type openings 457. Each of the hole regions of the fence concave region 460 may be defined between a pair of the line patterns 430 adjacent to each other and between a pair of the filling pillar patterns 450*a*, which are adjacent to each other and are disposed between the pair of the line patterns 430.

The etching process for the formation of the fence concave regions 460 and the filling pillar patterns 450*a* may have a dominant anisotropic etching property substantially perpendicular to the substrate 100. Additionally, the etching process may also have a lateral etching property. The second protecting spacer layer 445 covering a sidewall of the sacrificial spacer 440 may further be recessed by the lateral etching property. Thus, the sacrificial spacer 440 and the second protecting spacer layer 445 on the sidewall of the line pattern 430 may be recessed to be lower than a top surface of the recessed portion of the hard mask pattern 425. FIG. 38D shows a cross-sectional view of the sacrificial spacer 440 taken along a longitudinal direction of the sacrificial spacer 440. As illustrated in FIG. 38D, a portion of the sacrificial spacer 440 under a center region of the line type opening 457 may be recessed to be lower than another portion of the sacrificial spacer 440 under an edge region of the line type opening 457. In some embodiments, as illustrated in FIG. 38B, the sacrificial spacer 440 under the fence concave region 460 may be recessed to be lower than a top surface of the conductive wire 420 in the line pattern 430.

Referring to FIGS. 39A to 39D, a fence insulating layer may be formed on the substrate 100 to fill the fence concave regions 460. The fence insulating layer may be planarized until the capping mask patterns 455 are exposed, thereby forming insulating fences 465 filling the fence concave regions 460, respectively. The capping mask patterns 455 may be formed of a material having an etch selectivity with respect to the insulating fences 465. The insulating fences 465 may be formed of an insulating material having an etch selectivity with respect to the filling pillar patterns 450a. For example, the capping mask pattern 455 may be formed of a semiconductor material (e.g., poly-crystalline silicon), and the insulating fences 465 may be formed of silicon nitride and/or silicon oxynitride. In some embodiments, top surfaces of the insulating fences 465 may be lower than top surfaces of the capping mask patterns 455. At this time, the top surfaces of the insulating fences 465 may be higher than top surfaces of the filling pillar patterns 450a.

The insulating fence 465 may cover the recessed portions of the sacrificial spacers 440 exposed by the fence concave region 460.

Meanwhile, the method of forming the fence concave regions 460 and the insulating fences 465 using the capping mask patterns 455 may be applied to the first to third embodiments described above. In other words, the method of forming the upper insulating fences 147 and 320 of the first to third embodiments may be replaced with the method of forming the fence concave regions 460 and the insulating fences 465 using the capping mask patterns 455.

Figure 40A:
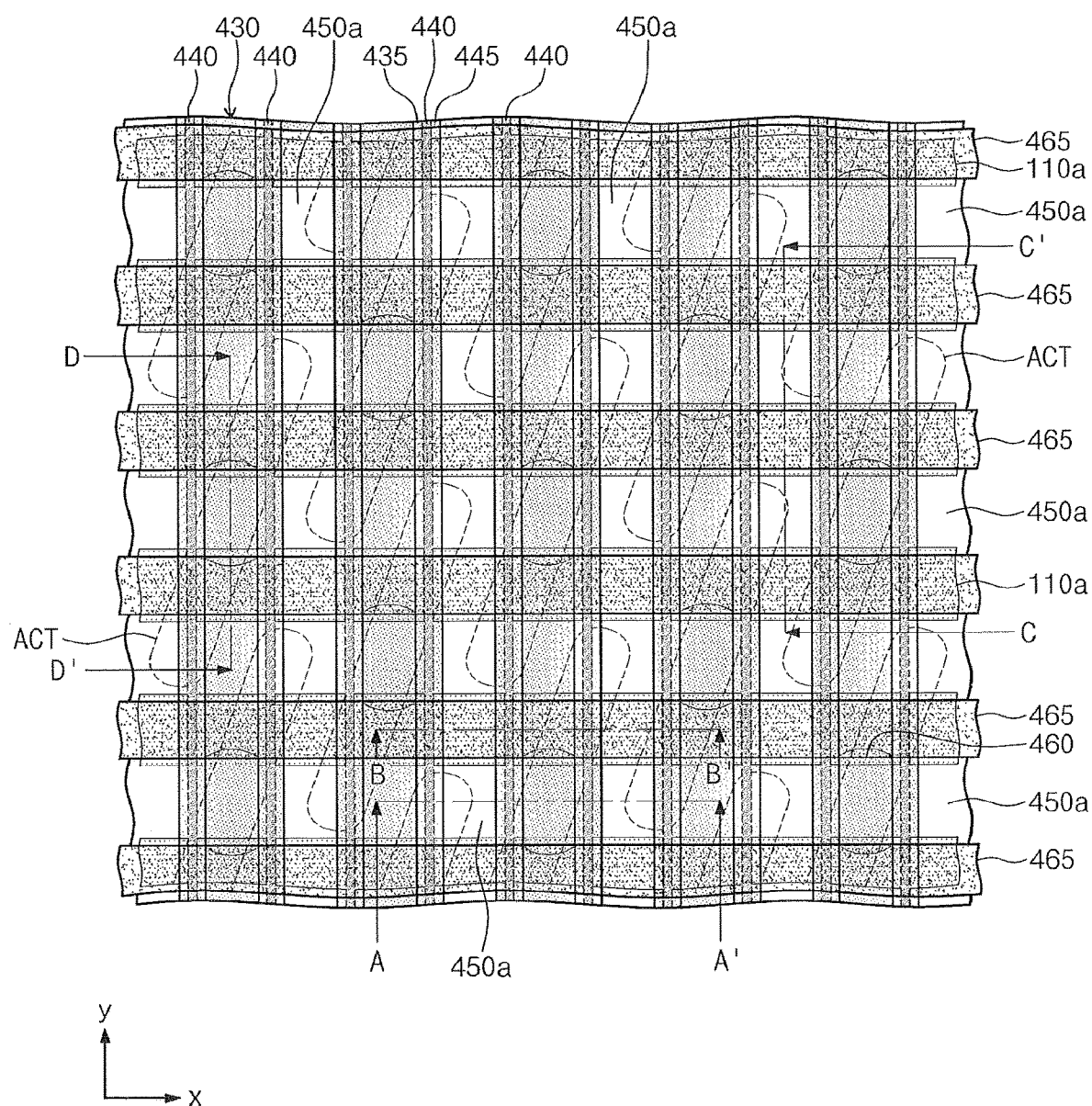
Figure 40B:
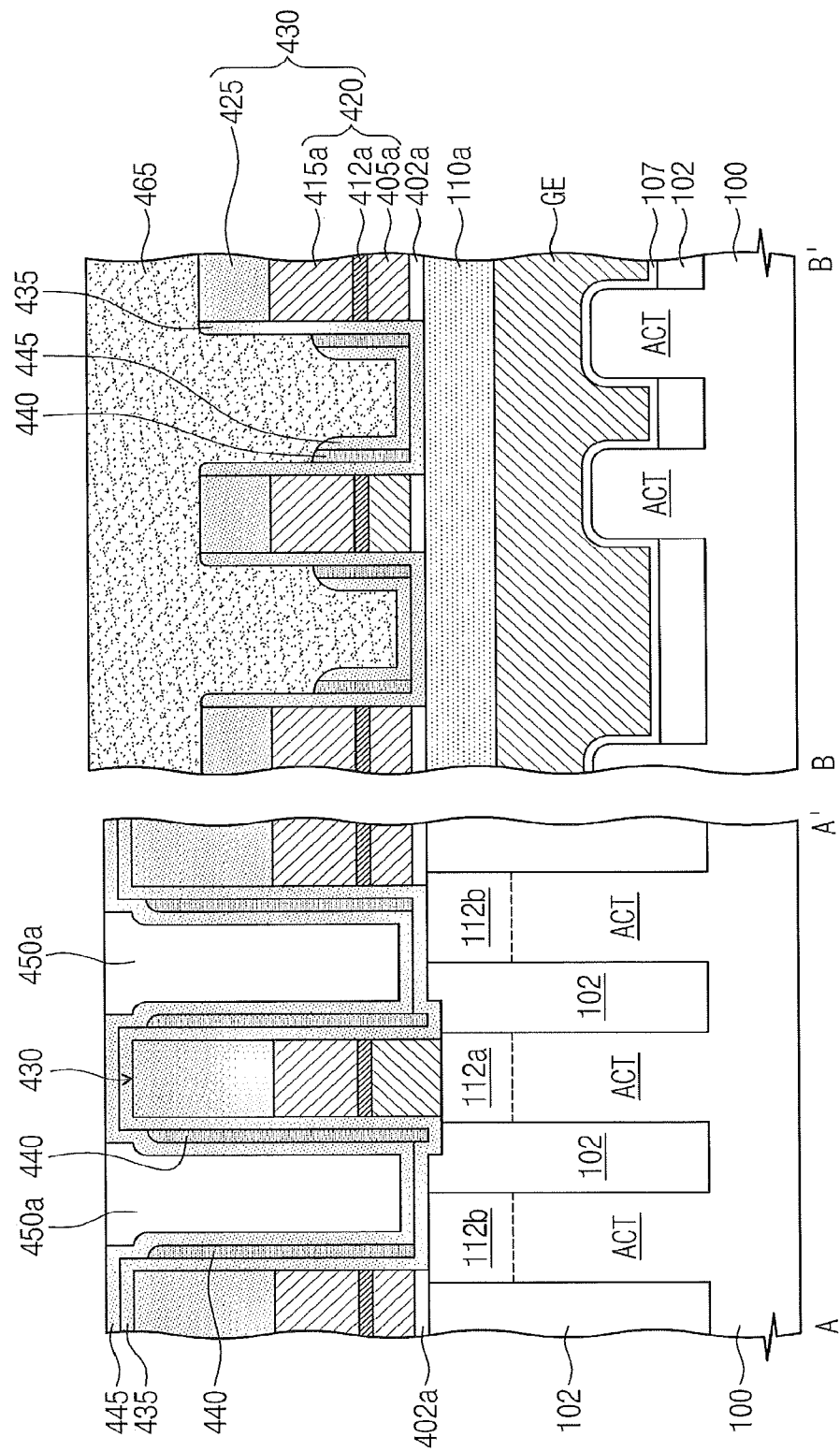
Figure 40C:
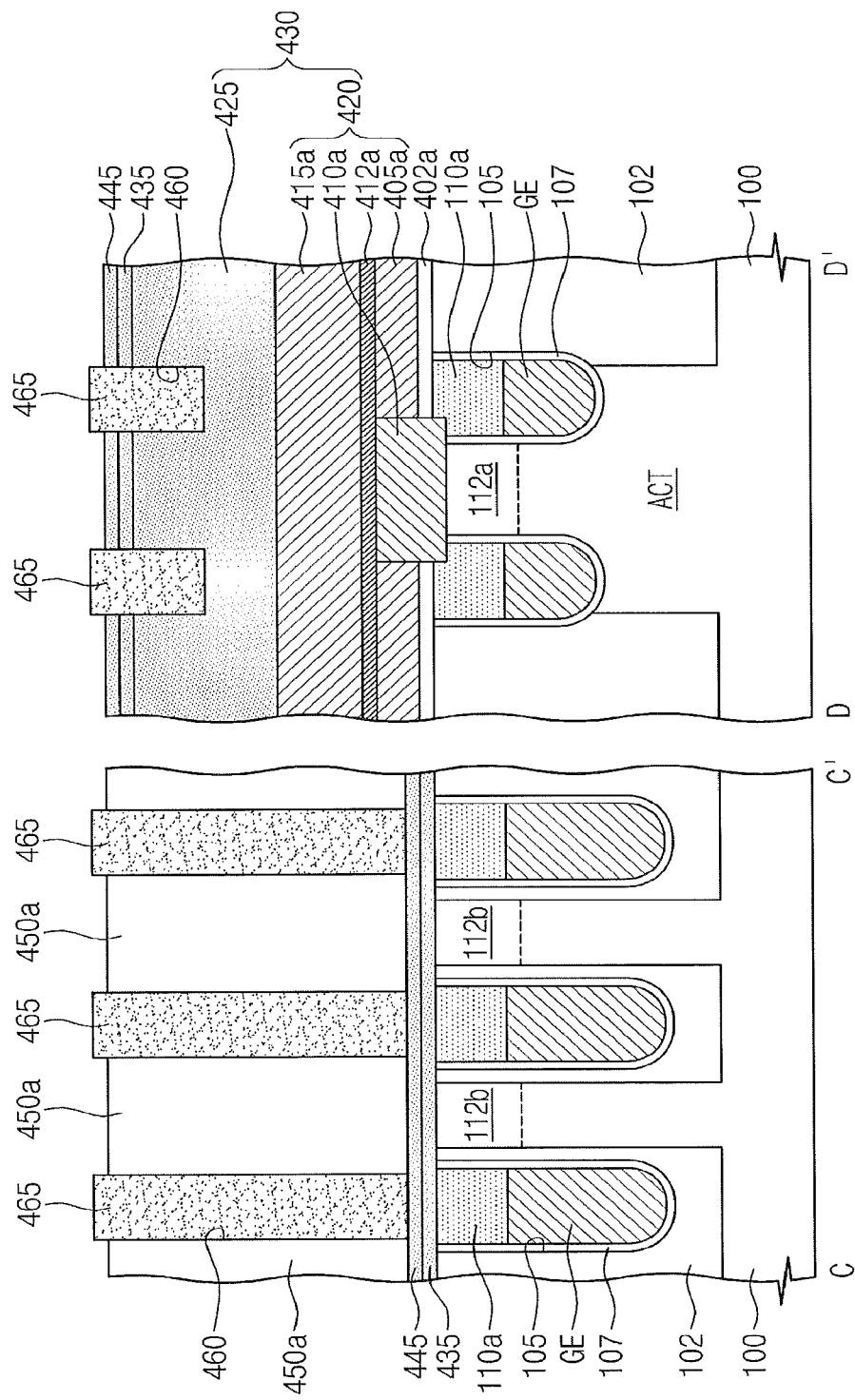

Referring to FIGS. 40A to 40C, the capping mask patterns 455 may be removed to expose the filling pillar patterns 450a. In this case, the capping mask layer covering the peripheral circuit region (not shown) may remain in some embodiments.

Figure 41A:
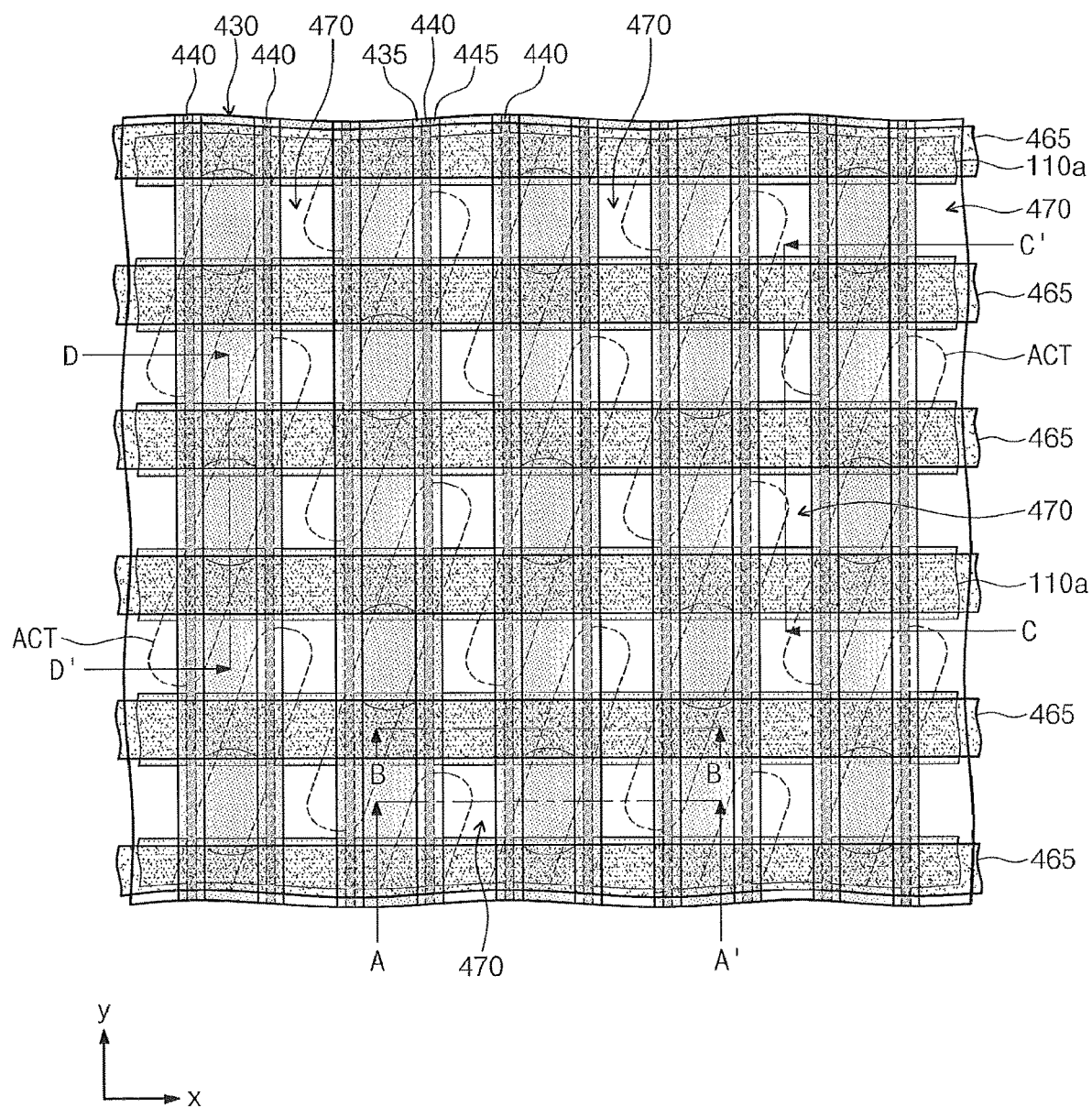
Figure 41B:
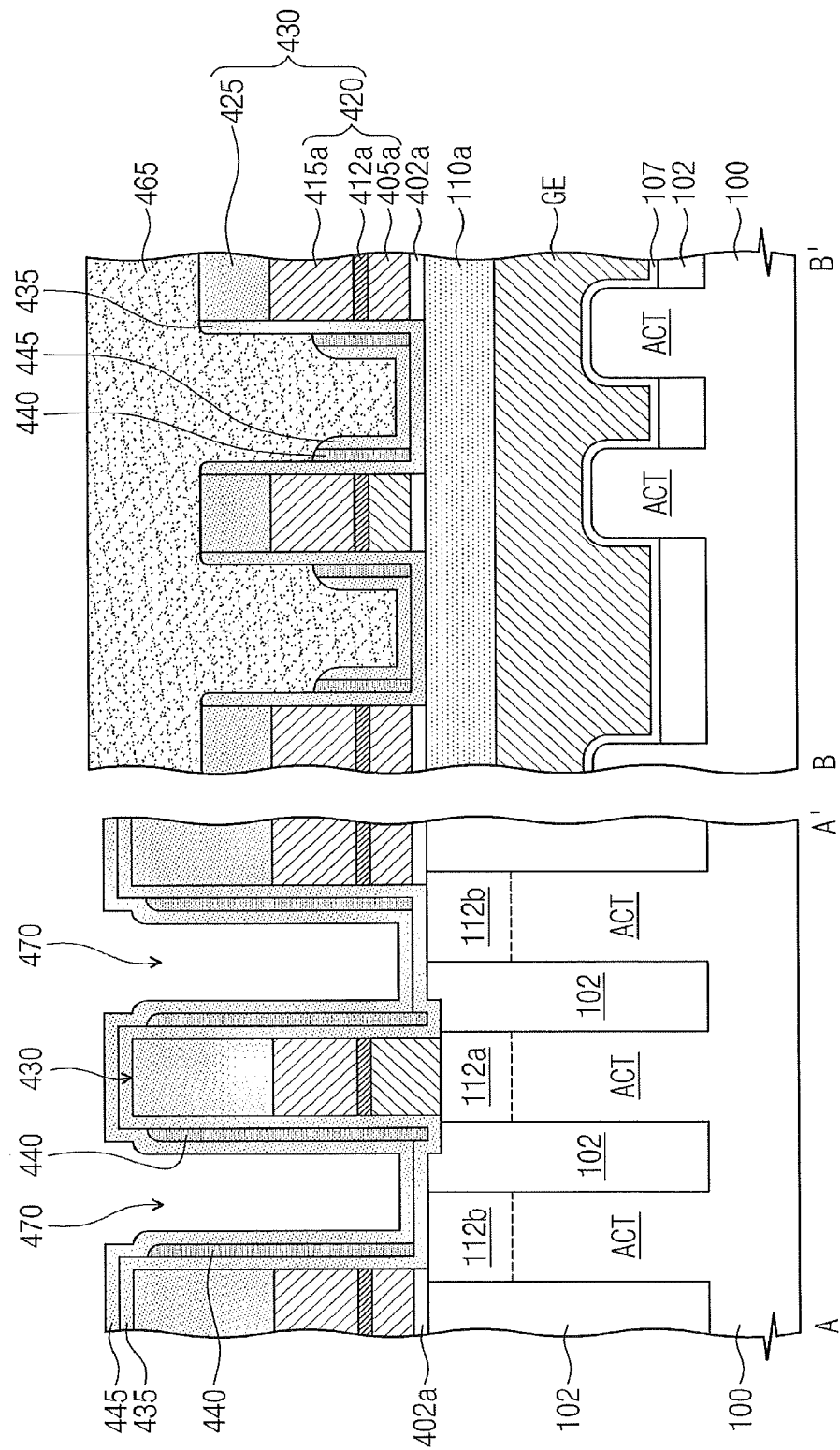
Figure 41C:
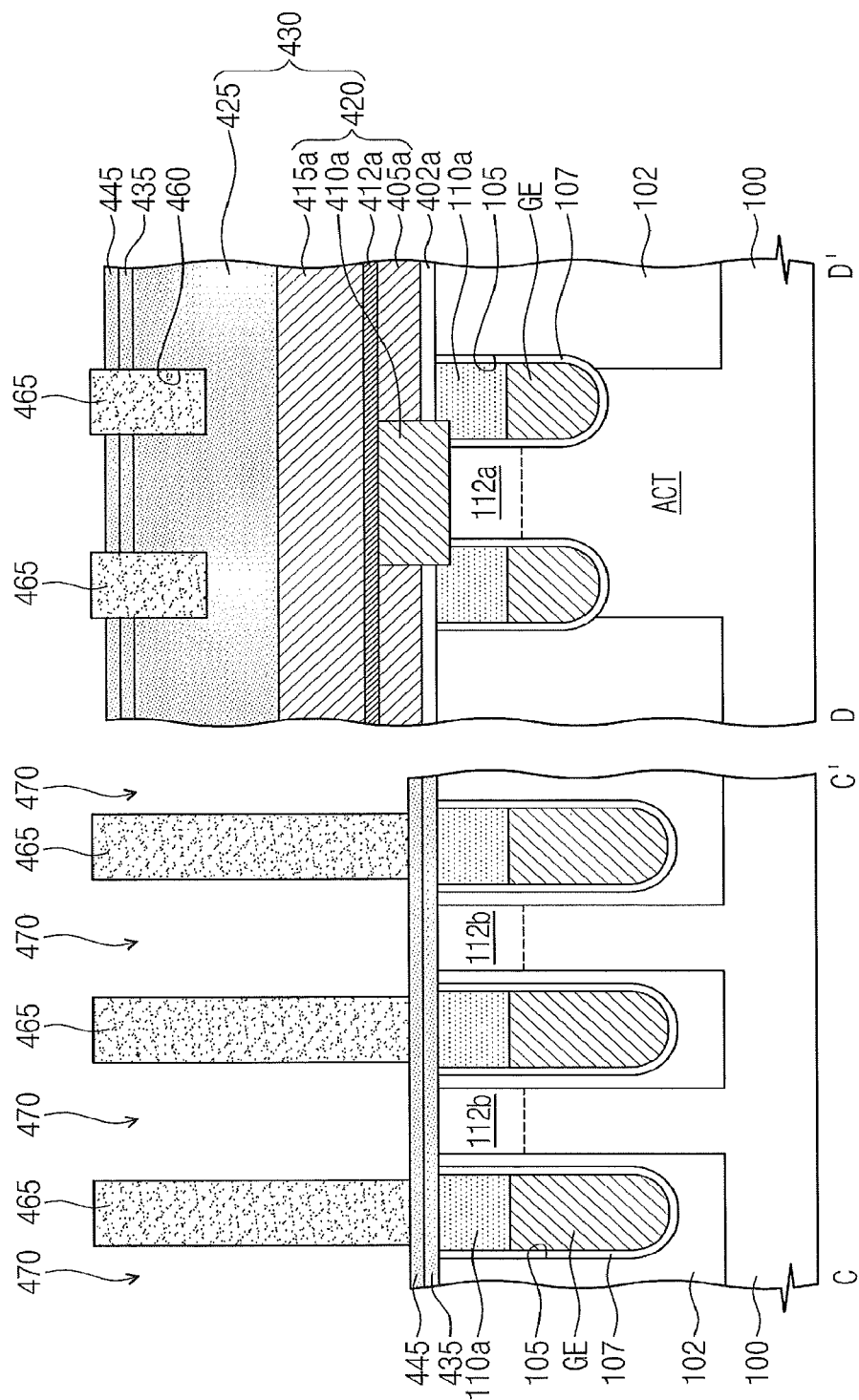

Referring to FIGS. 41A to 41C, the exposed filling pillar patterns 450a may be removed to form preliminary contact holes 470. The filling pillar patterns 450a may be removed by an isotropic etching process (e.g., a wet etching process). The preliminary contact hole 470 may be surrounded by a pair of the line patterns 430 adjacent to each other and a pair of the insulating fences adjacent to each other. A bottom surface of the preliminary contact hole 470 may be formed of the second protecting spacer layer 445.

In some embodiments, after the preliminary contact holes 470 are formed, the capping mask layer remaining in the peripheral circuit region (not shown) may be removed. The remaining capping mask layer may protect the structure formed of the same material as the filling pillar pattern 45a in the peripheral circuit region during the formation of the preliminary contact holes 470.

Figure 42A:
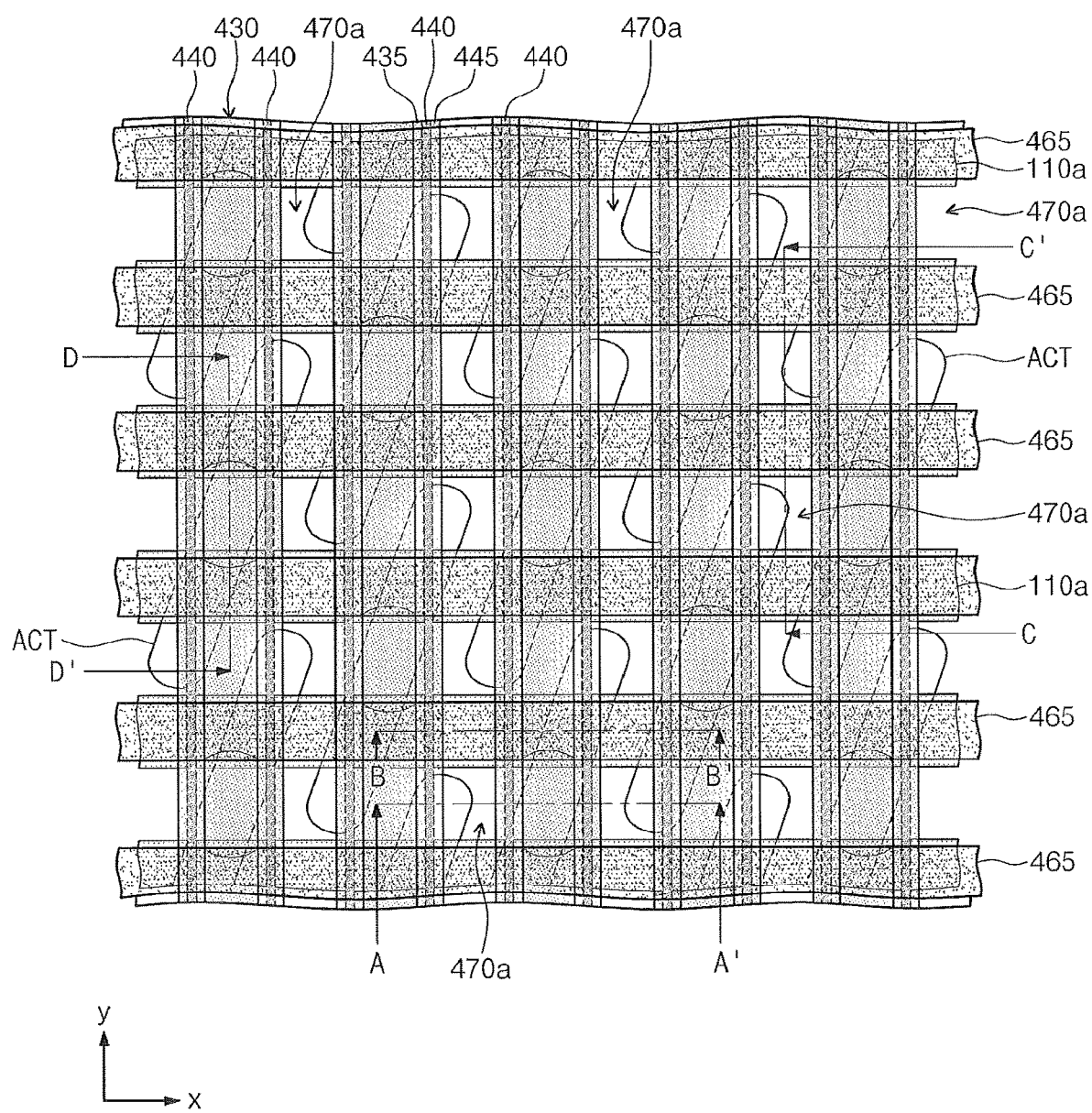
Figure 42C:
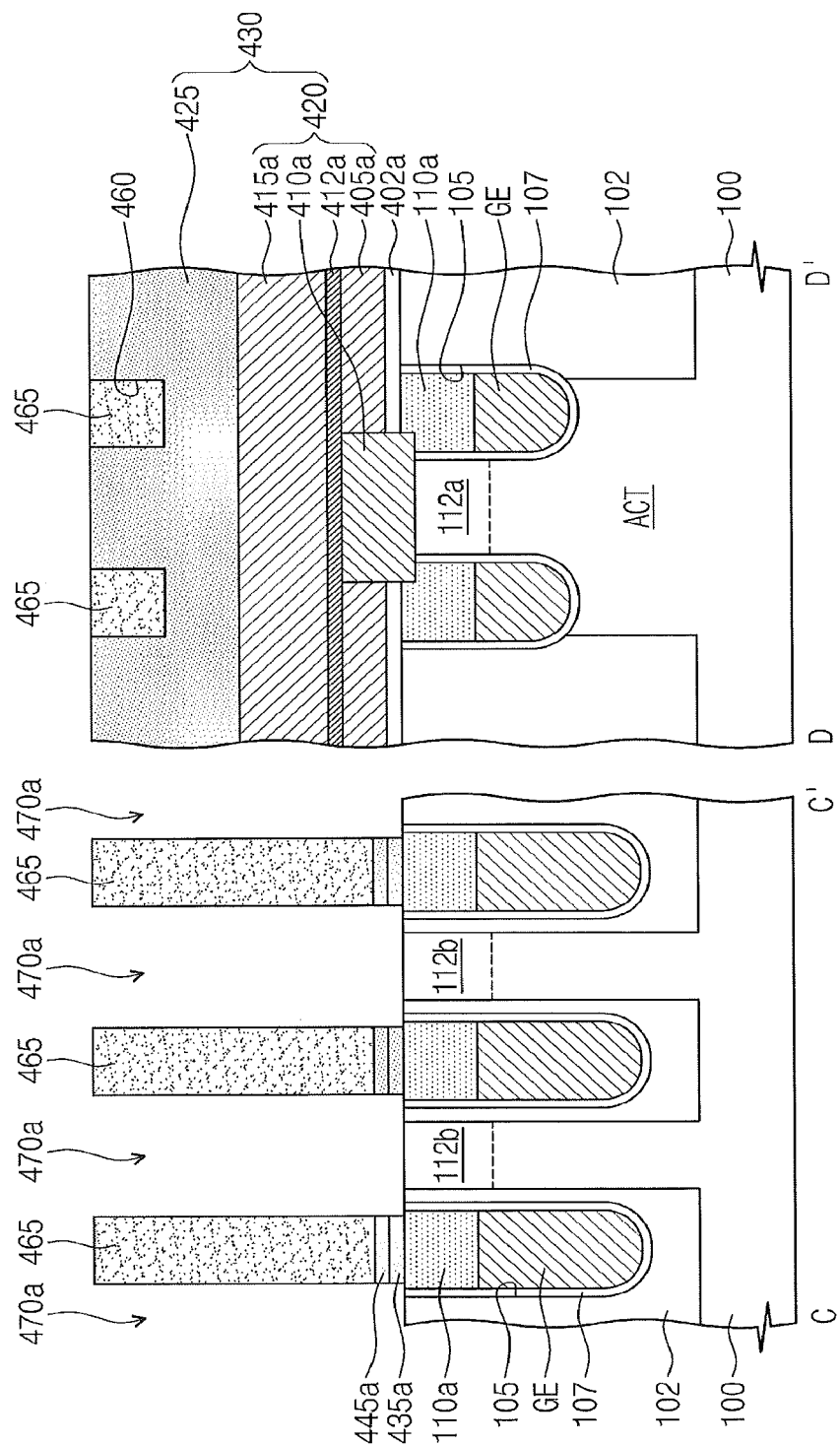

Referring to FIGS. 42A to 42C, after the preliminary contact holes 470 are formed, the second and first protecting spacer layers 445 and 435 are successively and anisotropically etched. Thus, the second and the first protecting spacer layers 445 and 435 under the bottom surface of the preliminary contact holes 470 may be etched to form contact holes 470a exposing the second doped regions 112b, respectively. Additionally, a first protecting spacer 435a and a second protecting spacer 445a may be formed on each of both sidewalls of the line pattern 430. In other words, the first protecting spacer 435a, the sacrificial spacer 440 and the second protecting spacer 445a may be sequentially stacked on each sidewall of the line pattern 430. At this time, top ends of the sacrificial spacers 440 between the insulating fences 465 are exposed.

Figure 43A:
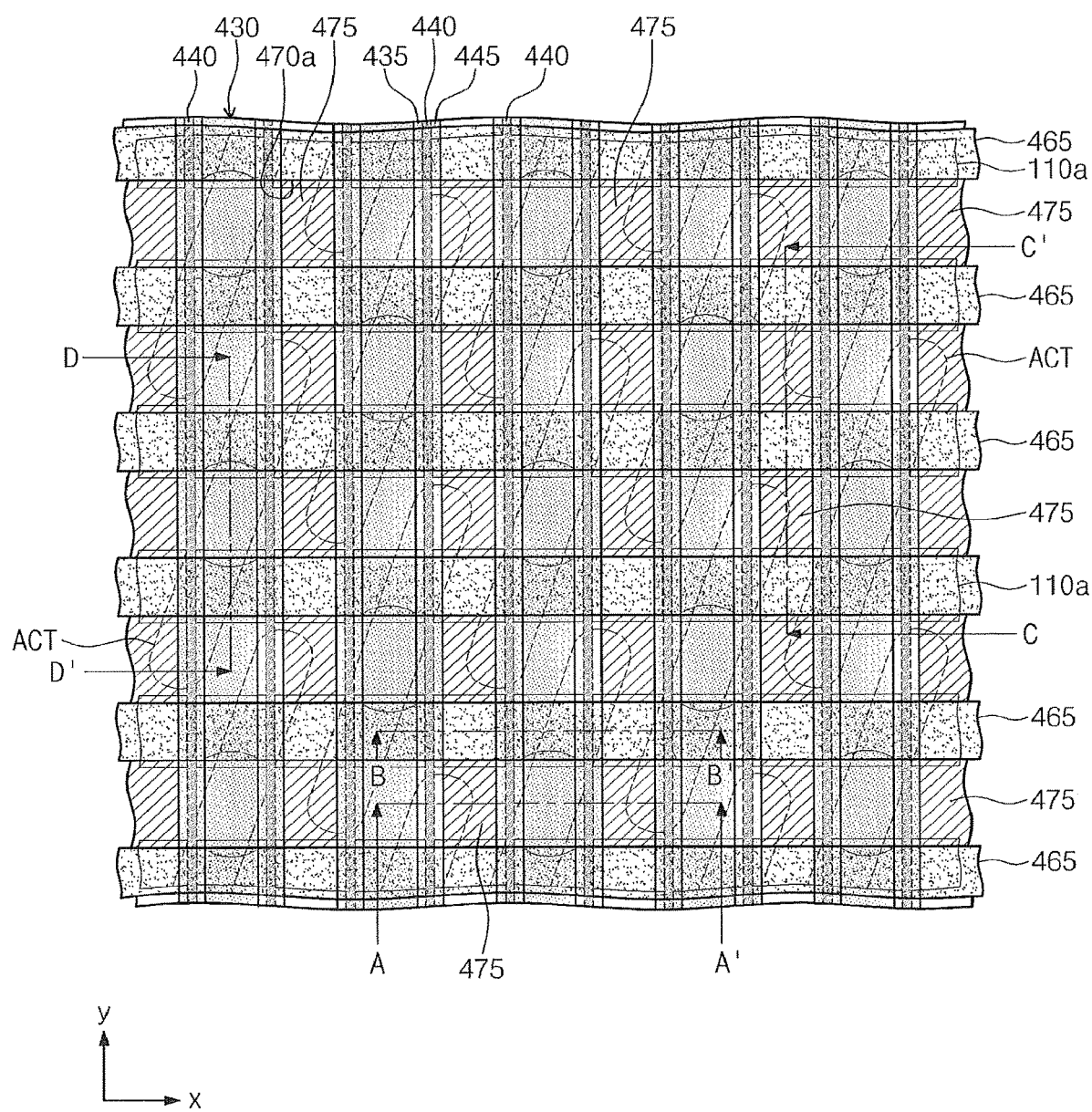
Figure 43B:
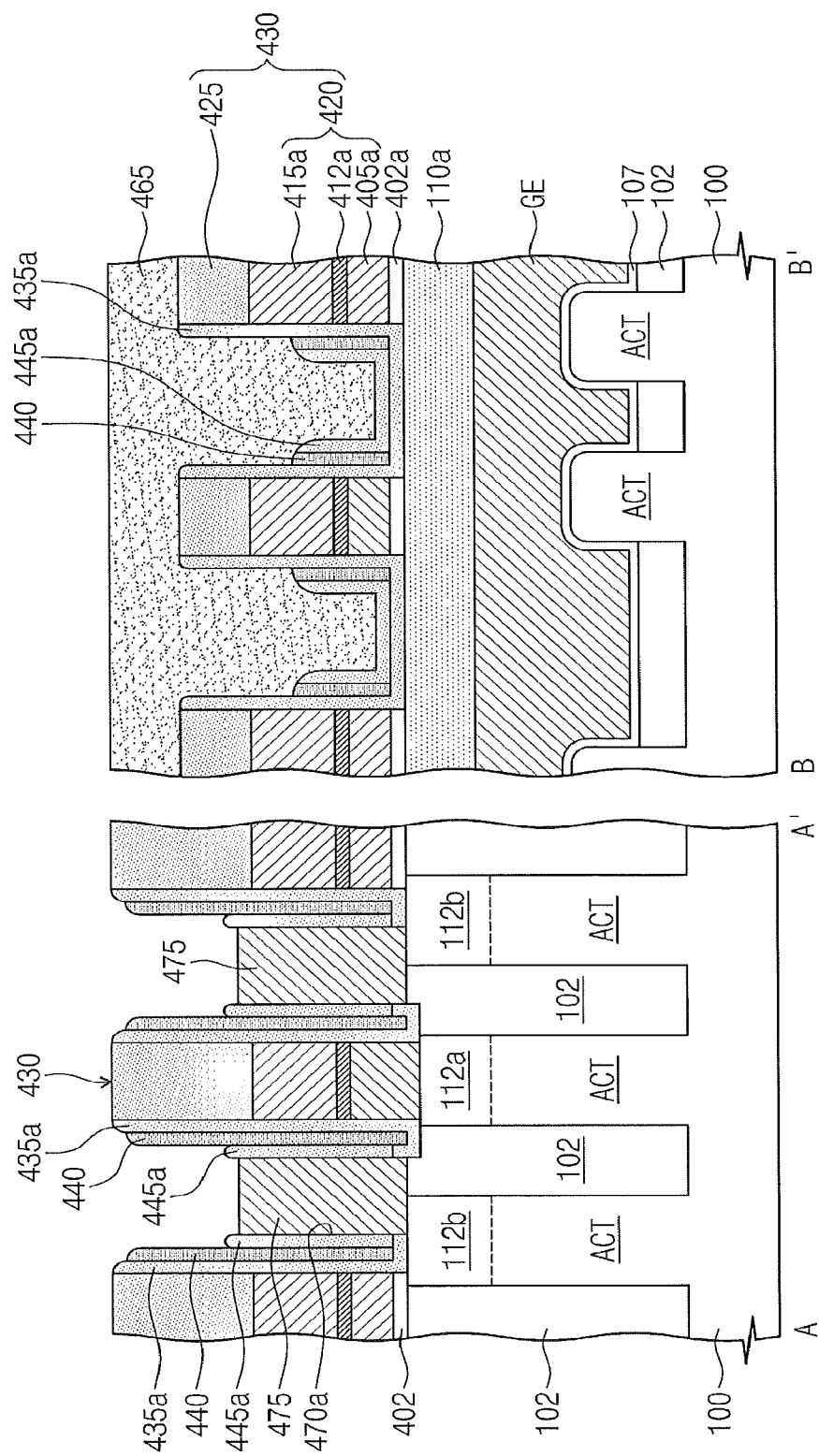
Figure 43C:
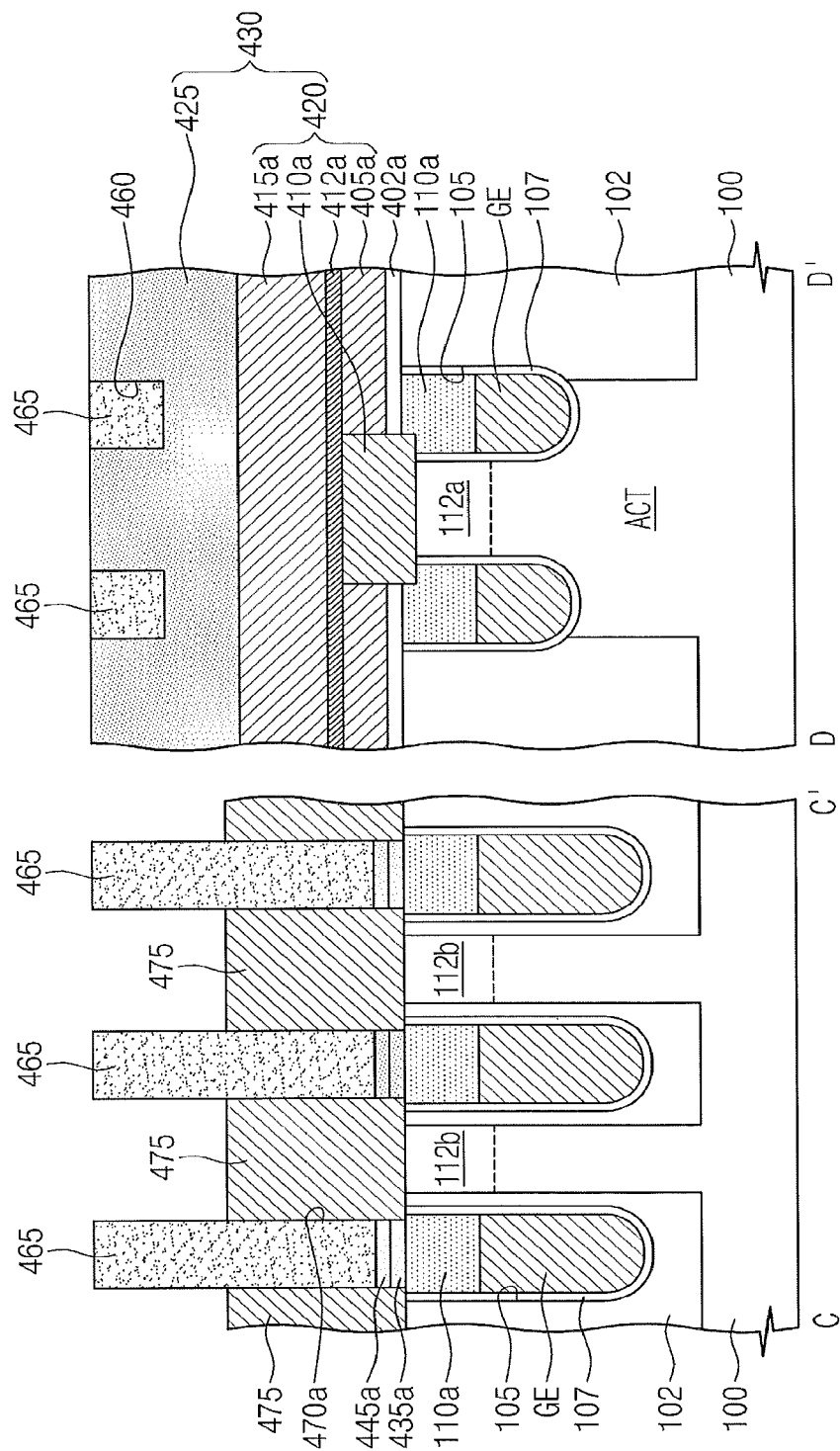

Referring to FIGS. 43A to 43C, subsequently, a first conductive layer may be formed to fill the contact holes 470a and then an etch-back process may be performed on the first conductive layer to form a lower plug 475 filling a lower region of each of the contact holes 470a. The lower plug 475 may be in contact with the second doped region 112b under the contact hole 470a. The lower plug 475 may include a first conductive material. For example, the lower plug 475 may be formed of a semiconductor material doped with dopants (e.g., doped silicon).

Upper portions of the second protecting spacers 445a disposed at both sides of an upper region of the contact hole 470a may be recessed during the etch-back process for the formation of the lower plug 475. In other words, the etch-back process may include a lateral etching property as well as a dominant anisotropic etching property. Since the upper portions of the second protecting spacers 445a are etched by the etch-back process, a width of the upper region of the contact hole 470a may widen.

In some embodiments, a top surface of the lower plug 475 may be higher than a top end of the recessed sacrificial spacer 440 under the insulating fence 465 as illustrated in FIG. 43B. Additionally, a top end of the recessed second protecting spacer 445a may also be higher than the top end of the recessed sacrificial spacer 440 under the insulating fence 465.

Figure 44A:
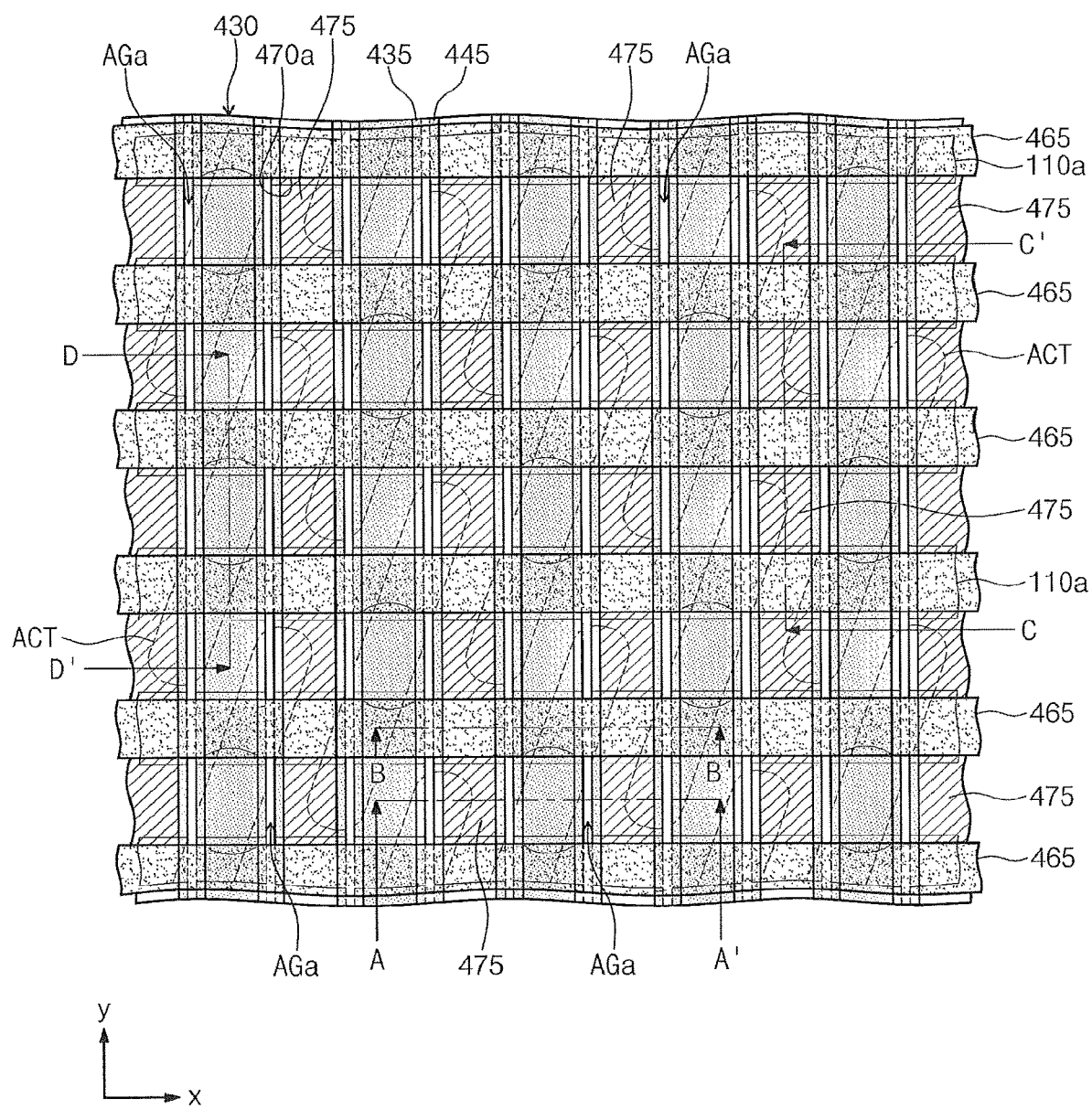
Figure 44B:
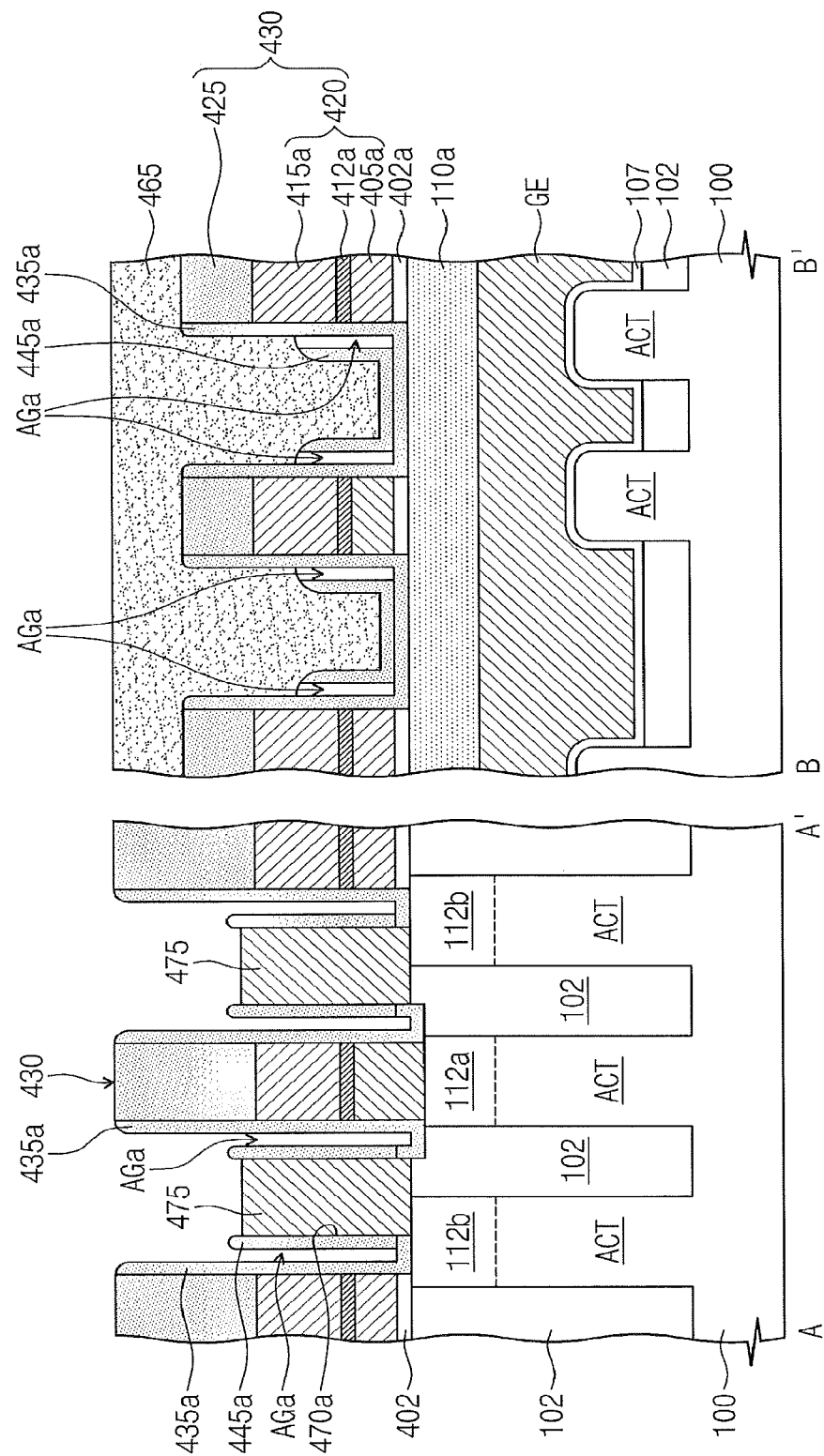
Figure 44C:
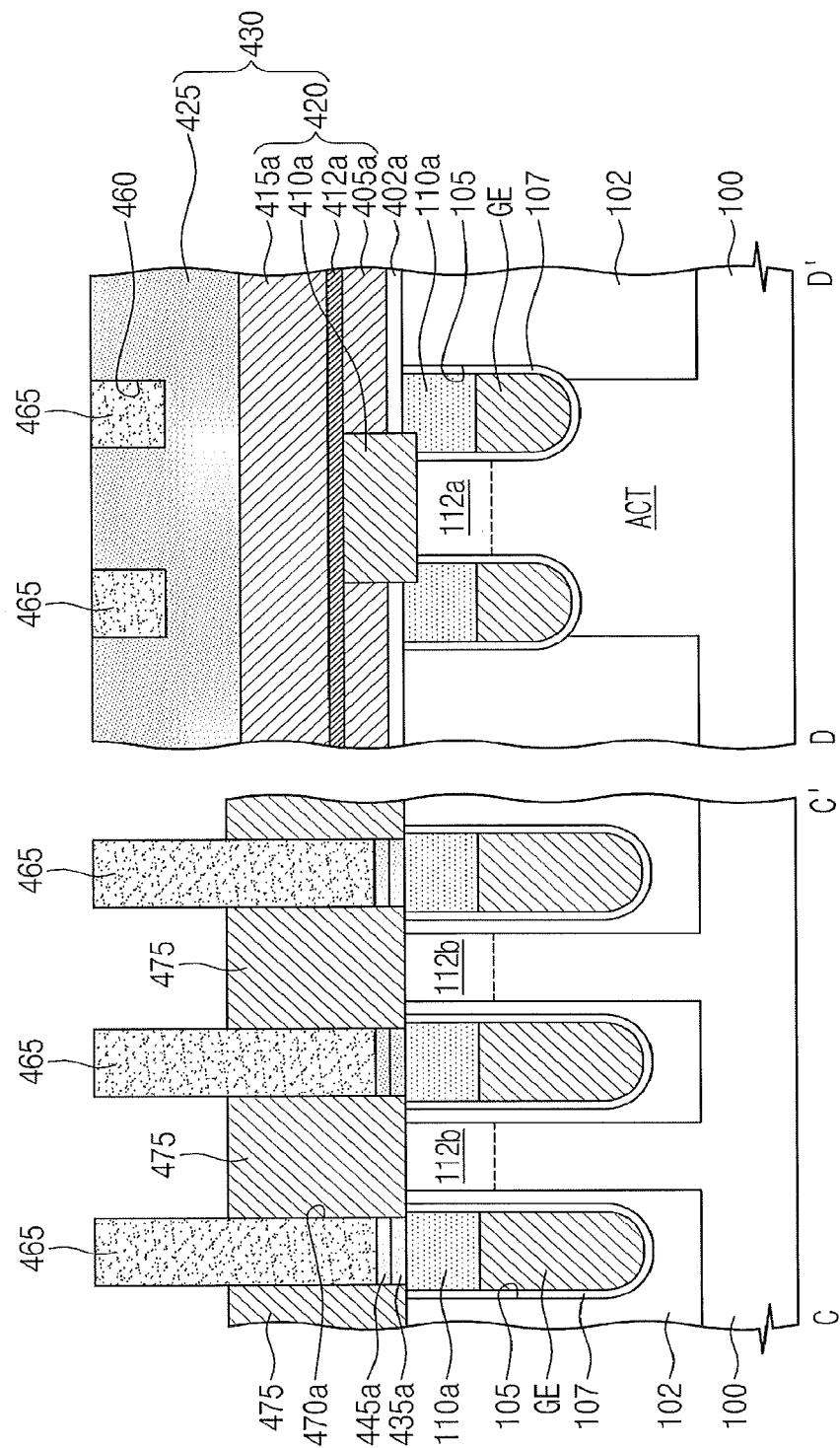

Referring to FIGS. 44A to 44C, the exposed sacrificial spacers 440 may be removed to form air gaps AGa. The exposed sacrificial spacers 440 may be removed by an isotropic etching process (e.g., a wet etching process). Thus, the recessed sacrificial spacers 440 under the insulating fence 465 may be removed. As a result, the air gaps AGa described with reference to FIGS. 31A to 31D may be formed. The lower plugs 475 are in contact with the insulating fences 465. Thus, the lower plugs 475 may be supported by the insulating fences 465 during the process of removing the sacrificial spacers 440.

Figure 45A:
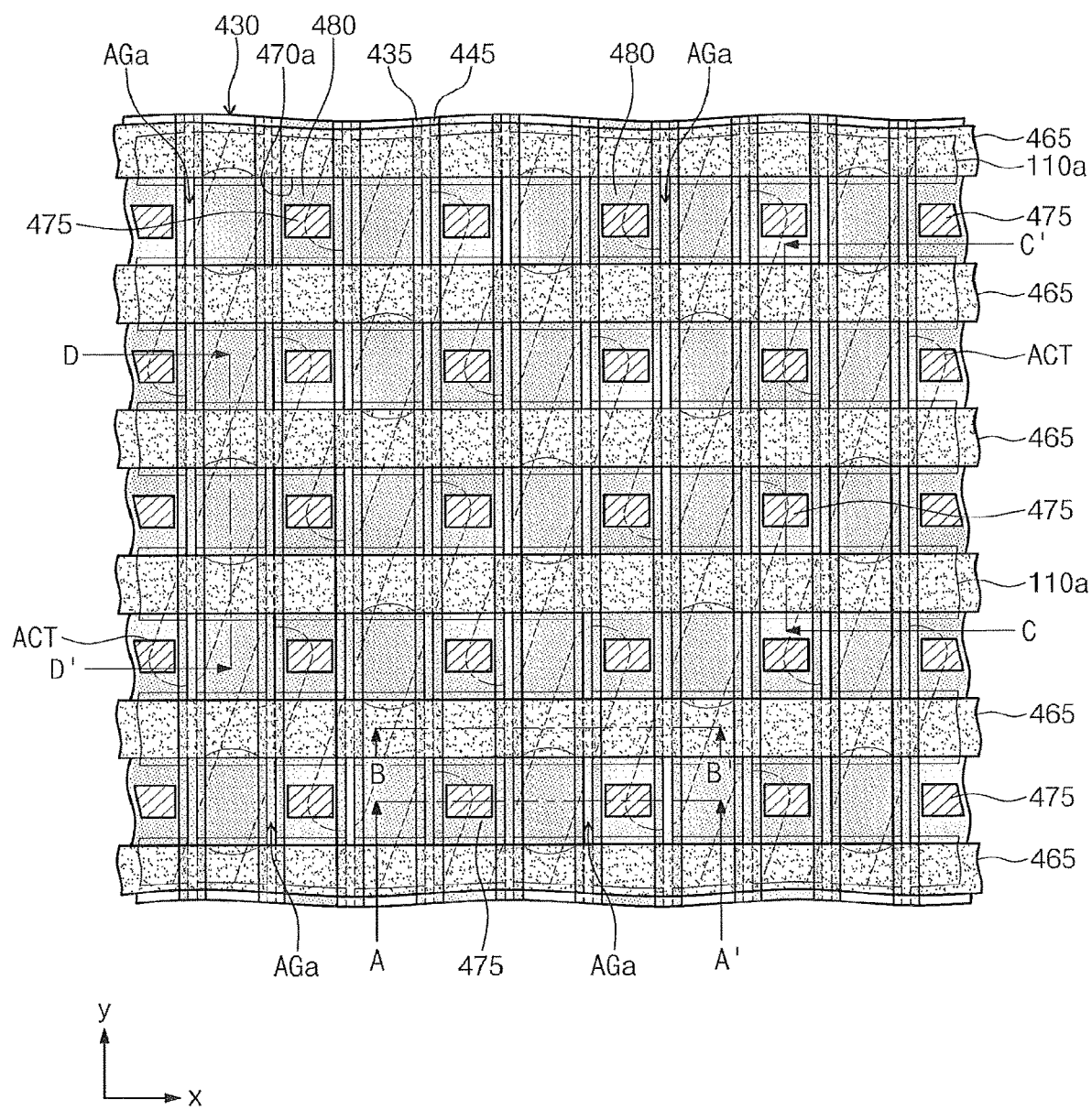
Figure 45B:
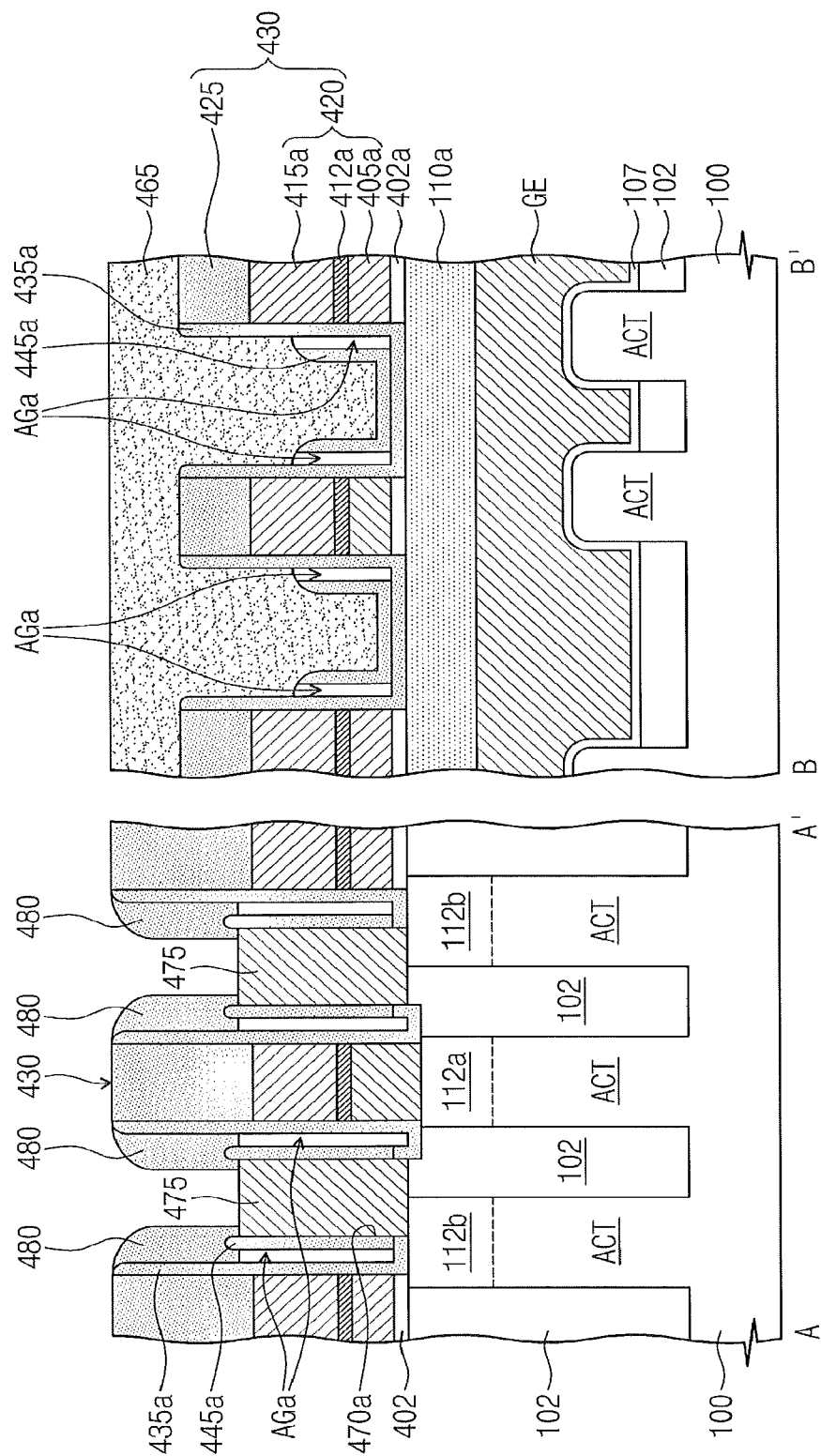
Figure 45C:
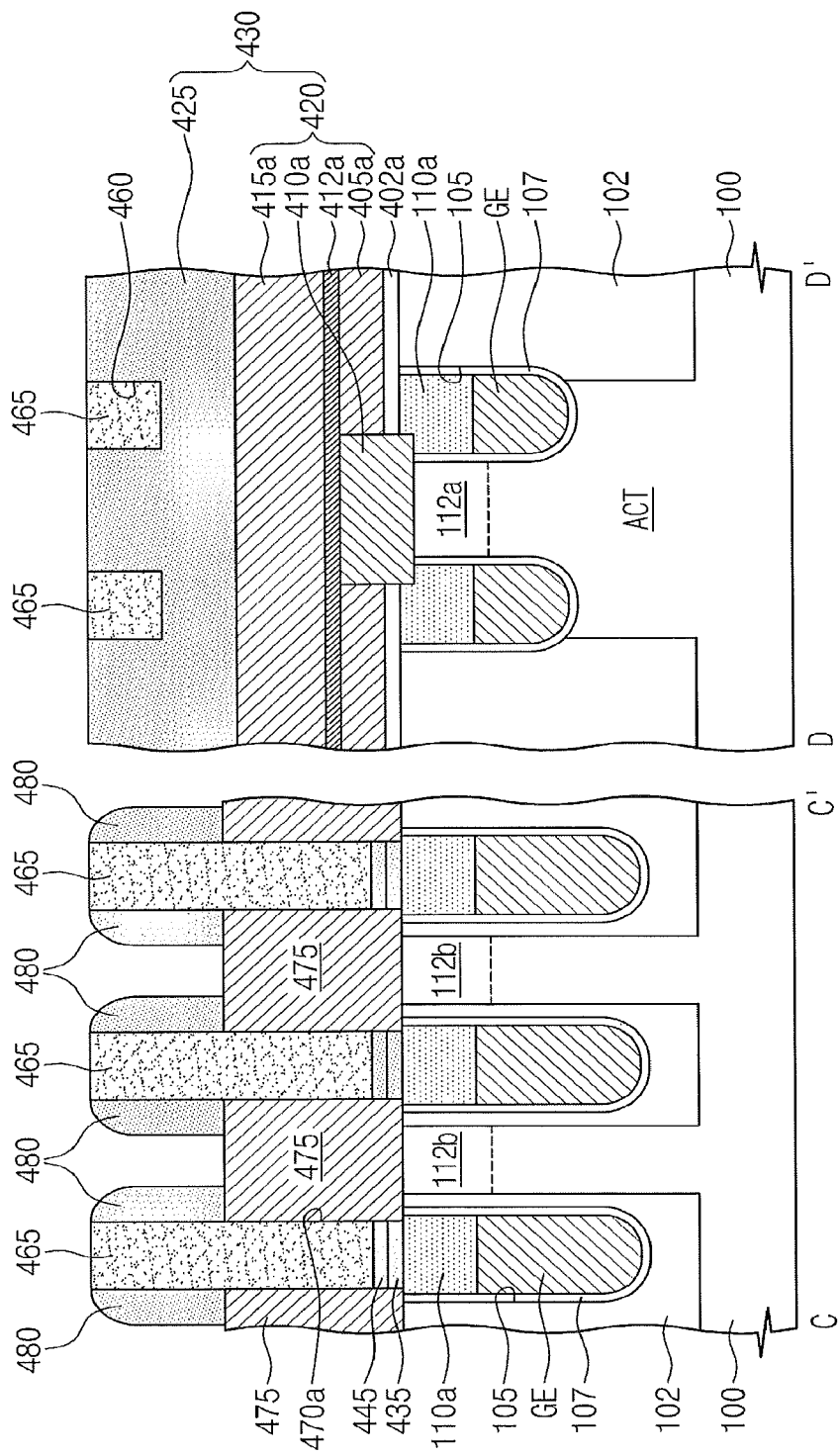

Referring to FIGS. 45A to 45C, a capping spacer layer may be formed on the substrate 100 having the air gaps AGa. The capping spacer layer may have a poor step coverage property. Thus, the capping spacer layer may not fill the air gap AGa. The capping spacer layer may close a top end of the air gap AGa. The capping spacer layer may be formed of an insulating material (e.g., silicon nitride and/or silicon oxynitride). Subsequently, an etch-back process may be performed on the capping spacer layer to form a capping spacer 480 on a sidewall of the upper region of the contact hole 470a. The capping spacer 480 may cover an edge portion of the top surface of the lower plug 475. In other words, a center region of the top surface of the lower plug 475 may be exposed.

Referring to FIGS. 31A to 31D again, a second conductive layer may be formed to fill the upper region of the contact hole 470a. The second conductive layer may include a second conductive material different from the first conductive material of the lower plug 475. For example, the second conductive layer may include a barrier layer (e.g., a transition metal (e.g., titanium, tantalum) and/or a conductive metal nitride (e.g., titanium nitride, tantalum nitride)) and a metal layer (e.g., tungsten, and/or aluminum), which are sequentially stacked. In some embodiments, the transition metal in the barrier layer may react with the lower plug 475 to form an ohmic layer 485. The second conductive layer may be patterned to form the upper plug 490c and the landing pad 490L.

Subsequently, the interlayer insulating layer 173, the via-plug 175, and the data storage part DSP may be formed to realize the semiconductor device illustrated in FIGS. 31A to 31D.

Next, a method of manufacturing the semiconductor device illustrated in FIGS. 32A to 32C will be described around marked features.

Figure 46A:
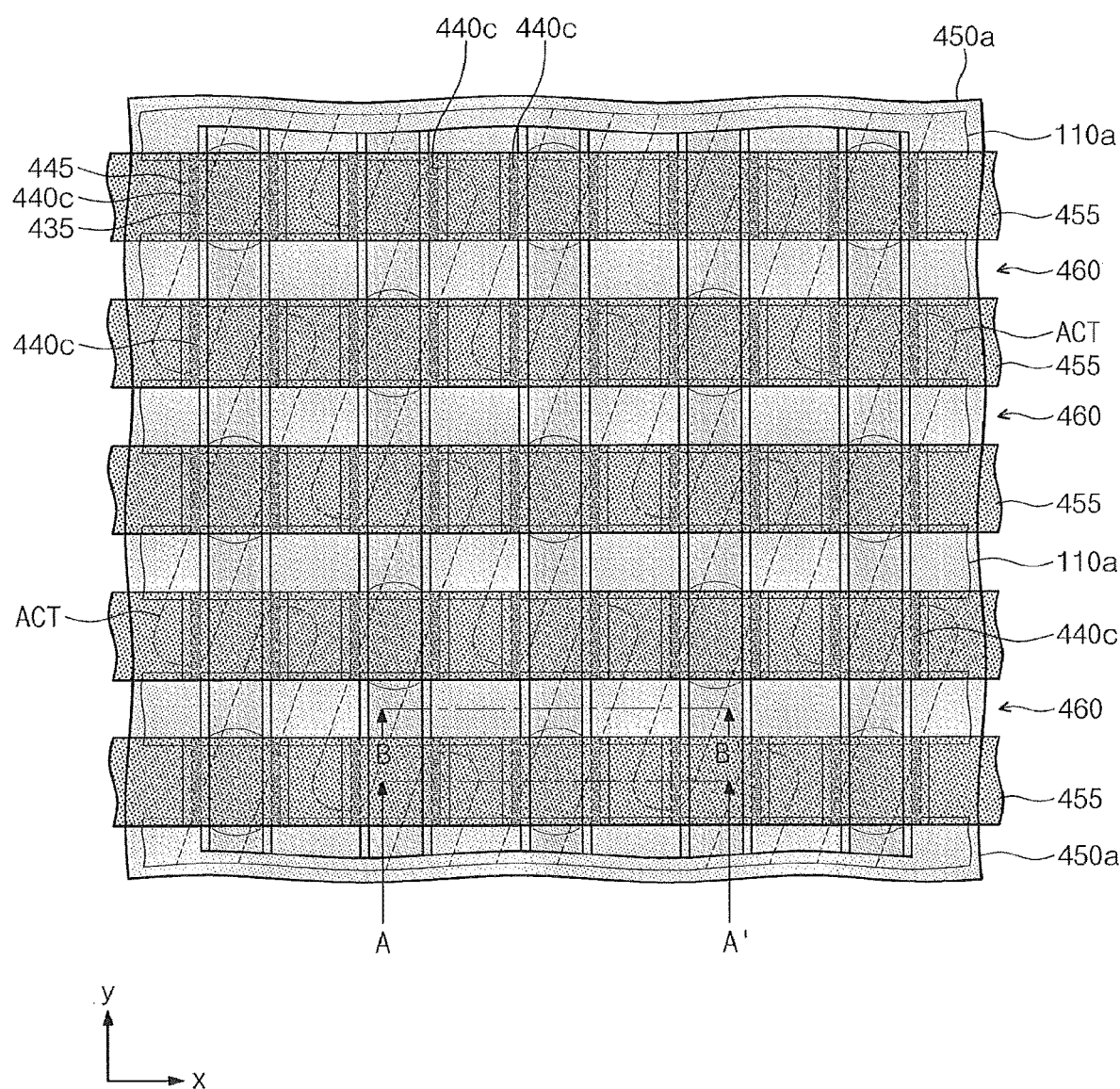
FIG. 46A is a plan view illustrating a modified example of a method of manufacturing a semiconductor device according to yet other embodiments of the inventive concept.
Figure 46B:
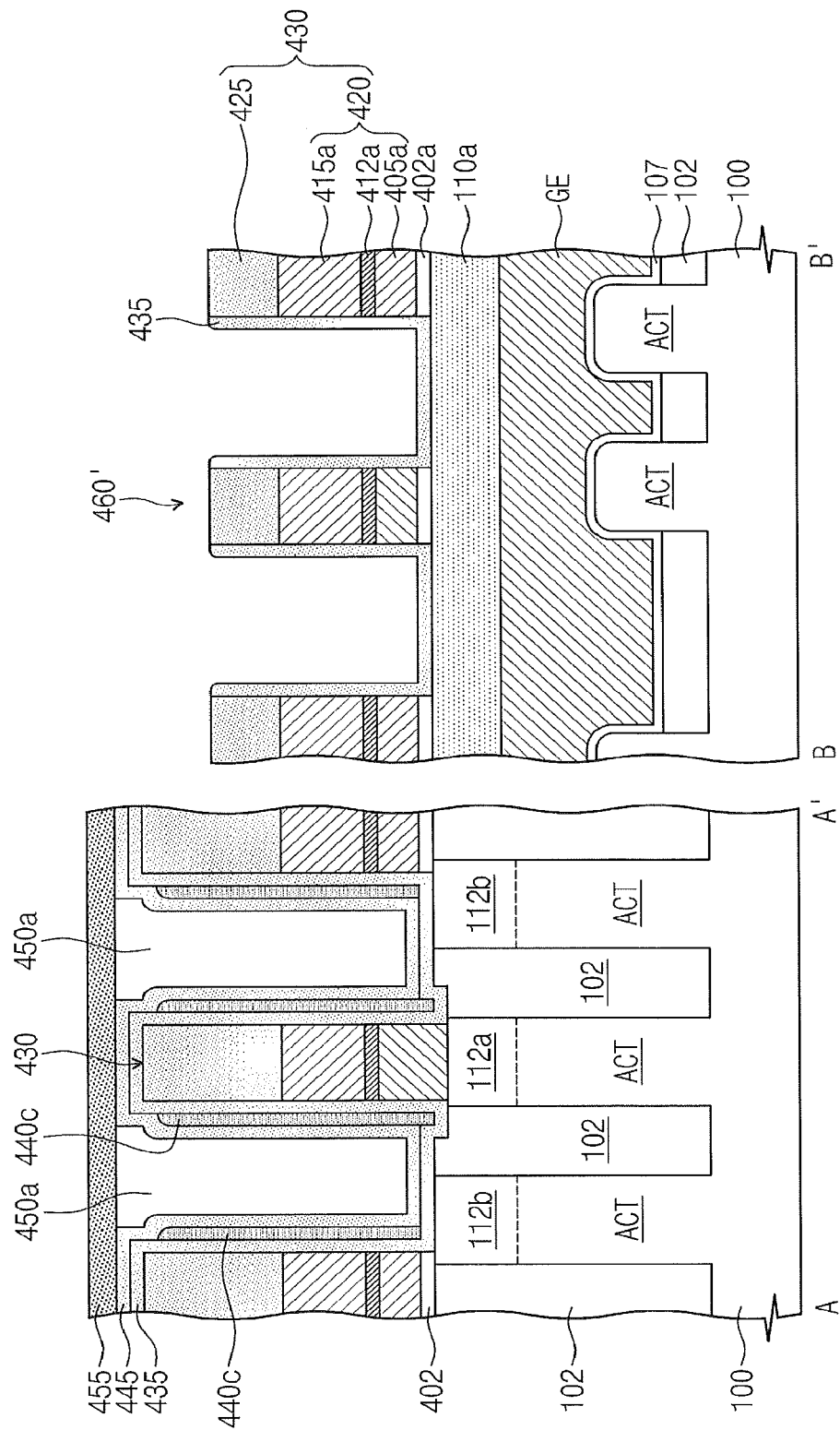
FIG. 46B is a cross-sectional view taken along lines A-A' and B-B' of FIG. 46A.
Figure 46C:
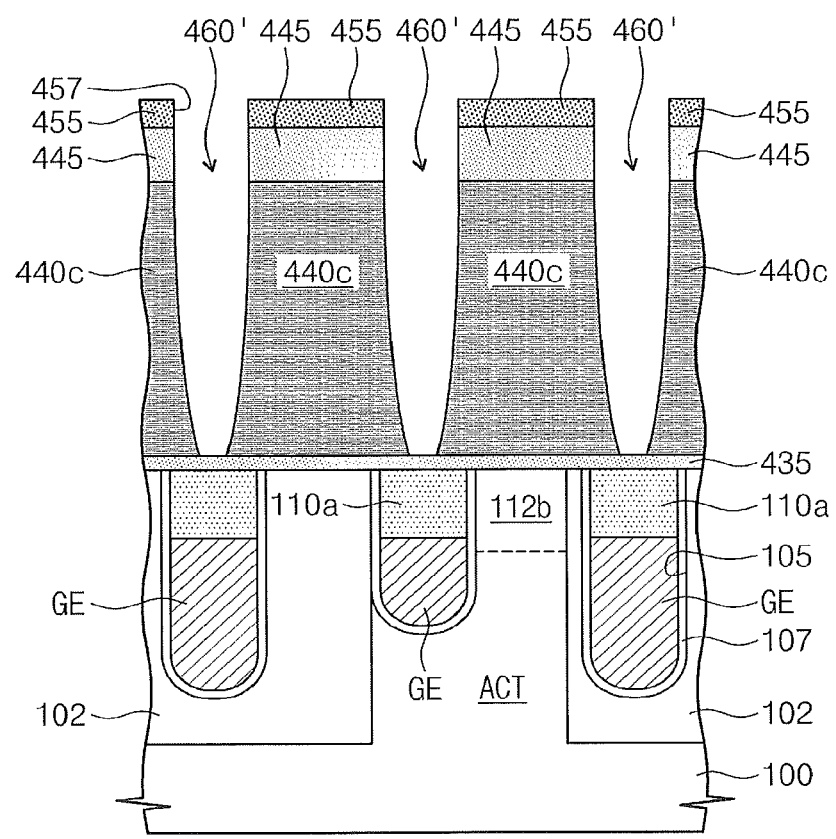
FIG. 46C is a cross-sectional view taken along a longitudinal direction of a sacrificial spacer of FIG. 46A.

FIG. 46A is a plan view illustrating a modified example of a method of manufacturing a semiconductor device according to yet other embodiments of the inventive concept. FIG. 46B is a cross-sectional view taken along lines A-A' and B-B' of FIG. 46A. FIG. 46C is a cross-sectional view taken along a longitudinal direction of a sacrificial spacer of FIG. 46A. The method according to the present modified example may include the processes described with reference to FIGS. 34A to 37A, 34B to 37B, and 34C to 37C.

Referring to FIGS. 37A to 37C and 46A to 46C, the filling line patterns 450 may be etched using the capping mask patterns 455 as etch masks to form fence concave regions 460'. At this time, the sacrificial spacer 440 under the line type opening 457 may be removed, so that portions 440c of the sacrificial spacer respectively disposed under the capping mask patterns 455 may be completely separated from each other. Additionally, the second protecting spacer layer 445 under the line type opening 457 may be removed, so that portions of the second protecting spacer layer 445 respectively disposed under capping mask patterns 455 may be separated from each other.

Subsequently, the insulating fences 465' illustrated in FIGS. 32A to 32C may be formed in the fence concave regions 460', respectively. Thereafter, subsequent processes may be performed as described with reference to FIGS. 40A to 45A, 40B to 45B, and 40C to 45C. Next, the upper plugs 490c, the landing pad 490L, the interlayer insulating layer 173, the via-plug 175, and the data storage part DSP of FIGS. 32A to 32C may be formed to realize the semiconductor device illustrated in FIGS. 32A to 32C.

Next, a method of manufacturing the semiconductor device of FIG. 33 will be described.

Figure 47A:
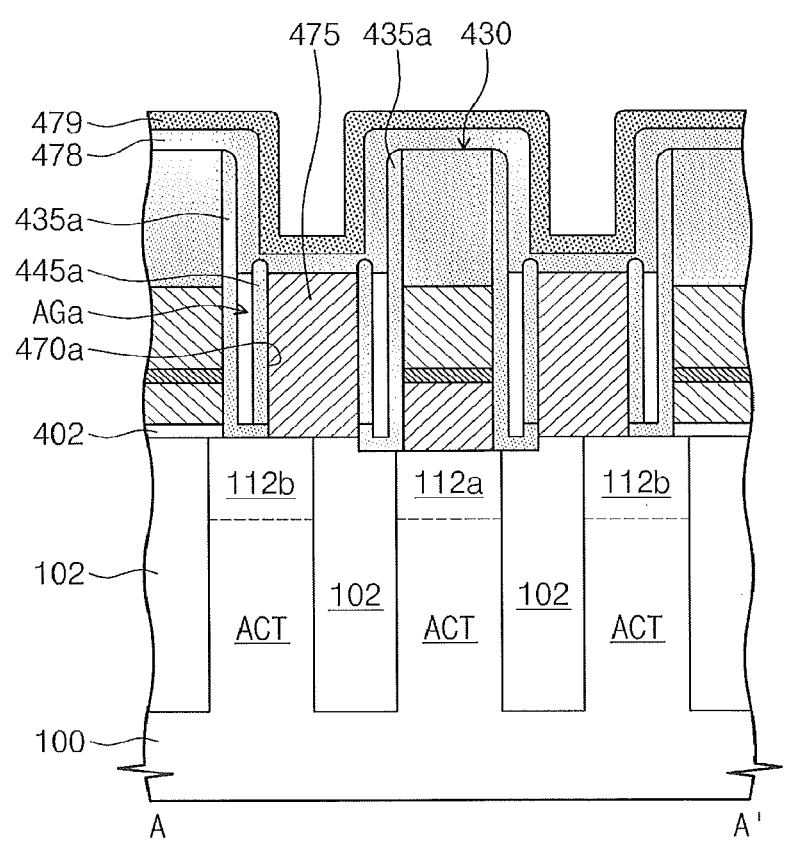
FIGS. 47A and 47B are cross-sectional views illustrating another modified example of a method of manufacturing a semiconductor device according to yet other embodiments of the inventive concept.
Figure 47B:
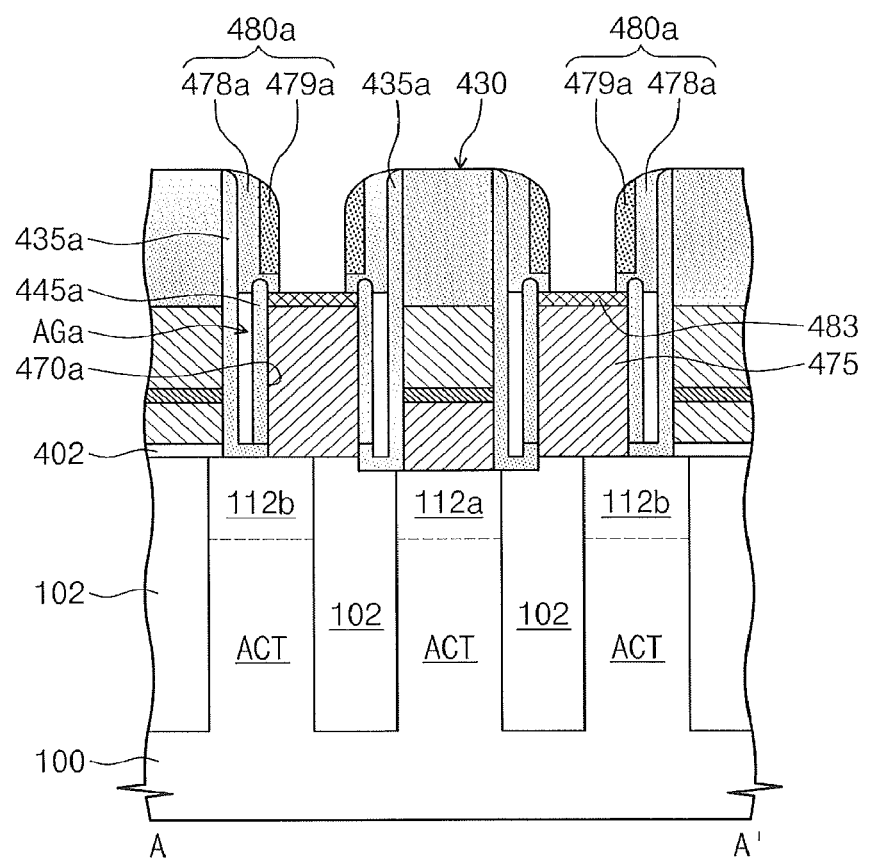

FIGS. 47A and 47B are cross-sectional views illustrating another modified example of a method of manufacturing a semiconductor device according to yet other embodiments of the inventive concept.

Referring to FIG. 47A, after the air gaps AGa described with reference to FIGS. 44A to 44C are formed, a first sub-spacer layer 478 may be formed on the substrate 100. And then a second sub-spacer layer 479 may be formed on the first sub-spacer layer 478. A step coverage property of the first sub-spacer layer 478 may be poorer than a step coverage property of the second sub-spacer layer 479. Thus, a top end of the air gap AGa may be substantially closed by the first sub-spacer layer 478 having the poor step coverage property. And a covering effect of the top end of the air gap AGa may be improved by the second sub-spacer layer 479 having the relatively good step coverage property. For example, the first sub-spacer layer 478 may be formed of a porous silicon nitride, and the second sub-spacer layer 479 may be formed of silicon nitride having a density higher than that of the porous silicon nitride.

Referring to FIG. 47B, an etch-back process may be performed on the second and first sub-spacer layers 479 and 478 to form a capping spacer 480a on an upper portion of a sidewall of the contact hole 470a. The capping spacer 480a may include a first sub-spacer 478a and a second sub-spacer 479a sequentially stacked. As illustrated in the FIG. 47B, the first sub-spacer 478a may have a L-shaped cross section. Subsequently, the upper plug 490c, the landing pad 490L, the inter layer insulating layer 173, the via-plug 175, and the data storage part DSP of FIG. 33 may be formed to realize the semiconductor device illustrated in FIG. 33.

The semiconductor devices according to the aforementioned embodiments of the inventive concept may be realized as semiconductor memory devices. However, the inventive concept is not limited thereto. Technical features relative to the line patterns, the contact plugs, and the air gaps of the semiconductor devices in the embodiments mentioned above may be applied to non-memory devices such as a logic device.

The semiconductor devices illustrated in the above embodiments may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

Figure 48:
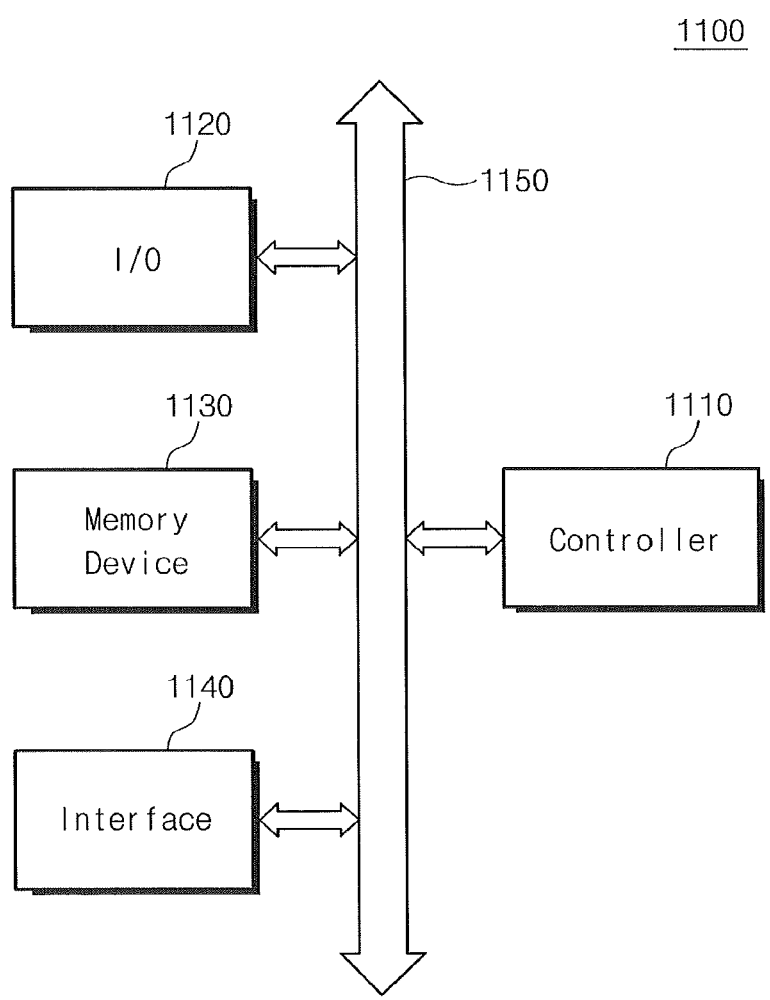
FIG. 48 is a schematic block diagram illustrating an example of electronic systems including semiconductor devices according to embodiments of the inventive concept.

FIG. 48 is a schematic block diagram illustrating an example of electronic systems including semiconductor devices according to embodiments of the inventive concept.

Referring to FIG. 48, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices according to the embodiments described above. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless communication.

Figure 49:
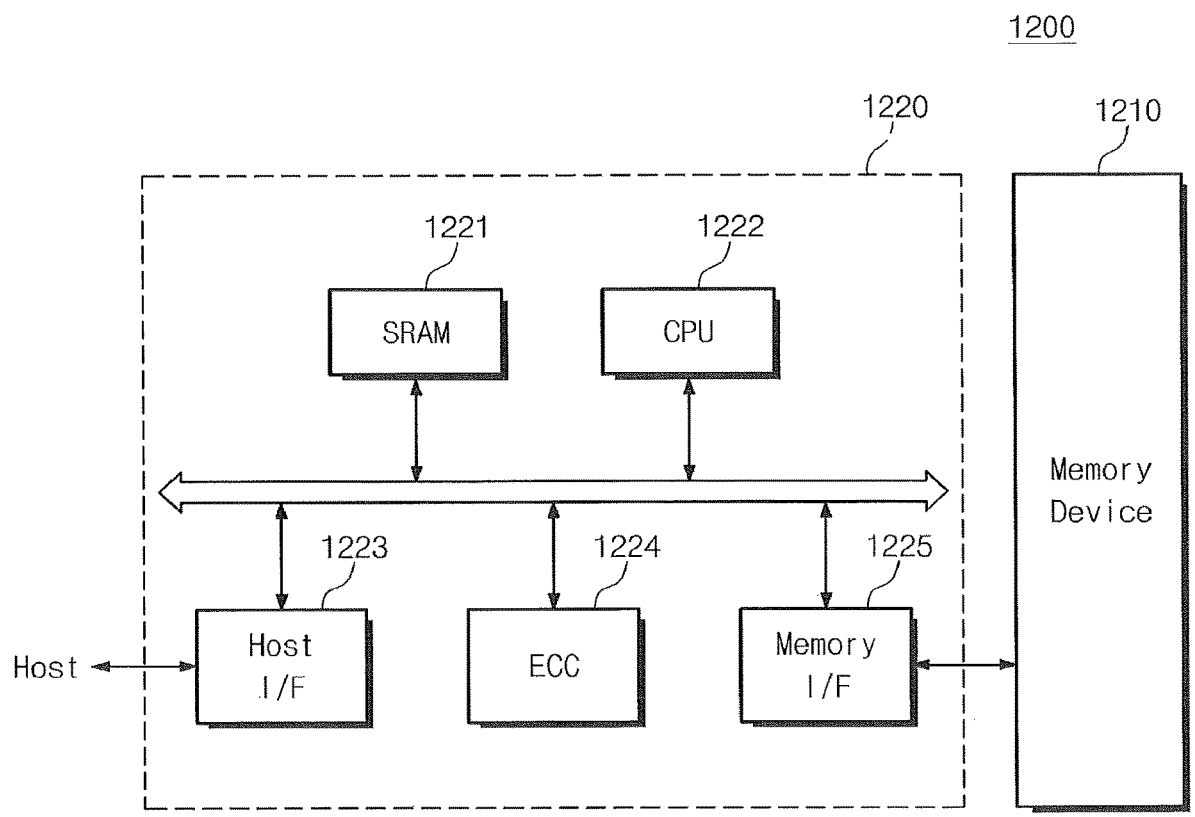
FIG. 49 is a schematic block diagram illustrating an example of memory cards including semiconductor devices according to embodiments of the inventive concept.

FIG. 49 is a schematic block diagram illustrating an example of memory cards including semiconductor devices according to embodiments of the inventive concept.

Referring to FIG. 49, a memory card 1200 according to an embodiment of the inventive concept may include a memory device 1210. The memory device 1210 may include at least one of the semiconductor devices according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

According to the above embodiments of the inventive concept, an air gap is disposed between a contact plug and line patterns. Thus, parasitic capacitance may be reduced to realize a highly integrated semiconductor device having improved reliability.

Additionally, a landing pad may cover a first part of the air gap, and a second part of the air gap may not be covered by the landing pad. Thus, the air gap may be easily formed to improve productivity of the semiconductor device.

Furthermore, first and second protecting spacers may be disposed between the contact plug and the line pattern, and the air gap may be disposed between the first and second protecting spacers. Due to the first and second protecting spacers, it is possible to prevent or reduce damage to the contact plug and the line pattern. Thus, the semiconductor device having improved reliability may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing a semiconductor device, the method comprising:
    forming line patterns on a substrate;
    conformally forming a first protecting spacer layer on the substrate having the line patterns;
    forming sacrificial spacers on sidewalls of the line patterns, the first protecting spacer layer being between each of the sacrificial spacers and a corresponding one of the line patterns;
    conformally forming a second protecting spacer layer on the substrate, after forming the sacrificial spacers, each of the first and second protecting spacer layers being formed of an insulating material having an etch selectivity with respect to the sacrificial spacers;
    forming a contact hole between the line patterns, each of the sacrificial spacers being between the contact hole and a corresponding one of the line patterns, respectively;
    forming a contact plug in the contact hole; and
    removing the sacrificial spacers to form air gaps,
    wherein forming the contact hole includes:
        forming a filling line pattern between the line patterns, the filling line pattern being formed after forming the second protecting spacer layer;
        forming capping mask patterns defining line type openings crossing the line patterns and the filling line pattern;
        removing portions of the filling line pattern exposed by the line type openings to form fence concave regions and a filling pillar pattern under each of the capping mask patterns;
        forming insulating fences filling the fence concave regions, respectively; and
        removing the capping mask patterns and the filling pillar patterns.

2. The method of claim 1, wherein:
    the capping mask patterns are formed of a material having an etch selectivity with respect to the filling line pattern and the insulating fences; and
    the insulating fences are formed of a material having an etch selectivity with respect to the filling line pattern.

3. The method of claim 2, wherein:
    the filling line pattern is formed of silicon oxide;
    the insulating fences are formed of silicon nitride; and
    the capping mask pattern is formed of poly-crystalline silicon.

4. The method of claim 2, wherein forming the insulating fences includes:
    forming a fence insulating layer filling the fence concave regions on the substrate; and
    planarizing the fence insulating layer until the capping mask patterns are exposed.

5. The method of claim 1, wherein at least portions of the second protecting spacer layer and the sacrificial spacers under the line type openings are recessed when the fence concave regions are formed.

6. The method of claim 5, wherein the recessed sacrificial spacers under the line type openings have a predetermined height after the fence concave regions are formed.

7. The method of claim 5, wherein, when the fence concave regions are formed, the sacrificial spacers under the line type openings are etched until the first protecting spacer layer thereunder is exposed, so that portions of the sacrificial spacers respectively disposed under the capping mask patterns are completely separated from each other.

8. The method of claim 1, wherein forming the air gaps, the contact hole, and the contact plug includes:
- anisotropically etching the second and first protecting spacer layers under the filling pillar patterns to form the contact hole after removing the filling pillar patterns, wherein top ends of the sacrificial spacers between the insulating fences are exposed;
- forming a lower plug filling a lower region of the contact hole;
- removing the exposed sacrificial spacers to form the air gaps;
- forming a capping spacer closing top ends of the air gaps in the contact hole; and
- forming an upper plug filling an upper region of the contact hole.

9. The method of claim 8, wherein forming the capping spacer includes:
- forming a first sub-spacer layer on the substrate having the air gaps and the lower plug;
- forming a second sub-spacer layer on the first sub-spacer layer; and
- performing an etch-back process on the second sub-spacer layer and the first sub-spacer layer,
- wherein a step coverage property of the first sub-spacer layer is poorer than a step coverage property of the second sub-spacer layer.

* * * * *

UNITED STATES PATENT AND TRADEMARK OFFICE
CERTIFICATE OF CORRECTION

PATENT NO. : 11,764,107 B2  
APPLICATION NO. : 17/144226  
DATED : September 19, 2023  
INVENTOR(S) : Choi et al.

Page 1 of 1

It is certified that error appears in the above-identified patent and that said Letters Patent is hereby corrected as shown below:

In the Claims

Column 38, Line 31-33, Claim 1: Please correct "form fence concave regions and a filling pillar pattern under each of the capping mask patterns" to read --form fence concave regions and filling pillar patterns under each of the capping mask patterns--

Column 38, Lines 47-48, Claim 3: Please correct "the capping mask pattern is formed of poly-crystalline silicon" to read --the capping mask patterns are formed of poly-crystalline silicon--

Column 38, Lines 49-50, Claim 4: Please correct "forming the insulating fences includes" to read --the forming the insulating fences includes--

Column 38, Lines 65-66, Claim 7: Please correct "so that portions of the sacrificial spacers respectively disposed" to read --so that portions of the sacrificial spacers are respectively disposed--

Column 39, Lines 1-2, Claim 8: Please correct "forming the air gaps, the contact hole, and the contact plug includes:" to read --the air gaps, the contact hole and the contact plug are formed by:--

Column 39, Line 5, Claim 8: Please correct "after removing the filling pillar patterns" to read --after the filling pillar patterns are removed--

Column 39, Lines 16-17, Claim 9: Please correct "forming the capping spacer includes" to read --the forming the capping spacer includes--

Signed and Sealed this  
Fourth Day of March, 2025

Coke Morgan Stewart  
*Acting Director of the United States Patent and Trademark Office*